(12) United States Patent
Wang et al.

(10) Patent No.: US 9,818,893 B2
(45) Date of Patent: *Nov. 14, 2017

(54) MICROSTRUCTURE ENHANCED ABSORPTION PHOTOSENSITIVE DEVICES

(71) Applicant: W&Wsens, Devices Inc., Los Altos, CA (US)

(72) Inventors: Shih-Yuan Wang, Palo Alto, CA (US); Shih-Ping Wang, Los Altos, CA (US)

(73) Assignee: W&WSENS DEVICES, INC., Los Altos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/309,922

(22) PCT Filed: Nov. 17, 2015

(86) PCT No.: PCT/US2015/061120
§ 371 (c)(1),
(2) Date: Nov. 9, 2016

(87) PCT Pub. No.: WO2016/081476
PCT Pub. Date: May 26, 2016

(65) Prior Publication Data
US 2017/0194522 A1    Jul. 6, 2017

Related U.S. Application Data

(63) Continuation of application No. 14/943,898, filed on Nov. 17, 2015, now Pat. No. 9,530,905, which is a
(Continued)

(51) Int. Cl.
| | |
|---|---|
| *H01L 31/0236* | (2006.01) |
| *H01L 31/0352* | (2006.01) |
| *H01L 27/144* | (2006.01) |
| *H01L 31/0232* | (2014.01) |
| *H01L 31/103* | (2006.01) |
| *H01L 31/107* | (2006.01) |
| *H01L 31/18* | (2006.01) |

(Continued)

(52) U.S. Cl.
CPC .......... *H01L 31/0236* (2013.01); *G02B 1/002* (2013.01); *H01L 27/1443* (2013.01);
(Continued)

(58) Field of Classification Search
CPC ..... H01L 31/00; H01L 31/02; H01L 31/0216; H01L 31/02161; H01L 31/02164;
(Continued)

(56) References Cited

U.S. PATENT DOCUMENTS

| | | | |
|---|---|---|---|
| 4,292,512 A | 9/1981 | Miller | |
| 4,571,559 A | 2/1986 | Henry | |

(Continued)

FOREIGN PATENT DOCUMENTS

| | | |
|---|---|---|
| WO | PCT/US11/51091 | 9/2011 |
| WO | WO2012034078 | 3/2012 |

(Continued)

OTHER PUBLICATIONS

European Patent Office Supplementary Search Report issued in European Application No. 14801543 dated Dec. 6, 2016.

Joshi et al., "25 Gbps 850 nm photodiode for emerging 100 Gb ethernet applications." SPIE proceedings vol. 8054, May 4, 2011, (May 4, 2011), Abstract http://proceedings.spiedigitallibrary.org/proceeding.aspx?articleid=1351039.

(Continued)

*Primary Examiner* — Eduardo A Rodela
(74) *Attorney, Agent, or Firm* — Cooper & Dunham LLP

(57) ABSTRACT

Techniques for enhancing the absorption of photons in semiconductors with the use of microstructures are described. The microstructures, such as holes, effectively increase the absorption of the photons. Using microstructures for absorption enhancement for silicon photodiodes and silicon avalanche photodiodes can result in bandwidths in excess of 10 Gb/s at photons with wavelengths of 850 nm, and with quantum efficiencies of approximately 90% or more. Their thickness dimensions allow them to be conveniently integrated on the same Si chip with CMOS, BiCMOS, and other electronics, with resulting packaging benefits and reduced capacitance and thus higher speeds.

30 Claims, 86 Drawing Sheets

Related U.S. Application Data continuation of application No. 14/945,003, filed on Nov. 18, 2015, now Pat. No. 9,525,084.

(60) Provisional application No. 62/081,537, filed on Nov. 18, 2014, provisional application No. 62/090,879, filed on Dec. 11, 2014, provisional application No. 62/100,025, filed on Jan. 5, 2015, provisional application No. 62/111,582, filed on Feb. 3, 2015, provisional application No. 62/139,511, filed on Mar. 27, 2015, provisional application No. 62/153,443, filed on Apr. 27, 2015, provisional application No. 62/154,675, filed on Apr. 29, 2015, provisional application No. 62/157,876, filed on May 6, 2015, provisional application No. 62/171,915, filed on Jun. 5, 2015, provisional application No. 62/174,498, filed on Jun. 11, 2015, provisional application No. 62/175,855, filed on Jun. 15, 2015, provisional application No. 62/182,602, filed on Jun. 21, 2015, provisional application No. 62/188,876, filed on Jul. 6, 2015, provisional application No. 62/197,120, filed on Jul. 27, 2015, provisional application No. 62/199,607, filed on Jul. 31, 2015, provisional application No. 62/205,717, filed on Aug. 15, 2015, provisional application No. 62/209,311, filed on Aug. 24, 2015, provisional application No. 62/213,556, filed on Sep. 2, 2015, provisional application No. 62/232,716, filed on Sep. 25, 2015, provisional application No. 62/081,538, filed on Nov. 18, 2014.

(51) Int. Cl.
    *H04B 10/25* (2013.01)
    *H04B 10/40* (2013.01)
    *H04B 10/80* (2013.01)
    *G02B 1/00* (2006.01)
    *H01L 31/09* (2006.01)

(52) U.S. Cl.
    CPC ...... *H01L 27/1446* (2013.01); *H01L 31/0232* (2013.01); *H01L 31/02325* (2013.01); *H01L 31/02327* (2013.01); *H01L 31/02363* (2013.01); *H01L 31/02366* (2013.01); *H01L 31/035218* (2013.01); *H01L 31/035281* (2013.01); *H01L 31/09* (2013.01); *H01L 31/103* (2013.01); *H01L 31/107* (2013.01); *H01L 31/1804* (2013.01); *H04B 10/25* (2013.01); *H04B 10/40* (2013.01); *H04B 10/801* (2013.01)

(58) Field of Classification Search
    CPC ........... H01L 31/02165; H01L 31/0232; H01L 31/02327; H01L 31/0236; H01L 31/02363; H01L 31/02366; H01L 31/035281; H01L 31/06; H01L 31/09; H01L 31/10; H01L 31/101; H01L 31/102; H01L 31/105; H01L 31/11
See application file for complete search history.

(56) References Cited

U.S. PATENT DOCUMENTS

| | | | |
|---|---|---|---|
| 4,637,129 A | 1/1987 | Derkits, Jr. et al. | |
| 4,716,449 A | 12/1987 | Miller | |
| 5,451,767 A | 9/1995 | Amano | |
| 5,457,327 A | 10/1995 | Taguchi | |
| 5,625,636 A | 4/1997 | Bryan | |
| 5,757,057 A | 5/1998 | Dabrowski | |
| 5,886,374 A | 3/1999 | Sakamoto | |
| 6,027,956 A | 2/2000 | Isissou | |
| 6,177,289 B1 | 1/2001 | Crow | |
| 6,667,528 B2 | 12/2003 | Cohen | |
| 7,115,971 B2 | 10/2006 | Stumbo | |
| 7,161,220 B2 | 1/2007 | Cohen | |
| 7,340,709 B1 | 3/2008 | Masini | |
| 7,397,101 B1 | 7/2008 | Masini et al. | |
| 7,495,306 B2 | 2/2009 | Langguth | |
| 7,601,597 B2 | 10/2009 | Takei | |
| 7,674,563 B2 | 3/2010 | Suda | |
| 7,772,615 B2 | 8/2010 | Ledentsov | |
| 7,795,064 B2 | 9/2010 | Pan et al. | |
| 7,893,348 B2 | 2/2011 | Korevan | |
| 7,898,052 B2 | 3/2011 | Prantl | |
| 7,972,934 B2 | 7/2011 | Wilson | |
| 7,977,637 B1 | 7/2011 | Yap | |
| 8,114,695 B2 | 2/2012 | Masuoka | |
| 8,129,710 B2 | 3/2012 | Cho et al. | |
| 8,357,960 B1 * | 1/2013 | Dutta ................ | H01L 31/03521 257/186 |
| 8,436,370 B2 | 5/2013 | Park | |
| 2003/0122210 A1 | 7/2003 | Cohen | |
| 2005/0092925 A1 | 5/2005 | Zentai | |
| 2005/0184354 A1 | 8/2005 | Chu | |
| 2006/0186501 A1 | 8/2006 | Ishimura | |
| 2007/0092192 A1 | 4/2007 | Achouche et al. | |
| 2007/0190434 A1 | 8/2007 | Suda | |
| 2007/0215968 A1 | 9/2007 | Wilson | |
| 2008/0047604 A1 | 2/2008 | Korevaar et al. | |
| 2008/0102582 A1 | 5/2008 | Takei | |
| 2008/0218740 A1 | 9/2008 | Williams | |
| 2008/0248608 A1 | 10/2008 | Wilson | |
| 2008/0265449 A1 | 10/2008 | Meinders et al. | |
| 2009/0188557 A1 | 7/2009 | Wang et al. | |
| 2009/0267049 A1 | 10/2009 | Cho et al. | |
| 2010/0029067 A1 | 2/2010 | Vijh | |
| 2010/0126548 A1 | 5/2010 | Jang et al. | |
| 2010/0193768 A1 | 8/2010 | Habib | |
| 2010/0197068 A1 | 8/2010 | Poon | |
| 2010/0221866 A1 | 9/2010 | Graham | |
| 2010/0313941 A1 | 12/2010 | Huang | |
| 2011/0000545 A1 * | 1/2011 | Nishi ................ | H01L 31/02243 136/261 |
| 2012/0141122 A1 | 6/2012 | Carusone | |
| 2012/0193676 A1 | 8/2012 | Bobde | |
| 2012/0292676 A1 | 11/2012 | Pan | |
| 2013/0009265 A1 | 1/2013 | Duatet | |
| 2013/0207222 A1 | 8/2013 | Qu | |
| 2014/0001528 A1 | 1/2014 | Pfirsch | |
| 2014/0167107 A1 | 6/2014 | Yoneda | |
| 2014/0225063 A1 | 8/2014 | Klem | |
| 2014/0263975 A1 | 9/2014 | Nagano | |
| 2015/0041965 A1 | 2/2015 | Schulze | |
| 2016/0225631 A1 | 8/2016 | Jun | |

FOREIGN PATENT DOCUMENTS

| | | |
|---|---|---|
| WO | WO2012149441 A2 | 11/2012 |
| WO | WO2013180690 | 12/2013 |
| WO | PCT/US1439208 | 5/2014 |
| WO | PCT/JP2014/39208 | 11/2014 |
| WO | WO2014190189 | 11/2014 |
| WO | PCT/US15/61120 | 11/2015 |

OTHER PUBLICATIONS

Dosunmu et al., "Germanium on double-SOI photodetectors for 1550 nm operation." Conference: Lasers and Electro-Optics Society, Nov. 2003, (Nov. 2003), pp. 2, 4-5, 8 https://www.researchgate.neVpublication/224745299.

Ackert, "10 Gbps silicon waveguide-integrated infrared avalanche photodiode." Optics xpress, Aug. 12, 2013, (Aug. 12, 2013), Abstract, pp. 19535 https://www.osapublishing.org/DirectPDF-Access/5DB4DFDB-E034-29D4-E6AEE5BDEF4D8089_260182/oe-21-17-19530.pdf?da=1&id=260182&seq=0&mobile=no.

M. K. Emsley, O. Dosunmu, and M. S. Unlu, "High-speed resonant-cavity-enhanced silicon photodetectors on reflecting silicon-on-

(56) References Cited

OTHER PUBLICATIONS insulator substrates," Ieee Photonics Technology Letters, vol. 14, pp. 519-521, Apr. 2002.
E. Ozbay, M. S. Islam, B. Onat, M. Gokkavas, O. Aytur, G. Tuttle, et al., "Fabrication of high-speed resonant cavity enhanced Schottky photodiodes," Ieee Photonics Technology Letters, vol. 9, pp. 672-674, May 1997.
T. Knodl, H. K. H. Choy, J. L. Pan, R. King, R. Jager, G. Lullo, et al., "RCE photodetectors based on VCSEL structures," Ieee Photonics Technology Letters, vol. 11, pp. 1289-1291, Oct. 1999.
K. Kato, "Ultrawide-bandlhigh-frequency photodetectors," Ieee Transactions on Microwave Theory and Techniques, vol. 47, pp. 1265-1281, Jul. 1999.
M. Amani, D. H. Lien, D. Kiriya, J. Xiao, A. Azcatl, J. Noh, et al., "Near-unity photoluminescence quantum yield in MoS2," Science, vol. 350, pp. 1065-1068, Nov. 27, 2015.
T. Mueller, F. N. A. Xia, and P. Avouris, "Graphene photodetectors for high-speed optical communications," Nature Photonics, vol. 4, pp. 297-301, May 2010.
L. Chen and M. Lipson, "Ultra-low capacitance and high speed germanium photodetectors on silicon," Optics Express, vol. 17, pp. 7901-7906, May 11, 2009.
P. Kuang, S. Eyderman, M. L. Hsieh, A. Post, S. John, and S. Y. Lin, "Achieving an Accurate Surface Profile of a Photonic Crystal for Near-Unity Solar Absorption in a Super Thin-Film Architecture," Acs Nano, vol. 10, pp. 6116-6124, Jun. 2016.
A. Mavrokefalos, S. E. Han, S. Yerci, M. S. Branham, and G. Chen, "Efficient Light Trapping in Inverted Nanopyramid Thin Crystalline Silicon Membranes for Solar Cell Applications," Nano Letters, vol. 12, pp. 2792-2796, Jun. 2012.
K. X. Z. Wang, Z. F. Yu, V. Liu, A. Raman, Y. Cui, and S. H. Fan, "Light trapping in photonic crystals," Energy & Environmental Science, vol. 7, pp. 2725-2738, Aug. 2014.
S. E. Han and G. Chen, "Optical Absorption Enhancement in Silicon Nanohole Arrays for Solar Photovoltaics," Nano Letters, vol. 10, pp. 1012-1015, Mar. 2010.
Y. Park, E. Drouard, O. El Daif, X. Letartre, P. Viktorovitch, A. Fave, et al., "Absorption enhancement using photonic crystals for silicon thin film solar cells," Optics Express, vol. 17, pp. 14312-14321, Aug. 3, 2009.
C. Yeh and F. L Shimabukuro, The essence of dielectric waveguides. New York ; London: Springer, 2008.
Y. G. Wang, Y. X. Kang, W. J. Zhao, S. Yan, P. J. Zhai, and X. W. Tang, "Studies on surface damageinduced by ion bombardment," Journal of Applied Physics, vol. 83, pp. 1341-1344, Feb. 1, 1998.
Liu AY et al., High performance continuous wave 1.3 μm quantum dot lasers on silicon, Appl. Phys. Letters, 104, 041104 (2014).
Ren, R., et al., "Enhanced absorption in elliptical silicon nanowire arrays for solar energy harvesting", Optical Engineering, vol. 53(2), 027102, Feb. 2014, http://opticalengineering.spiedigitallibrary.org/article.aspx?articleid=1828860.
Dayal, G., et al, "Broadband infrared metamaterial absorber with visible transparency using ITO as ground plane", Optics Express 15104 Jun. 2014.
Donnelly, J. L., et al., "Mode-based analysis of silicon nanohole arrays for photovoltaic applications," vol. 22, No. 55, Optics Express, A1343 25, Aug. 2014.
Gasca, L., "From O to L: The Future of Optical-Wavelength Bands," Broadband Properties, Jun. 2008. www.broadbandproperties.com.
Finsar, "World's Largest Supplier of Optical Solutions for the Communications Industry." http://files.shareholder.com/downloads/FNSR/0x0x382377/0b3893ea-fb06-417d-ac71-84f2f9084b0d/Finisar_Investor_Presentation.pdf,).
Silvaco., "Investigation of the SiGe Waveguide Phototides Using FDTD Method for High Speed Optical Communication, " Simulation Standard, http://www.silvaco.com/tech_lib_TCAD/simulationstandard/2010/apr_may_jun/a1/a1.html).

Kolodzey, J., et al, "Optical and electronic properties of SiGeC alloys grown on Si substrates," Journal of Crystal Growth 157, 386-391, (1995).
Kraus, T.F., "Slow light in photonic crystal waveguides," Journal of Physics D: Applied Physics, vol. 40, (2007).
Liu, A., et al., "Quantum dot lasers for silicon photonics [Invited]," Photonics Research, vol. 3, No. 5, Oct. 2015.
Liu, N., et al, "Infrared Perfect Absorber and Its Application as Plasmonic Sensor," Nano Lett. 10, 2342-2348, (2010).
Kang, Y., "Monolithic Ge/Si Avalnache Photodiodes," 978-1-4244-4403, IEEE, (2009).
Liu, A.Y., et al., Quantum Dot Lasers on Silicon, aUCSB Materials Department, Santa Barbara, California, USA, bUCSB Department of Electrical and Computer Engineering, Santa Barbara, California, USA.
Logeeswaran, V.J., "A 14-ps full width at half maximum high-speed photoconductor fabricated with intersecting InP nanowires on an amorphous surface," Applied Physics A, vol. 91, 1-5., (2008).
Hu, L., et al. "Analysis of Optical Absorption in Silicon Nanowire Arrays for Photovoltaic Applications," Nano Lett. vol. 7, No. 11, 2007.
Meng, L., et al. "Polarization-sensitive perfect absorbers at near-infrared wavelengths," Optics Express, A111, Dec. 2012.
Molin, D., "850-950nm WideBand 0M4 Multimode Fiber for Next-Generation WDM Systems," OFC (2015).
Piels, et al., "40 GHz Si/Ge uni-traveling carrier waveguide phototiode", Journal of Lightwave Technology, 15908, (2014).
Fountaine, K., et al., "Near-unity broadband absorption designs for semiconducting nanowire arrays via localized radial mode excitation", vol. 22, No. Optics Express A930, May 5, 2014.
Feng, D., et al, "High-speed Ge photodetector monolithically integrated with large cross-section silicon-on-insulator waveguide," Applied Physics Letters 95, 261105 (2009).
Schaub, J.D., et al. "Resonant-Cavity-Enhanced High-Speed Si Photodiode Grown by Epitaxial Lateral Overgrowth," IIEE Photonics Technology Letters, vol. 11, No. 12, Dec. 1999.
Seyedi, M.A. et al., "Efficient Schottky-like junction GaAs nanowire photodetector with 9 GHz modulation bandwidth with large active area," Applied Physics Letters 105, 041105 (2014).
Piatek, S., "Physics and Operation of an MPPC," Tutorials, Hamanatsu Phototonics, Nov. 16, 2015; http://www.hamamatsu.com/us/en/community/optical_sensors/tutorials/physics_of_mppc/index.html?utm_source=googleplus&utm_medium=social&utm_campaign=hc-social.
Garnett, E., "Light Trapping in Silicon Nanowire Solar Cells", Nano Letters, (2010) p. 10, 1082-1087.
Tanus et al.; "High-performance 1200-nm InGaAs and 1300-nm InGaAsN quantum-well lasers by metalorganic chemical vapor deposition," Selected Topics in Quantum Electronics, IEEE Journal of Selected Topics in Quantum Electronics, vol. 9, Issue: 5 (2003).
Kelzenberg, et al., Enhanced absorption and carrier collection in Si wire arrays for photovoltaic applications, Nature Materials, vol. 9, Mar. 2010, p. 239-244. http://authors.library.caltech.edu/17688/.
Lin, et al., "Optical absorption enhancement in silicon nanowire and nanohole arrays for photovoltaic applications," Proceeding of SPIE, vol. 772, 77721G-1, (2010).
Chang-Hasnain, C., et al., High contrast gratings for integrated optoelectrionics, Advances in Optics and Photonics vol. 4, (2012), p. 379-440. http://www.eecs.berkeley.edu/Pubs/TechRpts/2014/EECS-2014-197.html.
Chu., H-J.,et al., "Wurtzite InP nanowire arrays grown by selective area MOCVD," Phys. Status Solidi vol. C 7, No. 10, (2010), p. 2494-2497.
Kang et al., "Epitaxially-grown Ge/Si avalanche photodiodes for 1.3μm light detection," Optics Express 9365, vol. 16, No. 13, Jun. 23, 2008.
International Search Report dated Nov. 28, 2014 in PCT/US2014/39208.
International Search Report dated Dec. 23, 2011 in PCT/US2011/051091.

* cited by examiner

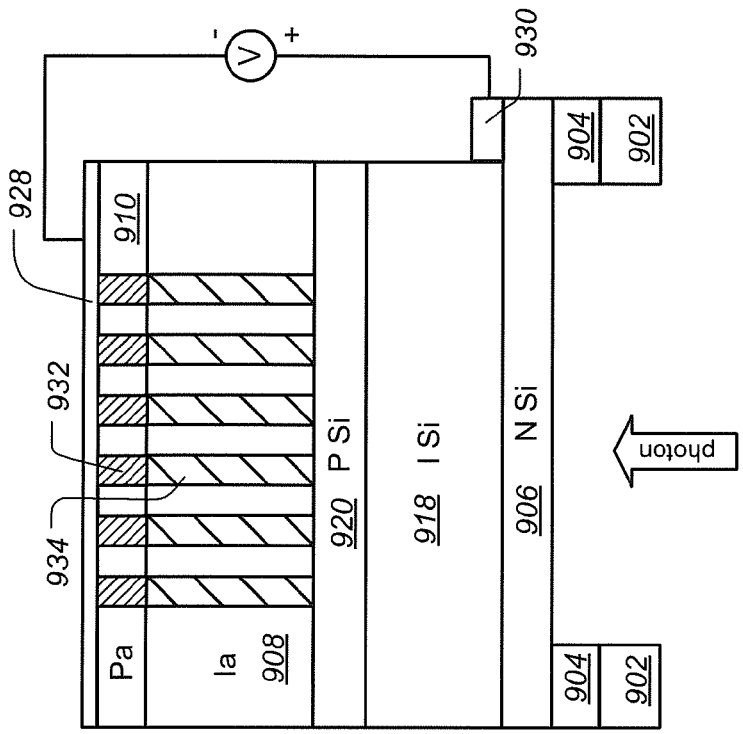
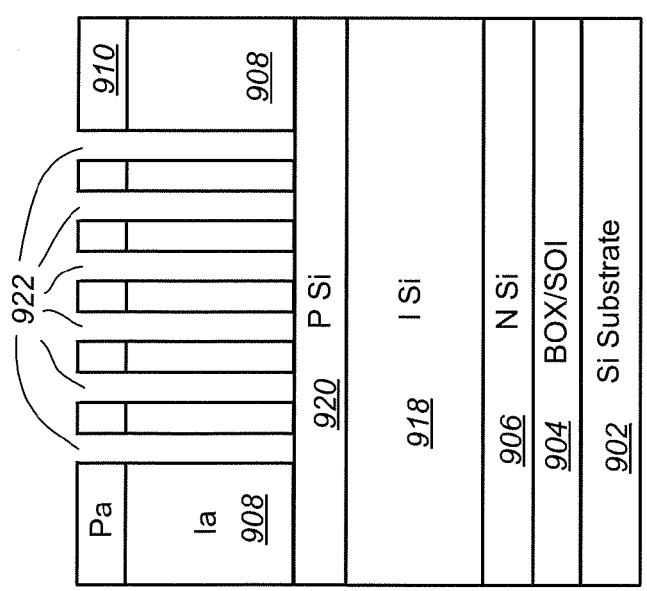
FIG. 9B
FIG. 9A

| 3110 | P or N doping > $1\times10^{19}/cm^3$ |
| 3108 | I not intentionally doped < $1\times10^{16}/cm^3$ |
| 3106 | N or P doping > $1\times10^{19}/cm^3$ |
| 3104 | SiO2 |
| 3102 | Si substrate |

FIG. 31  ← 3100

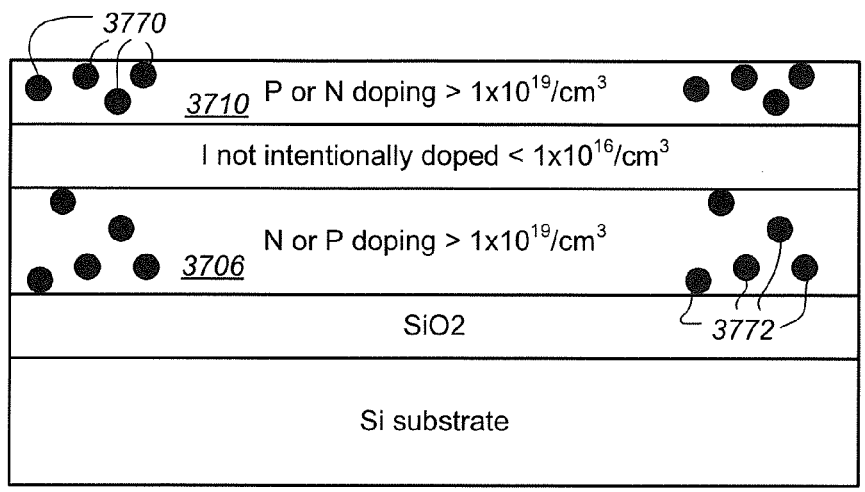
FIG. 37
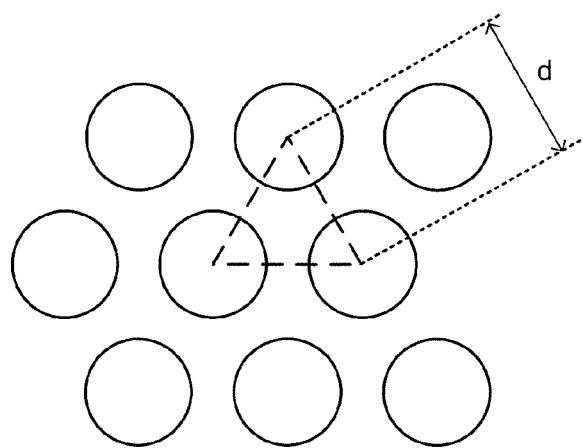
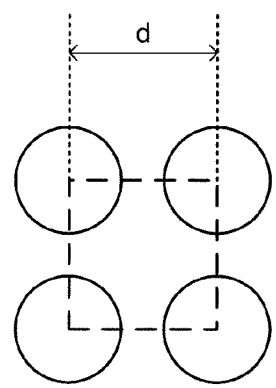
FIG. 38A            FIG. 38B

| Lattice shape | Ave. hole diameter nm | Distance between centers, nm | Distance between holes, nm | SiO2 layer round hole, nm | Substrate, μm | Height, μm |
|---|---|---|---|---|---|---|
| hexagonal | 500 | 1000 | 500 | 80 | 2 SiO2 | 2 |
| hexagonal | 700 | 1000 | 300 | 100 | 2 SiO2 | 2 |
| hexagonal | 630 | 900 | 270 | 0 | 2 SiO2 | 2 |
| hexagonal | 630 | 900 | 270 | 50 | 2 SiO2 | 2 |
| hexagonal | 630 | 900 | 270 | 100 | 2 SiO2 | 2 |
| hexagonal | 100 | 2000 | 1000 | 0 | 2 SiO2 | 2 |
| hexagonal | 1500 | 2000 | 500 | 0 | 2 SiO2 | 2 |
| hexagonal | 1300 | 2000 | 700 | 0 | 2 SiO2 | 2 |
| hexagonal | 500 | 1000 | 500 | 0 | 2 SiO2 | 2 |
| hexagonal | 700 | 1000 | 300 | 0 | 2 SiO2 | 2 |

FIG. 38C

Dimensions of Holes and Mesa Distribution
| Mesa diameter μm | Hole dia/ period nm A | Hole dia/ period nm B | Hole dia/ period nm C | Hole dia/ period nm D | Lattice |
|---|---|---|---|---|---|
| 25 | 1300/2000 | 1500/2000 | 700/1000 | 630/900 | Hexogonal/ Square |
| 30 | 1300/2000 | 1500/2000 | 700/1000 | 630/900 | Hexogonal/ Square |
| 40 | 1300/2000 | 1500/2000 | 700/1000 | 630/900 | Hexogonal/ Square |
| 50 | 1300/2000 | 1500/2000 | 700/1000 | 630/900 | Hexogonal/ Square |
| 80 | 1300/2000 | 1500/2000 | 700/1000 | 630/900 | Hexogonal/ Square |
FIG. 56
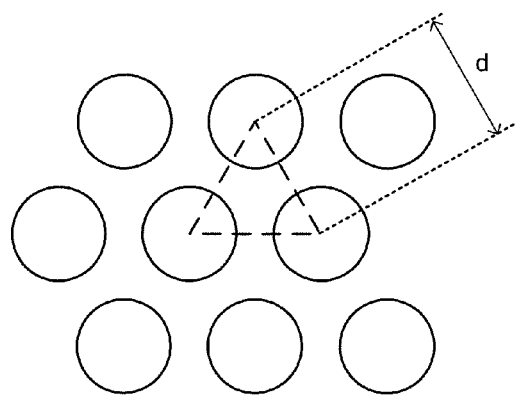
FIG. 57A
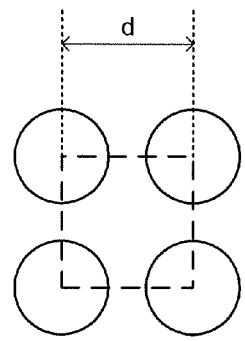
FIG. 57B

CASE 1

| | |
|---|---|
| Si N 0.3 μm > 1x10$^{19}$/cm$^3$ | 8710 |
| Si I 2 μm < 5x10$^{15}$/cm$^3$ | 8708 |
| Si P 0.2 μm  1x10$^{20}$/cm$^3$ | 8706 |
| Si P Substrate 150 μm | 8702 |

*FIG. 87*

CASE 2

| | |
|---|---|
| Si N 0.3 μm > 1x10$^{19}$/cm$^3$ | 8810 |
| Si I 2 μm < 5x10$^{15}$/cm$^3$ | 8808 |
| Si$_{0.99}$Ge$_{0.01}$B 0.3 μm p > 1x10$^{20}$/cm$^3$ | 8816 |
| Si P 0.1 μm  1x10$^{20}$/cm$^3$ | 8806 |
| SiO2 2 μm | 8804 |
| Si P Substrate 150 μm | 8802 |

*FIG. 88*

| | |
|---|---|
| Ge P .0.1-0.3 μm > 1x10²⁰/cm³ | _10110_ |
| Ge Intrinsic 2 μm < 1x10¹⁶/cm³ | _10108_ |
| Si P 0.1 μm p ~ 1.8x10¹⁷/cm³ | _10120_ |
| Si Intrinsic 0.5 μm < 1x10¹⁶/cm³ | _10118_ |
| Si N 0.3-2.0 μm > 1x10¹⁹/cm³ | _10106_ |
| Si Substrate 150 μm | _10102_ |

Dimensions of Holes and Mesa Distribution for Si and Ge Microstructured Holes for PD and APD

| Mesa diameter μm | Hole dia/ period nm A Si and Ge | Hole dia/ period nm B Si and Ge | Hole dia/ period nm C Si | Hole dia/ period nm D Si | Hole dia/ period nm E Ge | Hole dia/ period nm F Ge |
|---|---|---|---|---|---|---|
| 10 | 1300/2000 | 1500/2000 | 700/1000 | 630/900 | 1500/2500 | 1300/2300 |
| 25 | 1300/2000 | 1500/2000 | 700/1000 | 630/900 | 1500/2500 | 1300/2300 |
| 30 | 1300/2000 | 1500/2000 | 700/1000 | 630/900 | 1500/2500 | 1300/2300 |
| 40 | 1300/2000 | 1500/2000 | 700/1000 | 630/900 | 1500/2500 | 1300/2300 |
| 50 | 1300/2000 | 1500/2000 | 700/1000 | 630/900 | 1500/2500 | 1300/2300 |
| 80 | 1300/2000 | 1500/2000 | 700/1000 | 630/900 | 1500/2500 | 1300/2300 |

FIG. 103A

MICROSTRUCTURE ENHANCED ABSORPTION PHOTOSENSITIVE DEVICES

REFERENCE TO RELATED APPLICATIONS

This application is a §371 national stage of PCT International Application PCT/US2015/061120 filed Nov. 17, 2015, and a continuation of each of U.S. application Ser. No. 14/943,898 filed Nov. 17, 2015 and Ser. No. 14/945,003 filed Nov. 18, 2015. Each of the PCT application and the U.S. applications claims priority to each of the following provisional applications:

U.S. Prov. Ser. No. 62/081,538 filed Nov. 18, 2014;
U.S. Prov. Ser. No. 62/090,879 filed Dec. 11, 2014;
U.S. Prov. Ser. No. 62/100,025 filed Jan. 5, 2015;
U.S. Prov. Ser. No. 62/111,582 filed Feb. 3, 2015;
U.S. Prov. Ser. No. 62/139,511 filed Mar. 27, 2015;
U.S. Prov. Ser. No. 62/153,443 filed Apr. 27, 2015;
U.S. Prov. Ser. No. 62/154,675 filed Apr. 29, 2015;
U.S. Prov. Ser. No. 62/157,876 filed May 6, 2015;
U.S. Prov. Ser. No. 62/171,915 filed Jun. 5, 2015;
U.S. Prov. Ser. No. 62/174,498 filed Jun. 11, 2015;
U.S. Prov. Ser. No. 62/175,855 filed Jun. 15, 2015;
U.S. Prov. Ser. No. 62/182,602 filed Jun. 21, 2015;
U.S. Prov. Ser. No. 62/188,876 filed Jul. 6, 2015;
U.S. Prov. Ser. No. 62/197,120 filed Jul. 27, 2015;
U.S. Prov. Ser. No. 62/199,607 filed Jul. 31, 2015;
U.S. Prov. Ser. No. 62/205,717 filed Aug. 15, 2015;
U.S. Prov. Ser. No. 62/209,311 filed Aug. 24, 2015;
U.S. Prov. Ser. No. 62/213,556 filed Sep. 2, 2015; and
U.S. Prov. Ser. No. 62/232,716 filed Sep. 25, 2015.

This application incorporates by references each of the PCT, U.S., and provisional applications enumerated above and claims the benefit thereof.

This patent application relates to the following provisional and non-provisional applications that are each incorporated by reference:

International Patent Appl. No. PCT/US14/39208 filed May 22, 2014;
U.S. Prov. Ser. No. 61/826,446 filed May 22, 2013;
U.S. Prov. Ser. No. 61/834,873 filed Jun. 13, 2013;
U.S. Prov. Ser. No. 61/843,021 filed Jul. 4, 2013;
U.S. Prov. Ser. No. 61/905,109 filed Nov. 15, 2013; and
U.S. Prov. Ser. No. 62/017,915 filed Jun. 27, 2014.

All of the above-referenced provisional and non-provisional patent applications are collectively referenced herein as "the commonly assigned incorporated applications."

FIELD

This patent specification present invention generally relates mainly to photosensitive devices. More particularly, some embodiments relate to photosensitive devices having microstructure enhanced absorption characteristics.

BACKGROUND

Fiber-optic communication is widely used in applications such as telecommunications and communication within large data centers. Because of attenuation losses associated with using shorter optical wavelengths most fiber-optic communication uses optical wavelengths of 800 nm and longer. Commonly used transmission windows exist between 800 nm and 1675 nm. A main component of optical receivers used in fiber-optic communication system is the photo detector, usually in the form of a photodiode (PD) or avalanche photodiode (APD).

High-quality low-noise APDs can be made from silicon. However, while silicon will absorb light in the visible and near infrared range, it becomes more transparent at longer optical wavelengths. Silicon PDs and APDs can be made for optical wavelengths of 800 nm and longer by increasing the thickness of the absorption "I" region of the device. However, in order to obtain adequate quantum efficiency, the thickness of the silicon "I" region becomes so large that the device's maximum bandwidth is too low for many current and future telecom and data center applications.

To avoid the inherent problem that silicon PDs and APDs have with longer wavelengths and higher bandwidths, other materials are used. Germanium (Ge) detects infrared out to a wavelength of 1700 nm, but has relatively high multiplication noise. InGaAs can detect out to longer than 1600 nm, and has less multiplication noise than Ge, but still has far greater mulitiplacation noise than silicon. InGaAs is known to be used as the absorption region of a heterostructure diode, most typically involving InP as a substrate and as a multiplication layer. This material system is compatible with an absorption window of roughly 900 to 1700 nm. However, both InGaAs devices are relatively expensive and have relatively high multiplication noise when compared with silicon and are difficult to integrate with Si electronics as a single chip.

Information published by a major company in the business of photodetectors (See http://files.shareholder.com/downloads/FNSR/0x0x382377/0b3893ea-fb06-417d-ac71-84f2f9084b0d/Finisar_Investor_Presentation.pdf) indicates at page 10 that the current market for optical communication devices is over 7 billion U.S. dollars with a compounded annual growth rate of 12%. The photodiodes (PD) used for 850 nm wavelength employ GaAs material and for 1550 nm wavelength the photodiodes are InP material based, which is both expensive and difficult to integrate with Si based electronics. Therefore, there is a large market and a long-felt need that has not met for the development of a better device. To date there are no Si material based photodiodes nor avalanche photodiodes (APD) for 850 nm and no Ge on Si material based photodiodes nor avalanche photodiodes for 1550 nm that are top or bottom illuminated and with data rate of 5 Gb/s or greater, that are commercially available to the knowledge of the inventors herein. However, there has been no lack of trying to develop a better device for this large market. For example, there have been proposals for resonant photodiodes fabricated in Si material (see Resonant-Cavity-Enhanced High-Speed Si Photodiode Grown by Epitaxial Lateral Overgrowth, Schaub et al, IEEE PHOTONICS TECHNOLOGY LETTERS, VOL. 11, NO. 12, DECEMBER 1999), but they have not reached the known commercial market. Other forms of high speed photodiodes in a waveguide configuration have been proposed, such as in Ref. 40 GHz Si/Ge uni-traveling carrier waveguide photodiode, Piels et al, DOI 10.1109/JLT.2014.2310780, Journal of Lightwave Technology; Monolithic Ge/Si Avalanche Photodiodes, Kang et al, 978-1-4244-4403-8/09/ $25.00 ©2009 IEEE; High-speed Ge photodetector monolithically integrated with large cross-section silicon-on-insulator waveguide, Feng et al, Applied Physics Letters 95, 261105 (2009); doi: 10.1063/1.3279129; where light is coupled edge-wise into an optical waveguide and where the absorption length can be 100 um or longer to compensate for the weak absorption coefficient of Ge at 1550 nm. In these previously proposed waveguide photodiode structures, light propagates along the length of the waveguide and the electric field is applied across the PIN waveguide such that the direction of light propagation and the direction of the electric field are predominately perpendicular. Since light in Si travels approximately 1000 times faster than the saturated velocity of electrons/holes, a waveguide PD can be 200 microns long for example and the "I" in the PIN can be 2 microns for example and achieve a bandwidth of over 10 Gb/s. Such edge coupling of light is costly in packaging as compared to surface illumination as described in this patent specification, where dimensions of the waveguide cross section are typically a few microns as compared to tens of microns for known surface illuminated photodiodes or avalanche photodiodes. Known waveguide PD/APD are often only single mode optical systems whereas surface illuminated PD/APD described in this patent specification can be used in both single and multimode optical systems. In addition, known waveguide photodiodes are difficult to test at wafer level, whereas surface illuminated photodiodes described in this patent specification can be easily tested at wafer level. Known waveguide photodiodes/avalanche photodiodes are used mostly in specialty photonic circuits and are not widely commercially available. A top or bottom illuminated Si and Ge on Si PD/APD that can be integrated with Si is not known to be commercially available at data rates of 5 Gb/s or more at wavelengths of 850 nm and 1550 nm. In contrast, photodiodes on Si based material, as described in this patent specification, can be monolithically integrated with integrated electronic circuits on a single Si chip, thereby significantly reducing the cost of packaging. In addition, the microstructured PD/APD at 850 nm nominal wavelength described in this patent specification can be predominately for short haul, distances less than a meter and in certain cases less than 10 meters and in certain cases less than 100 meters and in certain cases less than 1000 meters optical data transmission for example. The microstructured PD/APD direction of incident optical beam and the electric field in the "I" region of a PIN or NIP structure, are predominately collinear and or almost collinear. This patent specification enables such a device and is expected to transform the current data centers to almost all optical data transmission between blades and or within a blade, that will vastly increase the data transmission bandwidth capabilities and significantly reduce electrical power usage.

The subject matter claimed herein is not limited to embodiments that solve any specific disadvantages or that operate only in environments such as those described above. Rather, this background is only provided to illustrate one exemplary technology area where some embodiments described herein may be practiced.

SUMMARY

According to some embodiments, an integrated detector/processor circuit for data communication comprises both a photodetector with microstructure-enhanced photoabsorption and an electronic processor formed into a single semiconductor chip. The single chip comprises a photodetector formed on a semiconductor substrate that has a photon absorbing region configured to absorb photons from an optical source signal modulated for data communication and provide an output electrical signal corresponding thereto, wherein the photon absorbing region comprises a plurality of holes therein extending toward said substrate and configured to concurrently receive the same source signal at a plural number of the holes; an electronic processor also formed on said semiconductor substrate and operatively associated with said photon absorbing region to receive therefrom and process said output electrical signal into a processed output, thereby forming a single semiconductor chip that receives the optical source signal and outputs the processed output; wherein said photon absorbing region and said electronic processor have respective thicknesses that are of the same order of magnitude; and a cathode region and an anode region operatively associated with said photon absorbing region and reverse biasing circuitry configured to apply a voltage between said cathode and anode regions such that said cathode region is driven to a more positive voltage than said anode region. The thickness of the photon absorbing region preferably is in the range of 0.5 to 5 micrometers. The electronic processor can be an application specific integrated circuit (ASIC) comprising at least one of complementary metal oxide semiconductor (CMOS) devices, bipolar (Bi) devices, and BiCMOS devices. The photon absorbing region can be configured to absorb in excess of 40%, or 50%, or 60% of the incident source signal at wavelengths from 800 nm to 900 nm, or from 1400 nm to 1700 nm, and provide an output electrical signal corresponding thereto. The photon absorbing region can be configured to absorb the incident source signal at an absorption percentage that varies by less than 20% over selected wavelength spans of at least 20 nm of source signal wavelengths from 800 nm to 900 nm, or from 1400 nm to 1700 nm. Each hole can have a cross-section parallel to a surface of the substrate, having a maximum dimension of between 400 nm and 2500 nm, and each hole can have a center that is spaced apart by less than 3500 nm from a center of a nearest adjacent hole of the plurality of holes. The photodetector preferably further comprises a P layer and an N layer highly doped at or exceeding $10^{19}$ per $cm^3$ and flanking said photon absorbing region, and the photon absorbing region preferably is lightly doped or not intentionally doped at most at $10^{16}$ per $cm^3$. The photodector can comprise an avalanche photodetector, and the photon absorbing region can comprise at least one of Si and Ge. The photodetector can comprise a tapered or stepped hole configured to accept an optical fiber carrying said source signal and maintaining an end of the fiber at a selected distance from said photon absorbing region. A lens can be included between said end of the fiber and the photon absorbing region. The photodector can further comprise a reflecting structure configured to cause multiple reflections of the source signal thereby traversing the photon absorbing region with said source signal multiple times. The photodector can be configured to receive the source signal from two opposite sides of the photon absorbing region, and said holes can be configured to cause coupled resonance in conversion of light to electrical signals at plural groups of the holes thereby enhancing source signal absorption.

One or more additional photodetectors can be formed on said semiconductor substrate, having respective photon absorbing regions receiving respective additional source signals and providing respective output electrical signals corresponding thereto, and one or more additional electronic processors can also be formed on said semiconductor substrate and operatively associated with the respective photon absorbing regions of said additional photodetectors to receive therefrom and process said respective output electrical signals therefrom. The plurality of holes can be configured to enhance absorption of photons compared to a hole-free but otherwise same photodetector at a range of wavelengths that includes a wavelength of said source signal. The electronic processor can include one or more types selected from a group consisting of: transimpedance amplifier, signal processing electronics, and routing electronics. A capacitance associated with the photodetector is decreased compared to an otherwise same photodetector having its anode and cathode regions operatively connected to a conventional bond pad. The photodector can further compare a multiplication region making it an avalanche photodiode configured to detect the source signal at a data bandwidth of greater than 10 gigabits per second, at source signal wavelengths of 800 to 900 nanometers, and having a gain of greater than 2.

In some embodiments, an optical/electronic system comprises a photodetector and an active electronic circuit built on the same semiconductor substrate and operatively associated with each other to thereby form a single integrated circuit chip; a laser modulated at Gb/s rates of data to thereby generate the optical source signal carrying information at Gb/s rates; and an optical fiber associated with the laser to receive the optical source signal at an input end thereof and transport it to an output end thereof; wherein the photodetector is associated with the output end of the optical fiber to receive the optical source signal therefrom and is configured to convert it to an electrical output signal; and wherein the active electronic circuit is associated with the photodetector to receive the output electrical signal therefrom and is configured to process the electrical output signal and output said processed electrical signal. Each of the source signal and the electrical output signal can be modulated at rates of at least 5 Gb/s. The photodetector and the active electronic circuit can have thicknesses that are of the same order of magnitude. The photodector can comprise a photon absorbing region that includes a plurality of holes extending toward the semiconductor substrate, wherein plural holes are configured to concurrently receive the same source signal. Highly doped P and N layers can flank the photon absorbing region, and the photon absorbing region can have a thickness in the range of 0.1-5.0 micrometers and preferably is not intentionally doped or is lightly doped compared with the P and N regions. The photodetector can be biased to cause electrons or holes to be swept in a direction along a direction in which the source signal is received by the photodetector. Each of the photodetector and the active electronic circuit can be silicon-based. The photodector can be an avalanche photodector.

In some embodiments, a photodetector with microstructure-enhanced photoabsorption comprises a photon absorbing region preferably having a thickness between 0.5 and 5 micrometers and configured to absorb photons from a source signal modulated for data communication and provide an output electrical signal corresponding thereto; said photon absorbing region comprising a plurality of holes extending through at least a portion of the thickness of the photon absorbing region and configured to concurrently receive the same source signal at a plural number of the holes; and said photon absorbing region being configured to absorb in excess of 40% of the incident source signal at wavelengths in at least one of the ranges from 800 nm to 900 nm and from 1400 nm to 1700 nm and provide an output electrical signal corresponding thereto. The photon absorbing region can be configured to absorb in excess of 40% or 50% or 60% of the incident source signal at wavelengths from 800 nm to 900 nm or from 1400 nm to 1700 nm and provide an output electrical signal corresponding thereto. The photon absorbing region can be configured to absorb the incident source signal at an absorption percentage that varies by less than 20% over wavelength spans of at least 20 nm of source signal wavelengths from 800 nm to 900 nm or from 1400 nm to 1700 nm. Each hole has a cross-section parallel to the upper surface of the substrate that preferably has a maximum dimension of between 400 nm and 2500 nm, and each hole has a center that preferably is spaced apart by less than 3500 nm from a center of a nearest adjacent hole of the plurality of holes. The photodetector can further comprise a P layer and an N layer preferably highly doped at or exceeding $10^{19}$ per $cm^3$ and flanking said photon absorbing region, and the photon absorbing region is preferably lightly doped or not intentionally doped at most at $10^{16}$ per $cm^3$. The photodector can comprise an avalanche photodetector. The photon absorbing region can comprises Si or Ge. The photodetector can comprise a tapered or stepped hole configured to accept an optical fiber carrying said source signal and maintaining an end of the fiber at a selected distance from said photon absorbing region, and a lens can be included between said end of the fiber and the photon absorbing region. The photodetector can comprise a reflecting structure configured to cause multiple reflections of the source signal thereby traversing the photon absorbing region with said source signal multiple times. The photodector can be configured to receive the source signal from two opposite sides of the photon absorbing region.

In some embodiments, a photodetector with microstructure-enhanced photoabsorption comprises a cathode region; an anode region; reverse biasing circuitry configured to apply a voltage between said cathode and anode regions such that said cathode region is driven to a more positive voltage than said anode region; a substrate material having an upper surface; and a photon absorbing region made of silicon operatively associated with the cathode and anode regions and configured to absorb photons from a source signal, said silicon absorbing region including a plurality of holes each having a cross section parallel to the upper substrate surface having a maximum dimension of between 400 nm and 2500 nm, and each hole having a center that is spaced apart by less than 3500 nm from a center of a nearest adjacent hole of the plurality of holes. The source signal can have a wavelength that is greater than 800 nm and less than 1000 nm. The plurality of holes can be arranged into a periodically-spaced array that can have a hexagonal or square lattice pattern. The plurality of holes enhances absorption of photons compared to a hole-free but otherwise same photodetector at a range of wavelengths that includes a wavelength of said source signal. Each of the holes can have a predominantly circular cross-section parallel to the upper substrate surface. The cathode and anode regions can be operatively connected to integrated circuit electronics and the photodetector and integrated circuit electronics can be integrated into a single silicon chip where the integrated circuit electronics can include one or more types selected from a group consisting of transimpedance amplifier, signal processing electronics, and routing electronics. A capacitance associated with the photodetector can be decreased compared to an otherwise same photodetector having its anode and cathode regions operatively connected to a conventional bond pad. The photodetector can further comprise a multiplication region formed of silicon and wherein the photodetector is an avalanche photodiode configured to detect the source signal at a data bandwidth of greater than 5 gigabits per second, at source signal wavelengths of 850 nanometers, and having a gain of greater than 2. The photodetector can be configured to detect said source signal at a data bandwidth of greater than 2.5 gigabits per second or greater or equal to 5 gigabits per second at source signal wavelengths of 850 nanometers with a quantum efficiency of at least 30%, or 50%. The plurality of holes can be formed by etching away portions of silicon. The photodetector can be configured for a portion of the source signal to pass through the photon absorbing region a first time, reflect from a surface, and thereafter pass through the photon absorbing region a second time. The photodetector can further include a substrate, wherein the cathode, absorbing and anode regions are formed above the substrate and the photodetector is configured to receive the source signal from directions facing a side of the photodetector opposite of the substrate.

In some embodiments, a photodetector with microstructure-enhanced photoabsorption comprises a cathode region; an anode region; reverse biasing circuitry configured to apply a voltage between said cathode and anode regions such that said cathode region is driven to a more positive voltage than said anode region; a substrate material having an upper surface; and a photon absorbing region made of germanium-based material operatively associated with the cathode and anode regions and configured to absorb photons from a source signal, said germanium-based absorbing region including a plurality of holes each having a cross section parallel to the upper substrate surface having a maximum dimension of between 750 nm and 3000 nm, and each hole having a center that is spaced apart by less than 5000 nm from a center of a nearest adjacent hole of the plurality of holes. The germanium-based photon absorbing layer can be formed by at least one of an epitaxial growth and an epitaxial lateral overgrowth process above one or more layers of material made of silicon. The photodetector can further comprise a Ge buffer layer configured to initiate crystalline growth of Ge on an uppermost silicon layer. The photodetector's anode region can comprise a P-doped germanium layer formed by at least one of an epitaxial growth and an epitaxial lateral overgrowth process. The photodetector can be an avalanche photodiode and can further comprise a multiplication region formed of silicon. The source signal can have a wavelength that is greater than 1200 nm and less than 1900 nm, or greater than 1400 nm. The photodetector can be configured to detect said source signal at a data bandwidth of greater than 2 gigabits per second, or 5 gigabits per second, at source signal wavelengths of 1550 nanometers with a quantum efficiency of at least 30%, or 50%.

As used herein, the grammatical conjunctions "and", "or" and "and/or" are all intended to indicate that one or more of the cases, object or subjects they connect may occur or be present. In this way, as used herein the term "or" in all cases indicates an "inclusive or" meaning rather than an "exclusive or" meaning.

As used herein the terms "hole" and "holes" refer to any opening into or through material or materials. In general the opening can have any shape and cross-section including round, elliptical, polygonal, and random shape.

BRIEF DESCRIPTION OF THE DRAWINGS

To further clarify the above and other advantages and features of the subject matter of this patent specification, specific examples of embodiments thereof are illustrated in the appended drawings. It should be appreciated that these drawings depict only illustrative embodiments and are therefore not to be considered limiting of the scope of this patent specification or the appended claims. The subject matter hereof will be described and explained with additional specificity and detail through the use of the accompanying drawings in which:

FIGS. 9A and 9B are diagrams showing aspects of a selective area growth (SAG) APD structure before and after SAG of III-V or Ge material, according to some embodiments;

FIG. 31 is a diagram showing some aspects of a Simple PIN photodiode structure, according to some embodiments;

FIG. 37 is a diagram showing a technique to reduce minority carrier lifetime, according to some other embodiments;

FIGS. 38A-C describe various parameters for microstructured photodiodes that were simulated;

FIG. 56 is a table showing the mesa size, hole diameters, hole period distances, and lattice patterns for MS-PDs, according to some embodiments;

FIGS. 57A and 57B are diagrams showing hexagonal and square lattice hole patterns, according to some embodiments;

FIG. 87 shows a simple epitaxial structure without any microstructures.

FIG. 88 shows another simple epitaxial structure without any microstructures;

FIG. 91B shows the epitaxial structure in FIG. 90 (Case 4) where the microstructured hole arrays are etched to different depths;

FIGS. 103A-C shows hole diameters, periods, and other parameters for microstructured silicon and germanium on Si photodiodes and avalanche photodiodes, according to some embodiments;

DETAILED DESCRIPTION

Figure 1:
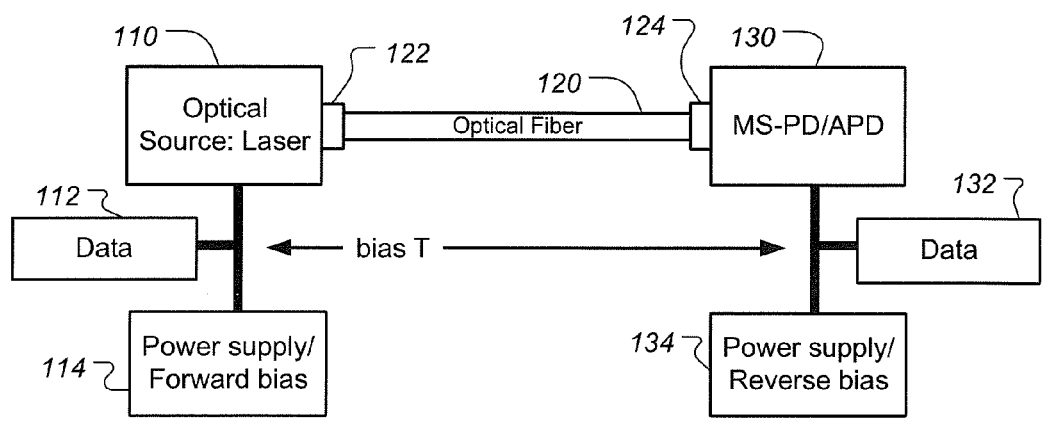
FIG. 1 is a diagram illustrating an optical data transmission system in which the microstructured photodiode/avalanche photodiode may be used, according to some embodiments.

A detailed description of examples of preferred embodiments is provided below. While several embodiments are described, it should be understood that the new subject matter described in this patent specification is not limited to any one embodiment or combination of embodiments described herein, but instead encompasses numerous alternatives, modifications, and equivalents. In addition, while numerous specific details are set forth in the following description in order to provide a thorough understanding, some embodiments can be practiced without some or all of these details. Moreover, for the purpose of clarity, certain technical material that is known in the related art has not been described in detail in order to avoid unnecessarily obscuring the new subject matter described herein. It should be clear that individual features of one or several of the specific embodiments described herein can be used in combination with features or other described embodiments. Further, like reference numbers and designations in the various drawings indicate like elements.

According to some embodiments, microstructures are used to improve bulk absorption constant or absorption of the material at wavelengths in the proximity of the semiconductor material's band gap. This allows for extending the operating optical wavelengths and/or operating spectrum of the photosensor. The enhanced bulk absorption constant (or coefficient) is called the effective absorption constant (or coefficient). The term "effective" is used since absorption constant or coefficient is an inherent material property. However, with resonance effects, coupled resonance effects, slow wave effects, plasmonic effects, field enhancement effects, scattering effects, near field and sub wavelength effects, linear and non-linear effects, the effective absorption constant or coefficient can be greater than the bulk or material absorption constant or coefficient. Since absorption is exponentially dependent on the product of the absorption coefficient and absorption length, by keeping the bulk absorption coefficient, the effective absorption length can be greater than the physical length of the "I" absorbing region of a PD/APD to achieve the same absorption which is proportional to quantum efficiency. As used herein, the following terms are used interchangeably: enhanced absorption constant, enhanced absorption coefficient; enhanced effective absorption constant; enhanced effective absorption coefficient; and effective absorption constant; and effective absorption coefficient, enhanced absorption length, effective absorption length, enhanced effective absorption length. Enhanced absorption or effective absorption can be due to either or both enhanced absorption coefficient and or enhanced absorption length.

According to some embodiments, enhanced absorption can also have drastic effects on path length. In one bulk absorption example, the path length for the photons to be absorbed to 1/e of its original amplitude is 100 micrometers (μm), whereas under enhanced absorption according to some embodiments described in this patent specification, the path length is 1 micrometer for the optical amplitude to decay to 1/e of its original amplitude. Equivalently, if path length is kept constant to one micrometer then the enhanced absorption coefficient is 100 times greater than the bulk absorption coefficient and or the enhanced effective absorption length is 100 times greater than the actual physical length.

This is seen by the relationship $A = A_0 e^{-\alpha L}$ where A is the decaying amplitude of the incident photon flux $A_0$ and $\alpha$ is the absorption coefficient and L the path length for absorption to take place. So, rather than have L be 100 times longer, an effective α can be defined such that it is 100 times greater than a non enhanced absorption coefficient such as the bulk absorption coefficient. The resonance/coupled resonance/scattering/near field effects of microstructures, for example, gives the equivalence of the path length that is 100 times longer where the resonant/scattering/near field microstructure is just one micron long. A more simplistic description of this is that the photons in the resonant/coupled resonance structures make 50 round trips before reaching the 1/e value of its original amplitude, so the equivalent linear length is 100 times the length of the coupled resonant structure. For simplicity, resonance/coupled resonance/linear and nonlinear field enhancement/scattering/near field effects will collectively be referred to herein as "resonant" which can include, resonant, coupled resonance, slow wave, scattering, near field, plasmonic, nonlinear and linear optical field effects.

As used herein the terms "microstructures" and "microstructured" refer to: pillars, voids, holes and mesas, of various shapes and sizes having at least one dimension in the micrometer scale, or submicrometer scale, and/or sub-wavelength scale and or wavelength scale.

According to some embodiments, the techniques for enhancing effective absorption can be applied to various materials including: silicon, germanium, III-V material such as InP, GaAs, GaN, InGaAs, and any combination of the III-V material family. As used herein, the term "material family" of a III-V material is defined as any material that is lattice matched or approximately lattice matched (within a few percent) to GaAs, InP, GaN, InSb semiconductors. For example, the InP material family can include InGaAs, InGaAsP, InAlAs, InAs. According to some embodiments, in the case of microstructures, regrowth such as selective area growth (SAG), epitaxial lateral over growth (ELOG), epitaxial growth (EG) with or without a thin buffer layer of Ge, InGaAs, or other III-V material in silicon microstructures can be carried out without the detrimental effects of lattice mismatch since the dimension of the footprint of the lattice mismatched material on silicon is small (approximately a few micrometers to sub-micrometers). This allows Ge and other III-V materials to be integrated with silicon without the use of a conventional buffer layer (such as amorphous Ge in the case of Ge on Si growth). The heterogeneous integration of materials can be homo or hetero structures, combination of crystalline and microcrystalline and amorphous semiconductor, conductor such as carbon, graphene, insulator, dielectrics, solid, gaseous, liquid such as glass or polymer that can be semiconducting. Ge and III-V materials can also be grown on Si with or without a buffer layer using SOG, ELOG, EG methods that can cover areas greater than micrometer scale to areas that cover wafer scale.

According to some embodiments, a low index material is used such as buried oxide (BOX), silicon on insulator (SOI), silicon on sapphire (SOS), low-density semiconductors such as amorphous semiconductor, nanowire semiconductors, voids and holes to lower the effective refractive index. Refractive index is an inherent property of a material. However, according to some embodiments, when structures such as voids, air gaps, and/or holes (which can be filled with low index material, and/or regrowth) have dimensions on the order of the optical wavelength, the optical electromagnetic field will see an average refractive index consisting of the material refractive index and the structures (which can be filled or partially filled by a low refractive index material). This average is referred to herein as the effective refractive index. According to some embodiments, a low index or low effective index material need not be used in the microstructures.

According to some embodiments, the techniques for enhancing effective absorption can be applied to various materials including: silicon, germanium, III-V material such as InP, GaAs, GaN, InGaAs, and any combination of the III-V material family.

Due to the microstructures, the capacitance can also be represented by an effective capacitance which is a parallel capacitance of (1) the dielectric constant of one semiconductor, and (2) the dielectric constant of another material, which can be a semiconductor, dielectric, gas, vacuum, partial vacuum, liquid such as glass or polymer (polyimide, mylar, or other organic compound). The effective capacitance of the device is the combination of the capacitance of the parallel capacitors, which can be two or more. An advantage of the use of microstructure, according to some embodiments, is that the effective capacitance can be significantly lower than the capacitance of a homogeneous material such as a semiconductor. The RC time (resistance capacitance) is one of the fundamental time that determine the bandwidth of a photodiode and avalanche photodiode. Lower capacitance allows a device to have a larger area while still maintaining suitably high data rate bandwidth, and/or increase the data rate bandwidth by reducing the thickness of the device to reduce the electron and or hole transit time which is also a fundamental time that determine the bandwidth of the PD/APD. Another fundamental time is the optical transit time.

According to some embodiments, the photosensor can be a photodiode (PD), avalanche photodiode (APD), photovoltaic (PV) or solar cell, or any optoelectronic device that converts photons to electrons. According to some embodiments, emitters such as lasers and light emitting diodes that convert electrons/holes to photons can also be implemented using microstructures.

According to some embodiments, the enhanced absorption allows the APD/PD to: (1) extend the sensitivity of the APD/PD to photons with energies (or wavelength) closer to the material band gap where the bulk absorption coefficient is weak, for example approximately 1000 1/cm or less with QE (quantum efficiency) greater than 30% or greater than 50% and data bandwidth greater than 3 Gb/s; (2) operate at a high data rate bandwidth (e.g. >10 Gb/s), due to shorter absorption length therefore shorter transit time; (3) increase quantum efficiency with enhanced absorption; (4) be manufactured of silicon which has superior multiplication properties with low excess noise for avalanche photodiode; (5) be compatible with Si Photonics and CMOS processes. According to some embodiments, the PD/APD can be integrated with an ASIC (application specific integrated circuit) such as signal processing, signal amplification, memory, cpu, electrical transmitter, optical waveguides, integrated optics, and other ICs for specific applications. This is advantageous for mass production using CMOS foundries. In addition the surface (or bottom) illuminated PD/APD integrated with or without electronics can be tested at wafer level probing and in addition can handle both single and multimode. The single optical and electronic chip by pass the need of ceramic multichip carriers and significantly reduce the cost of assembly and packaging. Silicon bench can also be used in conjunction for optical alignment to optical components such as lens, fibers, if needed.

According to some embodiments, silicon is used for avalanche gain. Silicon has lower excess noise for an avalanche photodiode. By integrating Ge with silicon, the absorption takes place in the Ge material and the electronic gain occurs in silicon. Depending on the optical wavelengths, for example shorter than 1100 nm, silicon may be used for both absorption and electronic gain with the use of microstructures.

According to some embodiments, the absorption of photons in semiconductors is enhanced with the use of microstructures. The microstructures can have effects such as resonance, coupled resonances, field enhancement, near field and sub wavelength effects, scattering, plasmonics, linear and non linear optical field, photonic crystal, absorption mode or lossy mode in high contrast grating at the near field regime, which are both linear and non linear effects that can effectively increase the effective absorption length resulting in a greater absorption of the photons for a given physical length and or the absorption coefficient can be enhanced to an effective coefficient.

According to some embodiments, microstructures used for absorption enhancement, due to length and/or coefficient enhancement, for silicon photodiodes and silicon avalanche photodiodes can result in silicon PD and APD with bandwidths in excess of 10 Gb/s (or equivalently 6.75 GHz approximately depending of the digital coding format) at photons with wavelengths of 850 nm approximately (which is the current datacom preferred wavelength) with quantum efficiencies of approximately 50% or more, in some cases QE of 70% or more.

Silicon optical detectors are very robust due to the maturity of the material and processing techniques, the surfaces can be easily passivated to eliminate dangling bonds that can cause surface states and carrier recombination centers, they have excellent carrier lifetimes due to low defects and high material purity, and for APD applications, the noise is low due to the small ionization ratio between holes and electrons (k factor, silicon have the lowest k factor than any III-V material) and such detectors are CMOS compatible for integration with electronics for signal processing and with Si photonics.

According to some embodiments, the photogenerated carriers are swept out with an external reverse bias in the absorbing "i" (some times referred to as "I") region of a P-I-N diode (PD) or P-I-P-I-N diode (APD) for high modulation bandwidth (greater than or equal to 10 Gb/s bandwidth) and high quantum efficiency and for APD for high current gain, with gain greater than 3 dB.

The microstructured photodiodes and avalanched photodiodes with bandwidths of greater than 1 Gb/s are used in communication. An optical signal has information impressed on the light using techniques such as: binary (intensity), phase/frequency shifting (coherent, heterodyne communication); polarization coding; multiple wavelength such as wavelength division multiplexing; and polarization multiplexing. The optical signal travels through air and or fiber, and impinges on the microstructure photodiode and/or avalanche photodiode where the information impressed on the optical light can be extracted into electrical signals. In some cases, another optical source or sources need to be mixed as in heterodyne or homodyne.

FIG. 1 is a diagram illustrating an optical data transmission system in which the microstructured photodiode/avalanche photodiode may be used, according to some embodiments. The optical data transmission system 100 consists of an optical source(s) 110, a transmission medium such as air and/or optical fiber(s) 120 and the microstructured photodiode(s)/avalanche photodiode(s) MS-PD/APD) 130. According to some embodiments, optical source 110 can be a laser. Electrical data 112 is impressed on the optical signal with a power supply 114 forward biasing the laser 110 for direct modulation. The output of the laser 110 can be coupled to an optical fiber 120 via a coupler 122 such as a ball lens. The optical signal propagates through the fiber 120 (or air) and can be coupled from the fiber 120 via a lens 124, for example, to the high speed microstructure photodiode/avalanched photodiode 130, where the optical signal is converted to electrical signal and the resulting data 132 (which matches data 112) is recovered. The microstructure photodiode/avalanche photodiode is reverse biased using power supply 134.

According to some embodiments, wavelength selective elements can be integrated with the microstructured photodiode and microstructured avalanche photodiode. In particular, arrays of microstructured photodiodes/avalanche photodiodes can be fabricated on a single chip that can include application specific integrated circuits comprising CMOS, bi-CMOS, bipolar devices and circuits, for example. A wavelength selective element, such as a bandpass filter, can be used for coarse wavelength division multiplexing (CWDM) where, for example, 810, 820, 830, 840, 850, 860, 870, 880 nm wavelengths each carrying 10-40 Gb/s of modulated data can have an aggregated data rate of 80-320 Gb/s within a single transmission medium.

Examples of wavelength selective elements include: high contrast subwavelength gratings; arrays of subwavelength holes in a metal film or dielectric film, and dielectric layers with alternating refractive indices as in Bragg reflectors. The wavelength selective element can be a bandpass filter that includes multiple high contrast gratings to form a resonance cavity. The element can also be a combination of gratings and other wavelength selective elements such as subwavelength hole arrays on metallic or semi-metallic films and/or Bragg mirrors.

In addition, the microstructure of the photodiode/avalanche photodiode can itself form a reflector such as a high contrast grating such that it can be both wavelength selective and absorption length enhancing. In particular, the photon absorption region of the photodiode/avalanche photodiode can be enhanced. According to some embodiments, an additional high contrast grating can be fabricated above the microstructured photodiode/avalanche photodiode to form a resonance optical cavity for wavelength selectivity. If one of the high contrast gratings can be electrically biased such that a voltage develops between the two wavelength-selective elements, the selected wavelength can be tuned, such as a tunable optical filter.

Figure 2:
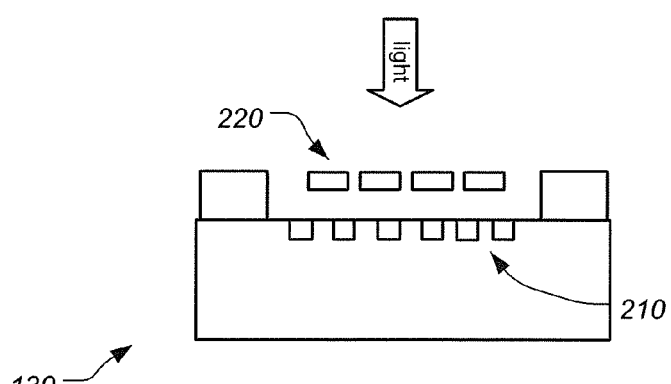
FIG. 2 is a diagram showing wavelength selective elements included with the microstructured photodiode (MS-PD) and microstructured avalanched photodiode (MS-APD), according to some embodiments.

FIG. 2 is a diagram showing wavelength selective elements included with the microstructured photodiode (MS-PD) and microstructured avalanched photodiode (MS-APD), according to some embodiments. Using wavelength selective elements 220, only wavelengths within the selected wavelength range impinge on the MS-PD/APD 130. According to some embodiments, the window can be 1-20 nm in width (e.g. a center wavelength of 820 nm+/−5 nm where the bandpass is 10 nm centered at 820 nm). Shown in the case of FIG. 2 is a high contrast grating 220 made of silicon that can be integrated with the silicon MS-PD/APD 130. According to some embodiments, the microstructure features 210 of the microstructured photodiode/avalanche photodiode 130 can also behave as a wavelength selector by itself, in addition to their function of enhancing the absorption properties of the photodiode and avalanche photodiode. If the microstructures 210 of the MS-PD/APD 130 are designed as a wavelength selector, than the addition of a high contrast grating 220 will create a resonance cavity that can function as a bandpass filter.

Figure 3:
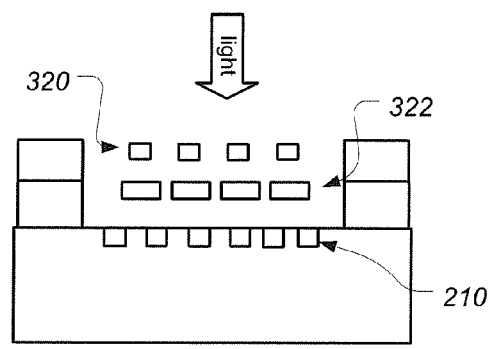
FIG. 3 is a diagram showing a MS-PD/APD having multiple wavelength selective elements, according to some embodiments.
Figure 4A:
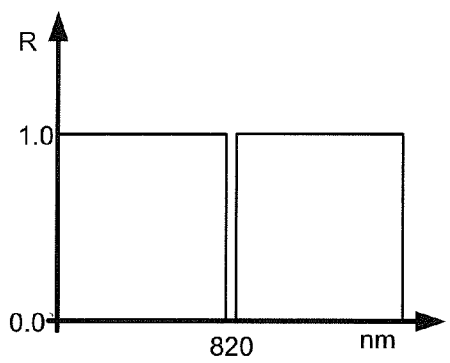
FIGS. 4A-D are plots showing various bandpass filter characteristics, according to some embodiments.
Figure 4B:
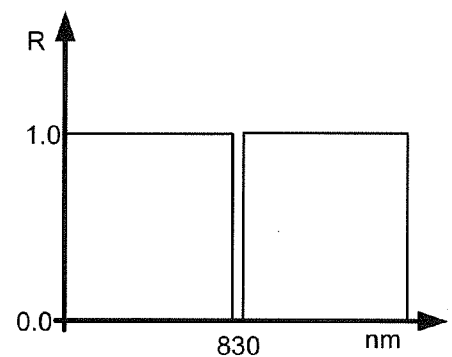
Figure 4C:
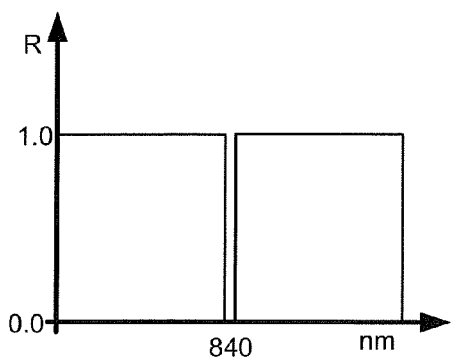
Figure 4D:
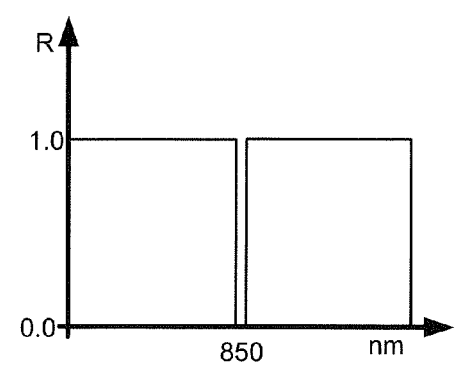

FIG. 3 is a diagram showing a MS-PD/APD having multiple wavelength selective elements, according to some embodiments. In this case, multiple wavelength selective elements 320 and 322 are fabricated and integrated into MS-PD/APD 130. Wavelength selective elements 320 and 322 can be a dual high contrast grating that function as a bandpass filter. According to some embodiments, if a voltage is applied to one wavelength selective element with respect to the other, a tunable bandpass filter can be fabricated.

FIGS. 4A-D are plots showing various bandpass filter characteristics, according to some embodiments. The plots in FIGS. 4A, 4B, 4C and 4D have center wavelengths at 820, 830, 840 and 850 nm, respectively where "R" is the reflectivity. At the center wavelength with a bandwidth of 10 nm for example, the reflectivity is practically nil and most of the light is transmitted, while outside the bandwidth, the reflectivity is almost 100% and transmission is practically nil.

Figure 5:
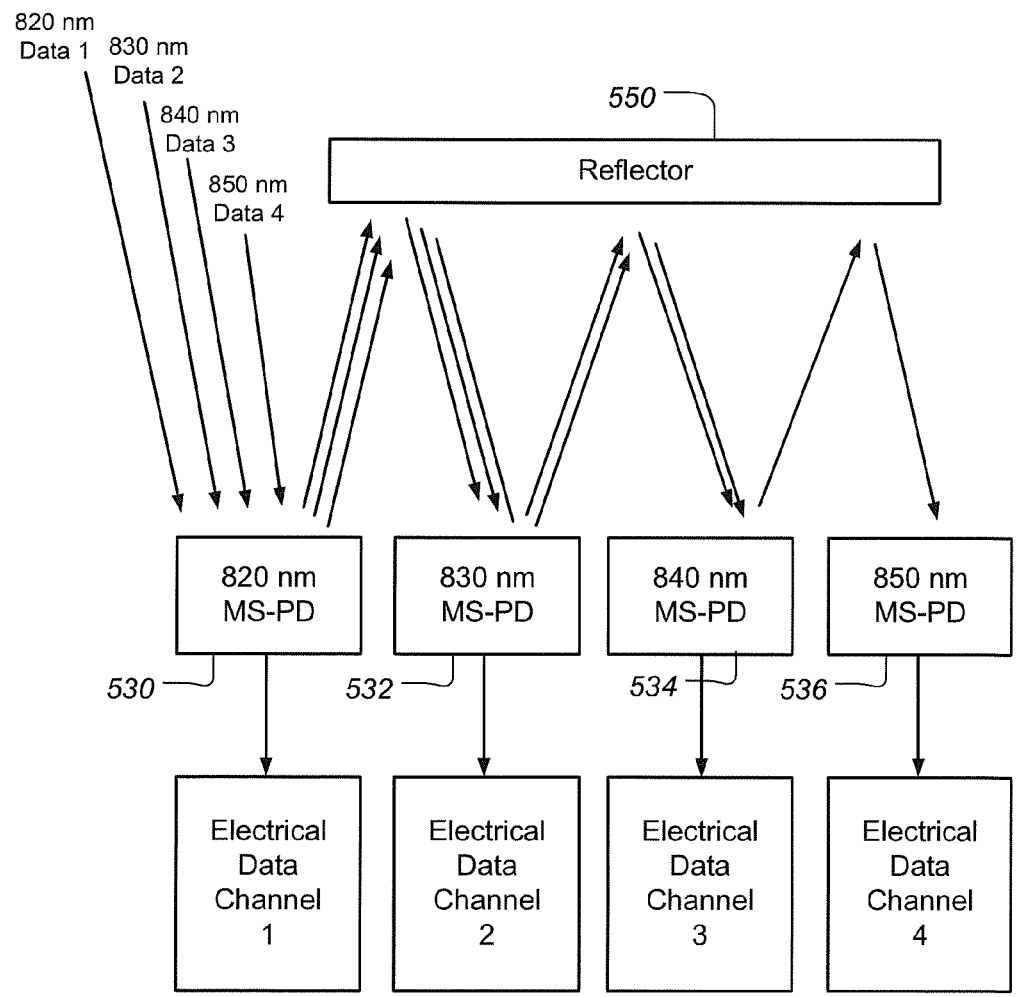
FIG. 5 is a diagram showing a coarse wavelength division multiplexing (CWDM) configuration, according to some embodiments.

FIG. 5 is a diagram showing a coarse wavelength division multiplexing (CWDM) configuration, according to some embodiments. In this case, four wavelengths propagate within a transmission medium, such as a multimode optical fiber with center wavelengths of 820, 830, 840 and 850 nm each with a modulated data rate of 25 Gb/s for an aggregated data rate of 100 Gb/s. The optical bands are separated by the bandpass filter on the MS-PD/APDs 530, 532, 534 and 536 by reflecting off each wavelength selective MS-PD/APD. After each reflection, the light is reflected to the next wavelength selective MS-PD/APD via reflector 550 and so on, until all the optical bands are absorbed by the designated MS-PD/APD. Each center wavelength carries a data channel, for example 820 nm carries data channel 1 at a data rate of 25 Gb/s and the MS-PD 530 with bandpass filter at 820 nm separates the 820 nm signal from the rest of the optical signals and generates restored Data Channel 1 for further signal processing by an integrated CMOS ASIC (not shown).

According to some embodiments, the MS-PD/APD epitaxial layer thickness is compatible with the epitaxial layer thickness and structure of CMOS (Complementary metal-oxide-semiconductor) processes and therefore can be integrated with a CMOS ASIC. In contrast, a conventional silicon photodiode at 850 nm with a data rate of 1.25 Gb/s has an epitaxial layer greater than 10 m thickness and a 53% quantum efficiency. Thus the relatively thick layers of conventional silicon photodiodes are not easily compatible with CMOS processing.

According to some embodiments, the light absorbing layer can be non crystalline. In particular, it can be hydrogenated amorphous Si (a-Si:H) deposited, for example, by plasma enhanced chemical vapor deposition (PECVD) and/or hot wire chemical vapor deposition (HWCVD). The layer typically is the order of 0.3-3 µm thickness. A voltage is applied across the light absorbing region (or i region of a pin photodiode structure) in reverse bias to sweep out the photogenerated carriers to enable high efficiency and high bandwidth for high speed data communication applications. The layer on top of the non crystalline layer can be a transparent or semitransparent conducting metal or conducting oxide such as indium tin oxide. The top layer can be a thin layer of doped non crystalline material to form a pin structure.

Figure 6B:
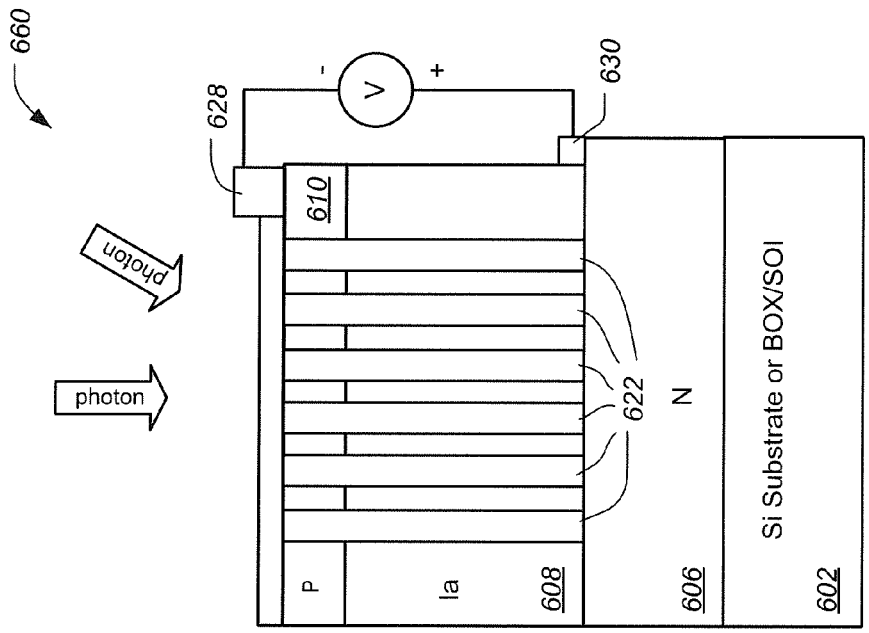
FIGS. 6A and 6B are diagrams showing some basic parts of a microstructured photodiode, according to some embodiments.
Figure 6A:
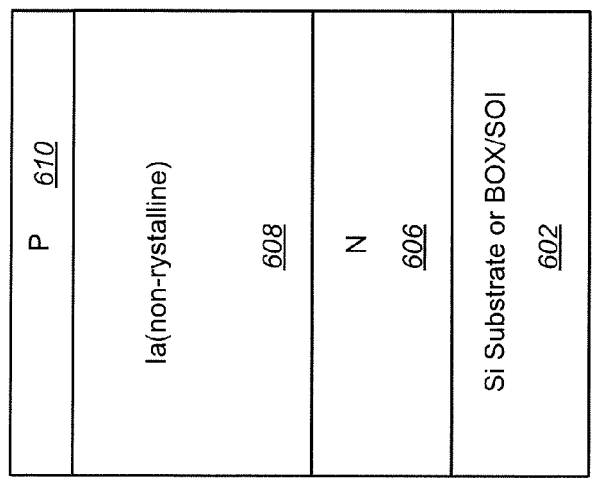

FIGS. 6A and 6B are diagrams showing some basic parts of a microstructured photodiode, according to some embodiments. FIG. 6A shows material structure 600 prior to etching a microstructure and FIG. 6B shows the MS-PD 660 after etching. Note that according to some embodiments the microstructures are holes 622, and in some other embodiments the microstructures are pillars. In some other embodiments the microstructures are a combination of holes and pillars. The "Ia" layer 608 can be non-crystalline (e.g. hydrogenated amorphous Si (a-Si:H)) grown on crystalline or non-crystalline N layer. The P layer 610 can be non-crystalline and highly doped P or a conductive oxide or metal. The N layer 606 can also be a metal or conductive oxide. A bias is applied between the P and N layers using ohmic contacts 628 and 630 to create a high field in the I layer 608 that sweeps out the photogenerated carriers. The substrate 602 can be non-crystalline and/or dielectric such as quartz, glass, ceramic and/or conductor such as metal, silicide, conductive polymer for example. According to some embodiments, the "Ia" also known as "i" layer 608 can have a thickness range of 0.3 to 3 micrometers.

Figure 7B:
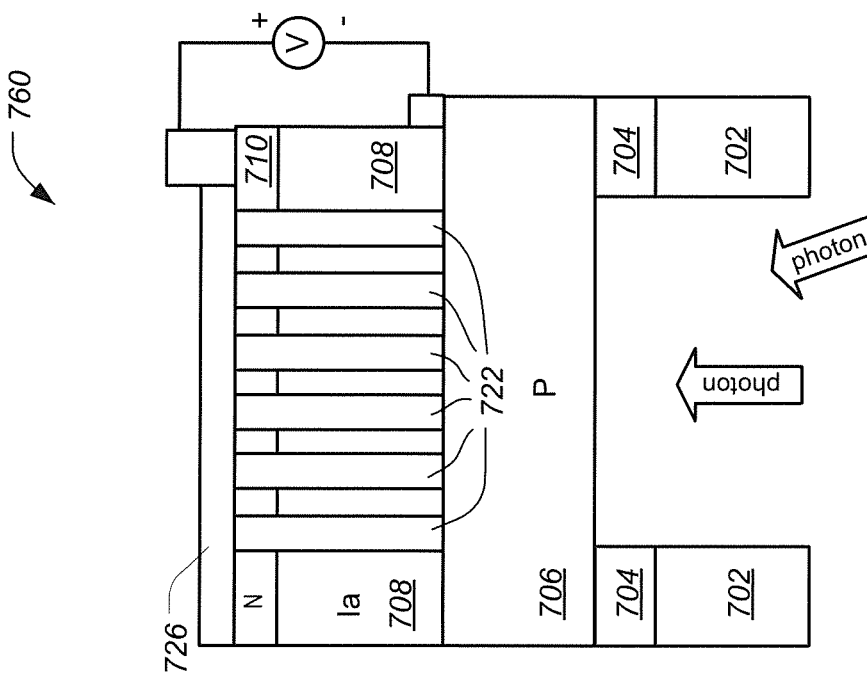
FIGS. 7A and 7B are diagrams showing some basic parts of a bottom illuminated photodiode, according to some embodiments.
Figure 7A:
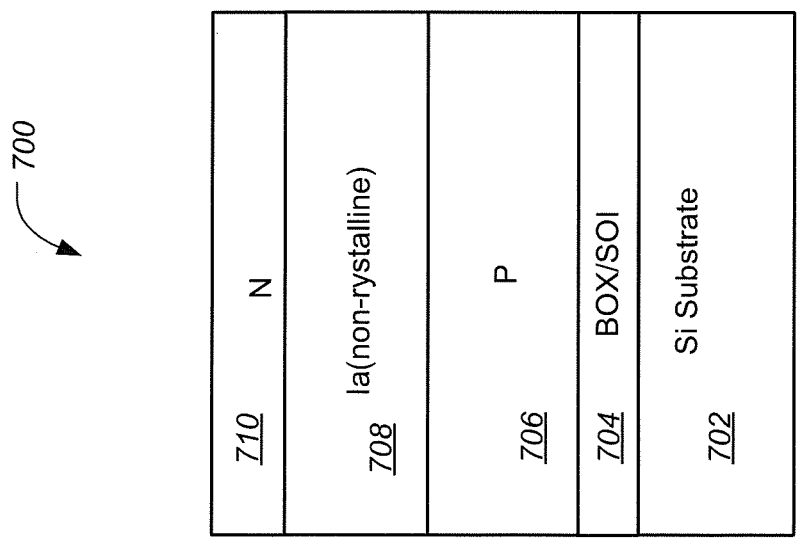

FIGS. 7A and 7B are diagrams showing some basic parts of a bottom illuminated photodiode, according to some embodiments. FIG. 7A shows material structure 700 prior to etching microstructure and FIG. 7B shows bottom illuminated MS-PD 760 after etching microstructures (such as holes 722). For a bottom illuminated PD/APD, the "Ia" or "I" region 708 can be non-crystalline such as a-Si:H and the "N" layer 710 can also be non-crystalline whereas the "P"

layer 706 can either be crystalline or non-crystalline on BOX/SOI 704 and crystalline or non-crystalline substrate 702. However to minimize optical losses, it is desirable that the substrate 702 and the P layer 706 are crystalline since it is less absorbing than amorphous silicon at wavelengths from 800 to 1100 nm range. For a "double or multiple bounce" PD/APD the absorption region "Ia" layer 708 can have a thickness range of 0.2 to 2 micrometers since the optical signal will reflect off the N metal contact 726 and back into the "Ia" absorbing layer 708. The "Ia" layer 708 thickness can be reduced and therefore reduce the transit time and increase the bandwidth of the photodiode or avalanche photodiode.

Figure 8B:
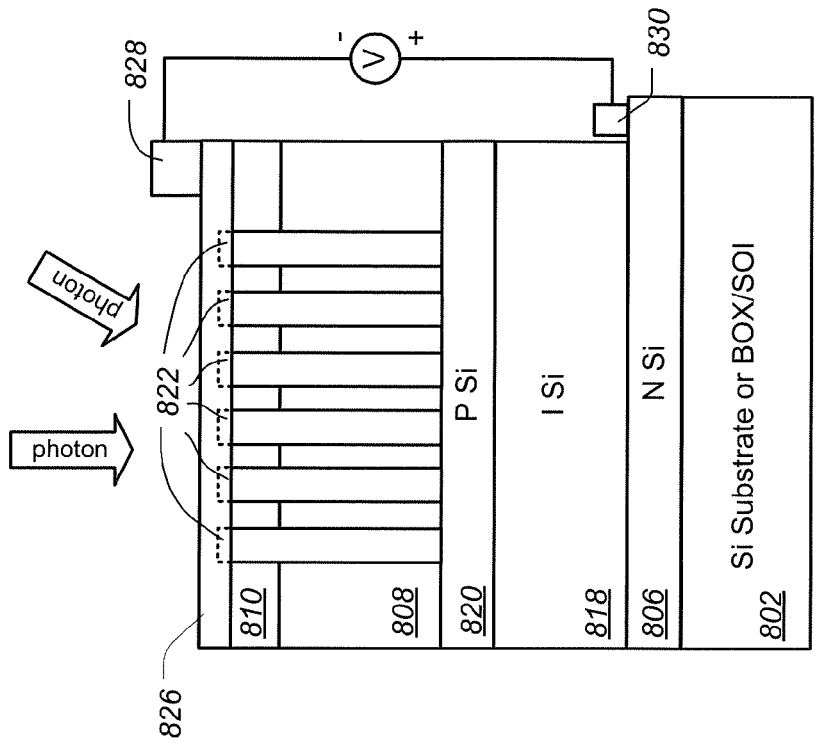
FIGS. 8A and 8B are diagrams showing some basic parts of an MS-APD structure, according to some embodiments.
Figure 8A:
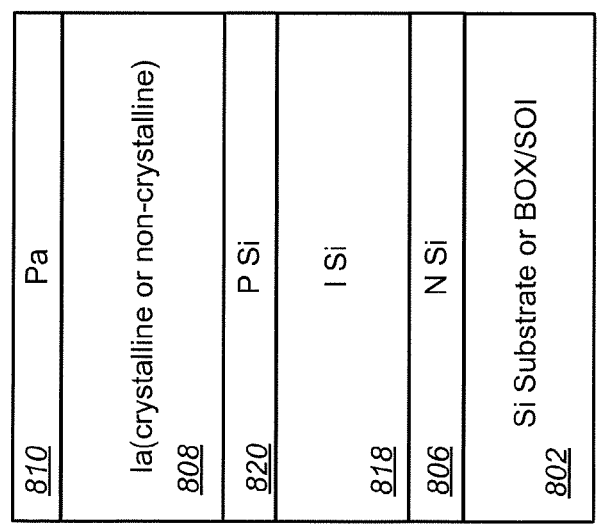

FIGS. 8A and 8B are diagrams showing some basic parts of an MS-APD structure, according to some embodiments. FIG. 8A shows material structure 800 prior to etching a microstructure and FIG. 8B shows MS-APD 860 after etching. The "Ia" region 808 for light absorption can be crystalline or non-crystalline such as a-Si:H. A crystalline avalanche gain region of PIN silicon (820, 818 and 806) is grown on silicon substrate or a BOX/SOI (buried oxide/silicon on insulator) substrate 802. The Pa top layer 810 can be crystalline or non-crystalline. A transparent metal oxide layer 826 can be provided to form an ohmic contact with P Si layer 810 and or to reduce the sheet resistance. Note that the optical signal can come straight on (perpendicular) to the upper surface or it can come from an angle, as shown by the photon arrows. The microstructures 822 can be holes, pillars or a combination of the two. Shown in FIG. 8B is a top illuminated APD 860, however according to some embodiments, using BOX/SOI the bulk of the substrate can be removed and the APD can be illuminated from the bottom at wavelength ranges of 800-1100 nm. A reverse bias is applied between P ohmic and bond metal 828 through the P layer 810 and N ohmic and bond metal 830 through N substrate 806. The reverse bias both sweeps out the photogenerated carriers and provides electronic gain. Typical bias voltages for PD are 1 to 10 volts reverse bias and for APD the range is 5 to 50 volts reverse bias approximately. As in all PIN, PIPIN devices described herein, the P and N can be interchanged for example PIN can be NIP and PIPIN can be NINIP for photodiodes and avalanche photodiodes. The anode or p layer is biased negatively with respect to the cathode N layer.

FIGS. 9A and 9B are diagrams showing aspects of a selective area growth (SAG) APD structure before and after SAG of III-V or Ge material, according to some embodiments. FIG. 9A shows a Si APD structure with etched holes 922 (or the area around pillars). Selective area growth (SAG) epitaxial growth of III-V material or Ge can be performed, as shown in FIG. 9B where Pa layer 910 and Ia layer 908 can be non-crystalline such as a-Si:H or it can be crystalline silicon. In particular, the I area 934 of the microstructures can be InGaAs or Ge, and the P area 932 can be InGaAs. According to some embodiments, starting with a PD structure, with the avalanche gain layers (P layer 920 and I layer 918) removed, a SAG PD with InGaAs or Ge can be fabricated. Other materials may also be used in SAG such as GaN, ZnSe, InP, GaAs. According to some embodiments, other amorphous semiconductors may also be used such as amorphous Ge. According to some embodiments, amorphous silicon can be used due to its higher absorption coefficient than crystalline silicon of photons with energies above the indirect bandgap.

Figure 10:
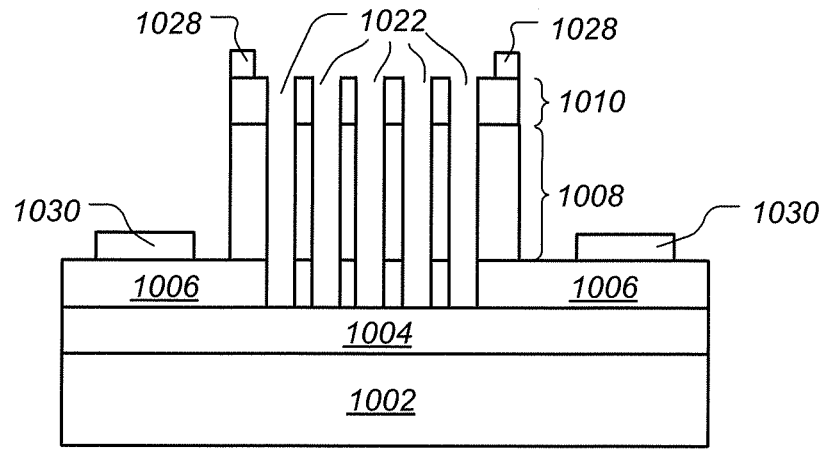
FIG. 10 is a diagram showing a simplified microstructured silicon photodiode with PIN epitaxial layers, according to some embodiments.

FIG. 10 is a diagram showing a simplified microstructured silicon photodiode with PIN epitaxial layers, according to some embodiments. Holes 1022 are etched to the buried oxide layer (BOX) 1004 which can be 0.2 to 10 micrometers thick. This structure 1060 offers a high contrast in refractive index between the silicon and the silicon dioxide that can result in absorption enhancement. The I layer 1008 can be in the range of 0.5 to 5 micrometers in thickness and the P layer 1010 and N layer 1006 can be in the range of 0.1 to 5 micrometers in thickness. The enhance absorption can be greater than 50% in the wavelength region of 800 to 900 nm or more. The enhanced absorption can be optimized for certain wavelength ranges of the optical signal, which is generated by directly modulating a laser such as a vertical cavity surface emitting laser or indirectly modulation where an optical modulator modulate the laser light. The modulated laser light at Gb/s rate is the optical signal. The optical signal impinges onto the microstructured photodiode 1060 either at normal incidence or at an angle to normal incidence. Reverse bias is applied between the P ohmic contact, anode 1028 and N ohmic contact cathode 1030 for high speed operation of the microstructured photodiode 1060. Not shown is a passivation layer on the silicon surfaces of 10 to 100 nm thickness for example grown by wet (steam) or dry oxidation of Si, atomic layer deposition of silicon dioxide, chemical vapor deposition, in order to reduce dangling bonds that results in surface recombination.

Figure 11:
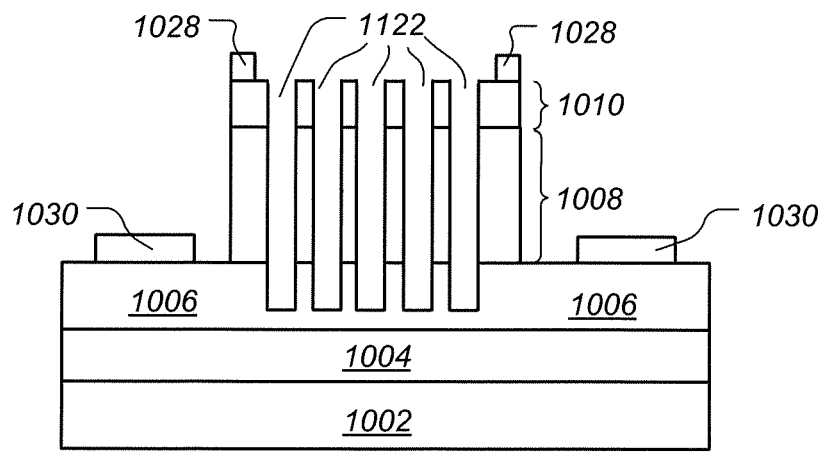
FIG. 11 is a diagram showing a simplified microstructured silicon photodiode with PIN epitaxial layers, according to some embodiments.

FIG. 11 is a diagram showing a simplified microstructured silicon photodiode with PIN epitaxial layers, according to some embodiments. MS-PD 1160 is identical to MS-PD 1060 except that the microstructured holes 1122 are not etched fully through to the BOX layer 1004. According to some embodiments, 0.01 to 2 micrometers of N layer 1006 can be left.

Figure 12B:
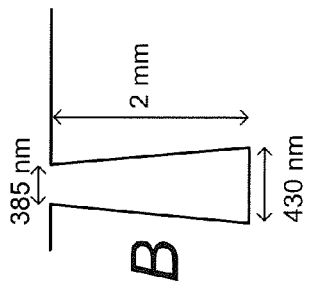
FIGS. 12A-C show aspects of a simulation of a particular microstructured hole pattern, according to some embodiments.
Figure 12A:
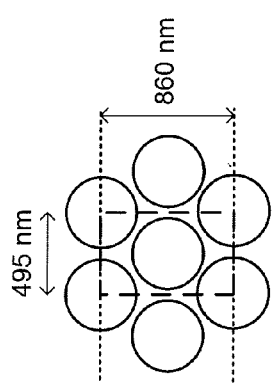
Figure 12C:
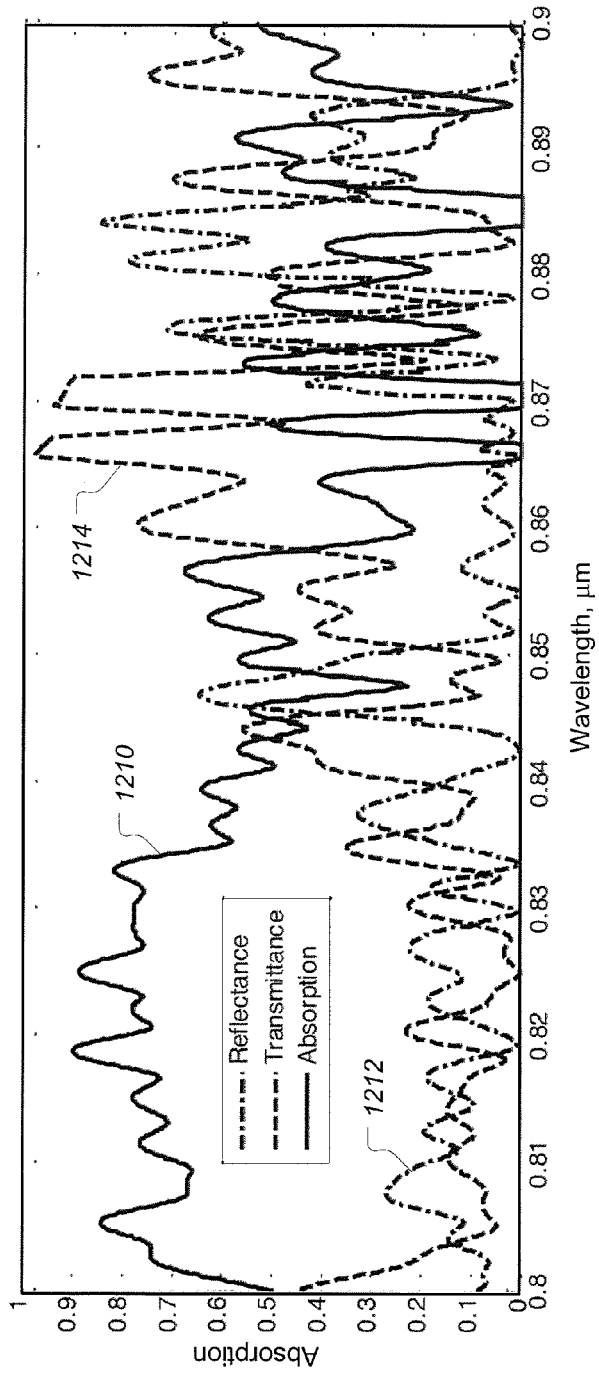

FIGS. 12A-C show aspects of a simulation using finite difference time domain (FDTD) of Maxwell propagation equations method of a particular microstructured hole pattern, according to some embodiments. FIG. 12A shows a hexagonal hole pattern with center to center spacing of the holes of 495 nm in the x direction and 860 nm in the y direction. As shown in FIG. 12B, the holes are completely etched through to a depth of 2 micrometers with hole diameter of 385 nm on top and 430 nm on bottom. FIG. 12C is a plot showing results of the simulation that used a finite difference time domain technique. Curves 1210, 1212 and 1214 show absorption, reflectance and transmittance, respectively. It can be seen that with a thickness of 2 micrometers of silicon, more than 60 percent of the light with wavelength range from 805 to 830 nm can be absorbed in this particular example. By varying the hole diameter, spacing and depth of etch, the absorption can be optimized for particular wavelengths of the optical signal. According to some embodiments, hole diameters can be varied from 200 to 1800 nm, spacing can vary from 200 to 3500 nm, and depths can vary from 0.1 to 20 micrometers.

Figure 13:
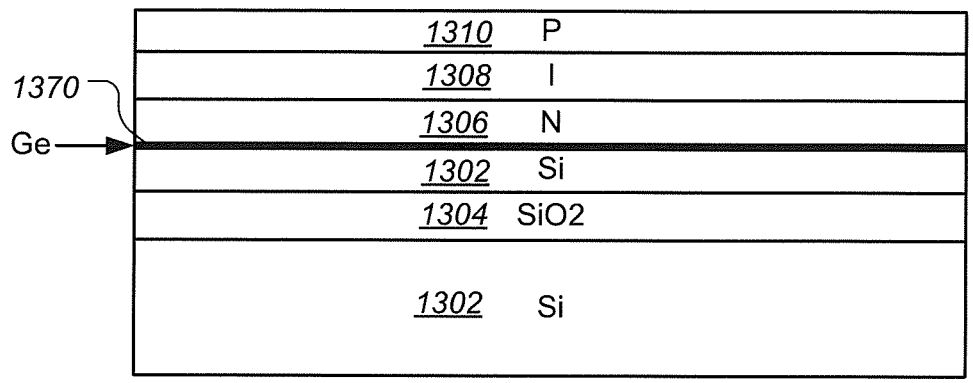
FIG. 13 is a diagram showing an epitaxial layer structure for a high contrast microstructured photodiode (PD) with a P-I-N doping, according to some embodiments.

FIG. 13 is a diagram showing an epitaxial layer structure for a high contrast microstructured photodiode (PD) with a P-I-N doping, according to some embodiments. Starting with a BOX (buried oxide) 1304 in Si 1302 where the oxide layer thickness range from 0.1 to 10 microns or more, a thin Ge buffer layer 1370 can be grown on top of the N Si 1302. With or without the Ge buffer layer 1370, subsequent N, I, P layers 1306, 1308 and 1310 can be Ge and/or III-V material family such as InGaAs, InP, InGaAsP, GaAs, AlGaAs, GaN, InGaN, AlGaN. If the N, I, P layers 1306, 1308 and 1310 are Si, then the Ge buffer layer 1370 may be omitted. For high speed operation of the PD, the N layer 1306 can range from 0.1 to 5 microns, the I layer 1308 can range in thickness from 0.2 to 3 microns, and the P layer 1310 can range from 0.1 to 2 microns. The final layer, in this example, the P layer 1310 can be a combination of layers, such as a P layer with InP with a capping of a thin InGaAs.

Figure 14:
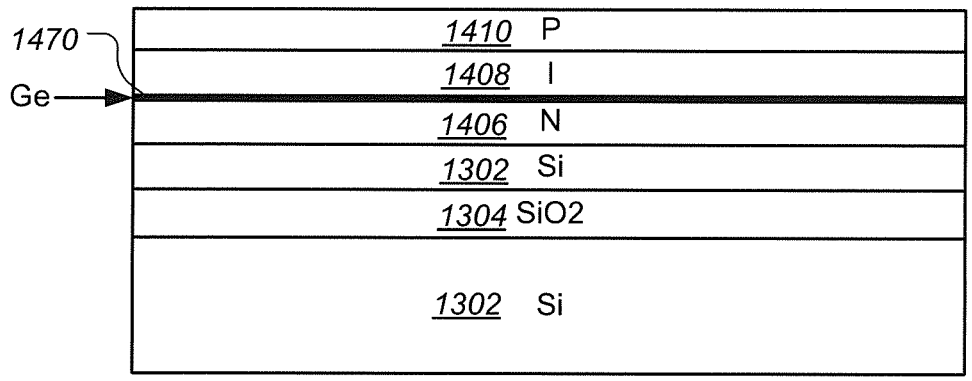
FIG. 14 is a diagram showing an epitaxial layer structure for a high contrast microstructured photodiode (PD) with a P-I-N doping, according to some embodiments.

FIG. 14 is a diagram showing an epitaxial layer structure for a high contrast microstructured photodiode (PD) with a P-I-N doping, according to some embodiments. The PIN heterogeneous structure is similar to that of FIG. 13 except that Ge buffer layer 1470 can be at the interface of I layer 1408 and N layer 1406, or thereabout, where I layer 1408 and P layer 1410 can be Ge and/or III-V material family. The advantage of this structure example is that for photon energies less than the bandgap of Si, less electron hole pairs are generated in the N layer 1406 where the photogenerated carriers can diffuse to the high field region in the I layer 1408, resulting in a slow component in the high speed response of the PD. The Ge buffer layer may also not be necessary for the heterogeneous growth.

Figure 15:
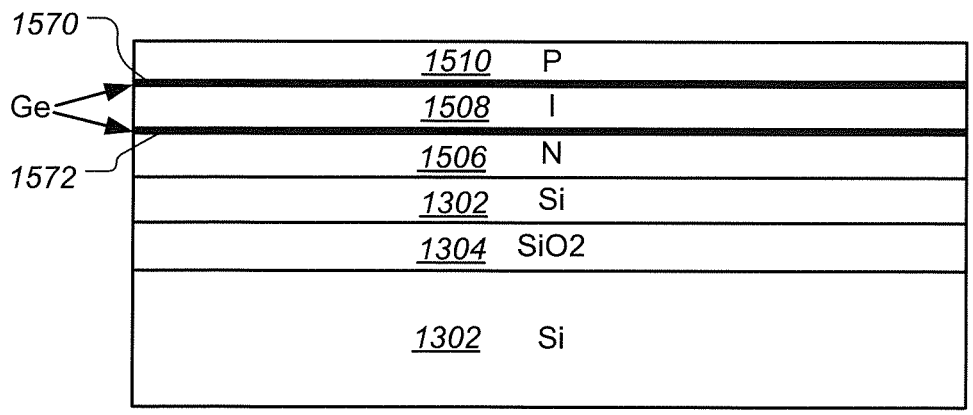
FIG. 15 is a diagram showing an epitaxial layer structure for a high contrast microstructured photodiode (PD) with a P-I-N doping, according to some embodiments.

FIG. 15 is a diagram showing an epitaxial layer structure for a high contrast microstructured photodiode (PD) with a P-I-N doping, according to some embodiments. The PIN heterogeneous structure is similar to that of FIGS. 13 and 14 except that only the I region 1508 is a lower bandgap material, such as Ge and/or III-V material family such as InGaAs, InSb, InGaAsP, InAs. Both the P layer 1510 and N layer 1506 are made of a higher bandgap material. According to some embodiments, the P layer 1510 and N layer 1506 have bandgap energies higher than the photon energy and the I layer 1508 has a bandgap energy that is lower or equal to the photon energy. For example, the N layer 1506 can be Si, the I layer 1508 can be InGaAs and/or Ge, and the P layer 1510 can be Si and/or InP. The Ge buffer layer may or may not be necessary for the heterogenous growth. The advantage of having higher bandgap material in the P and N region is to minimize photocarriers generated in those regions. Photocarriers generated in the P and N regions can diffuse to the high field region, resulting in a relatively slow component in the response of the photodiode to short optical pulses. Reducing the photocarriers generated in the P and N regions thus reduce the "tail effect"—the fall time of the electrical pulse output of the PD in response to an optical input pulse or set of pulses as in a bit stream for transmitting data optically. High doping of the P and N region also reduces the minority carrier lifetime such that photocarriers generated in these regions can recombine before diffusing to the high field "I" region.

Figure 16:
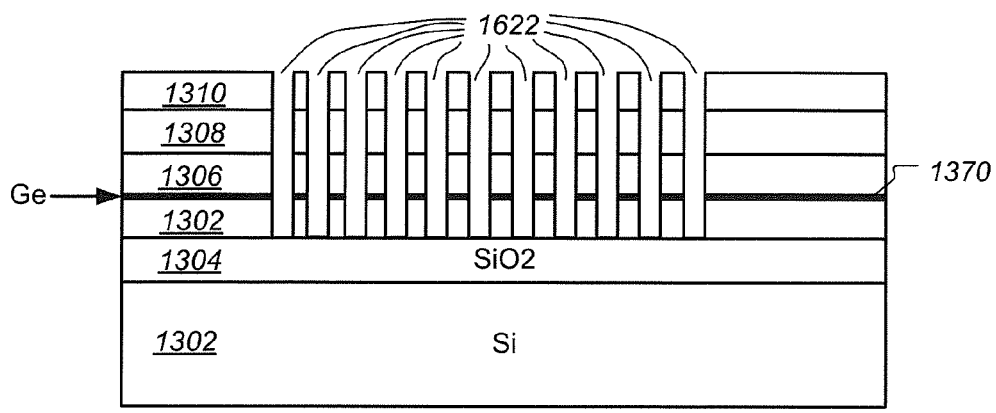
FIG. 16 is a diagram showing some aspects of fabrication of a high contrast microstructured photodiode (PD), according to some embodiments.

FIG. 16 is a diagram showing some aspects of fabrication of a high contrast microstructured photodiode (PD), according to some embodiments. The example structure depicted in FIG. 13 is shown with holes 1622 etched through the PIN layers 1310, 1308 and 1306 all the way to the oxide layer 1304 buried in silicon layer 1302. Dry and/or wet etch can be used, a passivation layer can be added to the exposed surfaces by atomic layer deposition. In this example, the Ge buffer layer 1370 is at the interface of N layer 1306 and Si layer 1302. According to some embodiments, similar fabrication methods are used for the structures shown in FIGS. 14 and 15.

Figure 17A:
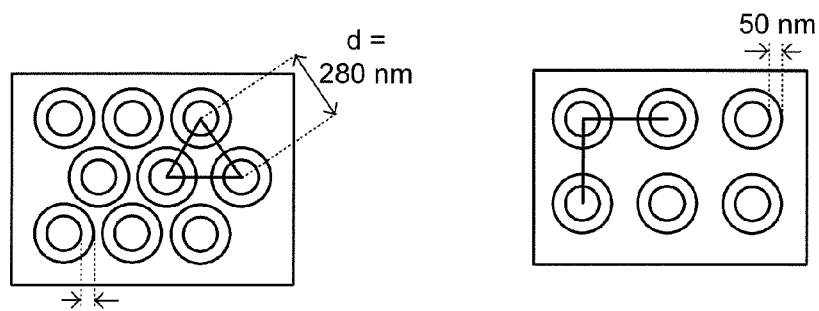
FIGS. 17A-D are diagrams showing examples of the hole arrangements, spacing, size, and passivation layers, according to some embodiments.
Figure 17C:
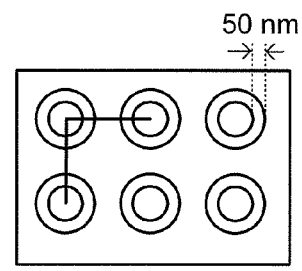
Figure 17B:
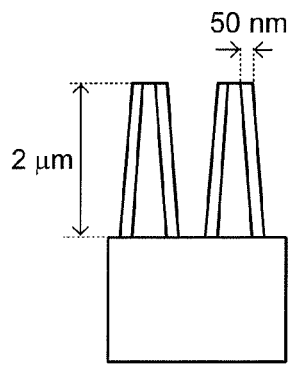
Figure 17D:
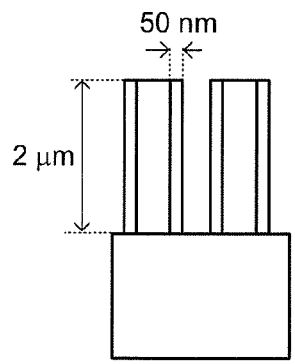

FIGS. 17A-D are diagrams showing examples of the hole arrangements, spacing, size, and passivation layers, according to some embodiments. FIG. 17A shows a hexagonal layout with a spacing of 280 nm and a passivation layer thickness of 50 nm. FIG. 17B shows a square layout. FIGS. 17C and 17D show tapered and vertical hole profiles, respectively. The examples shown are for Silicon, but with small modification of the dimensions, the techniques are also applicable to Ge and the III-V material family. The hole can have circular cross sections or according to some embodiments, other shapes such as oval, rectangular, for example can be implemented.

Figure 18:
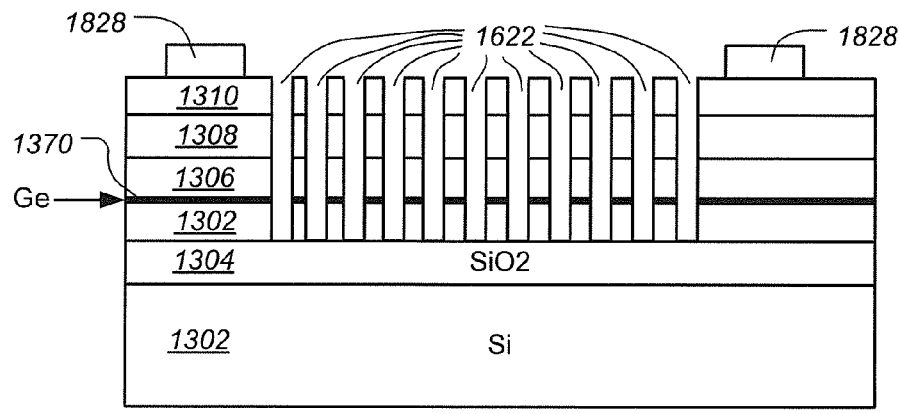
FIG. 18 is a diagram showing some further aspects of fabrication of a high contrast microstructured photodiode (PD), according to some embodiments.

FIG. 18 is a diagram showing some further aspects of fabrication of a high contrast microstructured photodiode (PD), according to some embodiments. The example structure depicted in FIGS. 13 and 16 is shown after the microstructured holes 1622 are etched, and the P ohmic contact layer 1828 is deposited and annealed.

Figure 19:
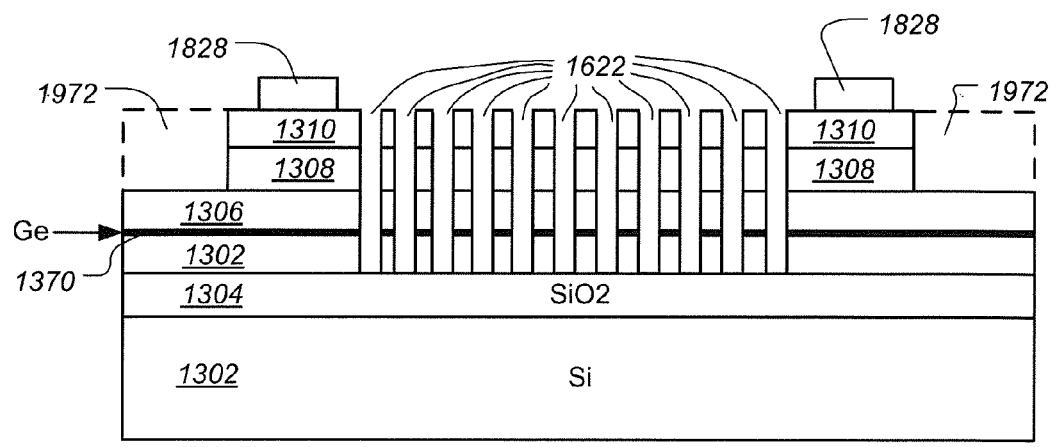
FIG. 19 is a diagram showing some further aspects of fabrication of a high contrast microstructured photodiode (PD), according to some embodiments.

FIG. 19 is a diagram showing some further aspects of fabrication of a high contrast microstructured photodiode (PD), according to some embodiments. The example structure depicted in FIGS. 13, 16 and 18 is shown. After P ohmic metal 1828 is deposited and annealed, a mesa can be etched, removing material 1972, to define the capacitance of the PD. The diameter of the mesa can range from 5 microns to over 100 microns depending on the RC time that is desired for the PD. Passivation of the exposed P, I and N regions is performed to minimize leakage current due to dangling bonds for example. According to some embodiments, ion implantation such as proton bombardment can also be used in place of mesa etching to define the capacitance of the PIN structure by generating an electrically semi-insulating or insulating region.

Figure 20:
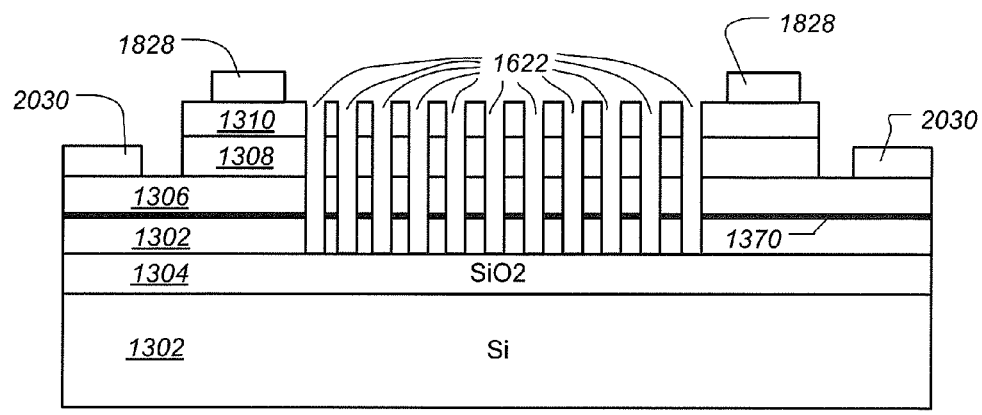
FIG. 20 is a diagram showing some further aspects of fabrication of a high contrast microstructured photodiode (PD), according to some embodiments.

FIG. 20 is a diagram showing some further aspects of fabrication of a high contrast microstructured photodiode (PD), according to some embodiments. The example structures depicted in FIGS. 13, 16, 18 and 19 are shown. After the mesa etch, a ring or partial ring-shaped N ohmic contact 2030 is formed on the N layer 1306. Additional processing steps to complete the PD are not shown, such as forming an insulating layer from a material such as polyimide so that a bridging path is formed for connecting metallization from the P ohmic contact 1828 to a bond pad (also not shown) for applying an electrical bias to the P region 1310. Also, connecting metal between the N ohmic contact 2030 and an N bond pad is not shown for simplicity. A reverse electrical bias is applied to the P and N ohmic contacts 1828 and 2030 to create a high field in the I layer 1308. According to some embodiments, voltages of negative 1 to negative 10 volts can be applied.

Figure 21:
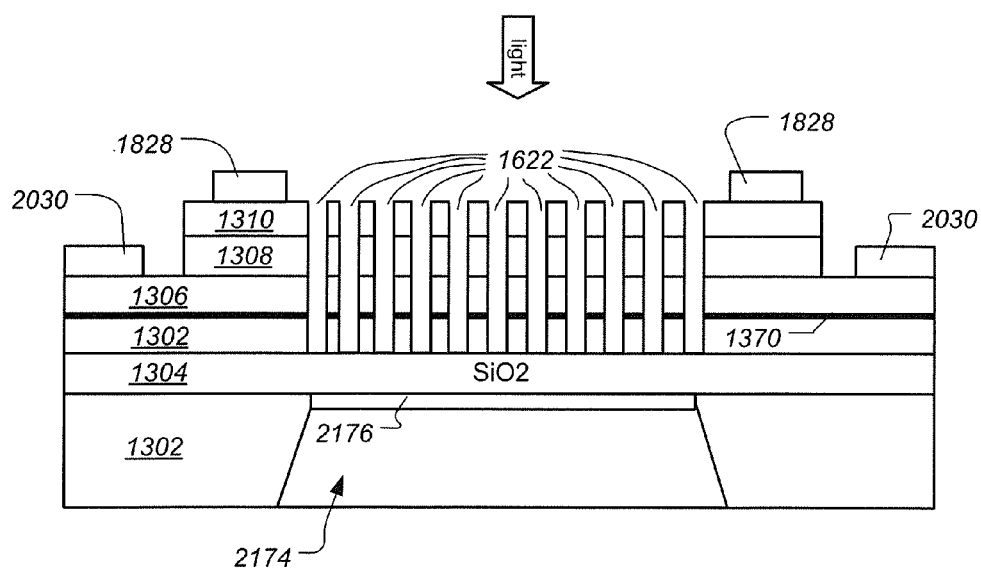
FIG. 21 is a diagram showing some aspects a high contrast microstructured photodiode (PD), according to some other embodiments.

FIG. 21 is a diagram showing some aspects of a lossy high contrast microstructured photodiode (PD), according to some embodiments. FIG. 21 shows a microstructured PD with the light transiting twice in the absorbing layer 1308. This is achieved by removing a portion 2174 of the Si substrate 1302 to the oxide layer 1304 and coating the oxide with a metallic reflector 2176, such as Au, Ag, Al, or Cu. According to some embodiments, a Bragg reflector can be configured for either broadband or wavelength selectivity. According to some embodiments, a Bragg layer can also be included on the upper surface of P layer 1310 to further provide wavelength selectivity especially for use in coarse wavelength division multiplexing, or wavelength division multiplexing.

Figure 22A:
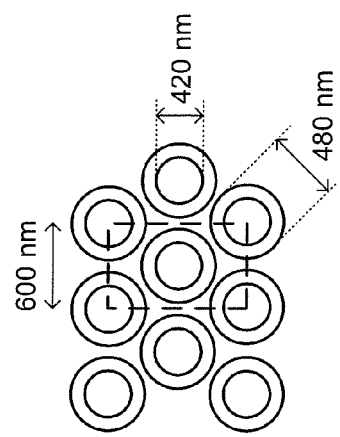
FIGS. 22A-B show aspects of a simulation of a particular microstructured PD, according to some embodiments.
Figure 22B:
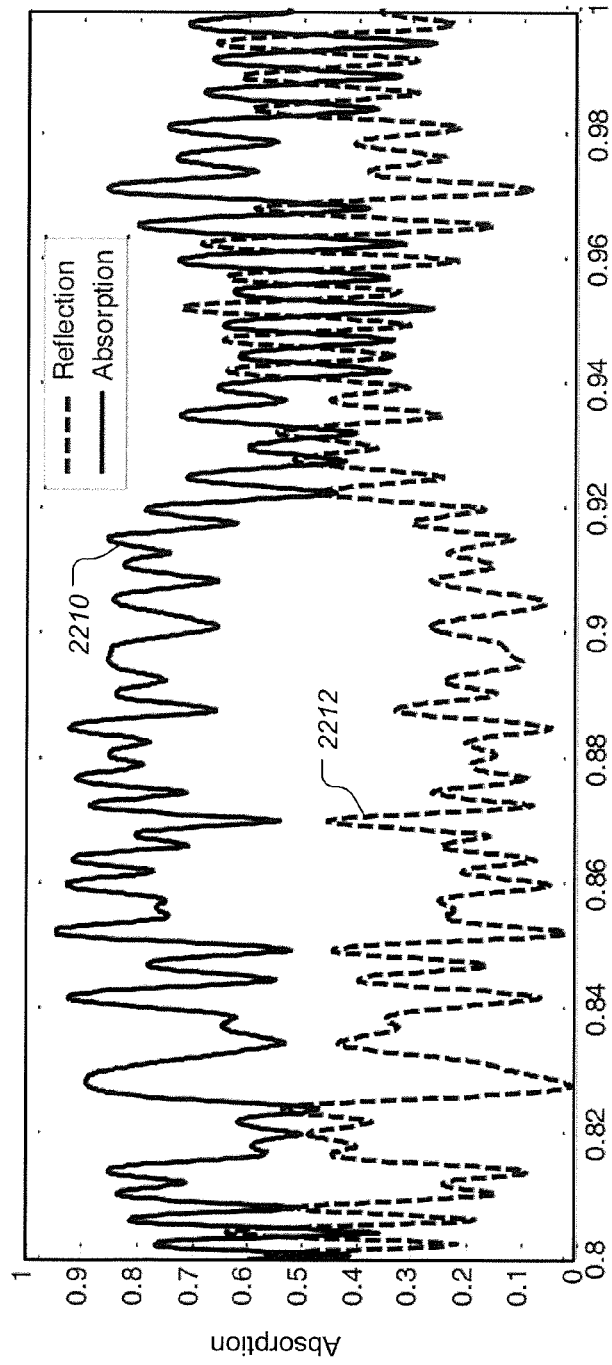

FIGS. 22A and 22B show aspects of a simulation using FDTD method of a particular microstructured PD, according to some embodiments. FIG. 22B is a plot showing results of a simulation of the absorption of the photons versus wavelength of the photons for a double bounce structure as depicted in FIG. 21. The following example thicknesses were used in the simulation: oxide 1304 is 2 microns; P silicon 1310 is 300 nm, I Si 1308 is 2 microns, and N silicon 1302 is 300 nm, the reflector 2176 is Au of 100 nm thickness. A hexagonal microstructured hole is assumed as shown in FIG. 22A. The holes are 600 nm center-to-center hexagonal period, 480 nm hole diameter and 30 nm of $SiO_2$ passivation as shown in FIG. 22A. These dimensions are just one example for the microstructured holes with the corresponding simulation of its absorption characteristics versus wavelength. The absorption was found to be significantly higher than in the case of Si without microstructured holes, as can be seen from curves 2210 (absorption) and 2212 (reflection) of FIG. 22B. In the vicinity of 850 nm wavelength the absorption is better than 70% for example.

Figure 23:
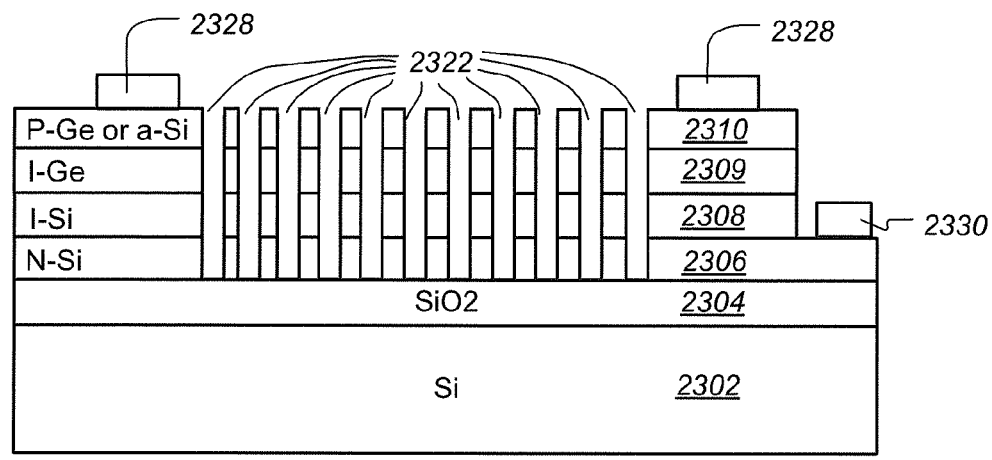
FIG. 23 is a diagram showing aspects of a high contrast microstructured PD, according to some embodiments.

FIG. 23 is a diagram showing aspects of a high contrast microstructured PD, according to some embodiments. The lower structure is similar to the structure of FIG. 20: Si substrate 2302, SiO2 layer 2304, and Si N layer 2306. A lower Si I layer 2308 can also be provided. In this case, Ge is used as an upper I layer 2309 and the P layer 2310. The P layer 2310 can also be made of InP, which can be grown on the Ge I layer 2309. The advantage of an InP P layer 2310 is that it is less absorbing at wavelengths from 0.9 to 2 micrometers. The P layer 2310 can also be made of GaAs grown on Ge I layer 2309. Also shown are microstructure holes 2322, P ohmic contact 2328 and N ohmic contact 2330. Note that light can impinge on the upper surface of P layer 2310 and/or on the Si substrate surface 2302.

Figure 24:
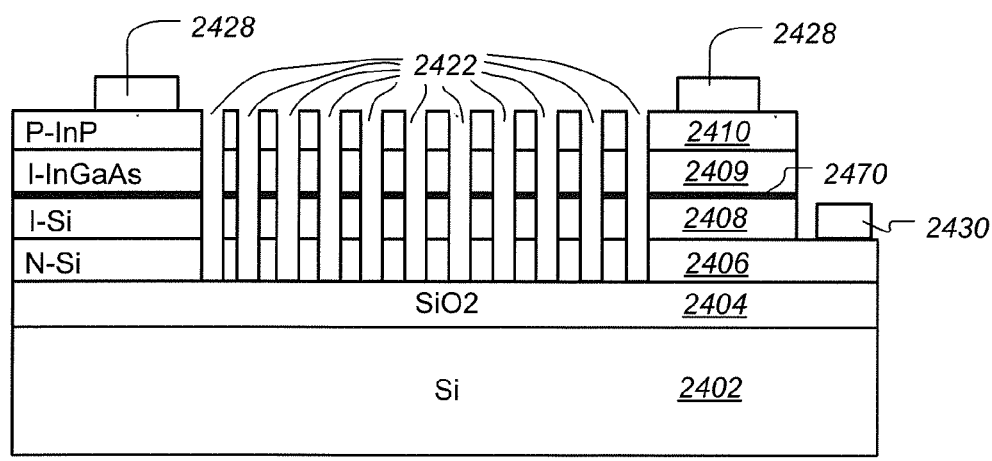
FIG. 24 is a diagram showing aspects of a heterogeneous epitaxial microstructured PD, according to some embodiments.

FIG. 24 is a diagram showing aspects of a heterogeneous epitaxial microstructured PD, according to some embodiments. In this case, the I region can be a composite of Si (lower I layer 2408) and InGaAs (upper I layer 2409) separated by Ge layer 2470. The P region 2410 is InP. According to some embodiments, the I region can also be entirely InGaAs grown on a thin layer of buffer Ge layer 2470. Also shown are Si substrate 2402, oxide layer 2404, N layer 2408, microstructure holes 2422, P ohmic contact 2428 and N ohmic contact 2430. This is an example of a high contrast Microstructured PD structure. It can also incorporate a metal reflector as in FIG. 21 where the Si is removed by etching below the PD to the oxide layer and Au, Ag, Al or Cu metal layers can be deposited to reflect the light back toward the I absorbing layer. Bragg reflectors can also be used as described above. Light comes from the P layer side in this example. Light can also come from the Si substrate side, in which case, a reflector is placed on the P layer surface for a double transit through the I layer. Advantages of such arrangements includes keeping the I layer thickness unchanged from that of a single pass, while the absorption is greatly improved by transiting the absorption region twice or more. By reducing the absorption region thickness to, for example, half that of a single pass PD, the speed of the PD increases since the transit time for the photogenerated carriers have to traverse only half the distance of a single pass PD. High contrast microstructure refers to the refractive index difference between the microstructure and the space or atmosphere at one surface interface and the SiO2 and or the bulk semiconductor material at another surface interface. Light interact with the microstructures in a complex manner of coupled eigen cells or resonator cells where each hexagonal or square cell in the lattice can be considered as an individual resonator that is coupled to its adjacent cell or resonator in addition to linear and nonlinear optical field enhancements that may occur. If there are no or very little optical losses, the coupled resonator structures can have a high Q (quality factor of a resonator) or, in other words, light can bounce back and forth in the microstructure over $10^4$ to over $10^6$ times before damping out for example. However with optical loss such as due to weak absorption, the Q may be low and light may bounce back and forth in the microstructure less than 100 times, or even less than 20-30 times. The microstructures in the PD/APD are low Q high contrast structures or lossy high contrast structures with the Q of each cell coupled to adjacent cells.

Figure 25:
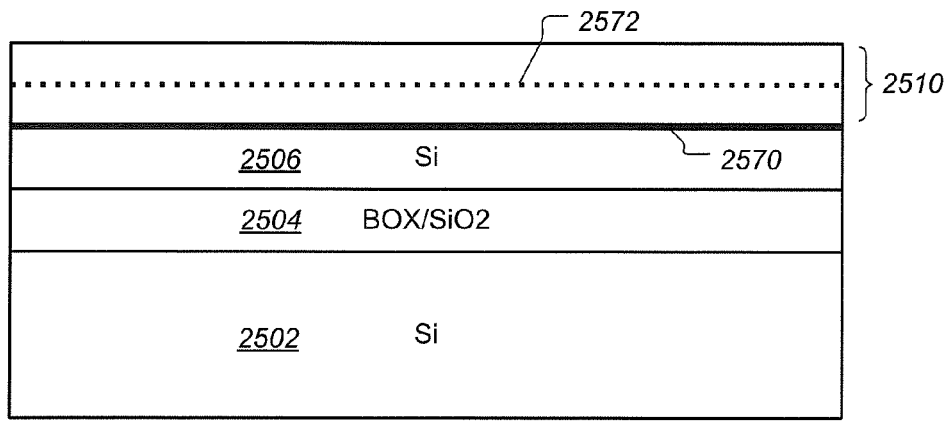
FIG. 25 shows a high contrast structure for an optical emitter such as a light emitting diode (LED) or a vertical surface emitting laser (VCSEL), according to some embodiments.

FIG. 25 shows a high contrast structure for an optical emitter such as a light emitting diode (LED) or a vertical surface emitting laser (VCSEL), according to some embodiments. Optical emitter 2500 is a heterogeneous epitaxial layer structure. Si layer 2506 is formed on Si substrate 2502 and BOX/SiO2 layer 2504. A buffer Ge layer 2570 can be grown on Si layer 2506 followed layer 2510, which can be InAs quantum dots 2572, cladded by GaAs and AlGaAs. In addition, a simple Si PIN microstructure where the "I" layer can be thin of approximately 1000 nm or less and where the structure in forward bias, can be a photon emitter.

Figure 26:
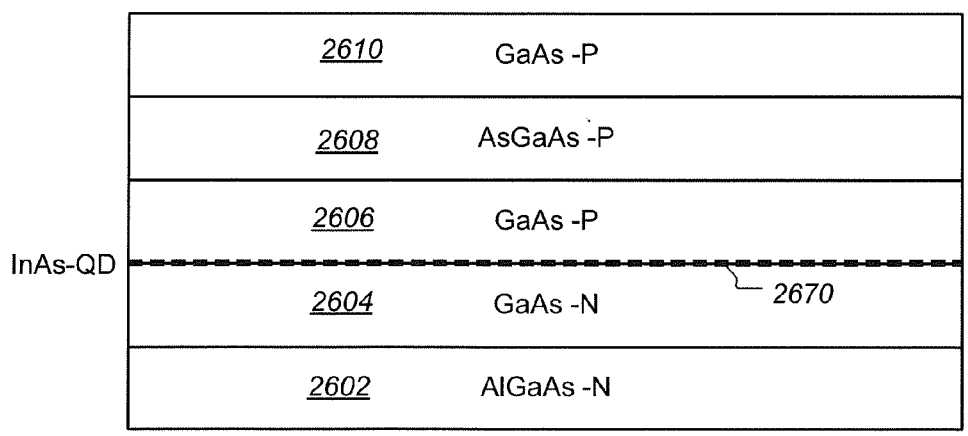
FIG. 26 shows for example the basic structure for a high contrast 1.3 micron wavelength photo emitter (PE), according to some embodiments.

FIG. 26 shows, for example, the basic structure for a high contrast 1.3 micron wavelength photo emitter (PE), according to some embodiments. An active layer for 1.3 micron wavelength emitter is formed using an InAs quantum dot layer 2570 (shown in FIG. 25) or 2670 in FIG. 26, sandwiched by GaAs P layer 2604 and N layer 2606 which in turn is sandwiched by AlGaAS P layer 2608 and N layer 2602, and a P GaAs capping layer 2610 as the final layer. Typical thickness can be found in the literature. See, e.g. A Y Liu, S Srinivasan, J Norman, A C Gossard, J E Bowers, Quantum Dot Lasers For Silicon Photonics, Photonics Research 3 (5), B1-B9 (2015), which is incorporated by reference herein. In addition there can be multiple layers of quantum dots and/or cladding layers. The microstructures can be designed such that the standing wave peak is positioned at one or more of the QD layers to optimize the gain and optical field overlap. For MS-PD/APD, the length of the microstructure can also be such that at a particular wavelength, an integer number of wavelengths is in a round trip to optimize the absorption enhancement at that particular wavelength for example. In addition a single microstructure for example a single hole can also have enhancement of absorption or emission for either PE or MS-PD/APD over than of a similar structure without any microstructures.

Figure 27:
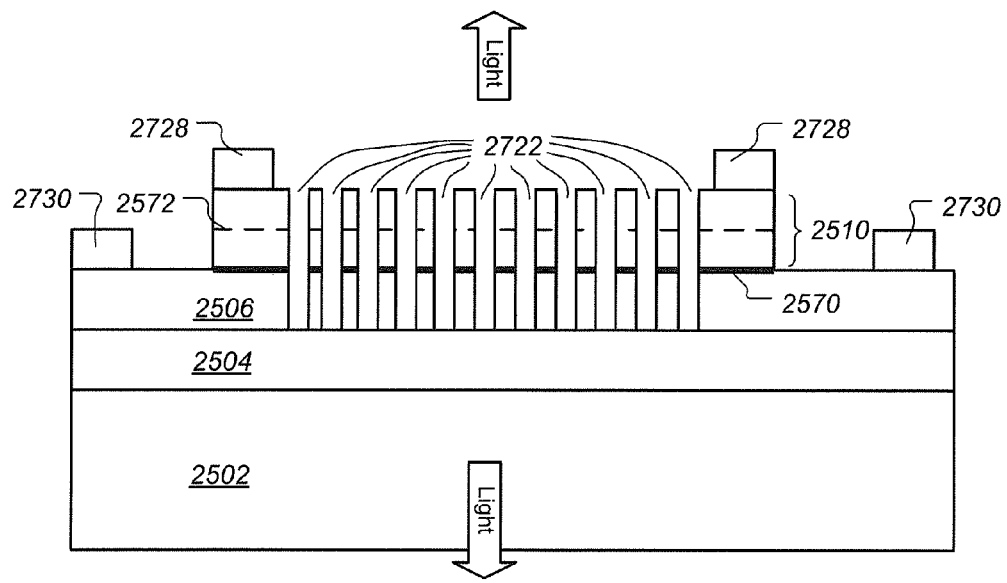
FIG. 27 is a diagram showing some basic features of a high contrast microstructured photo emitter (PE) structure with etched holes, according to some embodiments.

FIG. 27 is a diagram showing some basic features of a high contrast microstructured photo emitter (PE) structure with etched holes, according to some embodiments. The material structure is similar to that of PE 2500 shown in FIG. 25. Microstructure holes 2722 are etched into active layer 2510. Using P and N ohmic contacts 2728 and 2730, the device 2700 is biased in a forward bias, P positive in respect to N, to generate photons from the active layer 2510 comprising in this example of InAs quantum dots 2572 at a wavelength of 1.3 microns. Other active layers, cladding layers can be used to generate light at other wavelengths, from visible to infrared. Depending on the wavelength of light, light can be emitted from the top surface and/or the bottom surface through the oxide layer 2504. The advantage of a microstructured high contrast photon emitter is that the photons interact with the active layer and/or the gain layer in the case of a laser longer since the high contrast structure can have very high Q, with Q ranging from $10^3$ to over a million since the structures have very little optical loss and the quantum dots provide optical gain. The high contrast low loss microstructured photo emitter can operate as a LED, as a VCSEL and/or a laser and/or a super-radiant LED. The PE is forward biased with the anode, 2728 is the P ohmic, or P layer at a positive voltage with respect to the cathode, 2730 that is the N ohmic, or N layer.

Figure 28:
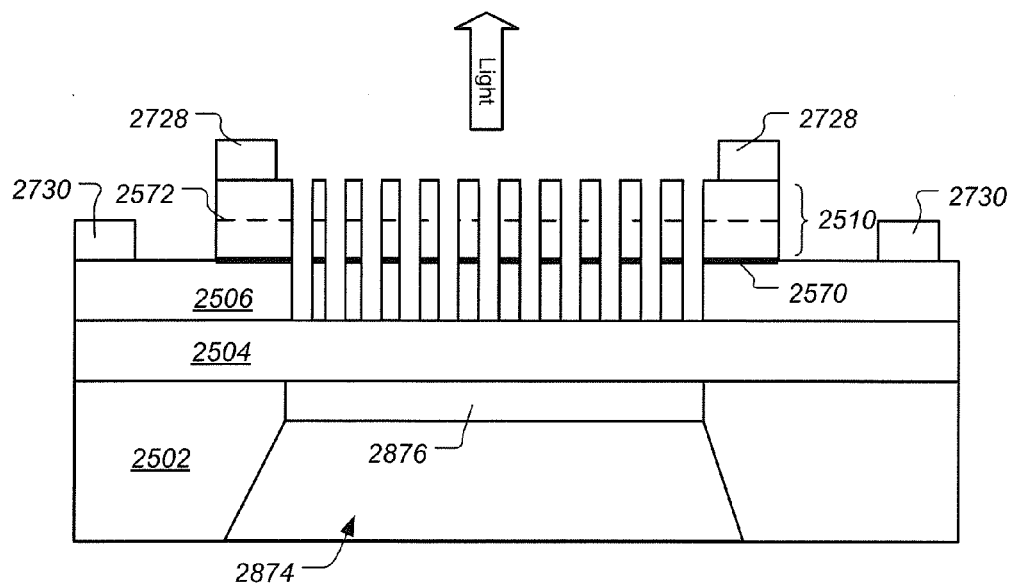
FIG. 28 is a diagram showing some aspects of a PE, according some other embodiments.

FIG. 28 is a diagram showing some aspects of a PE according some other embodiments. PE 2800 is similar to PE 2700 shown in FIG. 27 except that a portion 2874 of the substrate 2502 is removed underneath the light emitting region to the oxide layer 2504. A reflector, metal and/or Bragg such as distributed Bragg reflector (DBR) 2876 is formed on the oxide layer to reflect light generated in the active layer back toward the P layer 2510 surface. According to some embodiments, device 2800 operates in an LED mode and/or in a laser mode.

Figure 29:
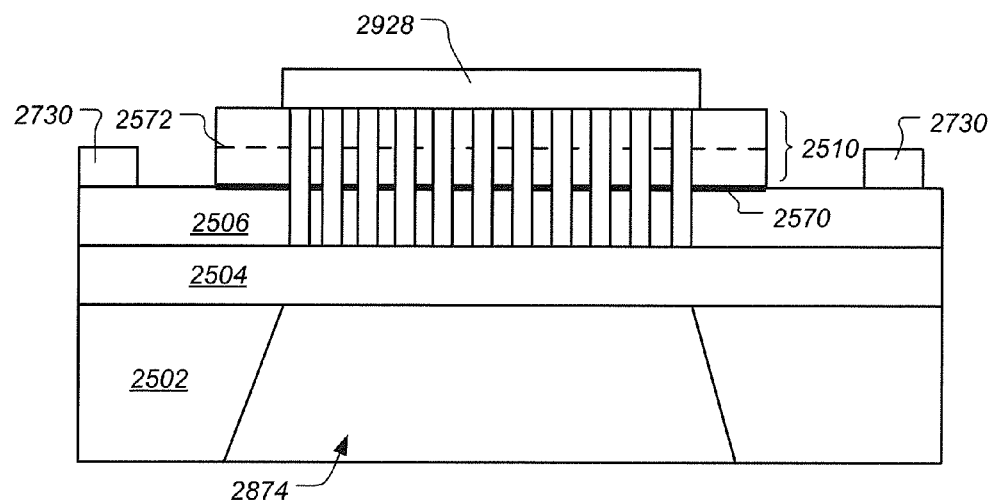
FIG. 29 is a diagram showing some aspects of a PE, according some other embodiments.

FIG. 29 is a diagram showing some aspects of a PE, according to some embodiments. PE 2900 is similar to PE 2800 of FIG. 28, except that in includes a reflector 2928, which can be metal and also can act as a P ohmic contact, if desired. According to some embodiments, a separate P ohmic can be provided. The reflector 2928 also can be a distributed Bragg reflector and/or partially metal and partially DBR. Light is emitted from the lower surface of oxide layer 2504 and through the substrate 2502 where a portion 2874 has been removed. The photo emitter 2900 can operate in LED and/or a laser mode such as VCSEL mode. According to some embodiments, the photo emitter 2900 can operate in an edge mode, where light is emitted in the plane of the active layer rather than perpendicular to it, with or without mirrors such as DBR or metal along the emitting edges.

Figure 30:
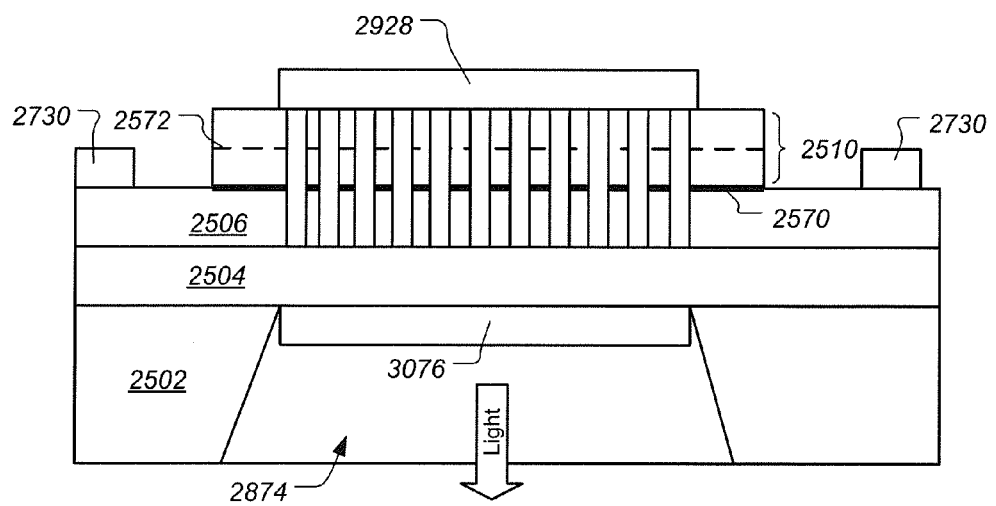
FIG. 30 is a diagram showing some aspects of a PE, according some other embodiments.

FIG. 30 is a diagram showing some aspects of a PE, according to some other embodiments. PE 3000 is similar to PE 2900 of FIG. 29, but is configured as a VCSEL (vertical cavity surface emitting laser). PE 3000 is heterogeneous epitaxially grown on Si with high contrast microstructured holes (or pillars). Note that only the very basic components are shown for simplicity. The high contrast structure can be sandwiched by reflectors 2928 and 3076. The P layer 2510 can be a DBR grown by semiconductor epitaxy and followed by P ohmic metallization layer 2928. According to some embodiments, the DBR can be formed from conductive oxides or non-conducting oxides, with either the P metal on the DBR and/or on the side as in FIG. 28. The mirror 3076 on the bottom side of oxide layer 2504 can be metal and/or DBR of dielectric layers of different refractive index. Light output as shown is from the bottom, but can also be from the top.

FIG. 31 is a diagram showing some aspects of a Simple PIN photodiode structure, according to some embodiments. To minimize diffusion current due to photocarriers generated in the regions outside the high field region, the "I" layer 3108, the P and N layers 3110 and 3106 are highly doped and/or doped degenerately to reduce minority carrier lifetime. N and P doping can range from $1\times10^{18}$ to $8\times10^{21}/cm^3$ or more. I layer 3108 is not intentionally doped and can be less than $5\times10^{16}/cm^3$. Also shown is an oxide layer 3104 and a Si substrate 3102. As in earlier examples, with or without the addition of a Ge buffer layer, Ge and/or III-V materials can be grown and the P and N layers can also be highly doped and/or doped degenerately. The doping need not be uniform and can have a gradation, for example where the doping is reduced in the P or N layer near the "I" layer interface to minimize diffusion of dopants into the "I" layer during epitaxial growth.

By reducing minority carrier lifetime in the P and N layers, photogenerated carriers in these layers can recombine before diffusing and/or drifting into the high field "I" where the electrons and/or holes can contribute to a photocurrent that can result in a degradation of the photodiode modulated frequency response. Therefore, it is beneficial to minimize photocurrent contributions due to carriers generated outside the high field region.

Other methods of reducing minority carrier lifetime include introducing defects, such as via ion implantation partially and/or entirely in the P and/or N regions. The introduced ions can be inert ions, and/or active ions with partial, full or no thermal annealing. In addition, the microstructured holes (and/or pillars) can be with or without partial passivation, such that the surface states in the low field regions of N and P layers can act as carrier sinks whereas in the high field regions of the "I" layer, the carriers are swept out rapidly. Passivation can also be selective, on the "I" layer predominately.

Figure 32:
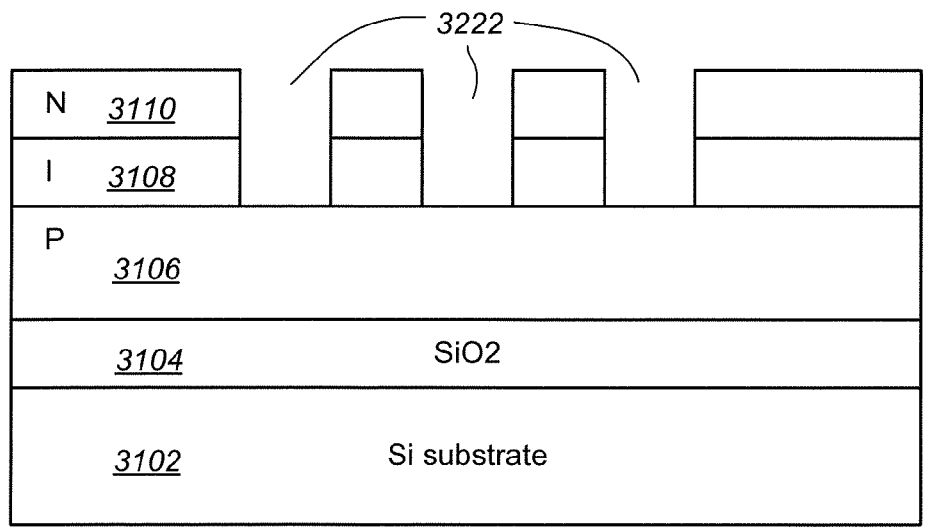
FIG. 32 is a diagram showing aspects of MS-PD fabrication, according to some embodiments.

FIG. 32 is a diagram showing aspects of MS-PD fabrication, according to some embodiments. The starting material structure can be such as depicted in structure 3100 of FIG. 31. A simple NIP (N and P can be interchanged for a PIN) microstructured photodiode is shown where holes 3222 are etched to the top of P layer 3106. The purpose is to passivate the N and "I" layer walls, and not passivate the P layer walls to thereby reduce the lifetime of minority carriers in the P layers that are generated by the light with wavelengths from 780 to 980 nm for example. Surface states on the un-passivated P walls can act as a potential sink for minority carriers where they are recombined.

Figure 33:
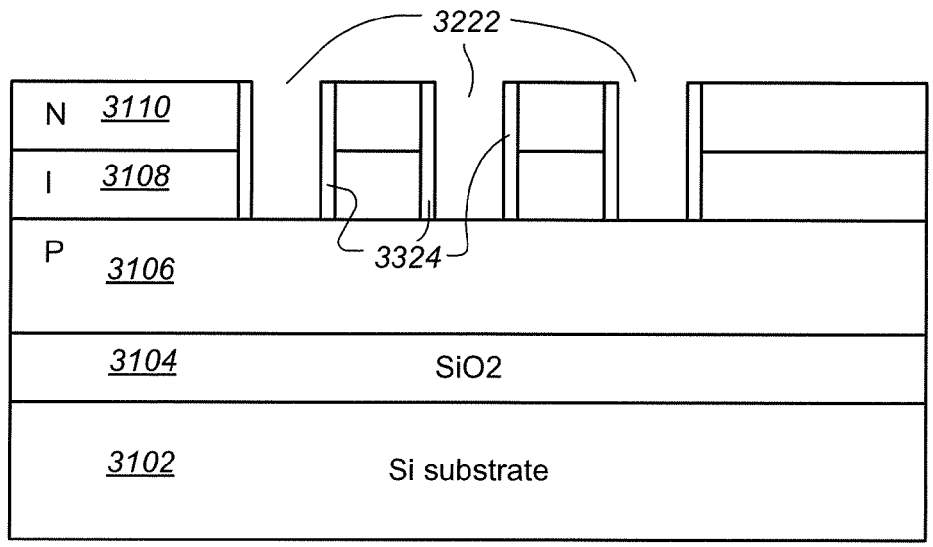
FIG. 33 is a diagram showing aspects of MS-PD fabrication, according to some embodiments.

FIG. 33 is a diagram showing aspects of MS-PD fabrication, according to some embodiments. Passivation of the side walls of the holes 3222 of the N and "I" layers is shown resulting in passivation layer 3324. The passivation can be carried out using thermal oxidation and/or atomic layer deposition of SiO2. Thermal oxides 3324 of 5-50 nm thick can be grown on the side walls for example. Other thicknesses can also be grown. After thermal oxidation, etching the holes can be continued to etch through the P layer 3106 to the SiO2 layer 3104, for example. Not all processing steps are shown, for example, the N layer can be protected by thermal oxide, not shown, during the continuation of the hole etch.

Figure 34:
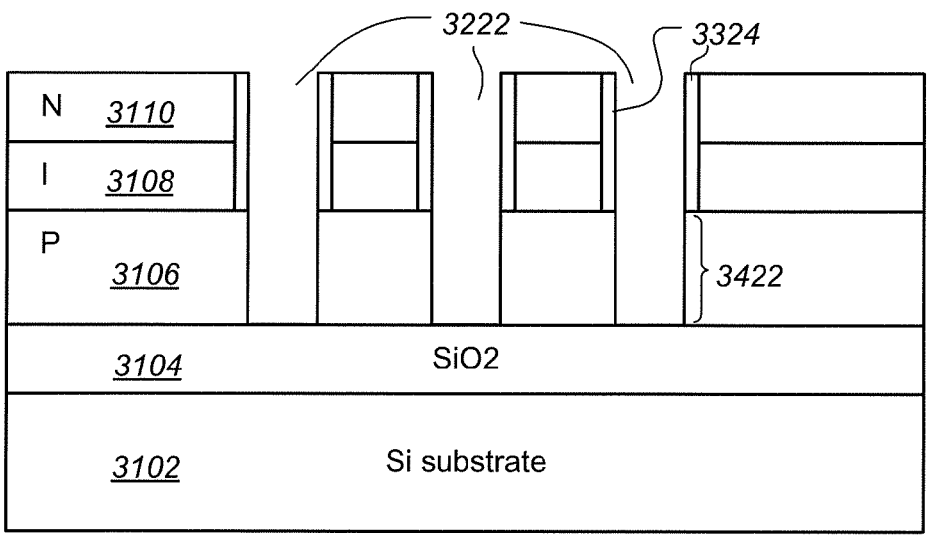
FIG. 34 is a diagram showing aspects of MS-PD fabrication, according to some embodiments.

FIG. 34 is a diagram showing aspects of MS-PD fabrication, according to some embodiments. After passivation, the holes 3222 are further etched as shown by area 3422. Note that the N and P layers can be interchanged so that instead of the NIP structure as shown in this example it can also be a PIN structure. The holes 3222 can be etched to the SiO2 layer 3104 and/or they can be etched only partially through the P layer 3106 so that a thin P layer remains. The sides of the holes 3222 within the P layer 3106 are not passivated in this example to allow the surface states to pull any minority carriers generated by the light toward its potential sink and result in recombination. According to some embodiments, the P layer 3106 can also be passivated and/or partially passivated. Since layer 3106 can also be heavily doped, the minority carrier lifetime may be in the 10s of picosecond or less.

Figure 35:
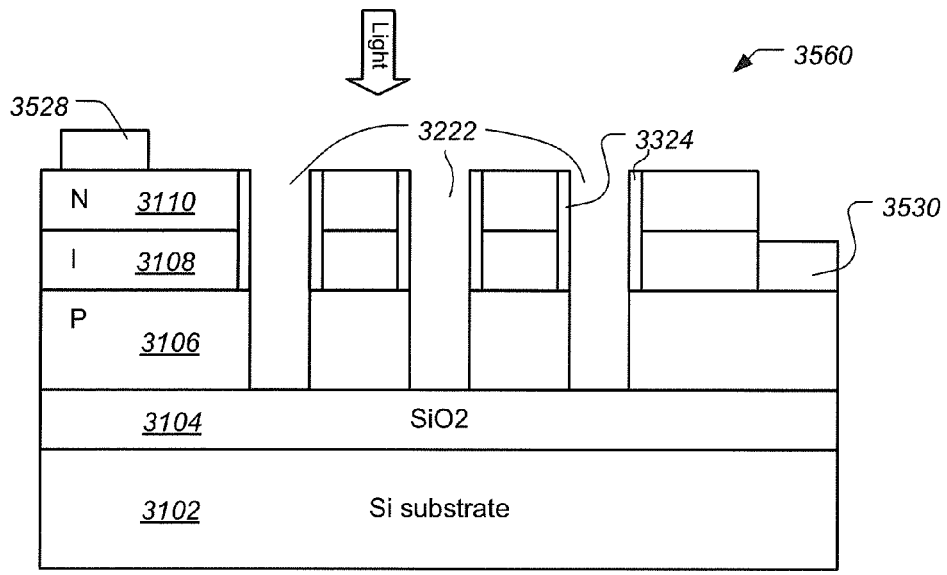
FIG. 35 is a diagram showing aspects of a MS-PD, according to some embodiments.

FIG. 35 is a diagram showing aspects of a MS-PD, according to some embodiments. The microstructured NIP photodiode 3560 has microstructure holes 3222 with passivated sidewalls of the N and "I" layers, but not passivated sidewalls of the P layer. Ohmic contacts 3528 and 3530 to the N and P layers respectively are added to provide a reverse bias for high-speed operation of the photodiode 3560. Light impinging on the N side of the photodiode is either normal and/or off normal to the N layer plane.

Figure 36:
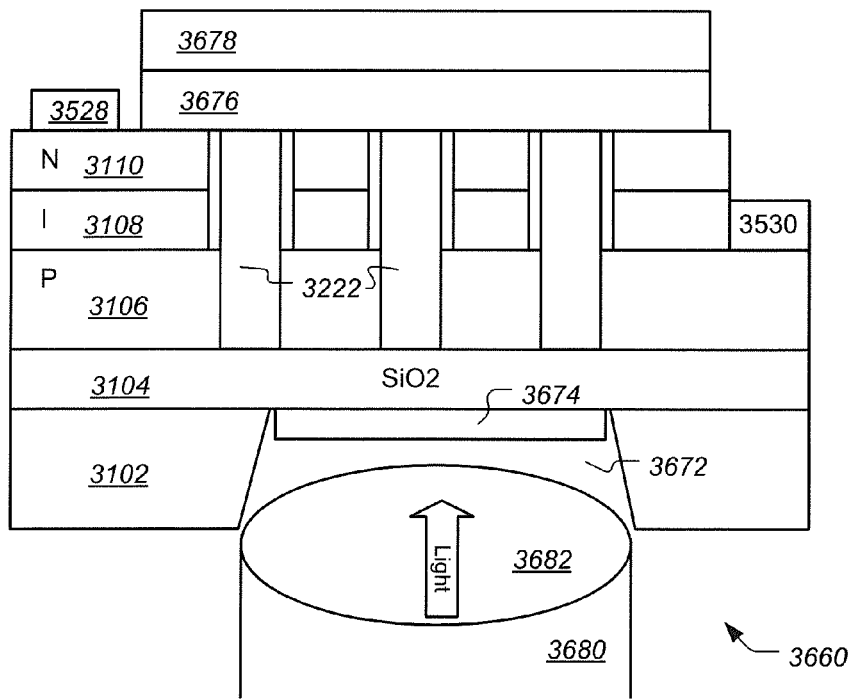
FIG. 36 is a diagram showing aspects of a MS-PD, according to some embodiments.

FIG. 36 is a diagram showing aspects of a MS-PD, according to some embodiments. The microstructured hole photodiode 3660 has Si NIP layers where passivation is partially on the sidewalls similar to PD 3560 shown in FIG. 35. With PD 3660, however, light comes in via an optical fiber 3680 from the Si substrate side where a via 3672 is etched to allow a self-aligning process where the fiber 3680 with or without a lens 3682 is guided along the via 3672 to the correct position for optimal coupling of light into the microstructured photodiode 3660. A dielectric layer 3676 of 0.1-10 micrometer thickness approximately can be positioned on the N layer 3110 over the holes 3222. On top of the dielectric layer 3676 can be a metal reflector 3678 such as Ag or Au (or any other suitable metal or alloy, such as Al, Ni, Cr, for example) and/or a dielectric stack such as a Bragg Reflector (BR), to reflect the light back toward the absorbing "I" layer 3108. An anti-reflective coating 3674 can also be provided. Also as in earlier examples, Ge and/or III-V materials can also be grown with or without the addition of a Ge buffer layer.

FIG. 37 is a diagram showing a technique to reduce minority carrier lifetime, according to some embodiments. In this case, surface and bulk recombination is used rather than passivating or partial passivating hole surfaces. A high doping of greater than $10^{20}/cm^3$ can reduce the diffusion length to less than 0.1 micrometer (Auger recombination) for example. In addition, ion implantation is used to introduce defects 3770 and 3772 in layers 3710 and 3706. The defects in the semiconductor can also cause reduced lifetimes via the Shockley-Read-Hall recombination process. Ions such as Xe, Bi, Ti, Cr, Ar, N, to name a few can be implanted into the N and/or P layers. Contrary to known structures where long minority carrier lifetimes are desirable for device operation, the described techniques introduce defects either by epitaxial growth and/or ion implantation of metal, non-metal and inert ions to increase the recombination rate due to Shockley-Read-Hall effects. Deep and/or shallow traps can be created due to the defects that can result in short lifetimes of the minority carriers. The short lifetime of minority carriers is desirable in the P and N regions to minimize the contribution of diffusion currents that find their way to the high field region "I" layer that can contribute to the photocurrent. These "slow" diffusion currents that diffuse and/or drift into the "I" region can cause degradation of the time response of the photodiode by contributing a slow component to the photocurrent-time response characteristic of the photodiode.

FIGS. 38A-38C describe various parameters for microstructured photodiodes that were simulated. FIG. 38A shows a hexagonal hole pattern having a distance "d" between the hole centers. FIG. 38B shows a square hole pattern having distance "d" between the hole centers. FIG. 38C is a table of parameters used for the simulation using FDTD method. It was found that absorption of greater than 90% can be accomplished with a 2 micrometer thick silicon layer on SiO2 layer of 2-2.5 micrometers thick, with holes ranging from 1300 to 1500 nm in diameter and with a period of 2000 nm in a hexagonal lattice of holes for wavelengths of the optical signal ranging from 850 to 950 nm and to 980 nm for example. In addition, wavelengths can range from 750-1000 nm. Hole diameters can be subwavelength to greater than a wavelength of the incident optical signal, ranging from 100 to 3000 nm in diameter. Thickness of the Si absorbing layer can range from 0.3 to 10 micrometers. The SiO2 layer can range from 0.2 to 10 micrometers. According to some embodiments, a mixture of hole diameters can also be used to optimize the absorption of the incident photons.

Figure 39:
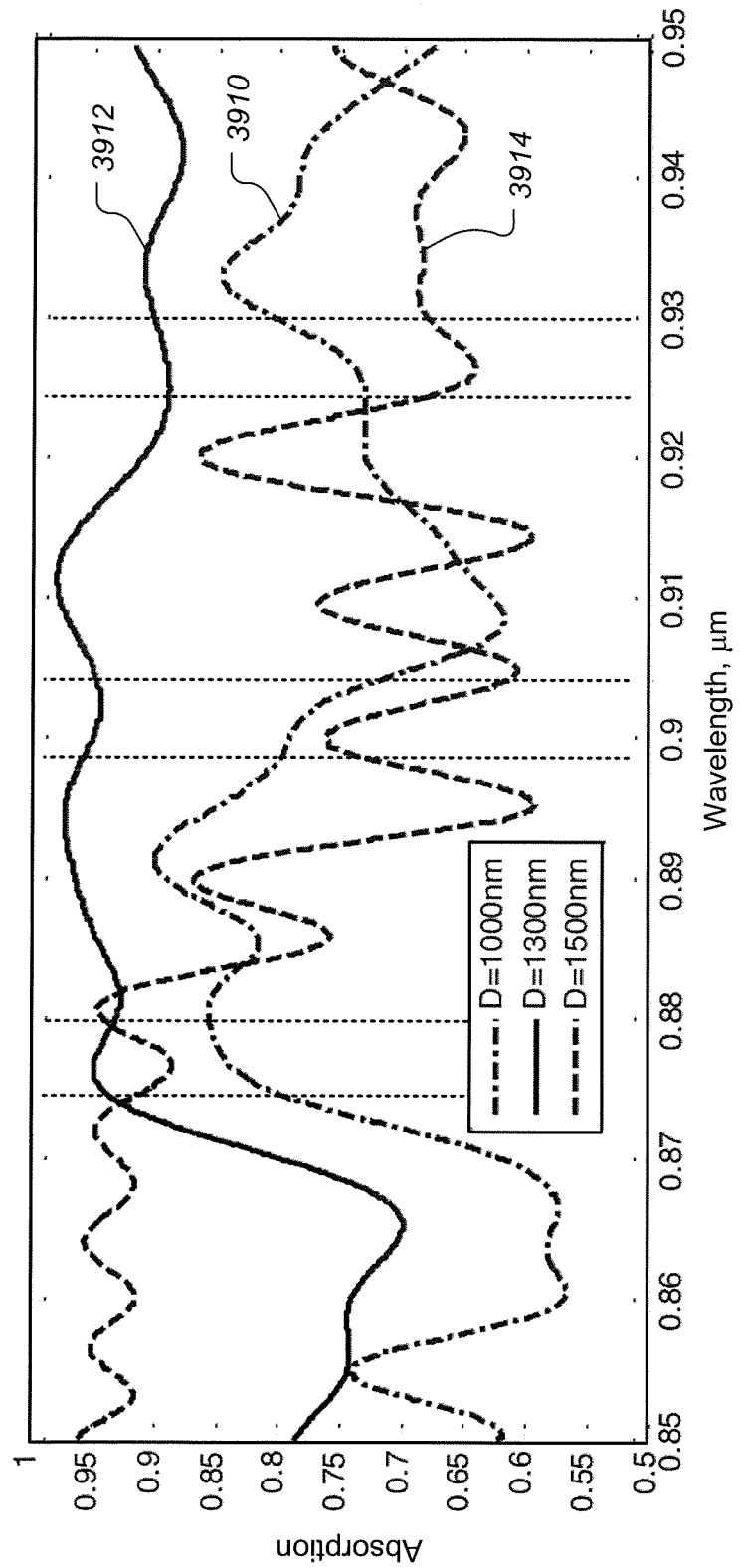
FIG. 39 is a graph plotting simulation results of microstructured hole photodiodes.

FIG. 39 is a graph plotting simulation results of microstructured hole photodiodes using FDTD for absorption verses wavelength. The photodiode absorption "I" layer was 2 micrometers thick, with hole diameters ranging from 1000 to 1500 nm. Incident energy wavelengths ranged from 850 to 950 nm. Three curves 3910, 3912 and 3914 plot the absorption for hole diameters of 1000 nm, 1300 nm and 1500 nm respectively. The simulations show that with hole diameter of 1500 nm, greater than 90% absorption is achieved over a wavelength range of 850-870 nm and with a hole diameter of 1300 nm, absorption of greater than 80% can be achieved over a wavelength range of 875 to 950 nm with a hexagonal lattice of holes with a period of 2000 nm. The 2 micrometer Si is on top of a 2-2.5 micrometer SiO2 layer. As can be seen, having a hole diameter larger than the incident wavelength can be used to enhance the absorption over that of a conventional silicon layer without any features.

Figure 40:
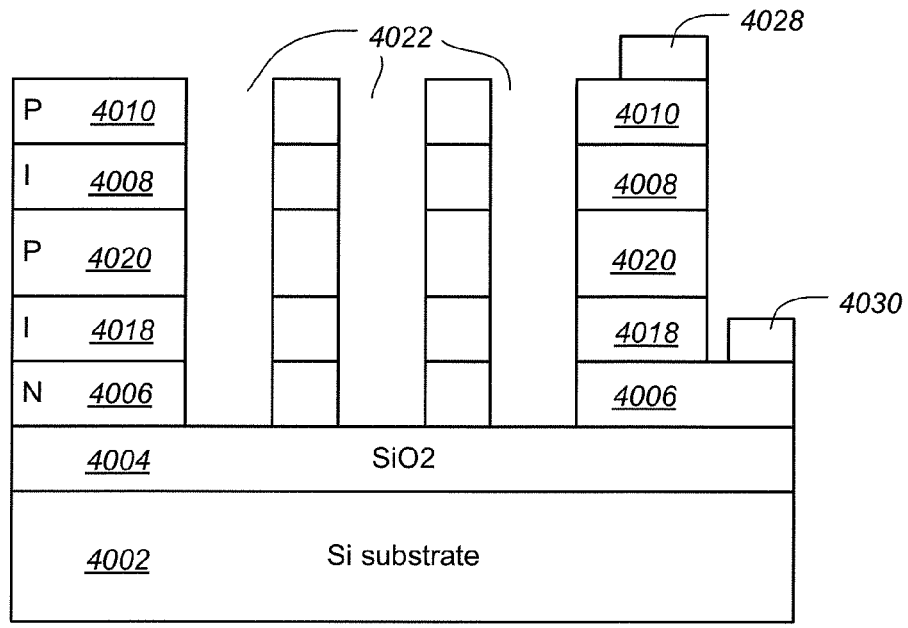
FIG. 40 is a diagram showing a microstructured avalanche photodiode (APD) with a P-I-P-I-N epitaxial structure, according to some embodiments.

FIG. 40 is a diagram showing a microstructured avalanche photodiode (APD) with a P-I-P-I-N epitaxial structure, according to some embodiments. In the case of FIG. 40 all the layers of APD 4060 are silicon for optical communication wavelength ranging from 780 to 1000 nm for example. The APD 4060 can also operate in the visible wavelength range. Data rates can range from 100 Mb/s to 50 Gb/s or more. A reverse bias voltage is applied between the P and N ohmic contacts 4028 and 4030 with voltage range of −4 to −50 volts. Avalanche microstructured photodiode 4060 can have the following doping and thicknesses: P layer 4010, doping $>1\times10^{19}/cm^3$, thickness 0.1-1.0 μm; I layer 4008, doping $<1\times10^{16}/cm^3$, thickness 0.5-3 μm; P layer 4020, doping $1-3\times10^{17}/cm^3$, thickness 0.1-0.5 μm; I layer 4018, doping $<1\times10^{16}/cm^3$, thickness 0.3-1 μm; and N layer 4006, doping $>1\times10^{19}/cm^3$, thickness 0.5-3 μm for example. According to some embodiments, the top two layers 4010 and 4008 can also be Ge instead of Si. The holes 4022 can be etched partially through the APD layers or completely to the SiO2 layer 4004 as shown in FIG. 40.

As in the case of microstructured photodiodes, for APDs the optical signal can impinge from the front side (epitaxial layer side) or the backside (substrate side). Additionally, with a via in the substrate, a reflector can be deposited on the SiO2 resulting in a double or multiple bounce of the optical signal within the APD structure. According to some embodiments, the P and N can be interchanged resulting in a N-I-N-I-P microstructured APD.

Figure 41:
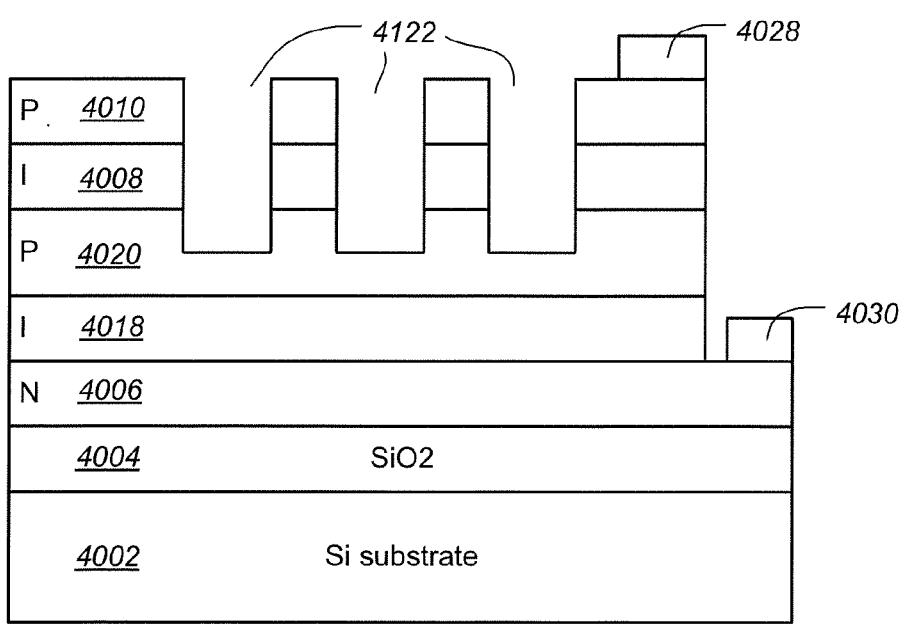
FIG. 41 is a diagram showing a microstructured avalanche photodiode (APD) with a P-I-P-I-N epitaxial structure, according to some other embodiments.

FIG. 41 is a diagram showing a microstructured avalanche photodiode (APD) with a P-I-P-I-N epitaxial structure, according to some other embodiments. The APD 4160 is identical to APD 4060 depicted in FIG. 40, except that the holes 4122 (or pillars) are partially etched. In the example shown in FIG. 41, the holes 4122 are partially etched into the P layer 4020 and/or stop at the P layer 4020. According to some other embodiments, the holes 4122 can be partially etched into the I absorption layer 4008.

Figure 42:
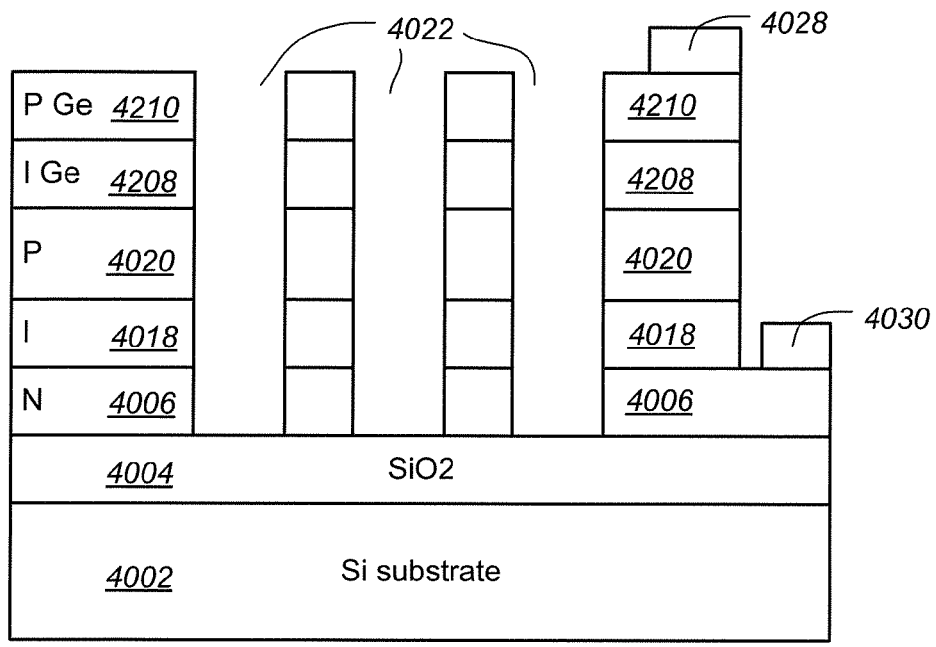
FIG. 42: is a diagram showing a microstructured APD with a Ge absorption layer and Ge P capping layer, according to some embodiments.

FIG. 42 is a diagram showing a microstructured APD with a Ge absorption layer and Ge P capping layer, according to some embodiments. The APD 4260 is similar or identical to APD 4060 depicted in FIG. 40 except that the two upper layers, 4210 and 4208 are Ge instead of Si. The APD 4260 can have the same doping and thicknesses ranges as described above for APD 4060 except that the P Ge layer 4210 can have a doping level greater than $1 \, 10^{20}/cm^3$. After the epitaxial growth of the APD structure P(Ge)-I(Ge)-P(Si)-I(Si)-N(Si) on a buried oxide (BOX) silicon substrate, the microstructures are then etched. The microstructures can be holes, pillars or a combination of the two. The etching can be made to the SiO2 layer or it can also be etched partially to a depth before reaching the SiO2 layer 4004, for example the holes can be etched to or into the P Si layer 4020. The Ge absorption layer 4208 with microstructures is expected to allow the optical signal to operate with wavelengths from 780 to 2000 nm at data rates from 100 Mb/s to 50 Gb/s or more. The optical signal can impinge from the top surface (epitaxial surface) or the bottom surface (substrate surface). With a via and a reflector deposited on the SiO2, the optical signal impinging from the top surface can be reflected back to the absorption I (Ge) layer 4208 for a second time and/or multiple times. Since there are optical refractive index differences between the Si, Air and Ge, standing waves can be established and the thickness of the structure can be optimized to have the absorbing layer at the peak intensity of a standing wave(s) also known as stationary waves or eigen modes. In addition, at wavelengths where Si is transparent, a microlens can be etched into the Si substrate to assist in coupling of the optical signal into the APD from the bottom surface. SiO2 and a reflector can also be placed on the P (Ge) 4210 surface to reflect the optical signal that impinges from the bottom back to the absorbing I (Ge) layer 4208. Reverse bias voltages are applied between the P and N ohmic contacts 4028 and 4030 ranging from −4 to −50 volts.

Figure 43A:
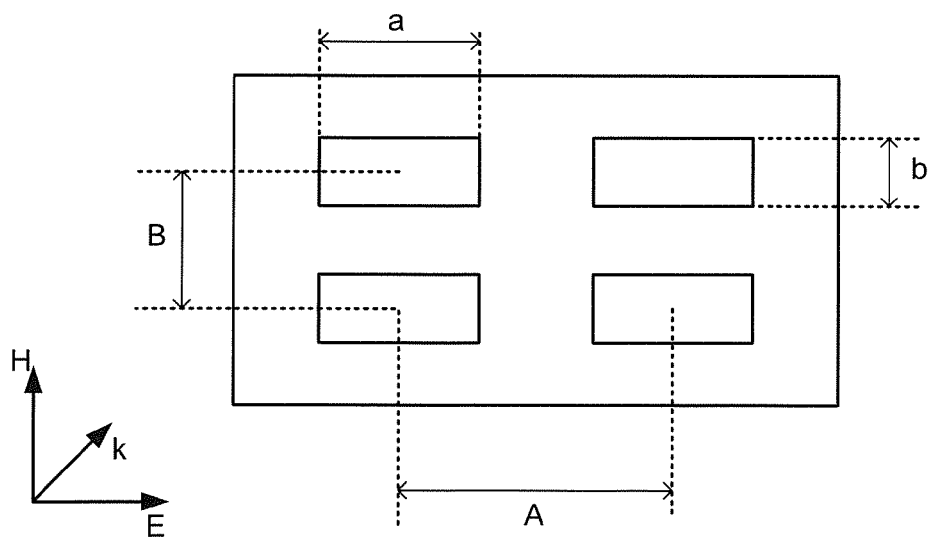
FIGS. 43A-D show polarization sensitivity of the microstructured photodiode and APD, according to some embodiments.
Figure 43B:
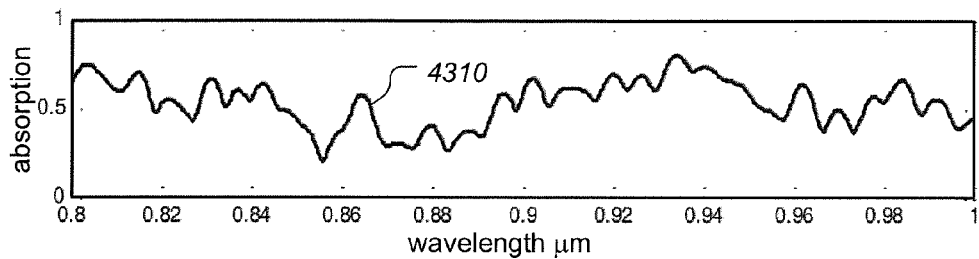
Figure 43C:
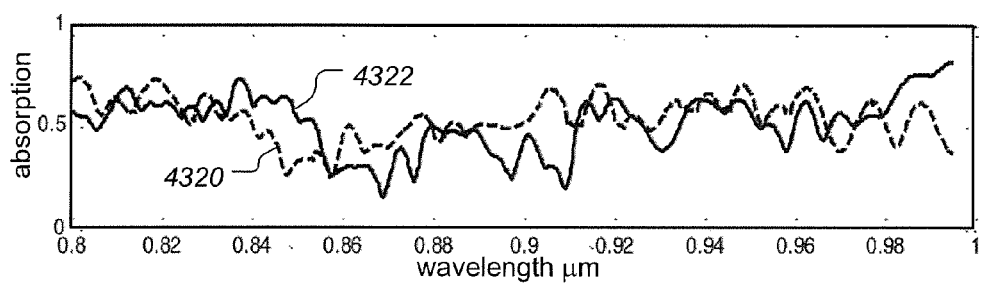
Figure 43D:
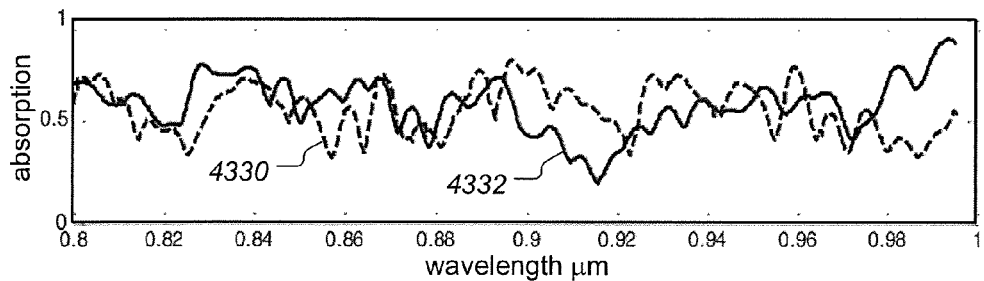

FIGS. 43A through 43D show polarization sensitivity of the microstructured photodiode and APD, according to some embodiments. FIG. 43A shows the geometry used for the simulation. The holes are symmetric in size and period; the electric field polarization of the optical signal either along B or A shows less than 5% difference in the absorption characteristic of the MS-PD/APD. Absorption is equal to the incident light minus the transmission and reflection of the light, and the quantum efficiency is directly proportional to the absorption. In cases where the dimensions of the hole dimensions "a" and "b" are not the same, the MS-PD/APD shows polarization sensitivity. In FIG. 43B, curve 4310 plots absorption vs wavelength where the "a" and "b" dimensions are both equal to 1000 nm. The absorption characteristic show less than 5% difference. FIG. 43C shows results for the case where a=1300 nm and b=870 nm. The curves 4320 and 4322 show that the difference in absorption value with polarization along A or B can be seen by as much as 2 times. FIG. 43D shows results for the case where a=1500 nm and b=650 nm. The curves 4330 and 4332 show that absorption differences due to polarization orientation can also be as much as 2 times. With further dimensional changes in both "a", "b", A and B, absorption differences due to polarization orientation can be 10 to 100 times different, or more. Both polarization "insensitive" (with absorption changes due to polarization orientation less than 5%) and polarization sensitive (with absorption changes to polarization orientation of 10 or more times) photodiodes and APD are useful. In cases where signals are not polarization multiplexed, for example where using the same wavelength, two channels can be transmitted, one with one polarization and another that is orthogonal to the first channel. For example, each channel can transmit at 25 Gb/s at a particular polarization at the same wavelength. At the receiver end, polarization sensitive photodetectors are used to demultiplex the signal. The aggregated data rate is 50 Gb/s at a wavelength of 850 nm. In direct modulation of a laser, the spectrum of the laser is always wider than, for example, a laser that is operating in CW mode. The spectrum can be broadened by as much as a few nanometers (e.g. 3 nm). Therefore at 850 nm, if the laser is directly modulated, the center frequency can be at 850 nm with a broadening of as much as 1.5 w nm approximately, plus or minus. In vertical cavity surface emitting lasers, lateral modes can contribute significantly to a wider spectrum due to multiple lateral modes. In multimode systems, this is desirable as it reduces mode selective losses.

Figure 44:
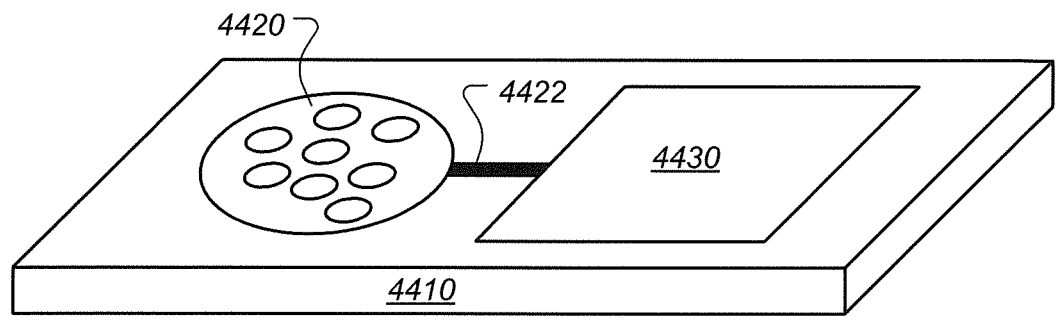
FIG. 44 shows a MS-PD/APD that is integrated with a transimpedance amplifier and/or other ASIC (application specific integrated circuits) for data processing and routing, according to some embodiments.

FIG. 44 shows a MS-PD/APD that is integrated with a transimpedance amplifier and/or another ASIC (application specific integrated circuits) for data processing and/or routing, according to some embodiments. The process can be CMOS and/or BiCMOS. MS-PD/APD 4420 is shown electrically connected to electronics 4430 (e.g. transimpedance amplifier (TIA) and/or another ASICs) via electrical leads 4422. The components are all integrated onto a single silicon substrate 4410. One advantage for integrating the microstructured PD/APD with IC electronics is a reduction of packaging costs, where instead of two or more individual devices, a single chip is used which may also be placed directly on a circuit board without the use of a multichip ceramic carrier. Another advantage of integrating the MS-PD/APD with electronics on a single chip is potentially lower capacitance, due to the omission of relatively large bond pads connected to the ohmic contacts. Operating wavelengths range from 800-990 nm for all silicon microstructured PD/APD. Operating wavelength can be extended to 1800 nm with the addition of Ge microstructured absorbing layer. Operating at data rates of 10, 28, 56 Gb/s can be achieved singly or in an array. The data rate can also be 1, 5, 20, 25, 30, 40 Gb/s depending on the protocol and link applications. Typically high data rates over multimode fiber and/or fibers are used at distances from under 1 meter to a length of over 100 meters. Multiple fibers and array of microstructured PD/APD (MS-PD/APD) can be utilized to give an aggregated data rate of 100 to over 400 Gb/s. For example a 10 fiber channel with each fiber operating at 10 Gb/s with a 10 MS-PD/APD array integrated with IC electronics such as transimpedance amplifiers (TIA) and/or other signal processing/routing IC electronics on a single silicon chip can have an aggregated data rate of 100 Gb/s. If each channel is at 56 Gb/s, the 10 channel can have an aggregated data rate of over 500 Gb/s.

Figure 45:
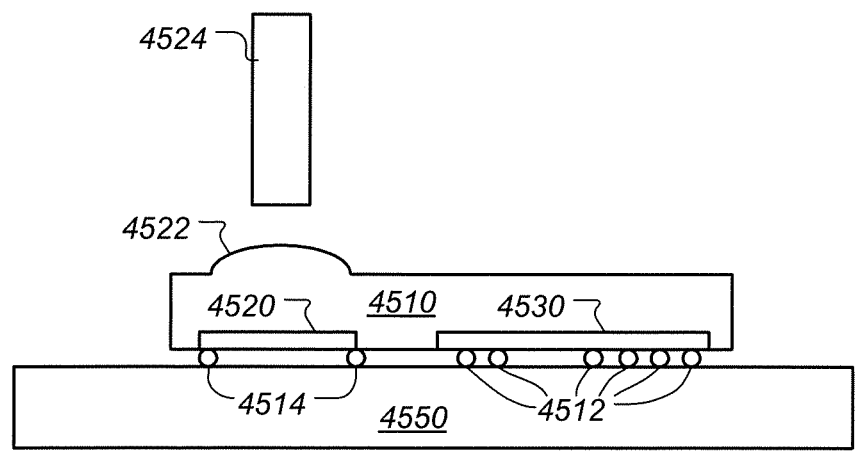
FIG. 45 is a diagram showing some aspects of a flip chip arrangement for a MS-PD/APD integrated with a TIA and/or other signal processing IC on a single silicon chip, according to some embodiments.

FIG. 45 is a diagram showing some aspects of a flip chip arrangement for a MS-PD/APD integrated with a TIA and/or another signal processing IC on a single silicon chip, according to some embodiments. According to some embodiments, the TIA and/or other signal processing integrated circuits 4530 are fabricated using CMOS and/or BiCMOS processes. Solder bumps 4512 and 4514 and/or similar bump technologies are used to attach the chip 4510 to a PCB (printed circuit board) 4550. According to some embodiments, some or all of solder bumps 4512 are used to make electrical connections between chip 4510 and PCB 4550, while solder bumps 4514 are used for physical mounting and/or stabilization only since electrical connection directly between MS-PD/APD 4520 and PCB 4550 may be unnecessary. According to some embodiments, chip 4510 is attached to another chip or multichip carrier instead of PCB 4550. Packaging the chip 4510 directly onto PCB 4550 reduces the cost of packaging by as much as 80% over known prior art packaging where the PD and IC electronics are first mounted on a multichip ceramic carrier prior to placing the carrier on a PCB. In addition, an integrated optical lens 4522 can be fabricated on the silicon chip 4510 to focus the light to the MS-PD/APD 4520 from the optical fiber 4524. Note that in this arrangement, light signal enters from the substrate side of MS-PD/APD 4520. The integrated lens 4522 on Si can be used in the case where the operating wavelength is greater than 1100 nm (e.g. 1100 nm to 1800 nm) where Ge microstructures can be used for absorption of the incoming optical signal.

Figure 46:
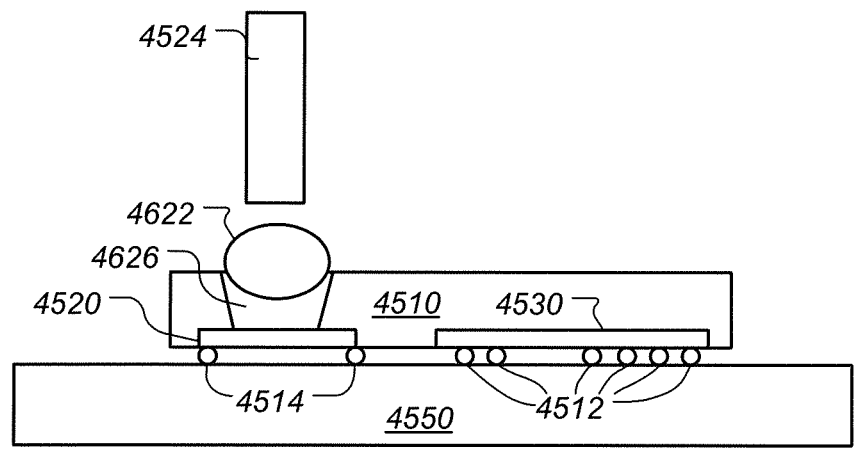
FIG. 46 is a diagram showing some aspects of a flip chip arrangement for a MS-PD/APD integrated with a TIA and/or other signal processing IC on a single silicon chip, according to some other embodiments.

FIG. 46 is a diagram showing some aspects of a flip chip arrangement for a MS-PD/APD integrated with a TIA and/or another signal processing IC on a single silicon chip, according to some other embodiments. The chip and mounting techniques are similar or identical to those depicted in and described with respect to FIG. 45. In this case, chip 4510 includes a via 4626 where most or all the silicon in the optical path to the MS-PD/APD 4520 is removed. An integrated dielectric lens 4622 is provided to collect the light and direct it on the MS-PD/APD 4520. According to some embodiments, a light pipe is used instead of lens 4622. The sidewall of the via 4626 can be coated with dielectric and/or metal to assist in the collection of light. Anti-reflection coating can be provided on the lens 4622 to reduce any reflection of the optical signal back into the optical fiber 4524. In addition, the fiber 4524 or chip 4510 can be tilted to reduce any reflection back into the fiber 4524. The optical fiber 4524 is used to bring the optical signal from a laser source to the integrated PD/APD and IC electronic chip 4510 with data rates ranging from less than a Gb/s to greater than 60 Gb/s. According to some embodiments, data rates of approximately 1, 5, 10, 20, 28, 50, 56 Gb/s can be used. According to some embodiments, optical signal wavelengths can range from 800-990 nm for all silicon microstructured PD/APD (MS-PD/APD), and with microstructured Ge for the absorbing layer, the wavelength can be extended to 1800 nm.

Figure 47:
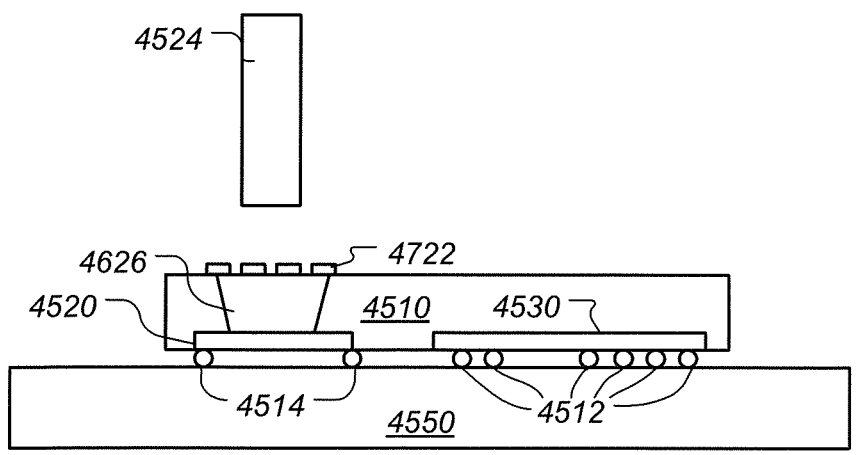
FIG. 47 is a diagram showing some aspects of a flip chip arrangement for a MS-PD/APD integrated with a TIA and/or other signal processing IC on a single silicon chip, according to some other embodiments.

FIG. 47 is a diagram showing some aspects of a flip chip arrangement for a MS-PD/APD integrated with a TIA and/or another signal processing IC on a single silicon chip, according to some other embodiments. The chip and mounting techniques are similar or identical to those depicted in and described with respect to FIGS. 45 and 46. As in FIGS. 45 and 46, a single chip 4510 contains both the optical and electronic elements. With a via 4626 in the substrate of chip 4510 to eliminate most or all of the Si in the optical path to the MS-PD/APD 4520 together with an integrated Fresnel lens 4722, the optical signal is efficiently collected from the optical fiber 4524. The collected optical signal is impinged on the MS-PD/APD 4520. According to some embodiments, instead of Fresnel lens 4722, a high contrast grating (HCG) is used. According to some embodiments, the HCG can have filtering effects so that only specific optical wavelengths can be transmitted to the MS-PD/APD while the rest is reflected. This bandpass property is useful for coarse wavelength division multiplexing (CWDM) where multiple wavelengths are used in a single fiber.

Figure 48:
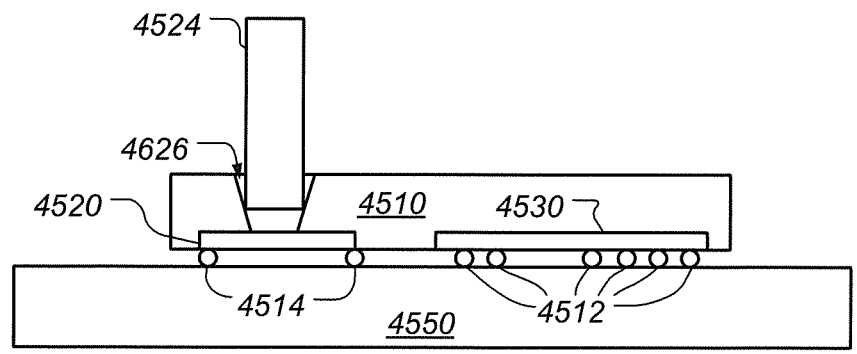
FIG. 48 is a diagram showing some aspects of a flip chip arrangement for a MS-PD/APD integrated with a TIA and/or other signal processing IC on a single silicon chip, according to some other embodiments.

FIG. 48 is a diagram showing some aspects of a flip chip arrangement for a MS-PD/APD integrated with a TIA and/or another signal processing IC on a single silicon chip, according to some other embodiments. The chip and mounting techniques are similar or identical to those depicted in and described with respect to FIGS. 45-47. The walls of via 4626 may be coated with dielectric and/or metal to provide a light pipe for the light to impinge on the MS-PD/APD 4520. The optical fiber 4524 can then be inserted into the via 4626 such that it provides a guide to align the fiber 4524 to the MS-PD/APD 4520 thereby simplifying the optical packing and alignment of the optical fiber to the MS-PD/APD with a cost reduction of approximately 30% or greater. According to some embodiments, the fiber 4524 may be also be tapered and/or the via 4626 may have multiple diameters such that it provides a stop for the fiber 4524. For example, a step in the via 4626 is provided such that the edge of the fiber 4524 can rest on the step, where it can be attached to the silicon. This step arrangement also provides a precise distance between the fiber and the MS-PD/APD for optimal light collection. According to some embodiments, index matching fluid, gel and/or polymer and/or dielectric bulk or thin film may be used in the via 4626, particularly in the space between the fiber 4524 and the MS-PD/APD 4520 to optimize the transfer of optical signal from the fiber to the MS-PD/APD.

As mentioned above, with light entering from the substrate side (bottom illumination) the MS-PD/APD may employ a double and/or multiple bounce of the optical signal within the MS-PD/APD. This allows the absorption layer to be made thinner while still achieving high quantum efficiency. The thinner absorption layer will also allow a faster transit time thereby allowing the MS-PD/APD to operate at a higher data rate.

Figure 49:
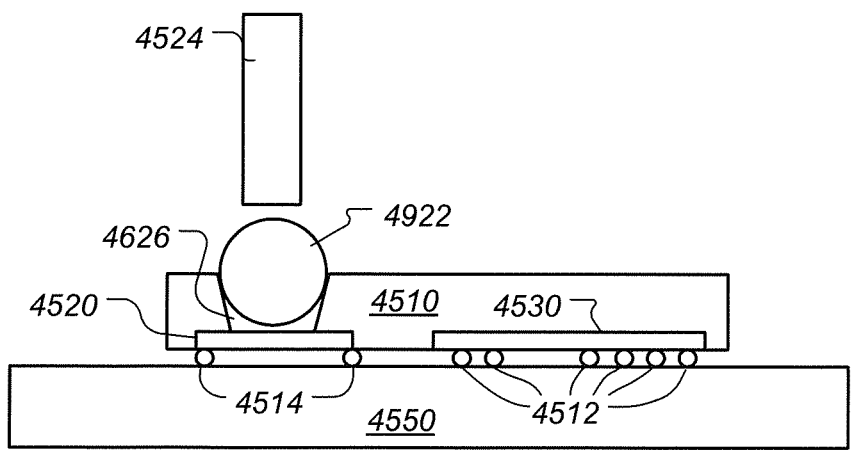
FIG. 49 is a diagram showing some aspects of a flip chip arrangement for a MS-PD/APD integrated with a TIA and/or other signal processing IC on a single silicon chip, according to some other embodiments.

FIG. 49 is a diagram showing some aspects of a flip chip arrangement for a MS-PD/APD integrated with a TIA and/or another signal processing IC on a single silicon chip, according to some other embodiments. The chip and mounting techniques are similar or identical to those depicted in and described with respect to FIGS. 45-48. In this example a ball lens 4922 is positioned within via 4626 to couple light from the optical fiber 4524 to the MS-PD/APD 4520 efficiently. The ball lens 4922 can sit in the via 4626 for alignment of the lens to the MS-PD/APD 4520.

Figure 50:
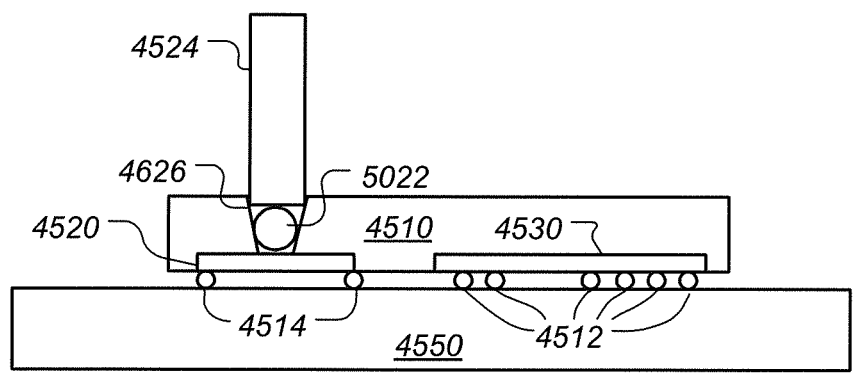
FIG. 50 is a diagram showing some aspects of a flip chip arrangement for a MS-PD/APD integrated with a TIA and/or other signal processing IC on a single silicon chip, according to some other embodiments.

FIG. 50 is a diagram showing some aspects of a flip chip arrangement for a MS-PD/APD integrated with a TIA and/or another signal processing IC on a single silicon chip, according to some other embodiments. The chip and mounting techniques are similar or identical to those depicted in and described with respect to FIGS. 45-49. In this example, the ball lens 5022 sits in the via 4626 where most or all of the silicon is etched away so that light travels mostly in air and/or index matching material such as fluid, gel, polymer, solid. Additionally, the via 4626 acts as a guide and/or a stop for alignment of the optical fiber 4626 to the ball lens 5022 and in turn to the MS-PD/APD 4520.

Figure 51:
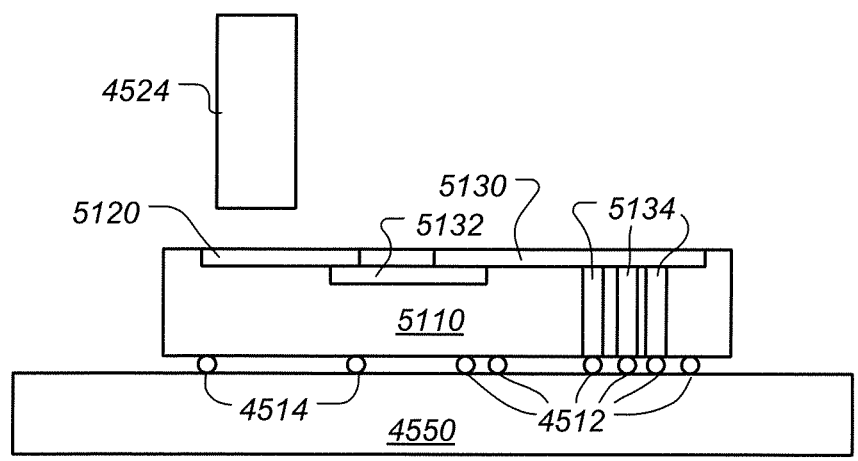
FIG. 51 is a diagram showing some aspects of a flip chip arrangement for a MS-PD/APD integrated with a TIA and/or other signal processing IC on a single silicon chip, according to some other embodiments.

FIG. 51 is a diagram showing some aspects of a flip chip arrangement for a MS-PD/APD integrated with a TIA and/or another signal processing IC on a single silicon chip, according to some other embodiments. The chip and mounting techniques are similar to those depicted in and described with respect to FIGS. 45-50 except that MS-PD/APD 5120 and TIA and/or other signal processing integrated circuits 5130 are mounted on or near the upper surface of silicon chip 5110. The metallic conductor conduits 5132 and 5134 can be made of Al, Cu, Mo, W, Ni, or TiN, to name a few. The conduit 5132 connects the MS-PD/APD 5120 to the IC electronics 5130. Conduit 5134 connects the IC electronics 5130 to traces on the PCB 4550 (or chip carriers) using, e.g., bump technologies, such as solder bumps for example, which allow good alignment of the chip to the PCB and/or chip carrier. According to some embodiments, other methods of using wire bonding may also be employed to connect the IC electronics to traces on the PCB and/or chip carrier. The fiber 4524 is brought to close proximity of the MS-PD/APD 5120 and the arrangement may include a ball lens on the tip of the fiber 4524, and/or a ball lens between the fiber and the MS-PD/APD. Other light focussing elements such as gratings, Fresnel lens, to name a few, may also be used, such as described with respect to FIGS. 45-50. According to some embodiments, light illuminating from the epitaxial surface (top illuminated) may also have a double and/or multiple bounce of the optical signal within the MS-PD/APD 5120 if there is a refractive index discontinuity such as a buried silicon dioxide layer (BOX, buried oxide) as shown in MS-PD/APD structures described above and/or a change in effective index of the microstructure to the refractive index of bulk material. Double and/or multiple bounce of the optical signal within the MS-PD/APD allows for a thinner absorption layer without significantly sacrificing quantum efficiency and short transit time, thereby allowing higher data rate operation of the MS-PD/APD. Double or multiple bounce of light refers to light that is not absorbed in the pass of the MS-PD/APD and is exiting the MS-PD/APD structure; these photons are reflected back toward the MS-PD/

APD structure. Within the microstructure of holes and or pillars, light can also be in a resonance and or coupled resonance state which can result in an enhanced effective absorption coefficient and/or enhanced effective absorption length.

Figure 52:
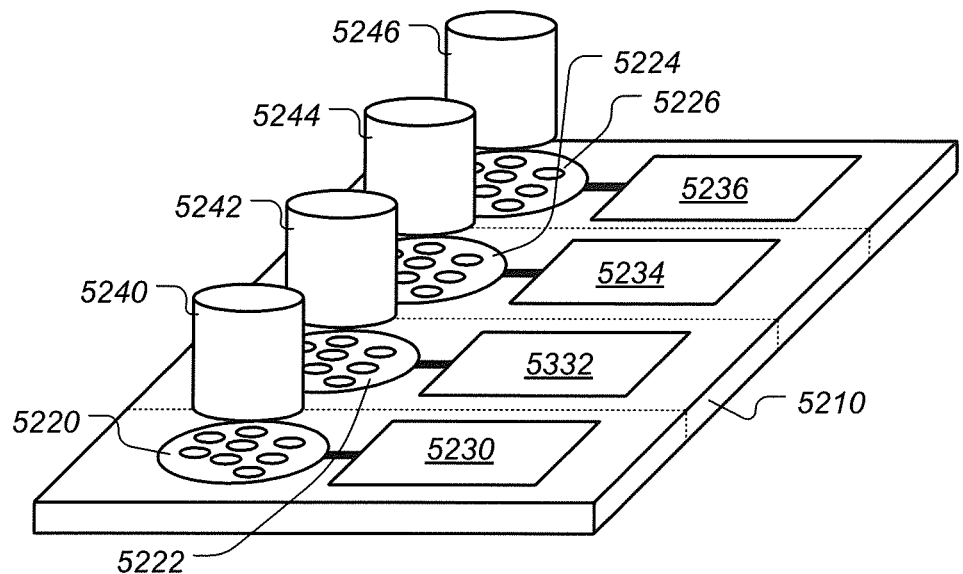
FIG. 52 is a diagram showing an array of MS-PD/APDs integrated with IC electronics such as TIA and/or other signal processing and routing electronics on a single Si chip, according to some embodiments.

FIG. 52 is a diagram showing an array of MS-PD/APDs integrated with IC electronics such as TIA and/or other signal processing and routing electronics on a single Si chip. Arrays can include 2 to over 10 MS-PD/APDs integrated with IC electronics such as TIA and/or ASIC for signal processing, routing, storage, for example. In the example shown, four MS-PD/APDs 5220, 5222, 5224 and 5226 are shown mounted on a single Si chip 5210. The MS-PD/APDs 5220, 5222, 5224 and 5226 are connected to IC electronics 5230, 5232, 5234 and 5236 respectively. According to some embodiments, however, multiple MS-PD/APDs are connected to a single IC electronics unit on the Si chip or multiple IC electronics units are connected to a single MS-PD/APD. The MS-PD/APDs in the array may be identical, for example the microstructure such as hole diameter and period are optimized for the same wavelength, for example 850-870 nm. According to other embodiments, each MS-PD/APD in the array may be optimized for a different band of wavelengths. For example, if there are four MS-PD/APDs in the array, the MS-PD/APDs can be optimized at 850-870 nm, 875-895 nm, 900-920 nm and 920-950 nm respectively (or any combination thereof) by optimizing the hole diameter and periods of each MS-PD/APD. See, e.g., Molin et al, 850-950 nm wideband OM4 multimode fiber for next generation WDM systems, OFC (2015), which is incorporated by reference herein. Data rates of 1, 5, 10, 16, 20, 25, 28, 32, 40, 56 and greater and all ranges in between are possible depending on the standard and protocol and applications for the optical data link. The optical fibers 5240, 5242, 5244 and 5246 may be separate fibers, or can be provided as a parallel fiber ribbon. The optical fibers 5240, 5242, 5244 and 5246 can each carry a single band of wavelength and/or multiple bands of wavelengths for WDM and CWDM to give an aggregated data rate of 100 Gb/s to 1 Tb/s or more. For example, an array of ten MS-PD/APDs with ten fiber channels each at 10 Gb/s give an aggregated data rate of 100 Gb/s. A four MS-PD/APD array with 4 fiber channels each at 25-28 Gb/s gives an aggregated data rate of 100 Gb/s, a two MS-PD/APD array with 2 fiber channels each at 56 Gb/s gives an aggregated data rate of 100+Gb/s. If each fiber channel can carry multiple wavelength bands, for example 850-870 nm and 875-895 nm, and each wavelength band can transmit at 25-28 Gb/s, then a 4 fiber array can effectively have an aggregated data rate of over 200 Gb/s.

Figure 53:
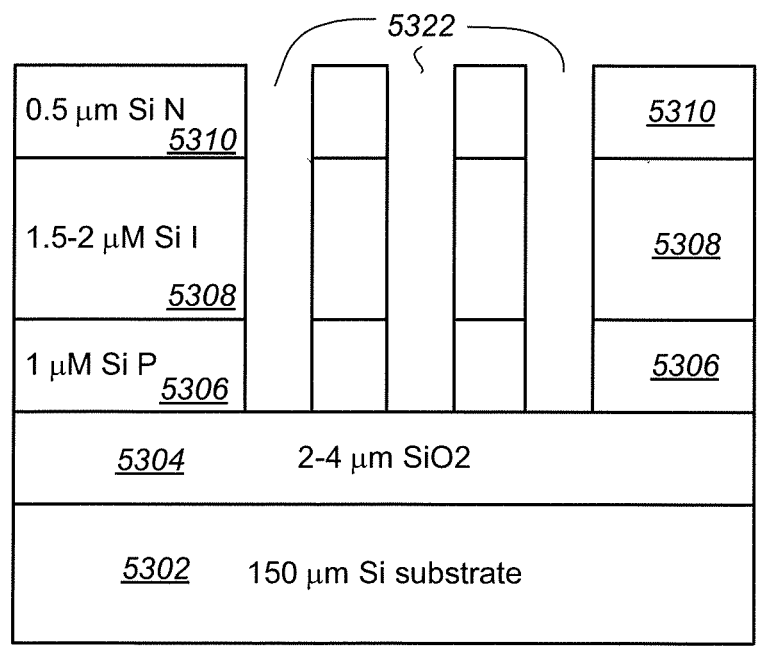
FIG. 53 is a diagram showing an epitaxial structure for a high data rate MS-PD, according to some embodiments.

FIG. 53 is a diagram showing an epitaxial structure for a high data rate MS-PD, according to some embodiments. The structure shown is capable of greater than 10 Gb/s. Holes 5322 are etched to the SiO2 BOX layer 5304 or they can be etched to the P layer 5306 and/or partially etched into the P layer 5306, for example. Doping and thicknesses are as follows: Si substrate 5302 is 150 µm thick; BOX layer 5304 is 2-4 m thick; P+ layer 5306 is 0.2-1 m thick with doping of $>1\times10^{20}/cm^3$; I layer 5308 is 1.5-2 µm thick and not intentionally doped (less than $5\times10^{16}/cm^3$); and N+ layer 5310 is 0.2-0.5 m thick with doping of $>1\times10^{19}/cm^3$. The high doping of the N and P layers 5310 and 5308 reduce the minority carrier lifetime to minimize diffusion current that can result in a slow response of the PD. According to some embodiments, doping as high as $>1\times10^{20}$ and $1\times10^{21}/cm^3$ is used so that minority carrier lifetimes are in the picoseconds and the in-series resistances are reduced.

Figure 54:
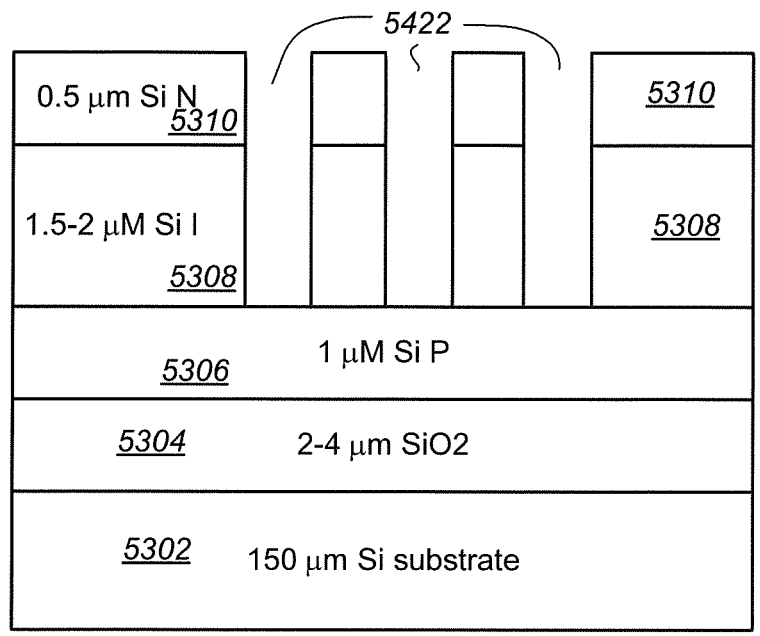
FIG. 54 is a diagram showing an epitaxial structure for a high data rate MS-PD, according to some embodiments.

FIG. 54 is a diagram showing an epitaxial structure for a high data rate MS-PD, according to some embodiments. The structure and doping is similar or identical to those depicted in and described with respect to FIG. 53, except that holes 5422 are etched to the top of the P layer 5306 and/or just into the P layer 5306.

Figure 55:
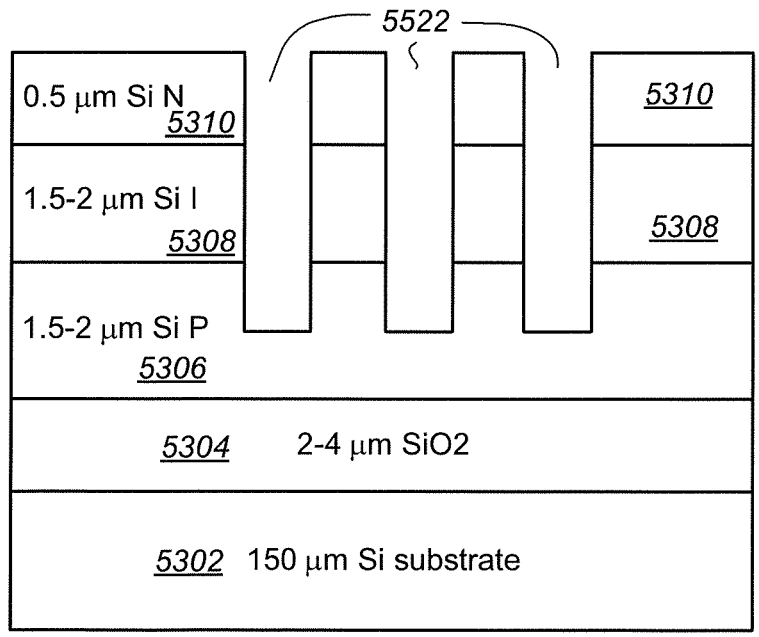
FIG. 55 is a diagram showing an epitaxial structure for a high data rate MS-PD, according to some embodiments.

FIG. 55 is a diagram showing an epitaxial structure for a high data rate MS-PD, according to some embodiments. The structure and doping is similar or identical to those depicted in and described with respect to FIGS. 53 and 54, except that the holes 5522 are etched at least half way into the P layer 5306.

FIG. 56 is a table showing the mesa size, hole diameters, hole period distances, and lattice patterns for MS-PDs, according to some embodiments. In these examples the lattice can be either hexagonal or square. The holes can be circular, oval, polygonal. The holes are 1300 nm in diameter with a period of 2000 nm, 1500 nm in diameter with a period of 2000 nm, 700 nm in diameter with a period of 1000 nm and 630 nm in diameter with a period of 900 nm. The wavelength of operation is from 800-990 nm and the material is Si. A thin passivation layer of SiO2 may be included with thicknesses ranging from 3-100 nm. The mesa size, which in part defines the capacitance of the MS-PD (excluding the bond pads and contact metals), are 5 µm, 10 µm, 20 m, 25 µm, 30 µm, 40 µm, 50 µm and 80 µm, depending on the data rate of the MS-PD. Low capacitance and short transit times result in higher data rate MS-PD.

FIGS. 57A and 57B are diagrams showing hexagonal and square lattice hole patterns, according to some embodiments. FIG. 57A shows a hexagonal lattice pattern and FIG. 57B shows a square pattern where "d" is the period in each case. According to some embodiments, these layouts are used for the example parameters for the MS-PDs shown in FIG. 56.

Figures 58, 59:
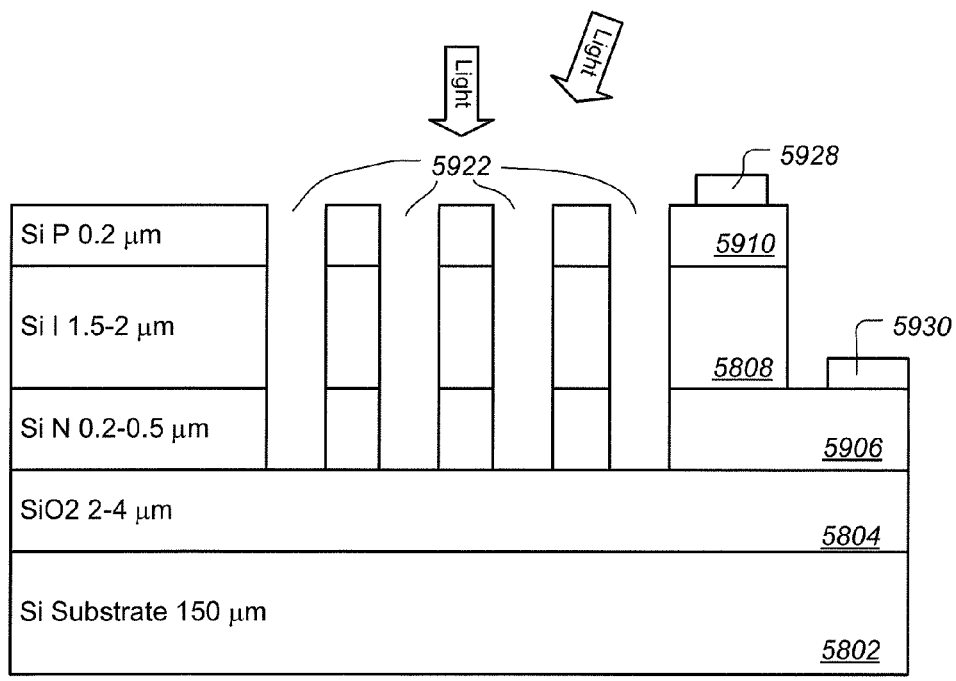
FIG. 58 is a diagram showing an epitaxial layer structure for a silicon MS-PD, according to some embodiments.
FIG. 59 is a diagram showing aspects of a MS-PD, according to some embodiments.

FIG. 58 is a diagram showing an epitaxial layer structure for a silicon MS-PD, according to some embodiments. The structure thickness and doping is as follows: Si substrate 5802 is 150 µm; BOX (buried oxide) layer 5804 is 2-4 um thick; Si P layer 5806 is 0.2-0.5 µm thick and doped to $>2\times10^{20}/cm^3$; Si I layer 5808 is approximately 1.5-2 µm thick and is not intentionally doped (having background doping of less than $5\times10^{16}/cm^3$; Si N layer 5810 is approximately 0.2 µm thick and doped to $>2\times10^{20}/cm^3$. The high doping of the P and N layers can also be $>1\times10^{19}/cm^3$ for example. According to some embodiments, an etch stop layer made of a material such as SiGeB, SiGeC or SiGeBC, with thickness of 5 nm to 50 nm can be included at the interface of P Si 5806 and I Si 5808 to assist in processing during the etching of microstructured holes and/or the mesa. If SiGeB is used which is heavily P doped, a structure is N-I-P may be desirable. The high doping of the P and N regions, in addition to reducing the sheet resistance, also reduces the minority carrier lifetime such that photons absorbed in the P and N region will have minimal contribution to the photocurrent. The reduced minority carrier lifetime in the P and N regions reduces the diffusion of photogenerated carriers to the high field "I" region where the minority carriers are swept to the anode and cathode and contribute to the photocurrent.

FIG. 59 is a diagram showing aspects of a MS-PD, according to some embodiments. The material structure, including thickness and doping is similar or identical to that depicted in and described with respect to FIG. 58. In the case of FIG. 59 the P and N doping in layers 5910 and 5906 are interchanged resulting in a P-I-N arrangement. Note that in either FIG. 58 or 59 the arrangement can be P-I-N or N-I-P.

Holes 5922 are etched to the SiO2 layer 5804, and P and N ohmic contacts 5928 and 5930 are made to the P and N layers 5910 and 5906, respectively. A mesa is etched to define the photosensitive area and to define the capacitance of the PIN structure. Mesa diameters range from 10 μm to 80 μm depending on the data rate the that the MS-PD is designed for (as described with respect to FIG. 56). For 20-40 Gb/s, diameters of the mesa are typically 20-40 μm diameter. The P layer 5910 with 0.2 μm thickness and doping of $>2\times 10^{20}/cm^3$ can have a sheet resistivity of less than 50 ohms approximately, The N layer 5906 with 0.2 μm thickness and doping $>2\times 10^{20}/cm^3$ can give a sheet resistance of less than ohms approximately. The high doping of the P and N layers can also be $>1\times 10^{19}/cm^3$ for example. The thinner P and N layer allow a higher percentage of the optical power to be in the "I" layer and smaller percentage in the P and N layers, thereby maximizing the quantum efficiency of the MS-PD. Passivation, polyimide bridge, bond pads and other processing steps are not shown for simplicity. A reverse bias voltage is applied between the P and N contact to form a high field region in the "I" layer. Voltages typically range from about 2-6 V. In the case shown, illumination is from the top at normal angle or at an angle off normal. Wavelength range from 800-990 nm, but other wavelengths such as 780 nm may also be used. The nominal wavelength is 850 nm, but may also include wavelengths such as 810-830, 830-850, 850-880, 930-960, 960-990.

Figure 60:
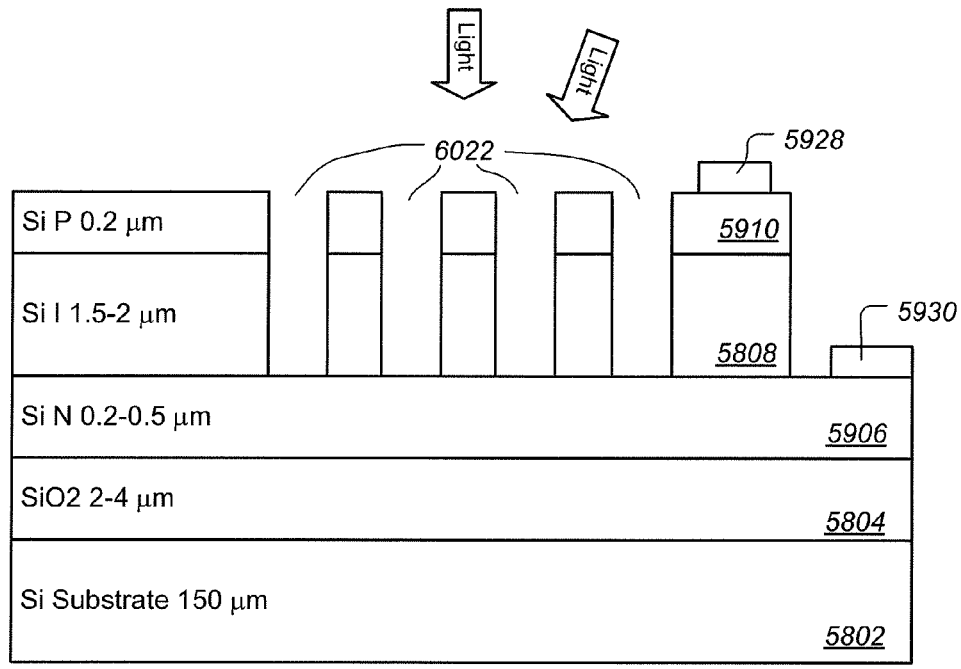
FIG. 60 is a diagram showing aspects of a MS-PD, according to some embodiments.

FIG. 60 is a diagram showing aspects of a MS-PD, according to some embodiments. The MS-PD, including thickness and doping of the material structure, is similar or identical to that depicted in and described with respect to FIGS. 58 and 60. In this case, holes 6022 are etched to and/or into the N layer 5906, but not all the way to the SiO2 layer 5804 as in FIG. 59. Accordingly, there is no enhanced absorption in the N layer, which may result in a higher percentage of the optical power in the "I" layer. This tends to improve the quantum efficiency of the MS-PD. The SiO2 layer 5804 may or may not be necessary.

Figure 61:
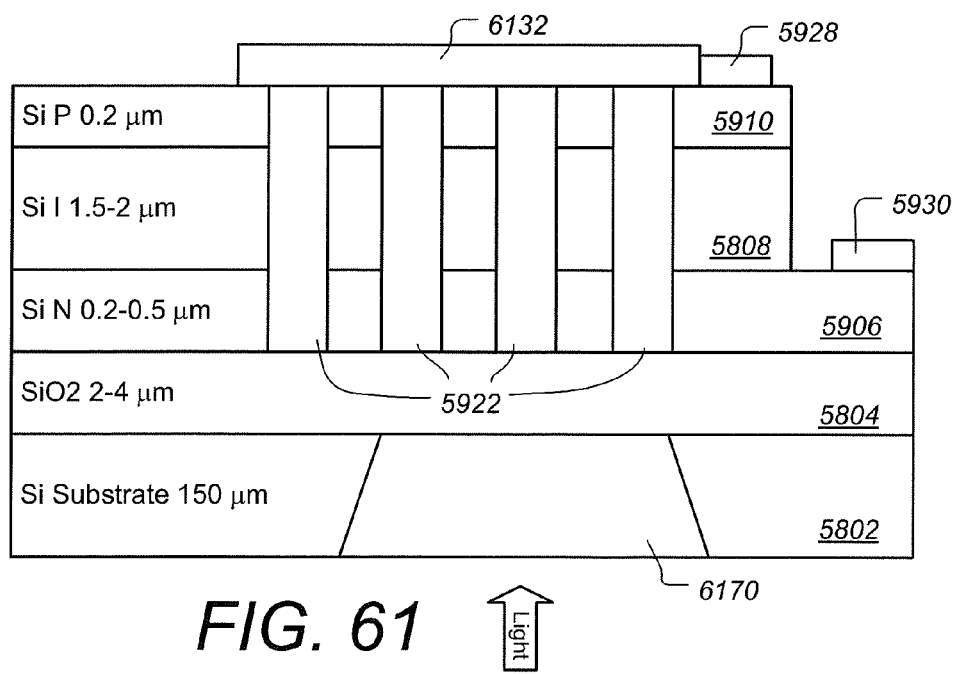
FIG. 61 is a diagram showing aspects of a MS-PD, according to some embodiments.

FIG. 61 is a diagram showing aspects of a MS-PD, according to some embodiments. The MS-PD, including thickness and doping of the material structure, is similar or identical to that depicted in and described with respect to FIGS. 58-61. In this case, the Si MS-PD is illuminated from the substrate side (also referred to herein as backside illuminated or bottom illuminated). A via 6170 is etched to remove the silicon substrate, and is etched to the SiO2 layer 5804 or almost to the SiO2 layer or into the SiO2 layer or through the SiO2 layer. The Si substrate 5802 is removed to minimize optical loss at wavelength ranges from 800-990 nm. A reflector 6132 on the P layer 5910 surface is fabricated that may include a filler process such as polyimide, solid carbon dioxide or spin on glass (SOG) such that the reflector 6132 doesn't short the PIN diode. Note that the reflector 6132 doesn't need to be exactly planar, but may be concave in the regions with holes, which may enhance the trapping of the light waves. The reflector 6132 may be dielectric, Bragg reflectors, conductive transparent metal oxide, metal or alloy such as Ag, Au, or any combination thereof. Indium tin oxide (ITO) may also be used, together with non-conductive dielectrics to form a Bragg reflector. Metal and/or conductive oxide can further reduce the sheet resistance of the P layer 5910, thereby reducing the parasitic resistance and improving the modulated frequency response (data rate) of the MS-PD. According to some embodiments, the "I" layer 5808 can be thinner in the case of back illumination with a reflector since light can transit at least twice and perhaps more times through the "I" layer without degrading the quantum efficiency while at the same time improving the modulated frequency (data rate) response of the MS-PD. This is because with a thinner "I" layer the transit time of the photogenerated carriers is shorter. The frequency response of a photodiode is determined by its capacitance and resistance (RC time) and the transit time. Optical transit time may become important at high enhanced effective absorption length of greater than a factor of 100 or more for certain high data rates for example.

Figures 62, 63:
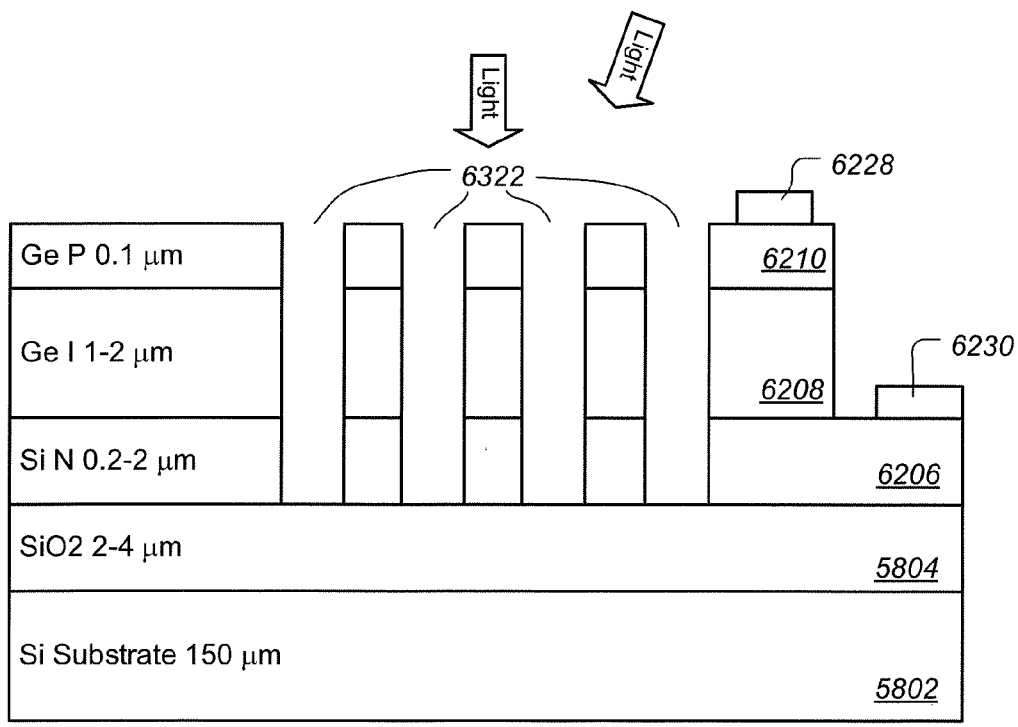
FIG. 62 shows a Ge on Si PIN epitaxial layer structure for a MS-PD, according to some embodiments.
FIGS. 63-65 are diagrams showing aspects of Ge on Si MS-PDs, according to some embodiments.

FIG. 62 shows a Ge on Si PIN epitaxial layer structure for a MS-PD, according to some embodiments. The material structure, including thickness and doping, is similar or identical to that depicted in and described with respect to FIGS. 58-62. In this case, the N Si layer 6206 with doping $>2\times 10^{19}/cm^3$ can have thicknesses of 0.2-2 μm. Also included is a Ge "I" layer 6208 that is not intentionally doped with doping less than $2\times 10^{16}/cm^3$ and with a thickness of 0.5-2 μm. An upper Ge P layer 6210 with doping $>2\times 10^{20}/cm^3$ is formed with a thickness of 0.1-0.2 μm. According to some embodiments, a thin Ge buffer layer (not shown) may be used at the interface of N Si layer 6206 and "I" Ge layer 6208 to initiate good crystal growth of Ge on Si. The high doping of the P and N also reduces the minority carrier lifetime, thereby minimizing the diffusion of photogenerated carriers that can be swept into the high field "I" region that can contribute to the overall photocurrent.

FIG. 63 shows a Ge on Si MS-PD, according to some embodiments. The MS-PD, including thickness and doping of the material structure, is similar or identical to that depicted in and described with respect to FIGS. 58-62. Holes 6322 are etched to the SiO2 layer 5804 or the holes can be etched to the N Si layer 6208 in which case SiO2 layer 5804 may or may not be necessary, and the MS-PD is illuminated from the top or front (the epitaxial surface). The absorption of photons in the wavelength range from 1100 to 1800 nm is mostly in the Ge regions rather than the Si regions. By keeping the P Ge layer 6210 thin, a large percentage of the photons are absorbed in the Ge "I" layer 6208 thereby increasing the quantum efficiency. The high refractive index difference between Ge and Si may require that the holes only be etched to the top of Si N layer 6206. However in this example, the holes 6322 are etched to the SiO2 layer 5804. The N Si layer 6206 can be up to 2 μm thick in this case and doping can be in the range of $>1\times 10^{19}/cm^3$ to give a sheet resistance of less than 50 ohms. For 850 nm operation, or for wavelengths in the range of 800-990 nm, a thin N Si layer can increase the percentage of photons absorbed in the I Ge region. A 0.2 μm thick N Si layer with doping $>2\times 10^{20}/cm^3$ will give a sheet resistance of less than 50 ohms and also reduce the minority carrier lifetime. A thick N Si layer of 2 μm can also be used for the wavelength ranges of 800-990 nm or 800-1800 nm, since for wavelengths in the range of 800-990 nm, Ge absorbs over 90% of the photons over a length of 2 μm. Therefore, less than 5% of the photons reach the N Si layer. At wavelengths of 850 nm less than 1% reach the N Si layer, and at 990 nm less than 3% reach it.

In certain cases, for wavelength ranges 800-990 nm, microstructured holes may not be used predominately for enhancing the absorption, but rather to reduce capacitance with holes partially or fully etched into Ge layer(s). In addition, holes may not be necessary and bulk Ge may be used. According to some embodiments, microstructures can be used to also reduce reflections.

Figure 64:
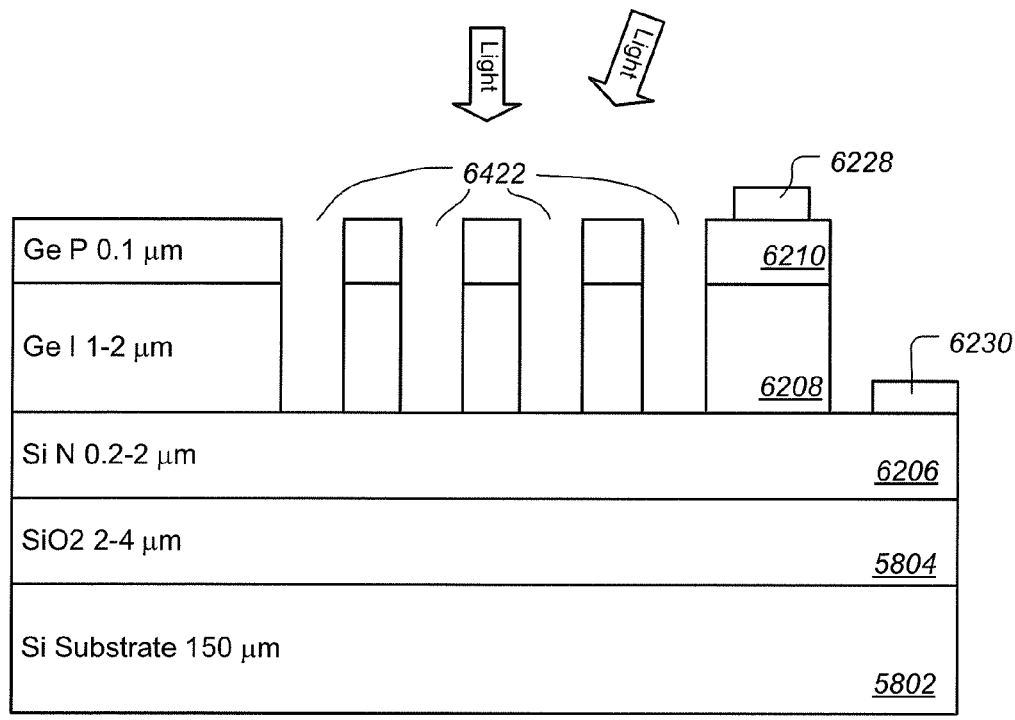

FIG. 64 shows a Ge on Si MS-PD, according to some embodiments. The MS-PD, including thickness and doping of the material structure, is similar or identical to that depicted in and described with respect to FIGS. 58-63. In this case, holes 6422 are etched to the Si layer 6206. The index of refraction for Ge is approximately 4 and the index of refraction for Si is approximately 3.45. This difference in refractive index may provide for sufficient enhanced absorption in the Ge region. In this case, the SiO2 layer 5804 may not be necessary and the MS-PD may be grown on a Si wafer without the BOX layer 5804. For wavelength ranges 1100-1800 nm, Si has acceptably low optical losses and most of the absorption is in the Ge regions. For top illuminated MS-PDs, the P Ge layer can be made thin so that the bulk of the photons are absorbed in the I Ge region, which increases the quantum efficiency. ITO (indium tin oxide) may be use in conjunction with the P Ge layer 6210 to further reduce the sheet resistance of the P layer.

Figure 65:
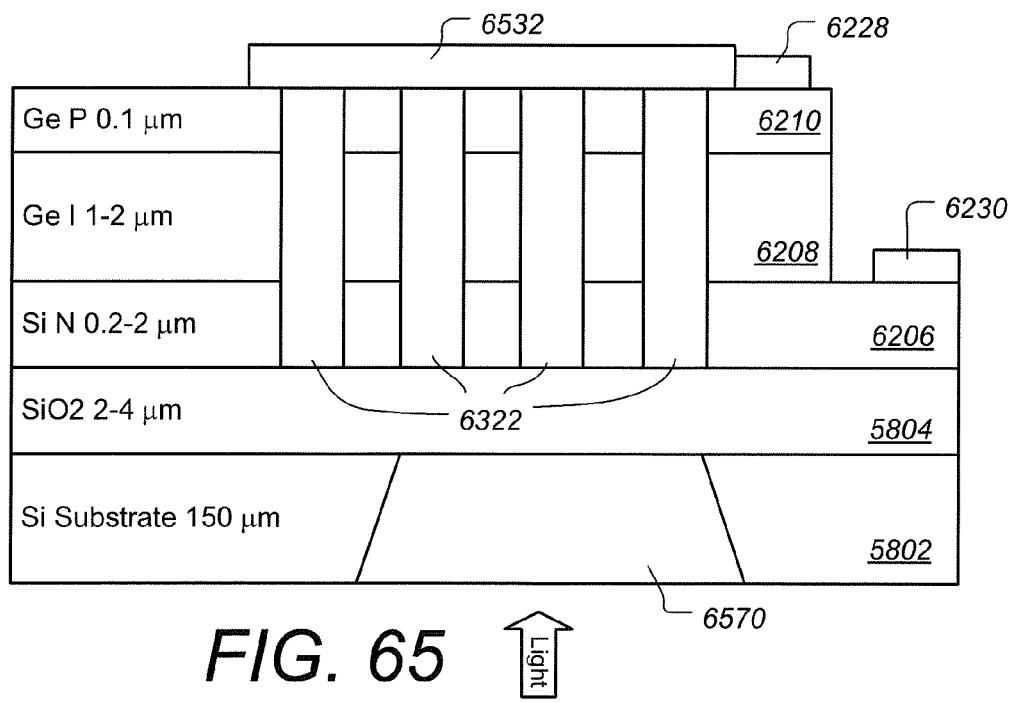

FIG. 65 shows a Ge on Si MS-PD, according to some embodiments. The MS-PD, including thicknesses and doping of the material structure, is similar or identical to that depicted in and described with respect to FIGS. 58-64. In this case, the MS-PD is back or bottom illuminated. This structure is very good for wavelength ranges from 800-1800 nm using a thin N Si layer of 0.2 µm. Less than 3% of the photons with wavelength at 800 nm are absorbed in the N Si layer 6206. Furthermore, in a single pass through 1 µm of Ge, over 85% of 990 nm photons are absorbed. In a double pass over 95% of 990 nm photons are absorbed. In the back illuminated MS-PD where Ge I is grown on N Si, together with a reflector 6532 on the P Ge layer, double and/or multiple passes of the photons allow a thinner I absorbing layer 6208, which reduces the transit time of the photogenerated electrons and holes. A photodiode with higher bandwidth of 40 Gb/s or more is achievable. Holes 6322 can be etched to the SiO2 layer 504 or can be etched to the Si layer 6206 (as shown in FIG. 64). With microstructured hole arrays, enhanced absorbing can occur at wavelengths of 1100-1800 nm. For example at 1550 nm, with double pass through a 1 µm thick bulk Ge, less than 9% is absorbed, whereas with microstructured holes in the Ge layer, absorption of greater than 30% can be achieved and in some cases, greater than 50% absorption can be achieved. In certain cases, absorption in a MS-PD with Ge I layer, greater than 70% can be achieved at 1550 nm for double pass in a 1 µm thick Ge or for a single pass in a 2 µm thick Ge MS-PD.

The MS-PD can have the following layers: Ge (or SiGe) P layer 6210 can be doped to $>2\times10^{20}/cm^3$ with thickness of approximately 0.1 µm, Ge I (absorbing layer) 6208 can be not intentionally duped ($<5\times10^{16}/cm^3$) with a thickness of 0.5-2.0 µm, and finally Si N layer 6206 can be doped to $>2\times10^{19}/cm^3$ with a thicknesses of 0.2-0.5 µm. In addition, during via etch to remove the Si substrate, the SiO2 layer can be left intact, partially etched or etched entirely to remove the SiO2.

Figure 66:
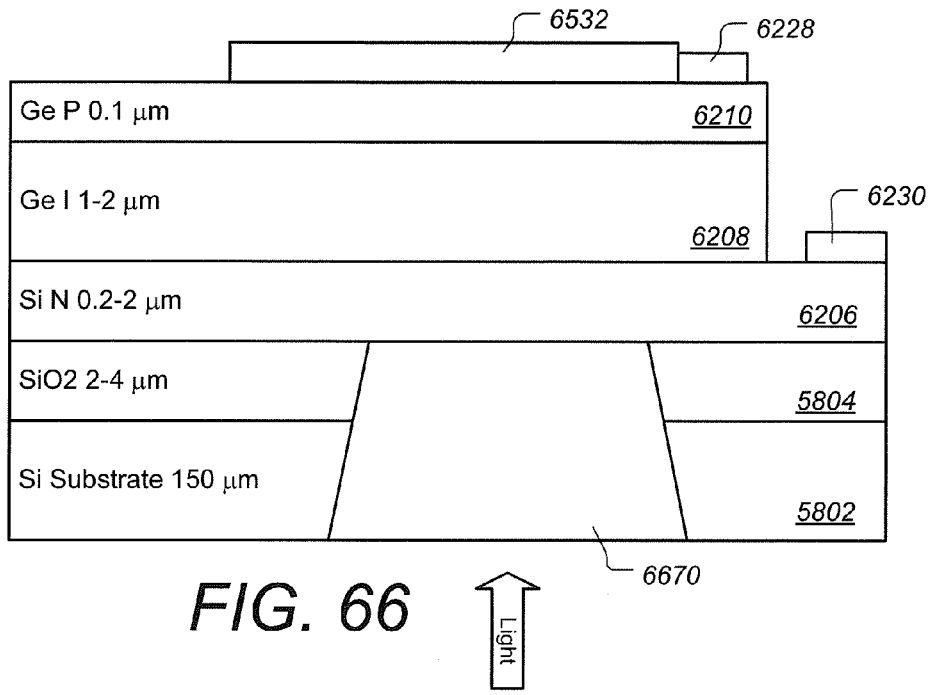
FIGS. 66-67 are diagrams showing aspects of Ge on Si PDs, according to some embodiments.

FIG. 66 is a diagram showing a Ge on Si PD, according to some embodiments. The PD, including thicknesses and doping of the material structure, is similar to that depicted in and described with respect to FIGS. 58-65. FIG. 66 is shown arranged as a flip chip although a front illuminated arrangement is also possible with slight degradation due to the P Ge layer. The PD is similar to the MS-PD shown in FIG. 64 without the microstructured hole arrays. The Ge on Si photodiode with epitaxial structure as shown for operation in the 800-1300 nm takes advantage of double bounce especially for the 1300 nm wavelength region and still maintains high data rate operation. The PD can be integrated with SiGe BiCMOS. According to some embodiments, the SiO2 layer is omitted. With solder bump technology the PD can be flip chip mounted directly on a PCB, as described above for other embodiments, e.g., as shown in FIGS. 44-52. According to some embodiments, the PD can have the following layers: Ge (or SiGe) P layer 6210 doped to $>2\times10^{20}/cm^3$ with a thickness of approximately 0.1 µm, Ge I (absorbing layer) 6208 not intentionally doped ($<5\times10^{16}/cm^3$) with a thickness of 0.5-2.0 µm, and finally Si N layer 6206 doped to $>2\times10^{19}/cm^3$ with a thicknesses of 0.2-0.5 µm. In addition, during the etching of via 6670 to remove the Si substrate, the SiO2 layer 5804 can be left intact (as shown in FIG. 65), etched partially or etched entirely to remove the SiO2 (as shown in FIG. 66). An antireflection layer (not shown) can be applied to the Si N layer to minimize reflection in the case the SiO2 layer is completely etched off.

Figure 67:
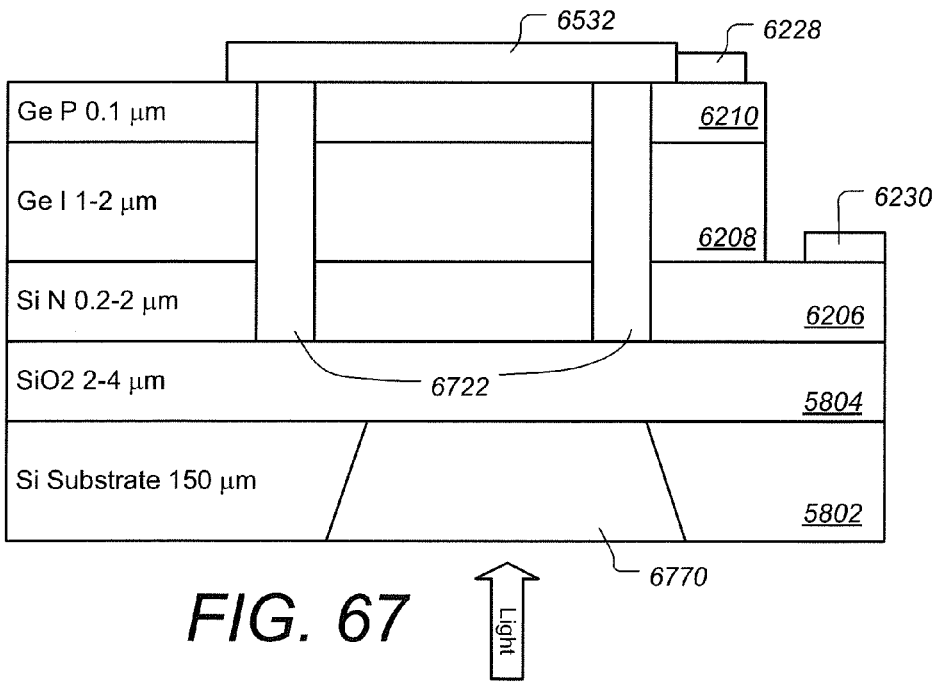

FIG. 67 is a diagram showing a Ge on Si PD, according to some embodiments. The PD, including thicknesses and doping of the material structure, is similar to that depicted in and described with respect to FIGS. 58-66. In this case voids 6722 are formed to reduce the device PIN junction capacitance. The voids 6722 can be partially etched into the Ge layers to remove a sufficient amount of material to reduce the capacitance by a certain amount. The capacitance reduction allows for a larger area PD while maintaining the same data rate bandwidth as a similar Ge on Si PD but without the voids. The larger area PD allows for greater tolerance in misalignment of the optical fiber and/or light source to the photodiode, thereby reducing packaging costs. Data rate bandwidth is determined by the RC time and the transit time. Integration of this structure as with all the structures discussed are possible with electronics such as TIA, which together with solder bump technology, can be directly attached to PCB. According to some embodiments, the wavelength of operation for this structure range from 800-1300 nm and with data rate in excess of 40 Gb/s.

Note that a BOX structures does need not be used. The PD can have the following layers: Ge P layer 6210 doped to $>2\times10^{20}/cm^3$ with a thickness of approximately 0.1 µm; Ge I (absorbing layer) 6208 that is not intentionally doped ($<5\times10^{16}/cm^3$) with a thickness of 0.5-1.0 µm; and finally Si N layer 6206 doped to $>2\times10^{19}/cm^3$ with a thicknesses of 0.2-0.5 µm; and a buried oxide layer 5804 of 2-4 µm.

Figure 68:
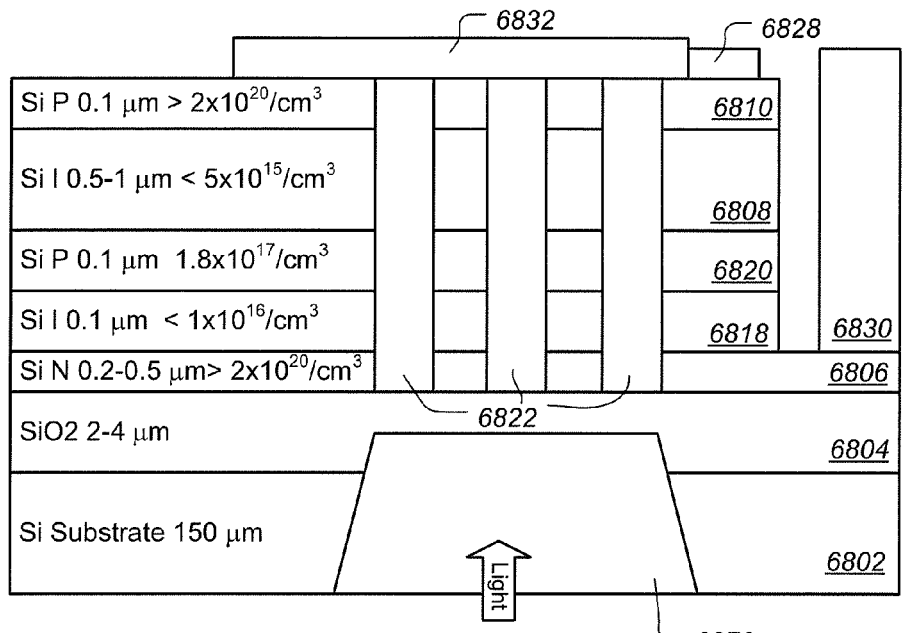
FIGS. 68-69 are diagrams showing aspects of MS-APDs, according to some embodiments.

FIG. 68 is a diagram showing aspects of a microstructured avalanche photodiode (MS-APD), according to some embodiments. The MS-APD can have the following layers: Si P layer 6810 P doped to $>2\times10^{19}/cm^3$ with a thickness of approximately 0.1-0.2 µm; Si I (absorbing layer) 6808 that is not intentionally doped ($<5\times10^{15}/cm^3$) with a thickness of 0.5-2.0 µm; Si N layer 6806 n doped to $>2\times10^{19}/cm^3$ with a thicknesses of 0.2-0.5 µm; and a buried oxide layer 6804 with thickness of 2-4 µm on an Si substrate 6802. The MS-APD device has two additional layers, a charge layer and a multiplication layer. The charge layer 6820 is right below the absorbing I layer 6808. The Si P charge layer 6820 is doped to about $1.8\times10^{17}/cm^3$ and has a thickness of approximately 0.1 µm. Directly below the charge layer is the multiplication layer 6818 of the MS-APD. Si I layer 6818 is not intentionally doped ($<1\times10^{16}/cm^3$) and has a thickness of approximately 0.5 µm. A via 6870 is etched in the silicon substrate to the SiO2 layer (an antireflection coating can be applied to minimize reflection) and light with wavelength ranging from 800-990 nm is applied through the via. A reflector 6832 on the top surface of the MS-APD provides a double/multiple pass of the photons through the absorbing "I" layer 6808. An advantage is a thinner absorbing layer, which results in a shorter transit time. The MS-APD data rate bandwidth is therefore enhanced. Microstructured hole arrays 6822 are etched to the SiO2 layer 6804 and/or almost to the SiO2 layer. P and N contacts 6828 and 6830 are shown on the same surface for solder bumps to be applied so that the MS-APD can be flip chip mounted directly on a ceramic multi chip carrier and/or on a printed circuit board. Only the most basic processing steps are shown for simplicity. Additional steps or elements such as passivation, bond pads, polyimide/spin on glass planarization, antireflection coatings, are not shown. In addition, during etching of via 6870, after removal of the Si substrate, the SiO2 layer can be partially etched or etched away entirely for either MS-APD or MS-PD structures. Without the reflector 6832, optical signal can also impinge from the top surface.

Figure 69:
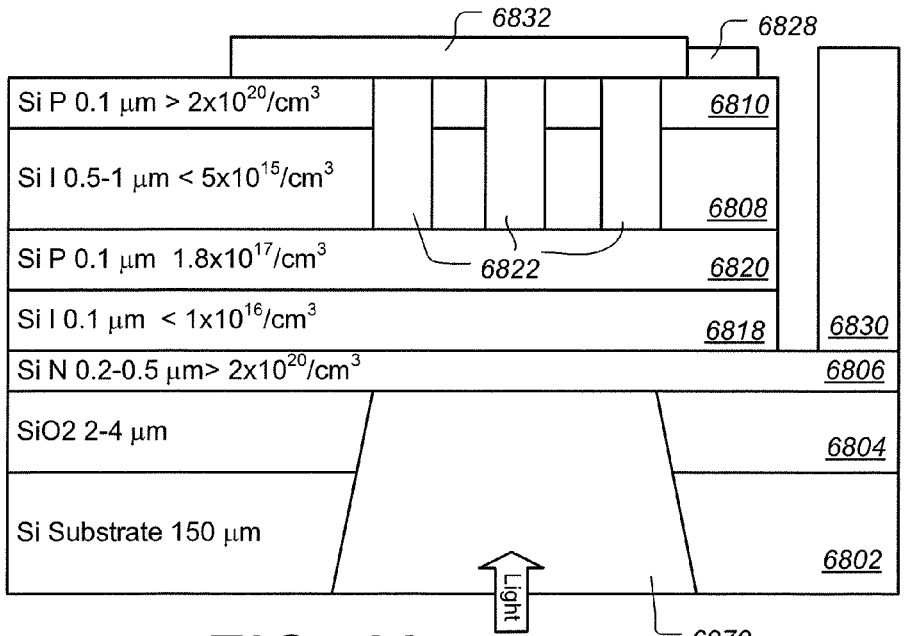

FIG. 69 is a diagram showing aspects of a microstructured avalanche photodiode (MS-APD), according to some embodiments. The MS-APD, including thicknesses and doping of the material structure, is similar to that depicted in and described with respect to FIG. 68. The microstructured hole array 6922 is etched to the charge layer 6820, multiplication layer 6818 and/or the N layer 6806 of the APD structure. The holes 6922 are not etched all the way to the SiO2 layer. Light is illuminated through the via 6970 where the silicon substrate is removed to the SiO2. The SiO2 layer can also be etched so that light is impinging directly on the N Si layer 6806. This can be applicable for all bottom illuminated MS-PD and MS-APD devices where an antireflection coating can be applied directly to Si. For wavelengths ranging from 800-990 nm, a thin N Si layer 6806 of 0.2 µm approximately is preferred to reduce absorbing in the regions away from the absorbing "I" layer 6808. Light can also impinge from the top/front surface where the reflector 6832 is removed. In such cases, a via might be omitted and the Si "I" layer may be increased to 1.5-2 µm for quantum efficiency >30%. In some cases the quantum efficiency is >50%, in some cases >70%, and in some cases >80%. The multiplication factor or gain of the avalanche can be >2. In some cases the gain is >5. In some other cases it is >10. In some further cases it is >15, and in yet some other cases the gain is >20. The data rate bandwidth can be >10 Gb/s. In some cases the bandwidth is >15 Gb/s. In some cases it is >20 Gb/s. In some cases the bandwidth is >25 Gb/s and in some cases >30 Gb/s. In addition, the SiO2 layer can be removed entirely, partially and/or it can have voids which are or are not filled with Si, for MS-PD and MS-APD, and an etch stop layer such as SiGeB, SiGeC or SiGeBC can be used during the removal of the Si substrate for formation of a via used for back/bottom illumination.

Figure 70:
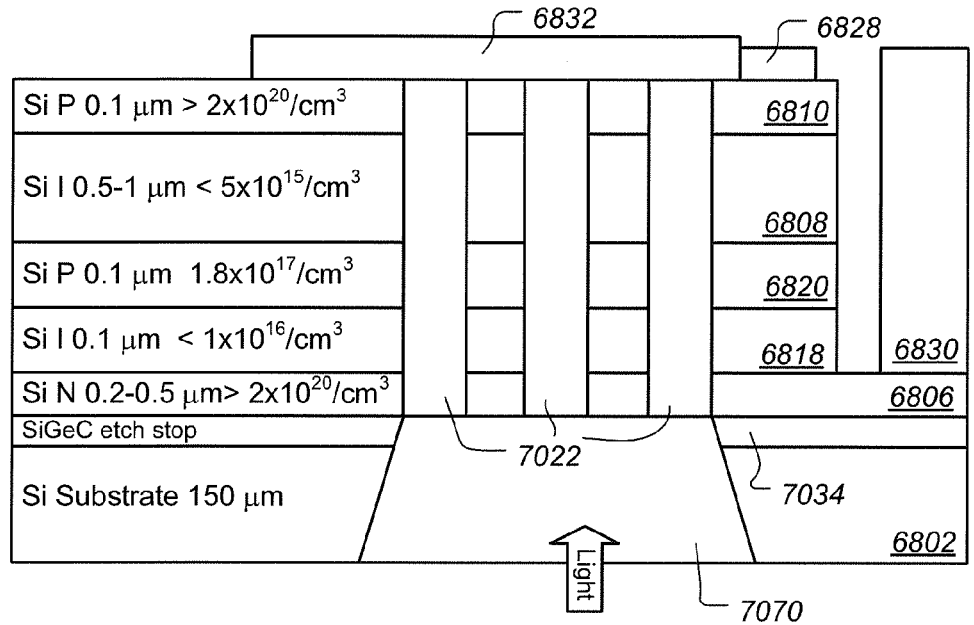
FIG. 70 is a diagram showing a MS-APD without the SiO2 layer, according to some embodiments.

FIG. 70 is a diagram showing a MS-APD without the SiO2 layer, according to some embodiments. The MS-APD, including thicknesses and doping of the material structure, is similar to that depicted in and described with respect to FIGS. 68-69. An etch stop layer 7034 of SiGe or SiGeC or SiGeB (where the SiGe has about 1% Ge and heavily doped with boron to >1×10$^{20}$/cm$^3$) and a thickness ranging from 0.1 to 2 µm. SiGeBC can be grown on the Si substrate 6802 and/or on Si epitaxial layer(s) such as N Si layer 6806. According to some embodiments, the MS-APD has the following thickness and doping levels: Si N layer 6806 has a thickness ranging from 0.2 to 1 µm and doping ranging from >2×10$^{19}$/cm$^3$ to >2×10$^{20}$/cm$^3$; Si I multiplication layer 6818 is not intentionally doped (<1×10$^{16}$/cm$^3$) and has a thickness of approximately 0.5 µm; Si P charge layer 6820 doped to about 1.8×10$^{17}$/cm$^3$ and a thickness of approximately 0.1 µm; Si I absorption layer 6808 is not intentionally doped (<5×10$^{15}$/cm$^3$) with a thickness of 0.5-1.0 µm; and Si P capping layer 6810 doped to >2×10$^{20}$/cm$^3$ with a thickness of approximately 0.1 µm. According to some embodiments, multiple etch stop layers can be used. For example, another etch stop layer can be formed at the interface of the Si I multiplication layer 6818 and the Si N layer 6806. Thickness of the etch stop layer can range from 1 nm to 100 nm, and can be doped P or N, or not intentionally doped to match the adjacent layer electrical characteristics. Wavelengths of the optical signal can range from 800 to 990 nm and if illuminated from the backside, a reflector can be formed of a dielectric such as SiO2/Ag. According to some embodiments, the reflector 6832 is a Bragg reflector consisting of two dielectrics with different indices such as SiO2 and HfO2, or ITO together with Ag, Au, and/or Pt. Reflector 6832 is used to reflect any un-absorbed signal photons for double and/or multiple pass through the absorbing Si I region 6808. In addition, the device can be front illuminated where the reflector 6832 is omitted and the absorbing Si I layer 6808 thickened to 1.5-2 µm for optimizing the quantum efficiency. According to some embodiments, a via can also be included in the front/top illuminated MS-APD. Similarly, a MS-PD can also be use this structure with the Si P charge and Si I multiplication layers omitted. A front and back illuminated MS-PD can be beneficial since the removal of the Si substrate improves the refractive index contrast and has improved absorption efficiency in the microstructure, which in turn improves the quantum efficiency.

The high dopings of the P and N layers are to both reduce the sheet resistivity and to reduce the lifetime of the minority carriers in the P and N layers to reduce diffusion of minority carriers into the high field Si I absorption layer that can cause degradation in the data rate response (also referred to as the frequency response) of the MS-PD/APD. The microstructured hole array can be etched to the SiGeC and/or SiGeB stop layer and/or past the stop layer either during the hole etch and/or during the via etch. The etch stop layer can also be entirely or partially removed after the hole etch or during the via etch. In this way, the SiGeC, SiGeBC or SiGeB layer is not in the optical path for a back illuminated MS-PD/APD. Note that in SiGeB where Ge is about 1% (e.g. Si$_{0.99}$Ge$_{0.01}$) the bandgap is approximately that of Si. In addition, as in FIG. 69, the microstructured hole arrays can be etched to a depth that corresponds to the absorbing Si I layer and/or to a depth that is greater than the Si I absorbing layer and partially into the avalanche region.

Figure 71:
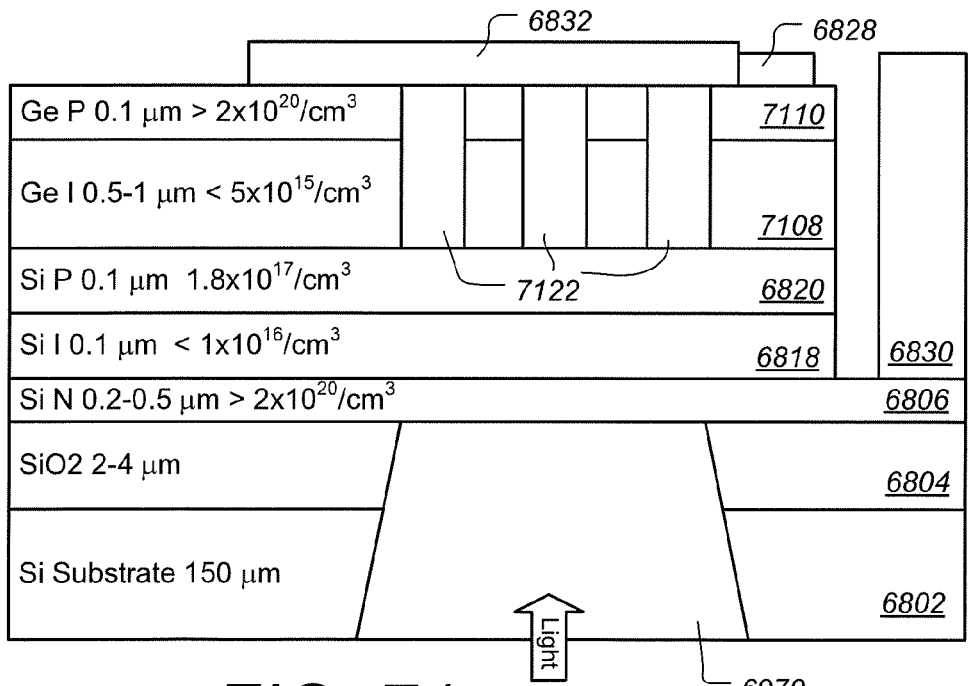
FIGS. 71-72 are diagrams showing Ge on Si microstructured avalanche photodiodes (MS-APDs), according to some embodiments.

FIG. 71 is a diagram showing a Ge on Si microstructured avalanche photodiode (MS-APD), according to some embodiments. The MS-APD, including thicknesses and doping of the material structure, is similar to that depicted in and described with respect to FIGS. 68-70. A Ge I absorption layer 7108 is not intentionally doped (<5×10$^{15}$/cm$^3$) and has a thickness of 0.5-2.0 µm. An upper Ge P capping layer 7110 is doped to >2×10$^{20}$/cm$^3$ with a thickness of approximately 0.1 µm. Microstructured hole array 7122 is etched to the Si P charge layer 6820 or just before the Si P layer. Alternatively, the holes 7122 can be etched into the Si P charge layer 6820 and/or into the Si multiplication layer 6818. A via 6970 is etched, removing the Si substrate from the optical path. The SiO2 layer can be left intact, partially etched or etched through entirely or a N Si substrate without SiO2 can be used. Antireflection layer (not shown) can be applied to the Si N layer 6806, if exposed, to minimize reflection. Wavelength ranges can be 800-1800 nm, 1300-1600 nm, 810-880 nm, and 930-990 nm, for example. Hole dimensions and period can be optimized for certain wavelength ranges. A reflector 6832 can be formed on the P Ge or SiGe layer 7110. The reflector 6832 can be made of dielectric and metal, ITO (indium tin oxide or similar transparent conducting oxides) and metal, all dielectric such as a Bragg reflector, or any combination thereof. The reflector 6832 reflects photons that are not absorbed on the first pass back toward the absorber Ge I layer 7108 for a double or multiple pass. A thinner Ge I absorbing layer 7108 can be used as compared to photodiodes with a single pass. The thinner Ge I layer results in shorter transit times and therefore higher data rates. The growth of Ge on Si may use a Ge buffer layer, which is grown to initiate high quality crystalline growth of Ge. See, e.g. Kang et al, Epitaxially-grown Ge/Si avalanche photodiodes for 1.3Ë m light detection, Vol. 16, No. 13/OPTICS EXPRESS 9365 (2008) (hereinafter "Kang et al") which is incorporated herein by reference. For wavelength ranges 1200-1750 nm, the via 7270 is not necessary as Si is mostly transparent at those wavelengths. In addition, without the reflector 6832, optical signal can impinge from the top surface and the Ge "I" layer 7108 can be increased in thickness to approximately 2 microns.

Figure 72:
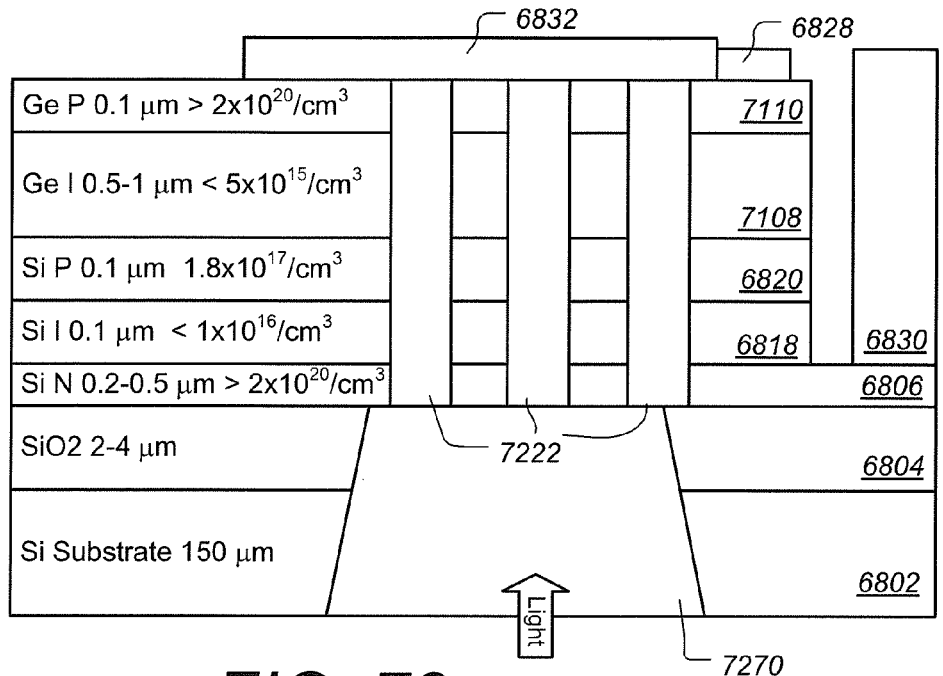

FIG. 72 is a diagram showing a Ge on Si microstructured avalanche photodiode (MS-APD), according to some embodiments. The MS-APD, including thicknesses and doping of the material structure, is similar to that depicted in and described with respect to FIGS. 68-71. In this case, the microstructure hole array 7222 is etched to the SiO2 layer 6804. According to some embodiments the holes 7222 are etched to within a few tenths of a micrometer of SiO2 layer 6804 and the via 7270 is etched to the SiO2 layer. The SiO2 layer can remain whole, be partially-etched, or can be etched through entirely during the via etch. The light impinging from the backside has wavelengths ranging from 800-1800 nm. Other wavelengths may also be used such as 630-780 nm, for example. Some photo generated carriers can occur in the Si layers, but the bulk of the photo generated carriers will be in the Ge I layer 7108, especially in the wavelength range of 800-1800 nm and in particular in the wavelength ranges of 1100-1800 nm. The epitaxial structure is similar to that shown in FIG. 71 as is the reflector 6832 on the Ge P layer for reflecting the light back toward the Ge I absorbing layer. The removal of the SiO2 layer allows for a high reflective index contrast between the microstructured semiconductor holes, which can improve the light gathering properties of the microstructured hole array and the air. Also, reflections are removed that could occur at the SiO2-air interface and SiO2-semiconductor interface. For a front illuminated MS-APD, the reflector 6832 is removed and the Ge I absorbing layer 7108 is thickened to the range of 1-2 μm. The via and SiO2 removal can be implemented for front side illuminated MS-APD. By removing the avalanche layers, P charge and I multiplication the MS-APD becomes a MS-PD.

Figure 73:
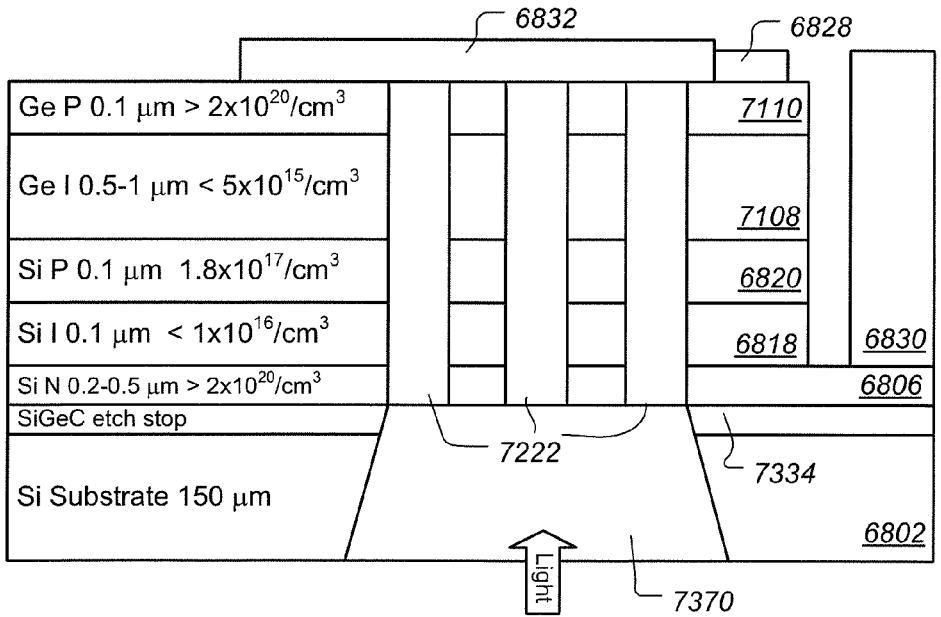
FIG. 73 is a diagram showing a Ge on Si microstructured avalanche photodiode (MS-APD) with an etch stop layer, according to some embodiments.

FIG. 73 is a diagram showing a Ge on Si microstructured avalanche photodiode (MS-APD) with an etch stop layer, according to some embodiments. The MS-APD, including thickness and doping of the material structure, is similar to that depicted in and described with respect to FIGS. 68-72. An etch stop layer 7334 such as SiGe, SiGeC, SiGeB or SiGeBC is grown on the Si wafer. Note that the Si substrate (wafer) 6802 may already have layers, such as an N Si epitaxial layer, subsequent APD layers, other buffer layers, spacer layers, or other etch stop layers on it (not shown) which promote good crystalline growth and processing reproducibility. The basic APD layers are: a Si N layer 6806 of thickness ranging from 0.2 to 0.5 μm with doping ranging from >$2 \times 10^{19}$/cm$^3$ to >$2 \times 10^{20}$/cm$^3$; Si I multiplication layer 6818 not intentionally doped and with a thickness of approximately 0.5 μm; Si P charge layer 6820, doped to about $1.8 \times 10^{17}$/cm$^3$ and having a thickness of approximately 0.1 μm; Ge I absorption layer 7108, which is not intentionally doped has a thickness of 0.5-1.0 μm; and Ge or SiGe P capping layer 7110 doped to >$2 \times 10^{20}$/cm$^3$ and having a thickness of approximately 0.1 μm. Microstructured hole arrays are etched with hole diameters and periods that are optimized for specific wavelength ranges. Specific wavelength ranges include the following: 800-860, 860-880, 880-920, 920-990, 990-1100, 1100-1350, 1350-1450, 1450-1550, 1550-1650, and 1650-1800 nm. Hole and mesa passivations are not mentioned for simplicity, but examples can be found in Kang et al. Other passivation methods exist in the literature. Light impinges from the backside, through a via 7370 where the etch stop layer can be removed. Light can also impinge from the front side, but with the absorption Ge I layer 7108 thickness increased to the range of 1-2 μm approximately. For front side illuminated MS-APD/PD, the via can also be implemented to increase reflective index contrast between the semiconductor microstructure and air for example. Other layers such as planarization layers, bridging layers, bond pads, and fillers are also not shown for simplicity.

Figure 74:
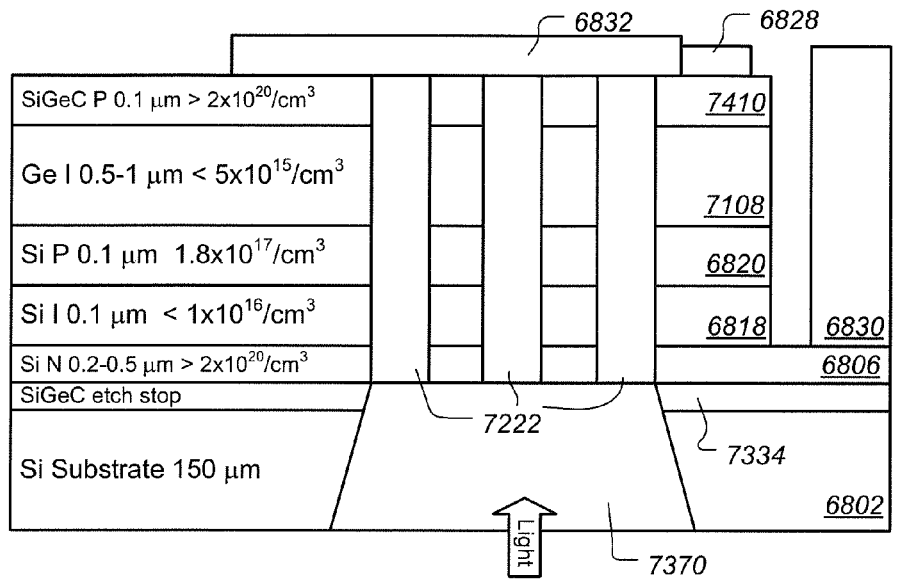
FIG. 74 is a diagram showing a Ge on Si microstructured avalanche photodiode (MS-APD), according to some embodiments.

FIG. 74 is a diagram showing a Ge on Si microstructured avalanche photodiode (MS-APD), according to some embodiments. The MS-APD, including thicknesses and doping of the material structure, is similar to that depicted in and described with respect to FIGS. 68-73, except that with the Ge P layer replaced with SiGe or SiGeC P layer 7410 to reduce absorption of photocarriers in the P contact layer. SiGe and/or SiGeC have a larger bandgap than Ge and therefore the absorption coefficient is smaller than in Ge for the same thickness. See e.g. Kolodzey et al, 'Optical and electronic properties of SiGeC alloys grown on Si substrates', Journal of Crystal Growth 157, 386-391 (1995) (hereinafter "Kolodzey, et al.") which is incorporated herein by reference. For example, from Kolodzey et al., with SiGe$_{0.88}$C$_{0.12}$, the band gap is 1.3 eV (direct) as compared to Si of 1.11 eV and 0.66 eV for Ge. SiGe alloy will give a bandgap between that of Si and Ge, therefore any addition of Si to Ge will increase the bandgap and reduce absorption in the P layer. According to some embodiments, this P layer replacement technique is applied to all the MS-PD/APD structures shown and described herein. In particular, a Ge P layer is replaced with SiGe P and/or SiGeC P layers. According to some further embodiments, in all MS-PD/APD structures shown and described herein, the Si P and N layers can also be fully or partially replaced with SiBeC P and SiGeC N which reduces absorption of the optical signal in the P and N regions of the MS-PD/APD. In some cases, the multiplication region of the APD, which is Si can also be replaced with SiGeC I to reduce absorption of the optical photons in this invention. At certain wavelengths 1200-1750 nm, Si is mostly transparent and either or both of a via 7370 and an etch stop layer 7334 are not necessary. In this case a N Si substrate is used with the back surface polished and antireflection coated.

Figure 75:
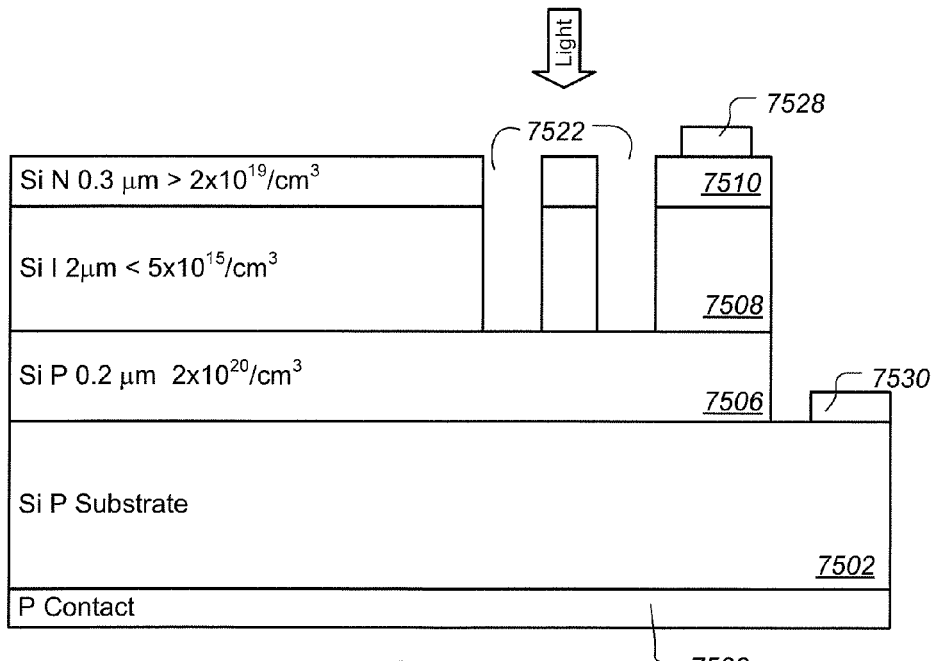
FIG. 75 is a diagram showing another SI NIP epitaxial layer structure for a MS-PD, according to some embodiments.

FIG. 75 is a diagram showing another SI NIP epitaxial layer structure for a MS-PD, according to some embodiments. The holes 7522 are etched to a depth of approximately 2.3 μm and can terminate a few tenths of a micron before and/or after the Si P layer 7506. Doping and thicknesses are approximately as follows: Si P substrate 7502; a Si P layer 7506 of 0.2 μm (or a range of 0.1-1 μm) with a P doping >$2 \times 10^{20}$/cm$^3$ that can also be >$1 \times 10^{19}$/cm$^3$; Si I layer 7508 that is not intentionally doped with background doping <$5 \times 10^{16}$/cm$^3$ and in some cases <$5 \times 10^{15}$/cm$^3$ with a thickness of about 2 or in the range of 1-2.5 μm; N Si layer 7510 with doping of >$2 \times 10^{19}$/cm$^3$ with a thickness of about 0.3 μm or in the range of 0.2-0.5 μm. N contact 7528 is on the Si N layer 7150. The P contact(s) can be on the upper surface of the Si P substrate as in contact 7530 and/or on the bottom/backside of the substrate as in contact 7532. A mesa etch is used to define the PIN junction area and therefore the capacitance. Mesa is etched to the P layer 7506 and/or to the P substrate 7502 and the P contact 7530 can be deposited on the Si P layer 7506 and/or on the Si P substrate 7502 back side 7532. According to some embodiments, other electrical isolation can be used also such as proton bombardment to define the PIN area or other doping techniques such as PN junction doping, or trench doping. Light in this structure impinges from the front side with wavelength ranges from 800-990 nm approximately. Hole diameters of 1300 nm with a period of 2000 nm, and hole diameters of 1500 nm and period of 2000 nm can be used with either a hexagonal and/or square lattice pattern. According to some embodiments, the range of hole diameters is from 600 nm to 1500 nm approximately and the range of periods is from 900 to 2500 nm approximately.

Figure 76A:
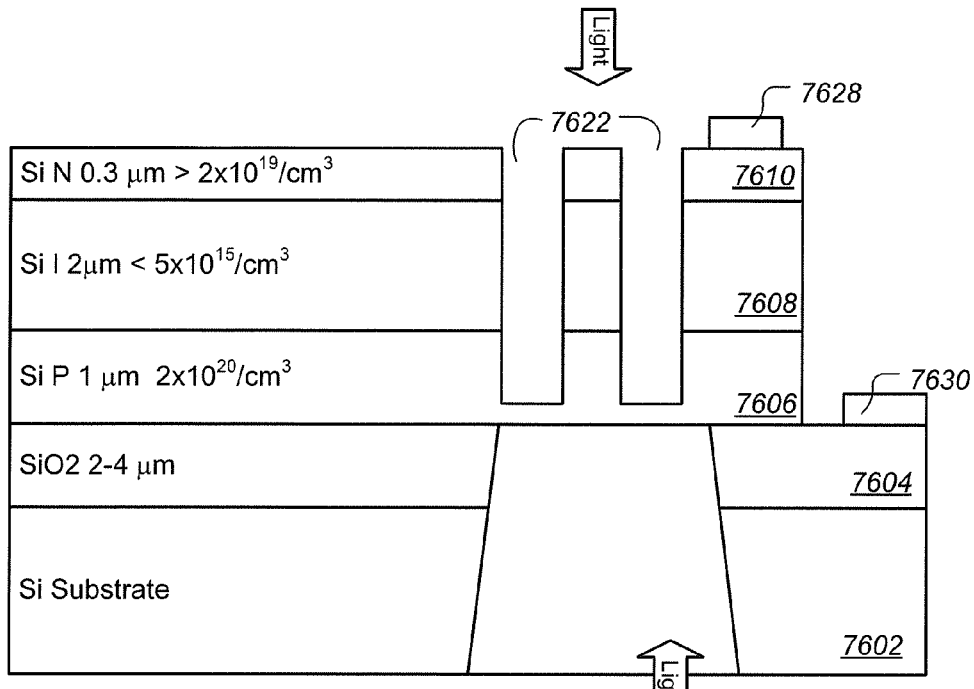
FIGS. 76A-C are diagrams showing Si N-I-P epitaxial layers on buried oxide for a MS-PD, according to some embodiments.
Figure 76B:
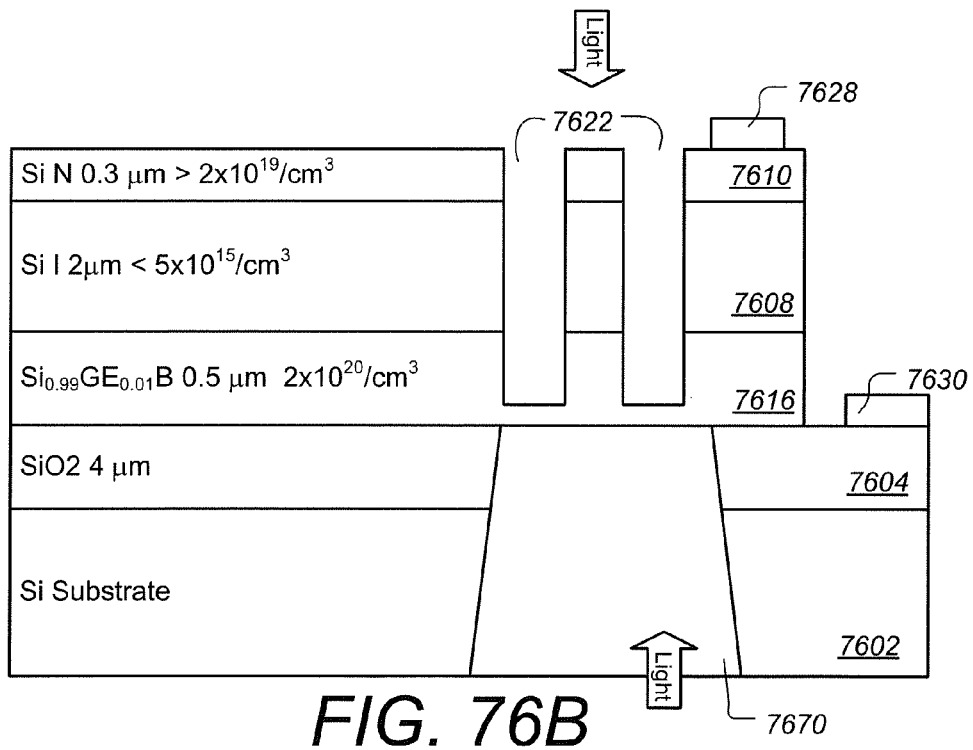
Figure 76C:
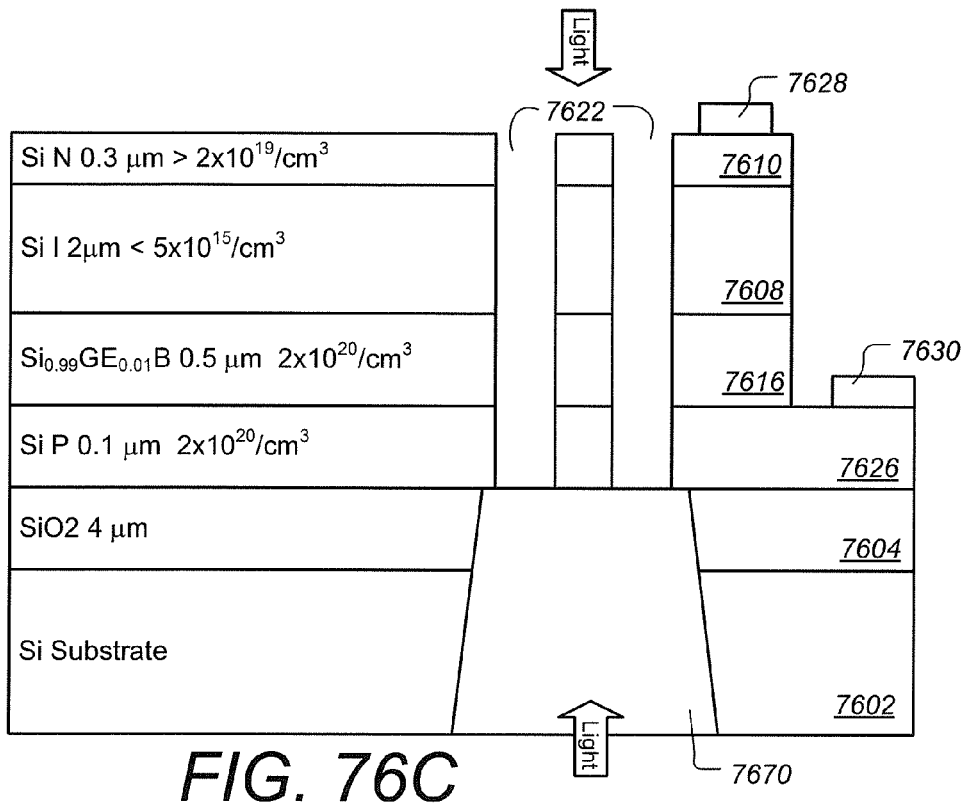

FIGS. 76A-76C are diagrams showing Si N-I-P epitaxial layers on buried oxide for a MS-PD, according to some embodiments. In FIG. 76A, the holes 7622 are etched to the Si P layer 7606, partially into the Si P layer and/or to the SiO2 layer 7604. Doping and thicknesses are approximately as follows: Si BOX (buried oxide) 7604 in substrate 7602; Si P layer 7606 of 1 µm (or a range of 0.1-1 µm) with a P doping $>2\times10^{20}/cm^3$; Si I layer 7608 that is not intentionally doped with background doping $<5\times10^{16}/cm^3$ and in some cases $<5\times10^{15}/cm^3$ and with thickness of 2 µm or a range from 0.5-2.5 µm; and N Si layer 7610 with doping of $>2\times10^{19}/cm^3$ and with thickness of 0.3 µm or a range from 0.2-0.5 µm for example. N and P contacts 7628 and 7630 can be on the front side, where P contact is made after a mesa etch to the P layer 7606. An etch stop layer, such as SiGeB or SiGeC, can be used at the interface between the P layer 7606 and I layer 7608. The I layer 7608 can be thin, 0.5-1 µm, for example, if the light impinges from the backside and a reflector is placed on the top surface Si N layer 7610 such that light can have multiple passes through the I layer 7608. The P and N can be interchanged and the microstructured photodiode (MS-PD) can be PIN, for example. If SiGeB is used as an etch stop layer, the SiGeB is heavily P type and the NIP structure is preferred. The etch stop layer can be 0.05 to 1 µm thick for example and may replace in whole or in part the Si P layer. Light can impinge either from the front side and/or from the backside with proper device or epitaxial layer modifications. Wavelength ranges are 800-990 nm approximately.

In FIG. 76B, the P Si 7606 layer in FIG. 76A is replaced by a $Si_{0.99}Ge_{0.01}B$ layer 7616 with P doping $>2\times10^{20}/cm^3$ and a thickness of 0.5 µm or a range of thicknesses from 0.2-1 µm. All other layers are as in FIG. 76A. The microstructured holes 7622 are etched and can stop at the SiGeB layer and/or pass through the SiGeB layer and stop at the SiO2 layer and/or go into the SiO2 layer. A via 7670 can be etched that stops at the SiO2 layer, or stops into or goes through the SiO2 layer. N and P ohmic contacts 7628 and 7630 are formed on the Si N layer and SiGeB P layer respectively. Light can impinge either from the top surface (the epi surface) and/or the bottom surface (the substrate surface), and reflectors can be placed on either the top or bottom with a dielectric spacer layer, for a multiple pass through the I absorbing layer. Wavelength ranges from 800 to 1000 nm. Not shown for simplicity are other elements such as passivation layers, polyimide bridge layers, mesas, bond metals.

In FIG. 76C, a P Si layer 7626 of approximately 0.1 µm thick and with doping greater than $1\times10^{20}/cm^3$ is added as the first layer on the SiO2 7604 onto which $Si_{0.99}Ge_{0.01}B$ layer 7616 is grown with P doping greater than $1\times10^{20}/cm^3$ and with a thickness of approximately 0.3 µm. As in FIGS. 76A and 76B, light can impinge from the top and/or bottom surfaces where a via is etched. N and P ohmic contacts are placed on the N and P layers, respectively. Microstructured hole array 7622 is etched through to the SiO2 layer 7604 and/or etched partially into the P layer 7626. If light is impinging from the bottom, a via 7670 is etched into the silicon substrate 7602 and into the SiO2 layer 7604, which can be partially or entirely etched. A reverse bias voltage is applied between the P and N contact of 1-10 volts.

In some applications, light can impinge from the top and bottom of a MS-PD/APD simultaneously. The light can have same or different wavelengths, data rates, polarization, and amplitude for coherent optical communications. An advantage of having light coming from both top and bottom is that the use of a beam splitter is not necessary and can save 3 dB in optical power loss.

Figure 77:
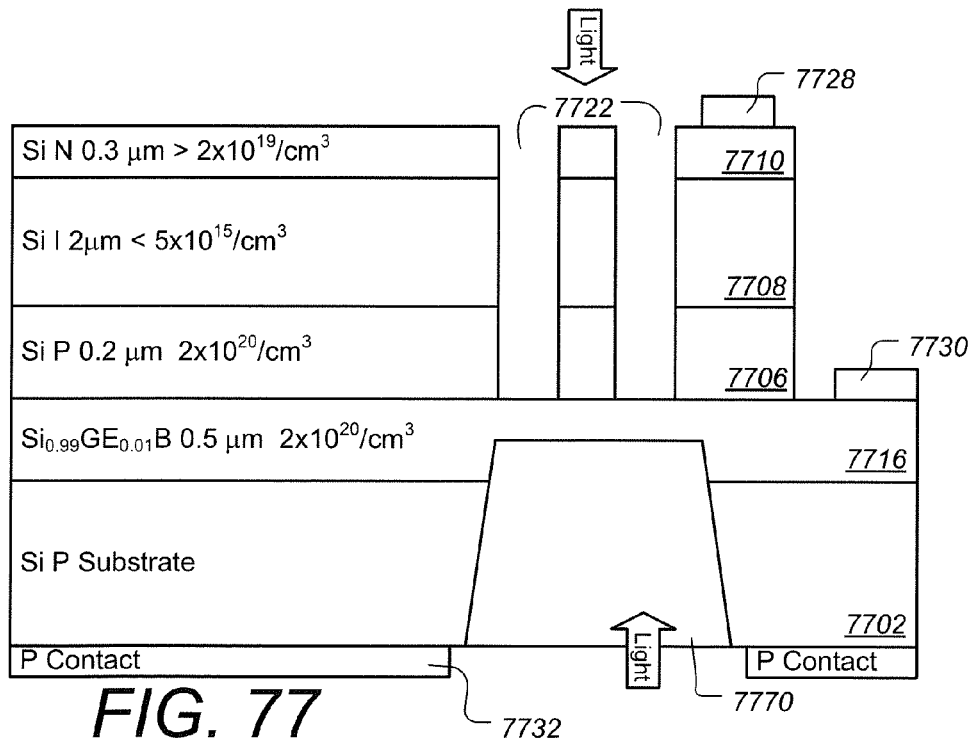
FIG. 77 is a diagram showing a MS-PD with Si NIP epitaxial layer and a SiGeB stop etch layer on a P Si substrate, according to some embodiments.

FIG. 77 is a diagram showing a MS-PD with Si NIP epitaxial layer and a SiGeB stop etch layer on a P Si substrate, according to some embodiments. The stop etch layer 7716 can consist of $Si_{0.99}Ge_{0.01}B$ or approximately 1% Ge in SiGe where the bandgap is substantially same as Si and with B doping of $>1\times10^{20}/cm^3$. This heavy P doping may partially or wholly replace the Si P layer 7706. The layers and thickness can be as follows: Si P substrate 7702; SiGeB layer 7716 of 0.1-2 µm thickness; Si P layer 7706 of 0.2 µm (or a range of 0.1-1 µm) with a P doping $>2\times10^{20}/cm^3$; Si I layer 7708 that is not intentionally doped with background doping $<5\times10^{16}/cm^3$ and in some cases $<5\times10^{15}/cm^3$ with a thickness of 2 µm or in the range of 0.5-2.5 µm; and N Si layer 7710 with doping of $>2\times10^{19}/cm^3$ with a thickness of 0.3 µm or in the range of 0.2-0.5 µm. N and P contacts 7728 and 7730 can be both on the front side. The P contact can also be on the backside on the P Si substrate as in contact 7732. Microstructured hole array 7722 can be etched to the stop etch layer 7716 of SiGeB. A mesa is etched into the Si P and/or to the SiGeB layer to define the NIP area and therefore the NIP capacitance. P contact 7730 can be placed on the P Si layer 7706 or the P SiGeB layer 7716. N contact 7728 is placed on the Si N layer 7710. A via 7770 can be etched to remove the Si substrate to the SiGeB layer and/or partially into the SiGeB layer using a etch process different for the Si and SiGeB. SiGeB layer 7716 can also be etched away and the via 7770 extended to the Si P layer 7706. In addition, the Si P layer 7706 can be partially or entirely replaced by the SiGeB layer. In such cases, it is preferred that at least 0.2 to 0.3 µm of SiGeB layer remain. Light can impinge from the front and/or backside. A dielectric metal reflector where the dielectric is in contact with the semiconductor with a thickness of 0.5-4 µm can be provided, where the dielectric can be SOG, polyimide, SiO2, calcium fluoride, or silicon nitride, followed by metal or alloy such as Ag, Au, Al, or Ni on either the front or back side. For example, if the dielectric metal reflector is placed on the backside, light from the frontside can be reflected multiple times through the absorbing I layer and conversely if the reflector is placed on the front side, light from the backside can be reflected multiple times through the absorbing I layer. With a reflector, a thinner I layer can be used, for example 1 µm or about half the thickness of a MS-PD without a reflector, which can result in higher data rate for the MS-PD. Wavelength ranges from 800-990 nm can be used with the MS-PD. In some cases, the reflector can simply be a metal, such as a Bragg mirror. In addition, the via 7770 may not be necessary if light is only impinging from the front surface and double and or multiple reflections are not implemented.

Figure 78:
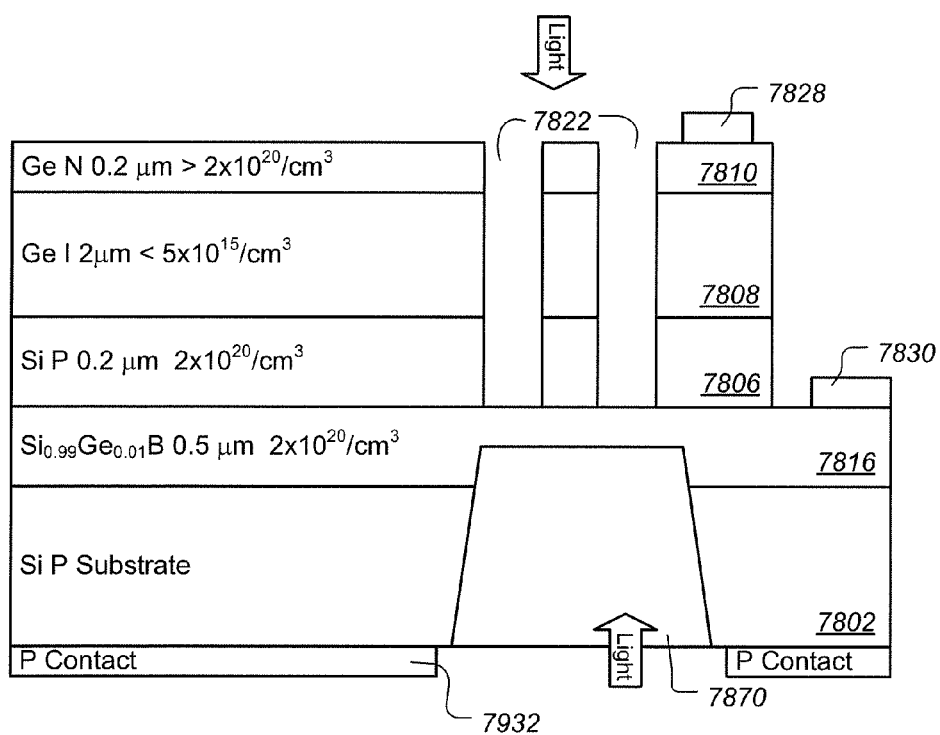
FIG. 78 is a diagram showing a Ge on Si NIP on SiGeB epitaxial layer structure for MS-PD, according to some embodiments.

FIG. 78 is a diagram showing a Ge on Si NIP on SiGeB epitaxial layer structure for MS-PD, according to some embodiments. The microstructured hole array 7822 is etched in the Ge layers 7810 and 7808 and into or up to the Si P layer 7806. The stop etch layer 7816 can consist of $Si_{0.99}Ge_{0.01}B$ or approximately 1% Ge in SiGe where the bandgap is substantially same as Si and with B doping of $>1\times10^{20}/cm^3$. This heavy P doping may partially or wholly replace the Si P layer 7806. The layers and thickness can be as follows: Si P substrate 7802; SiGeB layer 7816 having 0.1-2 µm thickness; Si P layer 7806 of 0.2 µm (or a range of 0.1-1 µm) with a P doping $>1\times10^{19}/cm^3$; Ge I layer 7808 that is not intentionally doped with background doping $<5\times10^{16}/cm^3$ and in some cases $<5\times10^{15}/cm^3$ and with a thickness of 2 µm or a range from 0.5-2.5 µm; and N Ge layer 7810 with doping of $>2\times10^{19}/cm^3$ and with a thickness of 0.2 µm or in the range from 0.2-0.5 µm. N and P contacts 7828 and 7830 can both be on the front side. The P contact can also be on the backside on the P Si substrate, as in contact 7832. A Ge buffer layer of a few nm may be grown between the Si and Ge layer and where the growth condition of the Ge buffer layer is different from the growth condition of the Ge I layer. A via 7870 can be etched in the Si substrate 7802 to remove the Si to the SiGeB layer 7816. With a different etch condition, the SiGeB layer 7816 can be partially and/or wholly etched. Light can impinge from either the front or back side and with a reflector, photons can make multiple passes through the I absorbing layer and the device can use a thinner I layer for higher data rate operation since the photogenerated carriers of electrons and holes transit time will be shorter. The wavelength range is from 800 to 1800 nm. Hole diameters and array periods can be optimized for certain wavelength ranges spanning 30-100 nm approximately. The via 7870 may not be necessary if the optical signal is impinging from the front/top surface. In addition, if the optical signal has wavelengths in the range of 1200-1750, vias may not be necessary for bottom illumination since silicon at these wavelengths is mostly transparent or causes very low optical loss.

Figure 79:
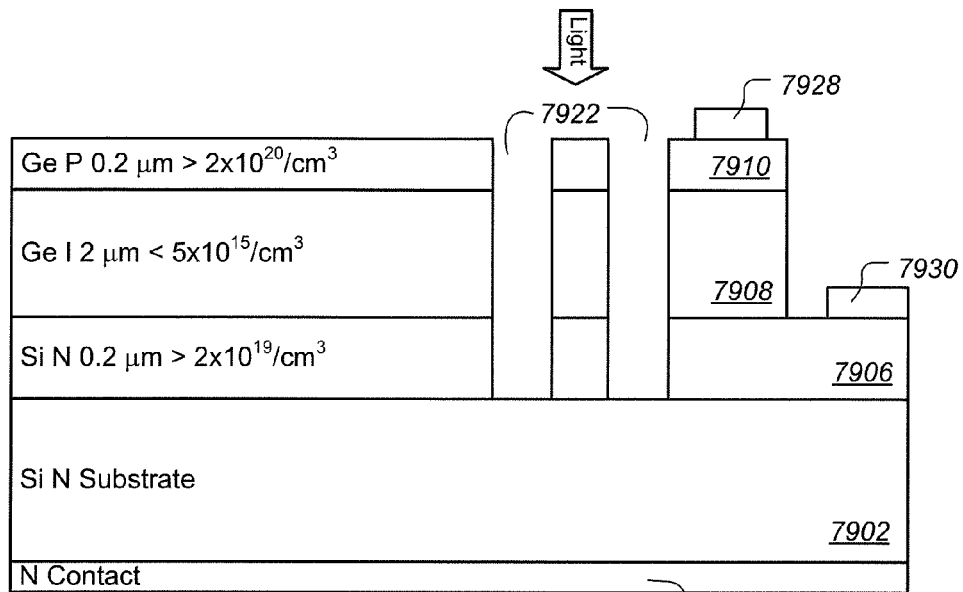
FIG. 79 is diagram showing a Ge on Si epitaxial structure for MS-PD, according to some embodiments.

FIG. 79 is a diagram showing Ge on Si epitaxial structure for MS-PD, according to some embodiments. The material structure is as follows: Si N substrate 7902 (or alternatively a NIP structure on P Si substrate); Si N layer 7906 of 0.2 µm (or a range of 0.1-1 µm) with a N doping $>2\times10^{19}/cm^3$; Ge I layer 7908 that is not intentionally doped with background doping $<5\times10^{16}/cm^3$ and in some cases $<5\times10^{15}/cm^3$ with a thickness of 2 µm or a thickness range from 0.5-2.5 µm; and P Ge layer 7910 with doping of $>2\times10^{20}/cm^3$ and with thickness of 0.2 µm or in the range of 0.2-0.5 µm. P and N contacts 7928 and 7930 can both be on the front side. The N contact can also be on the backside on the N Si substrate as with N contact 7932. Microstructured hole array 7922 is etched to, etched partially into, or etched through the N Si layer 7906. A mesa etch defines the PIN area and capacitance. N contacts 7930 and 7932 are deposited after the mesa etch, either on the front surface or the back surface on the N Si substrate. Passivations are not shown, but using Kang et al., where amorphous Si can be deposited on the sidewalls of exposed Ge surfaces and annealed at a high temperature, and/or SiGe can be deposited on the sidewalls of exposed Ge and annealed to reduce leakage current. Mesa diameters in the MS-PD and MS-APD can range from 5 µm to 100 µm depending on data rates. According to some embodiments, the mesa diameter range is 20-40 µm for data rates of 30 Gb/s. In addition, a buffer Ge layer between the N Si 7906 and I Ge 7908 may be used to assure high crystalline quality. See, e.g. Kang et al. With light impinging from the front side, the wavelength can range from 800-1800 nm. In a preferred range, the wavelength can be from 1450-1600 nm, and in another preferred range, from 1250-1600 nm for example. The MS-PD/APD can cover both datacom wavelengths and telecom wavelengths.

Figure 80:
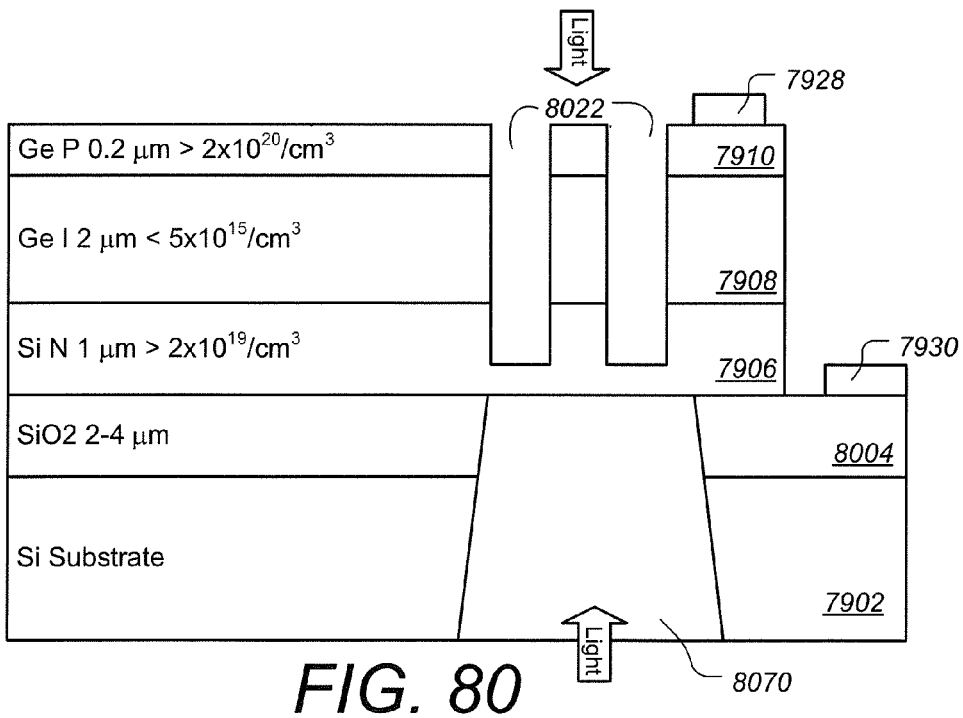
FIG. 80 is a diagram showing another Ge on Si epitaxial structure, according to some embodiments.

FIG. 80 is a diagram showing another Ge on Si epitaxial structure, according to some embodiments. The MS-PD, including thicknesses and doping of the material structure, is similar or identical to that depicted in and described with respect to FIG. 79, except that it is grown on a Si BOX wafer with a buried oxide layer 8004 thickness of 0.2 to 4 µm. Microstructured hole array 8022 is etched to the N Si layer 7906 and may etch into or up to the N Si layer 7906 or to the SiO2 layer 8004. A mesa etch defines the PIN capacitance and mesa diameters for the MS-PD/MS-APD range from 5-100 µm depending on the data rate bandwidth of the MS-PD/APD. A 20-50 µm mesa diameter is preferred for data rate bandwidth of 20-35 Gb/s. Light can impinge from the front surface or the back surface. At wavelengths of >1100 nm Si optical losses are very low and the Si substrate can be used to etch a lens, or grating for example. A via 8070 can be etched to remove the SiO2 entirely or partially. The via 8070 can be used to guide the light and/or fiber to the MS-PD for example. A reflector can be deposited in the via 8070 where the SiO2 is not removed entirely or not removed at all such that light from the front side can bounce off the reflector and traverse the I Ge absorbing region 7908 multiple times. With a reflector either on the front side or back side, the I Ge 7908 can be thinner for example 1 µm, which will decrease the electron hole transit time and increase the data rate bandwidth of the MS-PD/MS-APD. Wavelengths can range can be 800-1800 nm, covering both datacom and telecom wavelength ranges. With a continuous N Si layer 7906, an antireflection coating can be applied to the bottom surface of the N Si if the SiO2 is etched entirely, for example.

Figure 81:
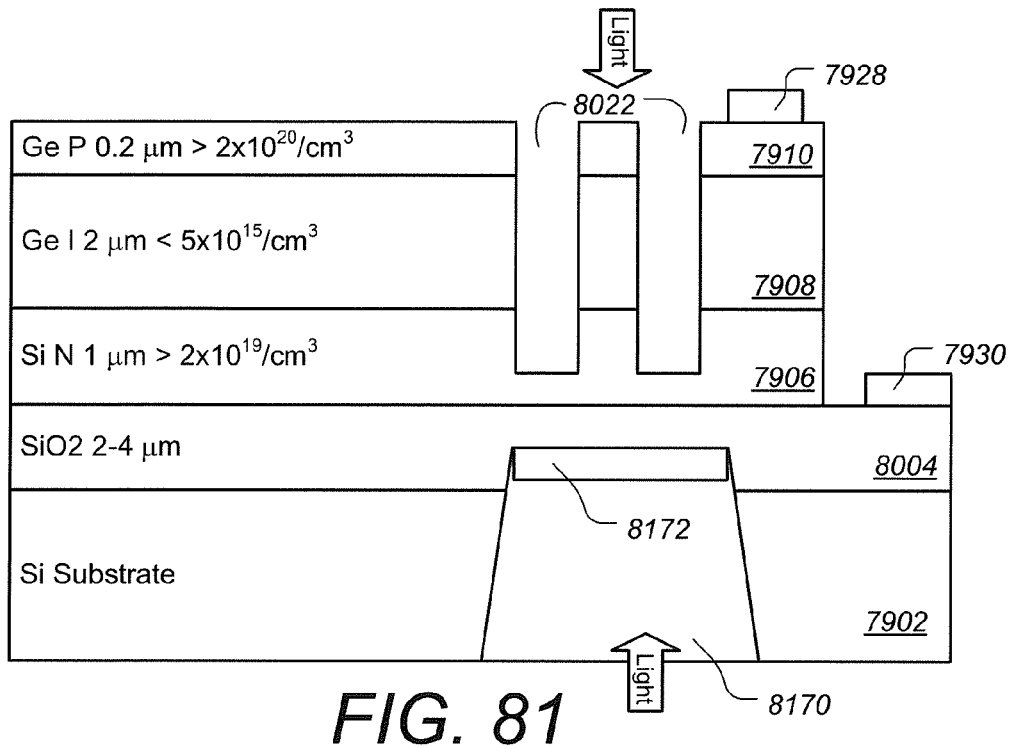
FIG. 81 is a diagram showing a Ge on Si epitaxial structure, according to some embodiments.

FIG. 81 is a diagram showing a Ge on Si epitaxial structure, according to some embodiments. The MS-PD, including thicknesses and doping of the material structure, is similar or identical to that depicted in and described with respect to FIGS. 79-80, except that via 8170 is etched to the SiO2 BOX layer 8004 and the SiO2 layer of thickness 2-4 µm, or a range from 0.2-6 µm, can be partially etched, fully etched or not etched. Further, a reflector 8172 made of a material such as Ag, Au, Cr, or Al can be formed. The reflector 8172 can also be a broad band, narrow band or pass band Bragg reflector. Note that if the reflector 8172 is a dielectric it can also be deposited on the N Si layer 7906 directly with the SiO2 layer etched off. Light impinging from the front side that is not absorbed on the first pass through the I Ge layer 7908 can be reflected back to the I Ge layer for passes through the I Ge absorbing layer. The I Ge layer can be thinner, 1 µm for example which results in a shorter transit time for electrons and holes in the I Ge layer. This can increase the data rate bandwidth of the MS-PD/MS-APD.

Figure 82A:
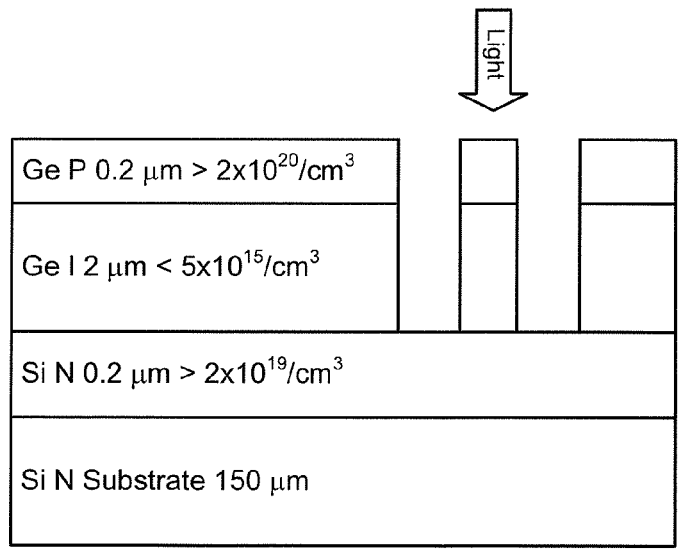
FIGS. 82A-82C relate to a simulation using finite difference time domain (FDTD) on a Ge on Si microstructured photodiode similar to the structure depicted in FIG. 79.
Figure 82B:
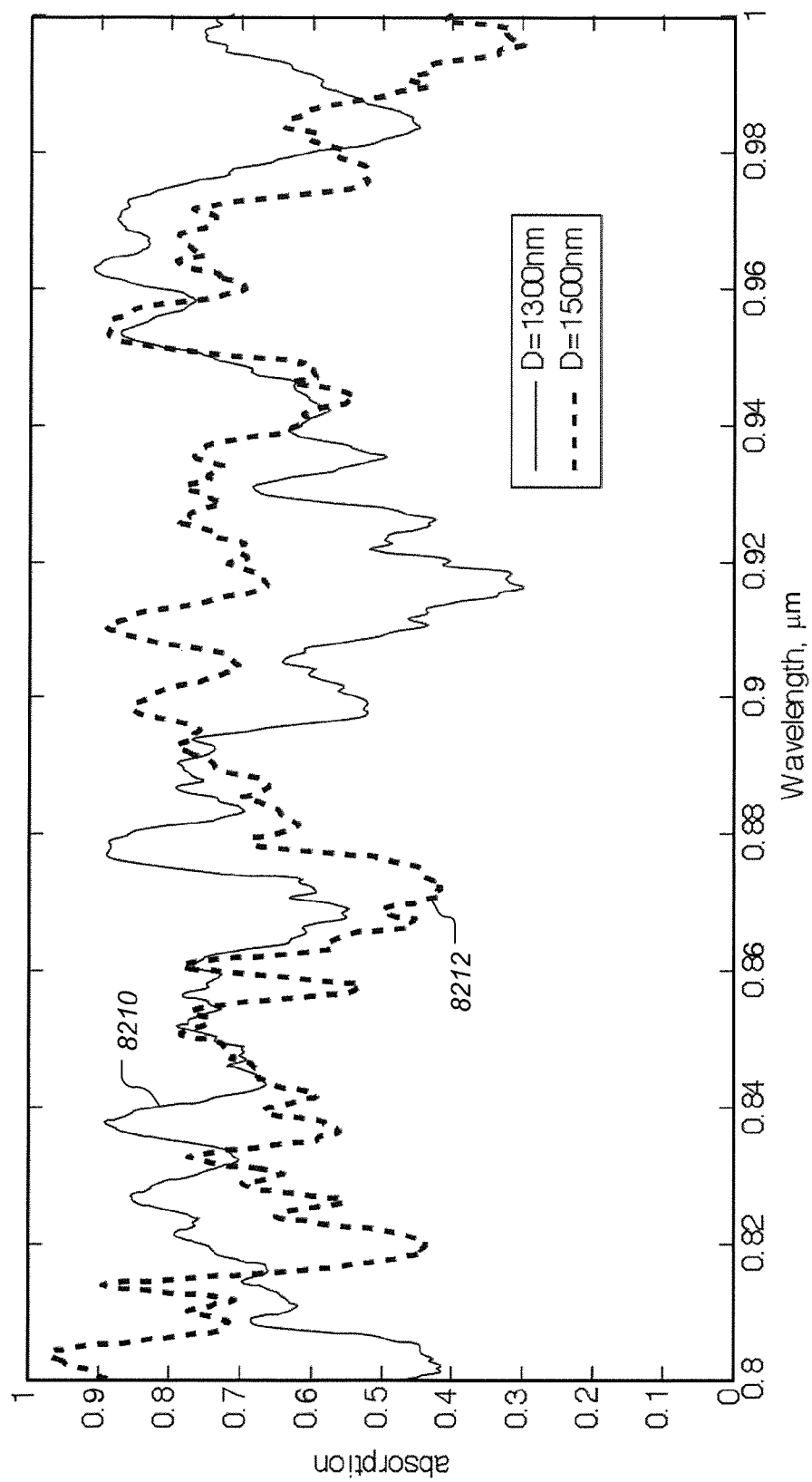
Figure 82C:
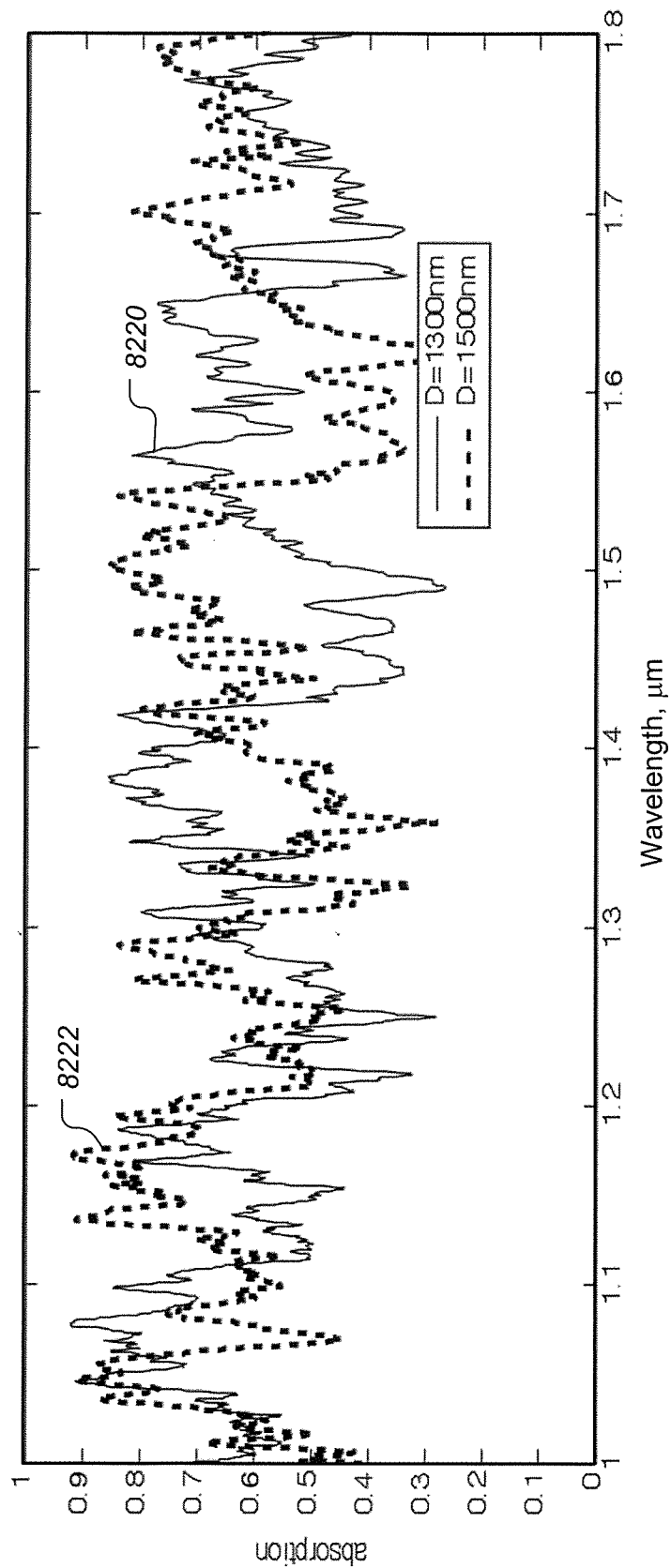

FIGS. 82A-82C relate to a simulation using finite difference time domain (FDTD) on a Ge on Si microstructured photodiode, similar to the structure depicted in FIG. 79. FIG. 82A is a diagram showing the Ge on Si microstructured photodiode that was simulated. The hole pattern was of a square lattice pattern. Two combinations of hole period and hole diameter were simulated—hole period of 2500 nm with diameter of 1500 nm, and hole period of 2300 nm with diameter of 1300 nm. In FIGS. 82B and 82C the horizontal axes is wavelengths in µm and the vertical axes is the absorption, which is directly related to quantum efficiency.

In each case a square lattice pattern of holes was simulated. In FIG. 82B, curve 8210 plots absorption for a hole period of 2300 nm and diameter of 1300 nm and curve 8212 plots absorption for a hole period of 2500 nm and diameter of 1500 nm for optical signal with wavelength ranging from 800 nm to 1000 nm. In FIG. 82C curve 8220 plots absorption for a hole period of 2300 nm and diameter of 1300 nm and curve 8222 plots absorption for a hole period of 2500 nm and diameter of 1500 nm for optical signal with wavelength ranging from 1000 nm to 1800 nm. Absorption of greater than 0.4 (40% of photons absorbed) to as high as more than 0.9 (90% photons absorbed) for wavelength range from 0.8 to 0.98 μm was found. Absorption of greater than 0.5 is seen for 1.55 μm and extends to 1.8 μm for an absorbing layer of approximately 2 μm of Ge. This is significantly greater than an equivalent Ge layer with a 2 μm thickness without microstructures, especially at 1550 nm and longer wavelengths.

Figure 83A:
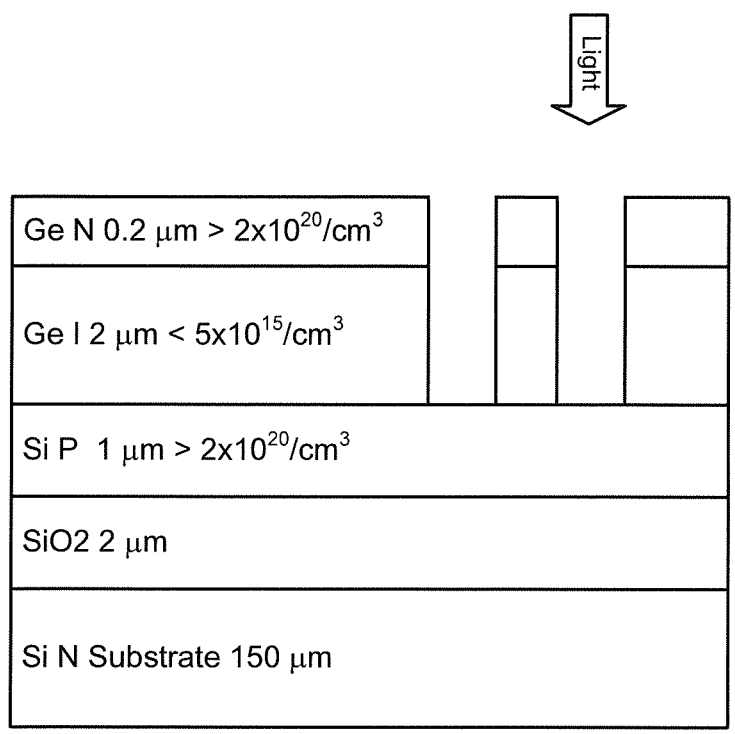
FIGS. 83A-83C relate to a simulation using finite difference time domain (FDTD) on a Ge on Si microstructured photodiode similar to the structure in FIG. 80.
Figure 83B:
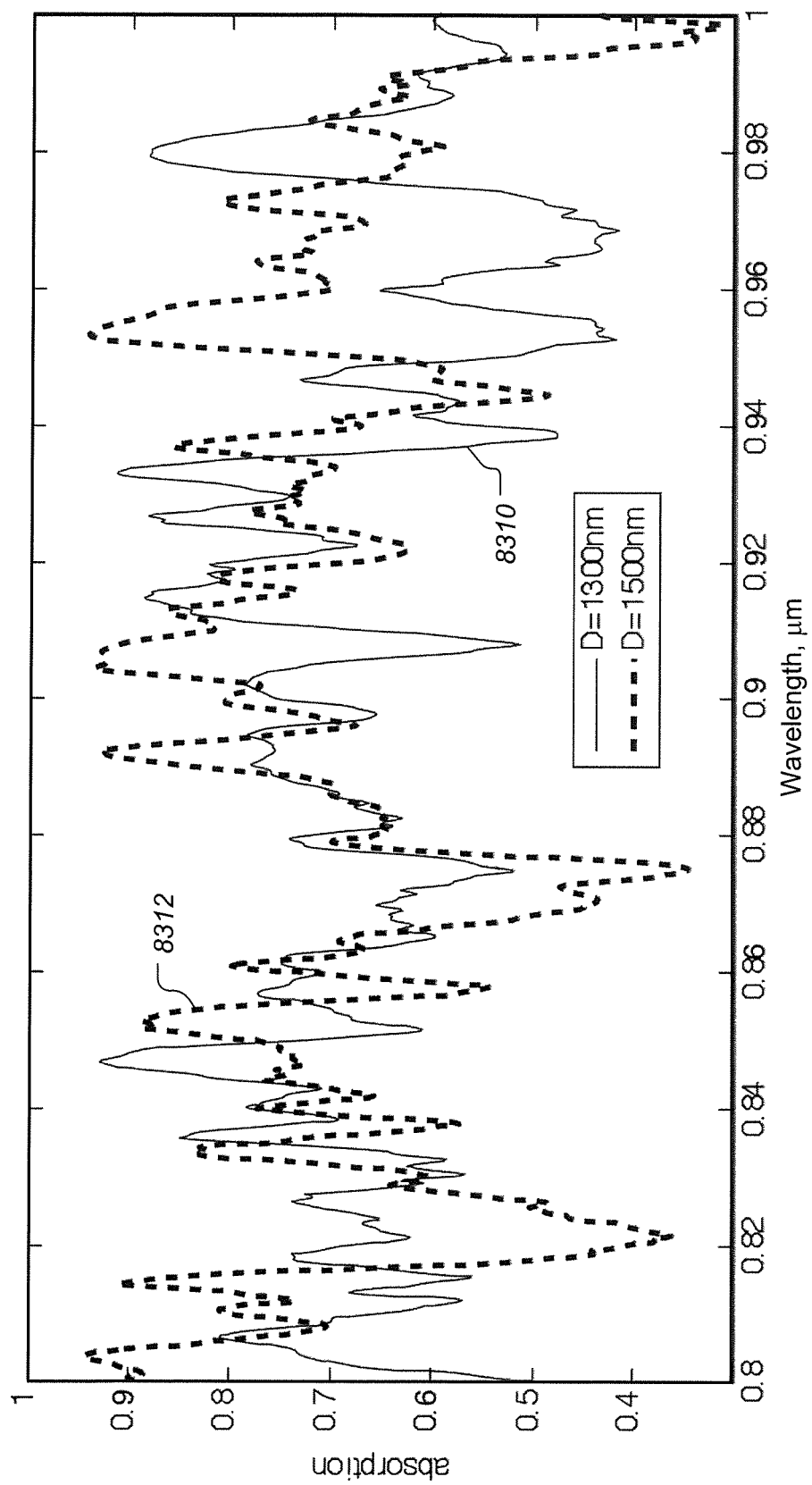
Figure 83C:
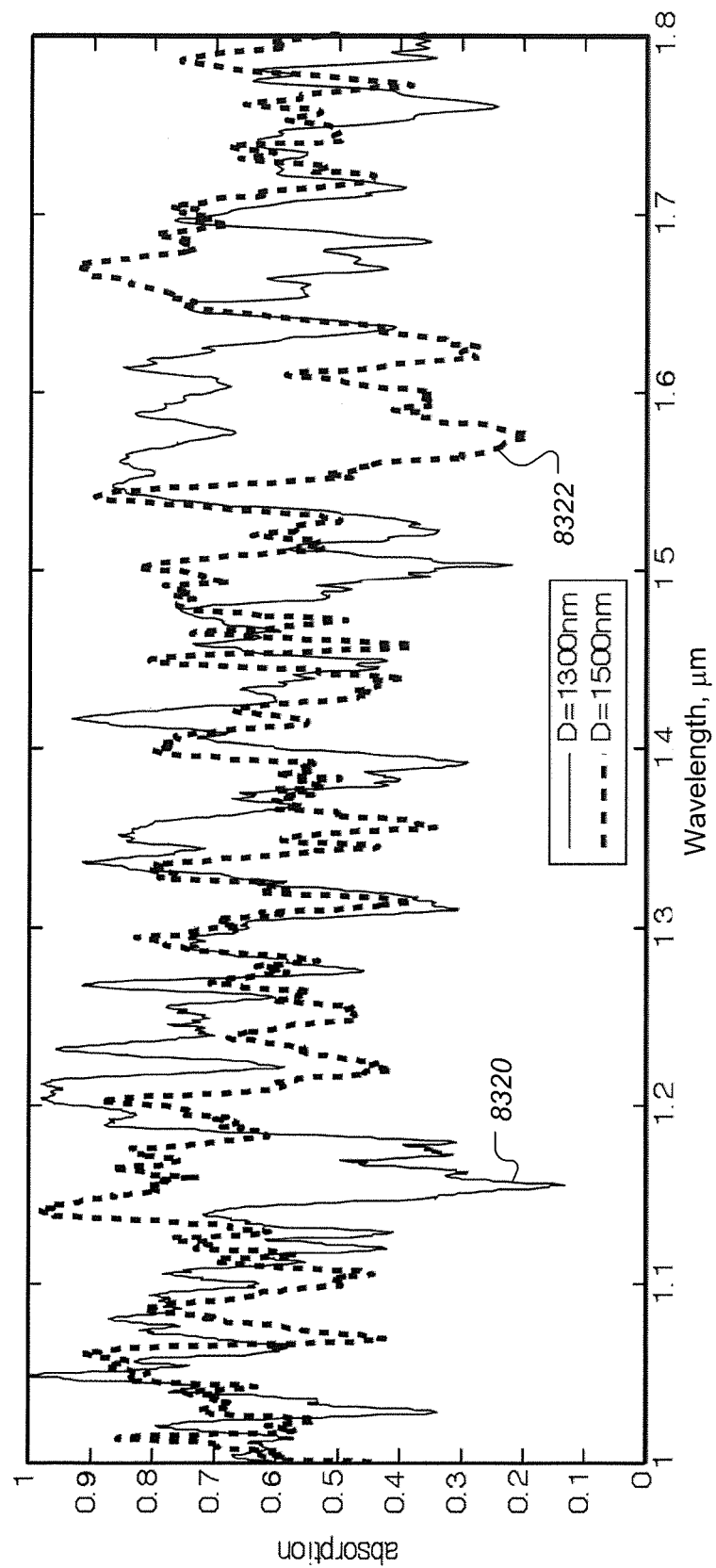

FIGS. 83A-83C relate to a simulation using finite difference time domain (FDTD) on a Ge on Si microstructured photodiode similar to the structure in FIG. 80. FIG. 83A is a diagram showing the Ge on Si microstructured photodiode that was simulated with light impinging from the top surface. In the graphs of FIGS. 83B and 83C, the horizontal axes are wavelengths in μm and the vertical axes are the absorption which is directly related to quantum efficiency for a square lattice of holes with a period of 2500 nm and a diameter of 1500 nm (curves 8312 and 8322) and for a period of 2300 nm and a diameter of 1300 nm (curve 8310 and 8320). Absorption of greater than 0.7 (70% photons absorbed) is seen for 1.55 μm and extends to 1.8 μm with better than 0.5 (50% photons absorbed) absorption for a absorbing layer of approximately 2 μm of Ge. This is significantly greater than an equivalent InGaAs layer lattice matched to InP with a 2 μm thickness at wavelengths of 1650 nm and longer for example.

Figure 84A:
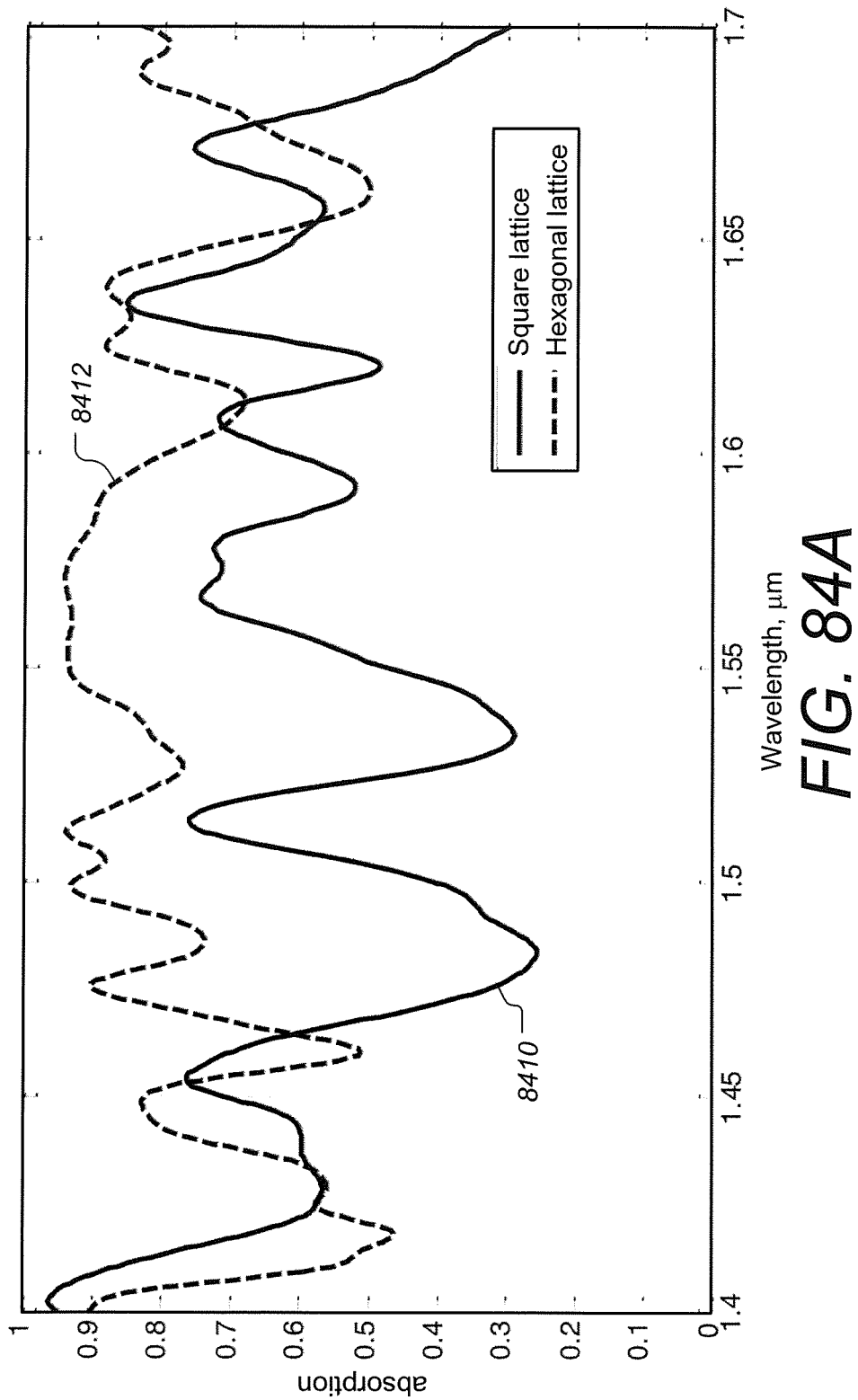
FIGS. 84A and 84B shows result of a simulation using finite difference time domain (FDTD) on a Ge on Si microstructured photodiode similar to the structure in FIG. 79.
Figure 84B:
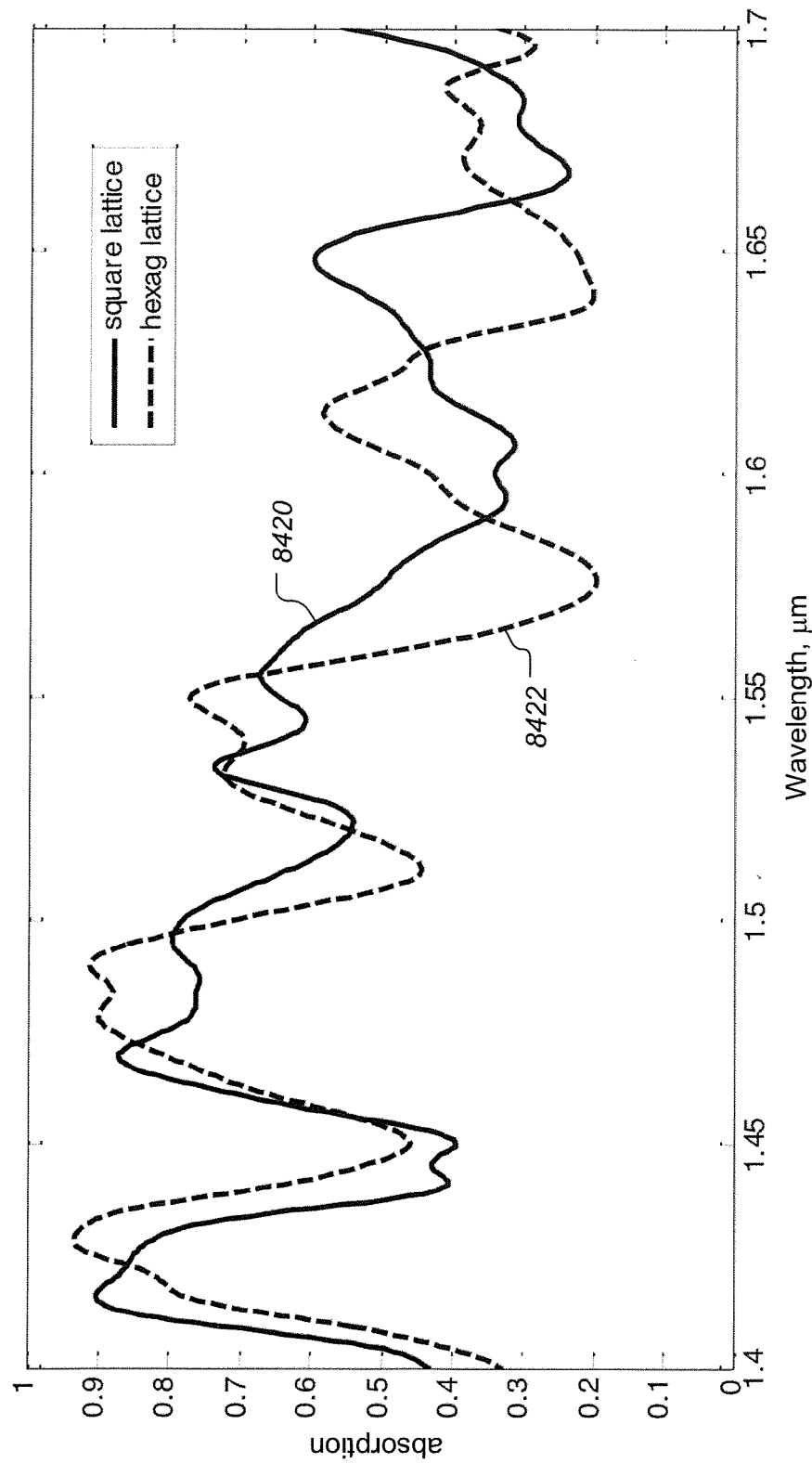

FIGS. 84A and 84B shows result of a simulation using finite difference time domain (FDTD) on a Ge on Si microstructured photodiode. The structure simulated is shown in FIG. 82A. In FIGS. 84A and 84B, the graph horizontal axis is wavelengths in μm and the vertical axis is the absorption which is directly related to quantum efficiency for both square and hexagonal lattices for the hole array. FIG. 84A shows both square lattice (curve 8410) and hexagonal lattice (curve 8412) with a period of 2300 nm and hole diameter of 1300 nm. Greater than 0.9 (90% of photons absorbed) absorption is shown for 1.55 μm wavelength with a region where the absorption is changing by less than 10% over a 50 nm wavelength span. FIG. 84B shows both square (curve 8420) and hexagonal (curve 8422) lattice for a period of 2500 nm and diameter of 1500 nm, which shows an absorption of 0.7 at 1.55 μm. Overall the hexagonal lattice shows a better absorption of photons than the square lattice. Other combinations of periods and hole diameters, hole shapes and lattices can be used to improve or optimize the absorption at certain wavelength ranges.

Figure 85:
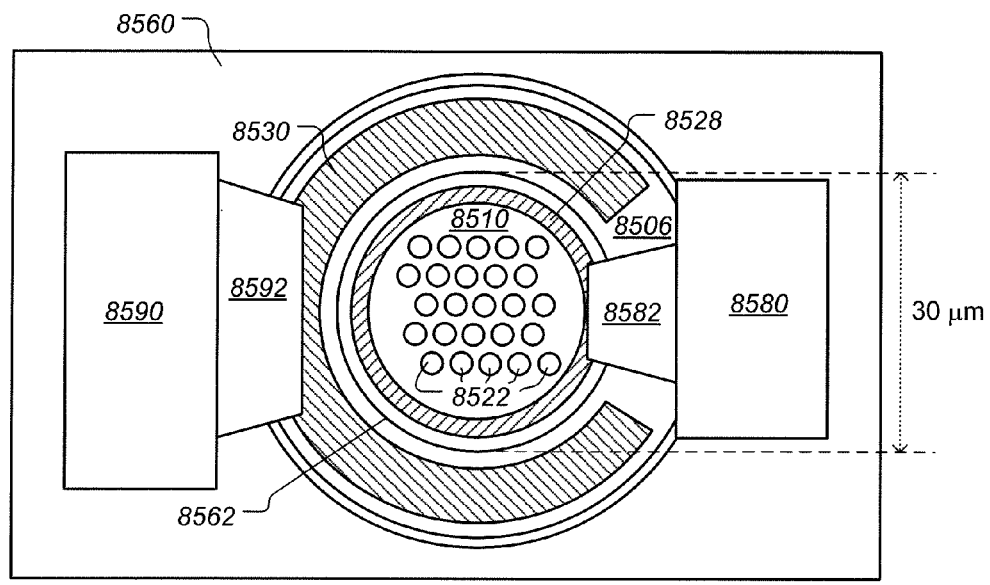
FIG. 85 shows a schematic top view of a microstructured photodiode chip, according to some embodiments.

FIG. 85 shows a schematic top view of a microstructured photodiode chip, not to scale, according to some embodiments. The approximate dimensions of the chip 8560 are 350 μm×300 μm×150 μm. A mesa defined by mesa edge 8562 has a diameter of 30 μm. The mesa defines the NIP or PIN junction capacitance. On the mesa top the upper surface 8510 is visible (e.g. N layer assuming an NIP MS-PD/APD) as are microstructured holes 8522. Near the outer edge of the mesa is the N ohmic contact ring 8528 (assuming an NIP MS-PD). Outside of the mesa is the P ohmic contact ring 8530. The N bond pad 8580 is electrically connected to N ohmic contact 8528 by bridge interconnect 8582. Similarly the P bond pad 8590 is connected to the P ohmic contact by interconnect 8592. According to some embodiments, an unwanted short between bridge interconnect 8582 and area 8506 (which could be the P layer surface) is prevented using an insulator such as polymide deposited therebetween. Note that the above description could also apply to a PIN arranged MS-PD/APD if the N and P layers and contact are reversed.

According to some embodiments, a simple process flow of the basic masking steps of a NIP MS-PD structure on a BOX Si wafer may consist of: (1) mask and etch hole array 8522 to the SiO2 layer; (2) mask and deposit the N ohmic contact metal ring 8528 on N layer 8510; (3) mask and etch the mesa that defines the junction capacitance, etch to P layer 8506; (4) mask and etch P mesa to the SiO2; (5) mask and deposit P ohmic contact metal 8530 onto P layer 8506; (6) mask polyimide bridge for contact to the N ohmic ring 8528 by the bond pad 8580; (7) mask and deposit bond pads 8590 and 8580 for both P ohmic and N ohmic, respectively. The bond pads are approximately 100×100 μm$^2$ contacting the N ohmic ring 8528 since the junction and bond pad capacitance are in parallel and therefore additive. The RC time constant is determined by the total junction, pad, fringe capacitances. Left out of the described process are passivation, anneal, cure, antireflection, thinning, backside metallization, dicing, to name a few. The NIP/PIN mesa diameter can range from 10 to 100 μm, as MS-PD/SPD have less semiconductor material in the mesa as compared to a conventional PD/APD, the capacitance is less, and therefore can have a larger area mesa (or equivalently a larger photosensitive area) for the same data rate bandwidth as compared to a conventional PD/APD, such that alignment of optical signal into the MS-PD/APD has a larger margin for error in alignment which translate to lower cost in packaging. From FIG. 56 and FIG. 57, for a square hole lattice and a period of 2000 nm and holes of diameter 1300 nm, the capacitance is approximately 30% less than an equivalent structure without holes, which means that the area of a MS-PD can be approximately 30% larger than a PD without holes but with the same diameter mesa, thickness of I layer, neglecting fringing capacitances. For a hexagonal lattice holes with period 2000 nm and hole diameter 1300 nm, the area of the MS-PD can be approximately 35% larger than a PD without holes. Other lattices, periods, and hole diameters, holes not for absorption enhancement but for capacitance reduction, can also be used to reduce capacitance, and/or increase or optimize absorption for example in a MS-PD/APD structure. According to some embodiments, multiple periods and/or multiple hole diameters can also be used. In addition, non-periodically spaced holes can also be used.

Figure 86:
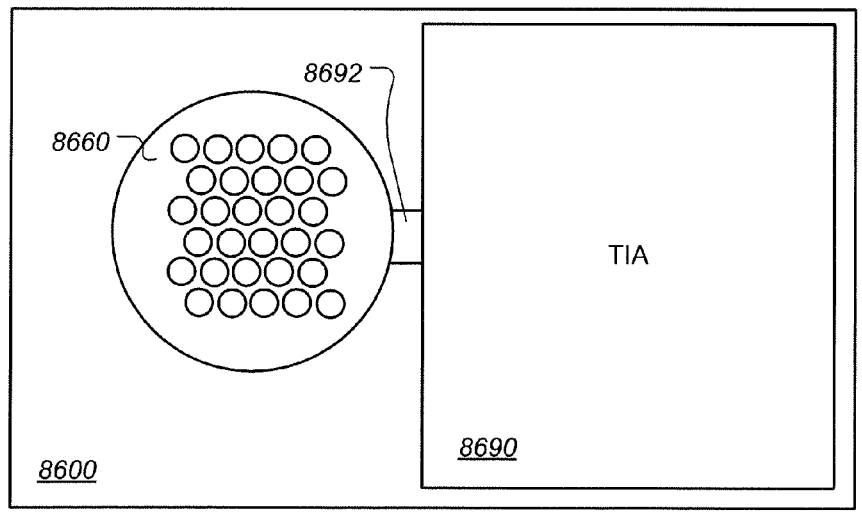
FIG. 86 is a top view diagram showing a MS-PD/APD integrated with a transimpedance amplifier and/or other electronics on a single chip, according to some embodiments.

FIG. 86 is a top view diagram showing a MS-PD/APD integrated with a transimpedance amplifier and/or other electronics on a single chip. On a single silicon chip 8600, MS-PD/APD 8660 is shown connected to TIA or other electronics 8690 using interconnect lines 8692. While FIG. 85 shows a stand alone MS-PD/APD that requires bond pads to transmit the electrical signal to other electronic components for further signal processing and transmission, FIG. 86 shows the MS-PD/APD and electronics integrated into a single chip. Bond pads add undesirable capacitance and this capacitance is used to calculate the data rate bandwidth of the MS-PD together with the junction capacitance. For example, the RC time to have a bandwidth of 20 GHz (or approximately 30 Gb/s) is approximately with a capacitance of 0.16 pF with a load resistance of 50 ohms. A 30 μm diameter Si PIN PD with 2 μm I layer will have a junction capacitance of 37 femtofarad (fF) with the I layer fully depleted by a reverse bias voltage. This allows a bond pad of 90 μm by 90 μm on top of 2 μm of polyimide to give approximately a total capacitance of 0.2 pF. If we integrate the MS-PD/APD to a TIA and/or electronics, bond pads are no longer used and neglecting the capacitance of the transmission line from the MS-PD/APD to the TIA and/or electronics, the MS-PD/APD capacitance can be 0.16 pF, which for a MS-PD would be a device of approximately 60 μm in diameter as compared to 30 μm in diameter for a stand along device. This increase in area allows greater margin in alignment error of the optical beam to the MS-PD/APD and translates to lower cost in packaging. Including parasitic capacitances, the diameter of the MS-PD is significantly greater than 30 μm of a stand alone MS-PD, and can be greater than 40 μm, for example, and in some cases greater than 50 μm in diameter.

It should be noted that as described in this patent specification, microstructured hole arrays (or pillars) with diameter of approximately that of the wavelength of light (more or less) enhance the absorption of the photons over that of a similar material without microstructured hole arrays (or pillars). For example, for a Si PIN PD to operate at 10s of Gb/s the thickness of the I layer necessarily has to be in the order of approximately 2 μm, otherwise transit times of the photogenerated carriers, electrons and holes, are too long to achieve 10s of Gb/s datarate bandwidth and still have sufficient quantum efficiency of approximately greater than 20%, and in some cases greater than 40% at a nominal wavelength of 850 nm, and in certain cases, 880 nm, and in certain cases to 980 nm. This is made possible with the techniques described herein using microstructured hole arrays (or pillars), either with single period and diameter and/or with multiple periods and diameters. The hole and or holes (pillar and or pillars) can be periodic and or non-periodic and can have cross-sectional shapes other than circular for the microstructure to enhance absorption and or emission. Without the microstructured hole arrays (or pillars) the 2 μm or less thick Si layer would absorb approximately 5% of 900 nm photons; whereas with microstructured hole arrays or pillars, greater than 20% can be absorbed, in some cases, greater than 30%. In yet some other cases greater than 40%, 50%, and 80% at 900 nm wavelength photons.

This is also the case with Ge on Si, by using this patent specification, 10s of Gb/s data rate bandwidths can be achieved at a wavelength of 1550 nm for example, and in some cases, 1600 nm and in some cases 1700-1800 nm.

In known nanowire photodiodes, there is no enhancement of the absorption such that a thin layer, for example approximately 2 μm or less for high data rate bandwidths of 10s of Gb/s over that of an equivalent bulk layer. For example, 2 μm long InP nanowire and 2 μm bulk InP at a wavelength that is larger than the bandgap are approximately equivalent, the advantage of the InP nanowire lies in the reduction in reflection only.

FIG. 87 shows a simple epitaxial structure without any microstructures. The structure of FIG. 87 is used to compare with a similar epitaxial structure with microstructures such as hole arrays on the absorption of incident photons with wavelength range of 800-880 nm. For simulation purposes using FDTD (finite difference time domain), only structures with and without microstructures are shown, without the P and N contacts, mesa etch, passivations, planarizations, and other processes to fabricate a complete photodiode. The epitaxial structure in Case 1 is grown on a silicon substrate P 8702 doped and thinned to approximately 150 μm, the first layer is a Si P layer 8706 approximately 0.2 μm thick with a doping of >1×10$^{20}$/cm$^3$ using boron, followed by a Si intrinsic layer, 8708 that is not intentionally doped of approximately 2 μm thickness and with a doping level <5×10$^{16}$ cm$^{-3}$ followed by Si N layer 8710 approximately 0.3 μm thick with a doping of >1×10$^{19}$ cm$^{-3}$ with phosphorus dopant.

FIG. 88 shows another simple epitaxial structure without any microstructures. The structure of FIG. 88 is used to compare with a similar epitaxial structure with microstructures such as hole arrays on the absorption of incident photons with wavelength range of 800-880 nm. For simulation purposes using FDTD (finite difference time domain) only structures with and without microstructures are shown, without the P and N contacts, mesa etch, passivations, planarizations, and other processes to fabricate a complete photodiode. The epitaxial structure in Case 2 is grown on a silicon substrate 8802 with a buried oxide (BOX) layer 8804 of 2 μm, on the BOX layer is a Si P layer 8806 approximately 0.1 μm thick with a doping of >1×10$^{20}$/cm$^3$ using boron, followed by a SiGeB ($Si_{0.98}Ge_{0.01}B_{0.01}$) layer 8816 where the p doping is >1×10$^{20}$/cm$^3$, followed by a Si intrinsic layer 8808 that is not intentionally doped of approximately 2 μm thickness and with a doping level <5×10$^{16}$ cm$^{-3}$ followed by Si N layer 8810 approximately 0.3 μm thick with a doping of >1×10$^{19}$ cm$^{-3}$ with phosphorus dopant. Photons for both Case 1 and Case 2 will impinge from the top surface or the surface with the Si N epitaxial layer (8710 and 8810) for the simulation study.

Figure 89:
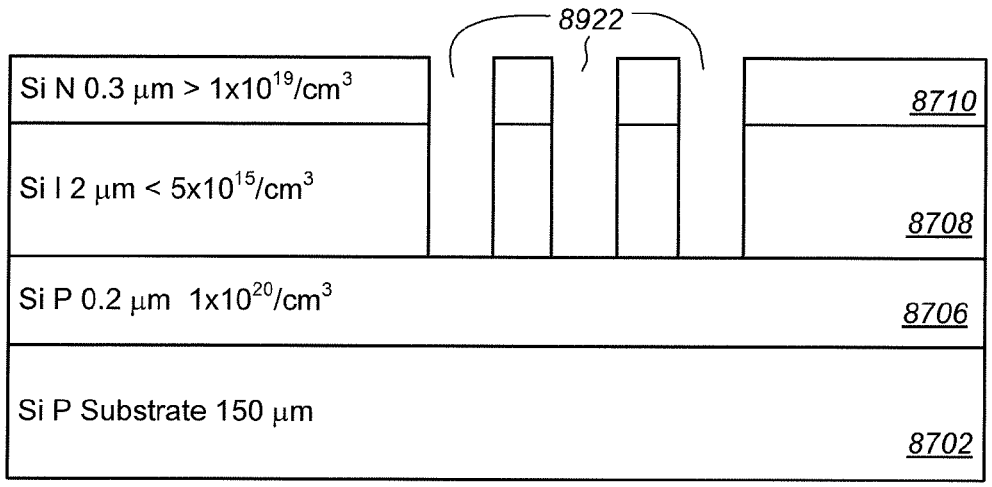
FIG. 89 shows an epitaxial structure the same as in FIG. 87 where microstructured hole arrays are etched to the Si P epitaxial layer, according to some embodiments.

FIG. 89 shows an epitaxial structure otherwise the same as in FIG. 87 where microstructured hole arrays are etched to the Si P epitaxial layer, according to some embodiments. In this Case 3, the holes 8922 have a diameter of 1500 nm and a period of 2000 nm in a square lattice array. Photons with wavelengths 800-880 nm impinge on the top surface or the Si N epitaxial layer 8710. The N and P layers/substrate can be interchanged in certain applications and the absorption results will be approximately the same.

Figure 90:
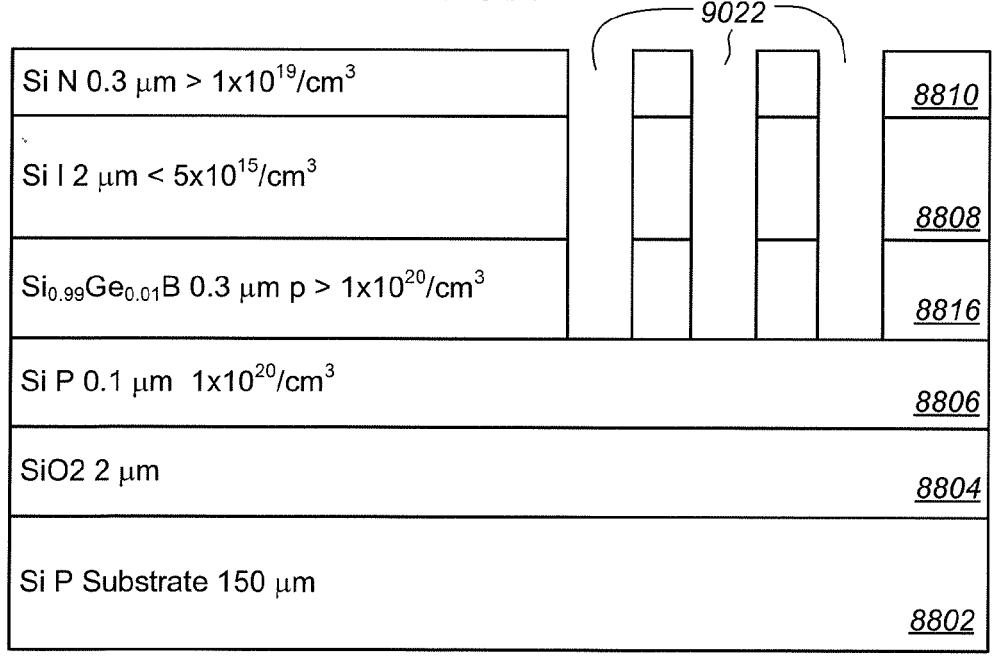
FIG. 90 shows an epitaxial structure the same as in FIG. 88 where microstructured hole arrays are etched to the BOX SiO2 layer, according to some embodiments.

FIG. 90 shows an epitaxial structure otherwise the same as in FIG. 88 where microstructured hole arrays are etched to the BOX SiO2 layer, according to some embodiments. In this Case 4, the holes 9022 have a diameter of 1500 nm and a period of 2000 nm in a square lattice array. Photons with wavelengths 800-880 nm impinge on the top surface or the Si N epitaxial layer 8810. The N and P layers/substrate can be interchanged in certain applications and the absorption results will be approximately the same.

In addition, the holes can be etched to the etch stop layer SiGeB 8816. The etch stop layer 8816 is heavily P doped and can be used in layer structures where there is a P layer and etch stop layer desired in processing, this include photodiodes and avalanche photodiode structures.

Figure 91A:
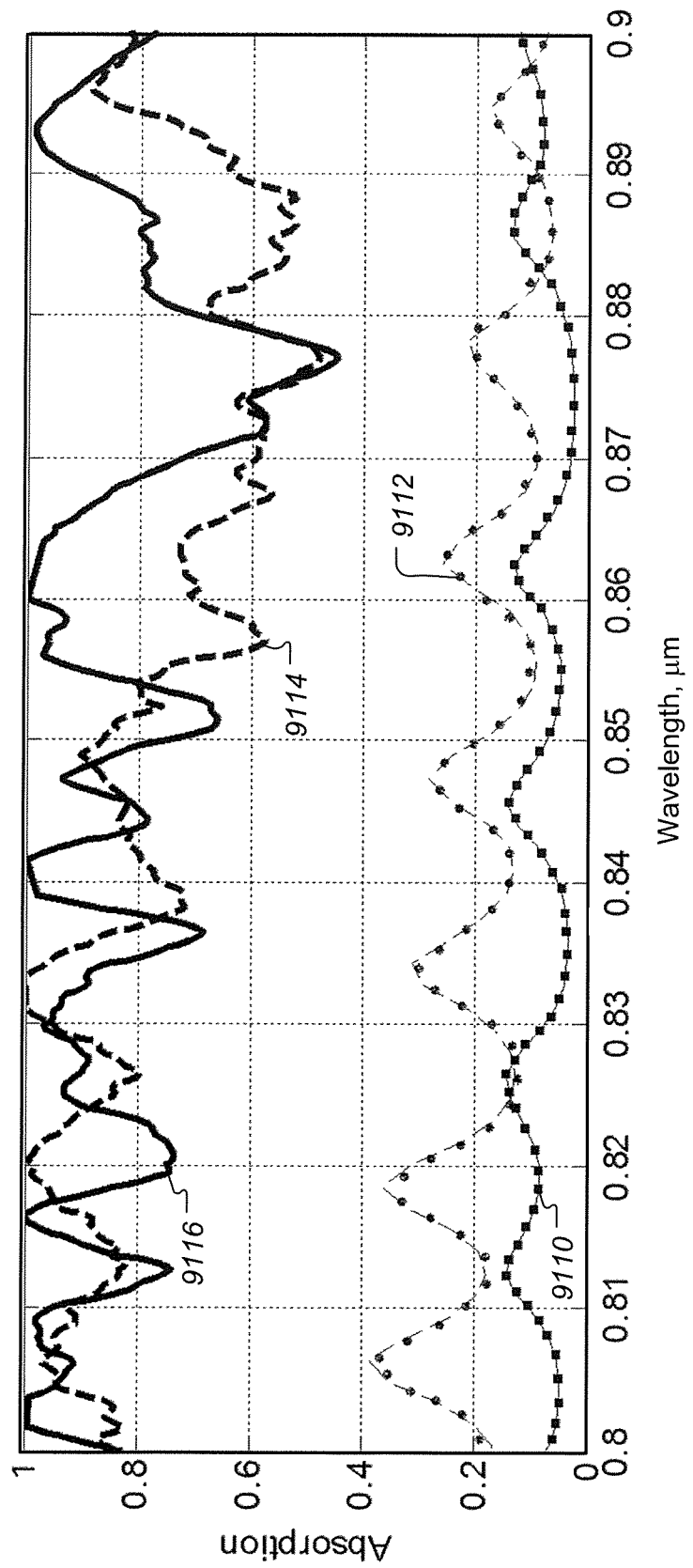
FIGS. 91A-91B are plots showing results of simulations for the example structures depicted in FIGS. 87-90.
Figure 91B:
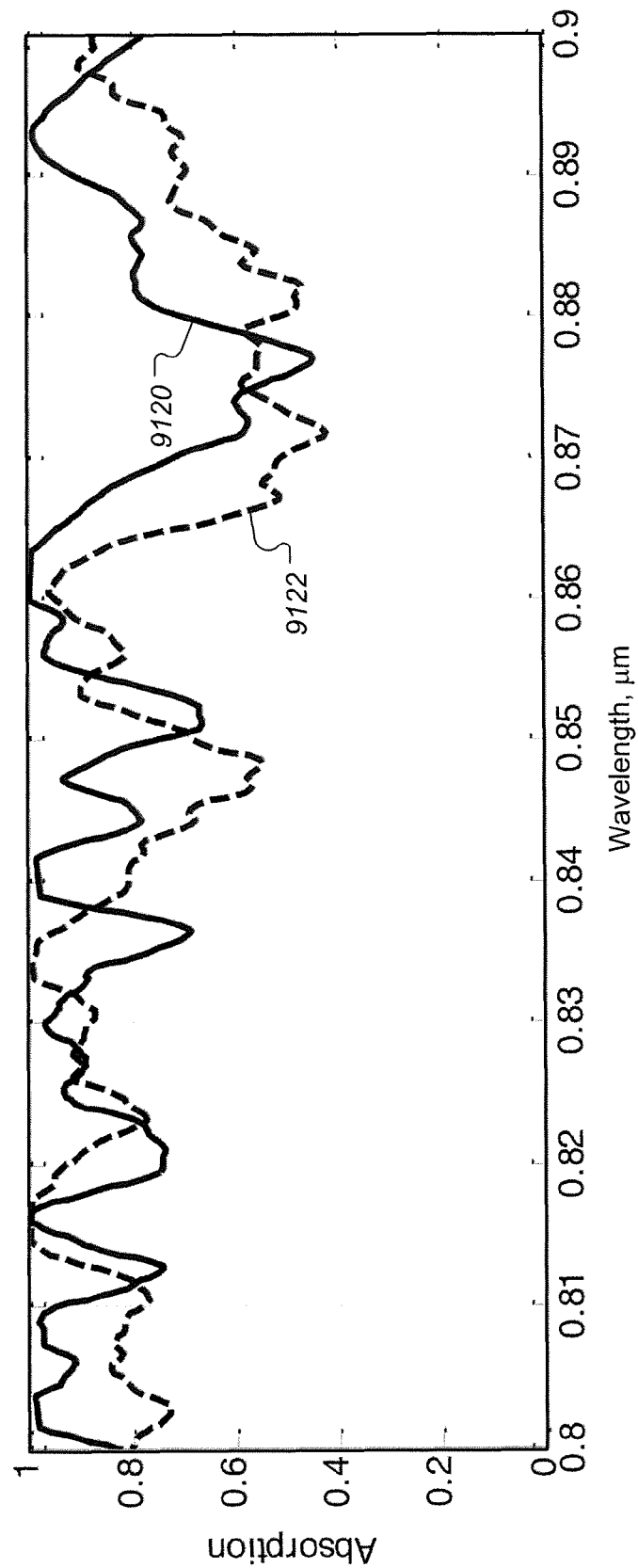

FIGS. 91A-91B are plots showing results of simulations for the example structures depicted in FIGS. 87-90. FIG. 91A shows a comparison of Cases 1-4 (FIGS. 87-90, respectively), using FDTD simulation to calculate the absorption due to the "I" Si intrinsic layer in each cases verse wavelength, shown from 800-900 nm. Photons impinging on the top surface or the N Si epitaxial surface in each case (layers 8710 and 8810 in FIGS. 87-90). Absorption due to other layers, other than the "I" layer were not included. Curves 9110, 9112, 9114 and 9116 show the results for Cases 1, 2, 3 and 4 (shown in FIGS. 87, 88, 89 and 90) respectively. In the Cases 1 and 2, where there are no microstructures, the absorption in the I layer is less than 40%. That means 40% of the incident photon are absorbed. In Case 1, it's less than 15% and in Case 2, at certain wavelength for example 805 nm, it can be just less than 40% and decreases with longer wavelength to less than 20% at 880 nm and 850 nm and at 885 nm is less than 10%. Absorption is directly proportional to quantum efficiency, since if photons are absorbed and converted into electrons and holes that do not recombine before being swept out of the "I" region under a voltage bias that depletes the "I" region, these photogenerated electrons and holes swept to N and P regions respectively contribute to the photocurrent. In Cases 3 and 4, which include microstructured holes with diameter of 1500 nm and period of 2000 nm in a square lattice, absorption levels of close to 100% are seen in certain wavelengths. In both Case 3 and 4, absorption is greater than 40% from 800 to 900 nm wavelength. In the range from 800-850 nm it is approximately greater than 70% absorption. And in Case 4, the absorption is better than 70% from 880 to 900 nm. At 855 nm in Case 4 absorption is over 95% as compared to Case 2 is less than 10%. The absorption percentage in the "I" layer in the cases of microstructures can be increased, or optimized for high absorption, at certain wavelengths by changing the hole diameter, period and/or lattice for example to a hexagonal lattice from a square lattice.

It has been found that for a silicon PIN photodiode with microstructures as described herein, the absorption does not necessarily decrease as the wavelengths approach the Silicon bandgap of 1.11 eV at 300 K, or approximately 1117 nm. In comparison, for a PIN (or NIP) photodiode without microstructures, the absorption decreases as the wavelength approaches 1117 nm. This may be due to the fact that the Q (Quality Factor) of the resonances and/or coupled resonances of the microstructure is increasing as the optical loss decreases and the photons therefore spend more time in the microstructure bouncing back and forth resulting in absorption that can be greater than 50% even as the wavelength approaches 1117 nm. The refractive index difference in the microstructure can be represented with an effective index. For example, since the holes remove silicon material and are replaced by air for example, the effective index or effective refractive index of the region with holes is less than the refractive index of the region without holes. A simple estimate would be the average of the indices, for example if the holes remove half of the silicon in the region with holes, the effective refractive index, assuming the holes are filled with air, is (1+3.44)/2=2.22 approximately, where bulk Si refractive index is approximately 3.44 at 1000 nm wavelength. Therefore, the region with holes and without holes will see a refractive index discontinuity of 1.22 approximately or approximately 35% index change. This discontinuity in refractive index can result in a high contrast grating with Q that can approach one million or more when the optical losses are low. This can explain the enhancement of the absorption in microstructured photodiode and/or avalanche photodiode. If the photons stay in the microstructure for times approaching the characteristic times of the photodiode/avalanche photodiode, which is the transit time and the RC time, then this will begin affecting the data rate bandwidth of the PD/APD adversely. However, if the data rate bandwidth is low, then a higher Q can be tolerated. The Q factor is defined as proportional to energy stored/energy loss per cycle. This is a possible explanation for absorption enhancement in the microstructures. The microstructures consists of a lattice and therefore are made up of many unit cells or cell each of which has its set of resonances and are intimately coupled together. Unlike previously known resonant photodiodes that show only one resonant characteristic, since they are single resonators, and where the resonances are sharp peaks and valleys and periodic wavefunction, the microstructure with coupled resonant cells have regions in the absorption verses wavelength were the absorption is slowly varying, for example varying by less than 10% over a certain wavelength span, for example 50-100 nm and non-periodic wavefunction. The microstructured PD/APD have a sum of multiple resonances and therefore have less pronounced peaks and valleys as compared to previously know resonant photodiodes. Non-periodic holes can also have resonant cells which are itself non-periodic and can couple with adjacent neighboring cells also resulting in a coupled resonance structure that can enhance absorption and or emission.

As a rough estimate, the characteristic time is approximately 20 ps for approximately 20 GHz 3 dB bandwidth. In 20 ps, light travels approximately 2000 µm in silicon, which means that the light can bounce within a 2 µm microstructure approximately 1000 times and therefore a 2 µm thick "I" layer can be 2000 µm thick in equivalent optical length; hence in the microstructures described in this patent specification, the light can traverse more bounces and can give an effective absorption that is enhanced over the bulk absorption coefficient and can roughly be written as effective-absorption=bulk-absorption×number-of-bounces within the microstructure. The time that light spends in the microstructure is called optical transit time, which is another fundamental time for the MS-PD/APD. The three fundamental times, RC time, transit time, and optical transit time add as the sum of squares to give the total time squared. For example $T(total)^2=T(RC)^2+T(transit)^2+T(optical\ transit)^2$; for 20 GHz the total time can be 20 ps, and for simplicity assuming transit time, RC time, and optical transit time are all approximately the same, then each time can only be approximately 11.5 ps. The 11.5 ps for the optical transit time translate to approximately 1000 µm equivalent optical length or the enhanced effective absorption length can be 1000 µm or roughly a Q of 250 before the optical transit time if it is longer than 11.5 ps starts to degrade the bandwidth of the MS-PD, assuming all 3 fundamental times are equal.

FIG. 91B shows the epitaxial structure in FIG. 90 (Case 4) where the microstructured hole arrays are etched to different depths. Curve 9120 shows the absorption in the "I" Si layer as a function of wavelength from 800 to 900 nm where the holes are etched to the SiO2 layer 8804. Curve 9122 shows the absorption vs wavelength for holes etched to the SiGeB layer 8816. In both cases light impinges from the top surface or Si N surface 8810. Peaks and valleys are shifted, but overall etching to the SiO2 layer in most wavelength in the range 800-900 is slightly better than etching the holes to the SiGeB layer.

Figure 92:
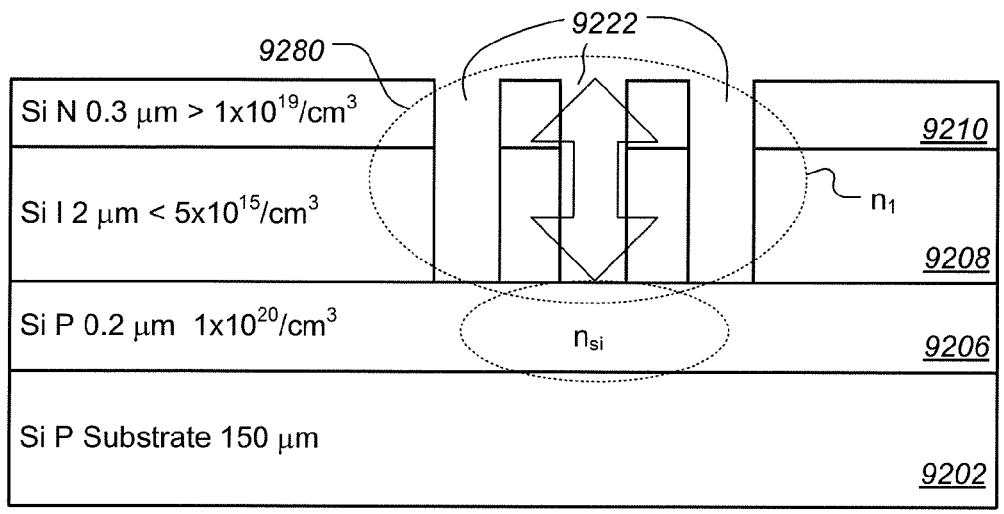
FIG. 92 is a diagram showing a microstructured region in the silicon where holes are etched into the silicon, according to some embodiments.

FIG. 92 is a diagram showing a microstructured region in the silicon where holes are etched into the silicon, according to some embodiments. The examples structure includes a Si P substrate 9202, Si P layer 9206, Si I layer 9208 and Si N layer 9210 all with thickness and doping levels shown. The holes 9222 are etched to a depth of approximately 2.3 µm and have diameters of 1500 nm and periods of 2000 nm in a square lattice. The region where the holes are present, shown roughly by dotted circle 9280, has an effective refractive index of $n_1$ which is less than the refractive index of bulk Si which is approximately 3.44 at 300K at 1000 nm wavelength. This assumes the etched region is in air, a vacuum or filled with material such as polyimide with an index lower than silicon index. For the dimensions given above for the microstructure, the effective index in the region with the holes is approximately given by fraction of air 0.44×1+fraction of Si 0.56×3.44, which is approximately 2.36. Photons impinging on the top surface of 9210 for example, can be trapped in the microstructure and bounce between the two refractive index discontinuities. One discontinuity is at the air-microstructure interface where the index difference is about 1.36 and the other is at the microstructure-silicon interface where the index difference is about 1.07. This index difference can qualify the microstructure as a lossy high contrast grating, which can explain the observed absorption enhancement.

Figure 93:
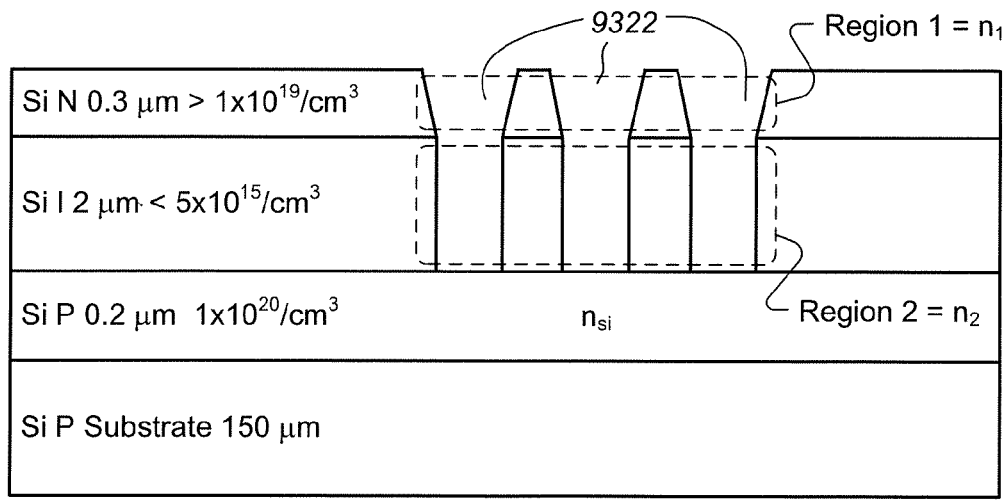
FIG. 93 is a diagram showing a MS-PD structure with tapered holes, according to some embodiments.

FIG. 93 is a diagram showing a MS-PD structure with tapered holes, according to some embodiments. Tapered, funnel-shaped holes 9322 results in a gradual change in effective index $n_1$ which is less than for a region without significant change in diameter of the hole but with a smaller diameter than region 1 for example, with effective index $n_2$ where effective index in Region 1 is less than effective index in Region 2 simply due to the fact that it has less silicon material. In Region 1, the effective index near the surface can be 60% or more voids (air or low index material such as polyimide for example) and 40% or less silicon, which can result in a lower reflection for normal incident photons to the top surface (Si N layer in this case). At off normal incident photons, the reflection can be even less. As a further example, if the holes occupy 90% or more and Si occupy 10% or less near the surface, the Fresnel reflection can be 1% or less for normal incident photons. The effective index in Region 1 changes gradually since the diameter of the holes is gradually decreasing with depth. The example shown is a funnel, however it can be a step with just two distinct hole diameters for example, or steps with multiple hole diameters, each step diameter smaller as the steps are further from the surface.

Figure 94:
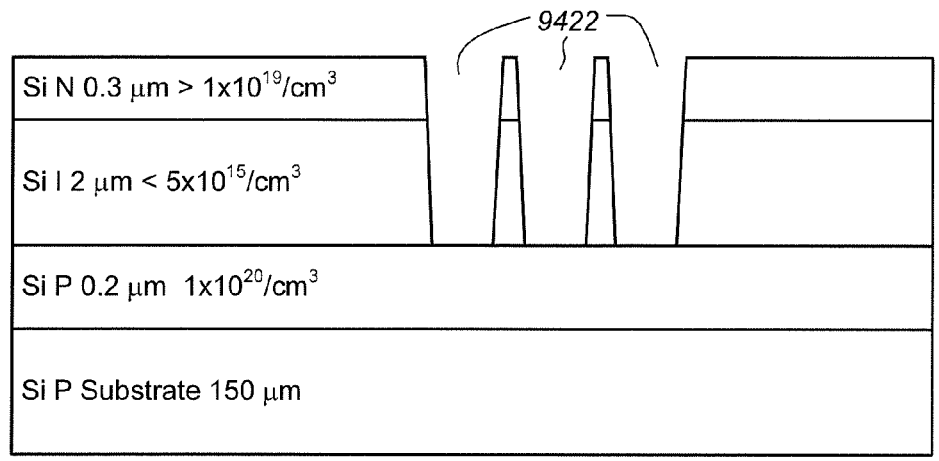
FIG. 94 is a diagram showing a MS-PD structure with gradually tapered holes, according to some embodiments.

FIG. 94 is a diagram showing a MS-PD structure with gradually tapered holes, according to some embodiments. Another configuration is depicted with holes 9422 having a gradual funnel shape extending the entire length of the hole. The effective index in turn also gradually increases as a function of depth. According to some embodiments, holes can be provided with multiple diameters, periods and/or pseudo random or random holes with different funnel shapes. The various hole parameters can be utilized to improve or optimize the absorption characteristics at certain wavelength bands. According to some embodiments, holes 9422 can be provided with a series of steps with each step having a different diameter. The steps can be evenly spaced and/or unevenly spaced. The spacings can be quarter wavelength, half wavelengths or multiples of quarter and half wavelengths to create for example filters, or coupled resonators, to name a few, to improve or optimize the absorption characteristics at specific bands of wavelengths. For optical emitters, such steps in the hole or pillar diameters can improve the optical wave overlap with the gain media for example. According to some embodiments, the funnel shape of holes 9422 can have any slope. For example they can be V shaped and the effective index at the air-hole interface and the hole-silicon interface can be optimized for reflection and enhancement in the absorption characteristics or emission characteristics.

Another explanation for the absorption enhancement associated with the microstructured PD/APD is that the microstructure is a metamaterial and can behave as a broadband absorber. See e.g.: G. Dayal et al, "Broadband infrared metamaterial absorber with visible transparency using ITO as ground plane", OPTICS EXPRESS 1514 June 2014; N. Liu et al, "Infrared Perfect Absorber and Its Application As Plasmonic Sensor," Nano Lett. 2010, 10, 2342-2348; and L. Meng et al. "Polarization-sensitive perfect absorbers at near-infrared wavelengths", OPTICS EXPRESS A111 December 2012 (hereinafter "Meng et al."), all of which are incorporated herein by reference.

For example in Meng et al., if the grooves are crossed in a crossbar pattern, the absorption will be polarization independent. Instead of long grooves, as described herein, the Au in Meng et al. is replaced with semiconductors such as silicon and/or germanium and the holes/grooves are voids that can be air, gas, vacuum, polyimide and/or any dielectric partially or fully covering the holes. In particular, in Meng et al. at FIG. 11, if the structure is a crossbar, there will be a square array of dielectric on a Au substrate. According to some embodiments, Au is replaced with semiconductor and dielectric with holes that are filled with air, gases, or dielectric material such as silicon dioxide, silicon nitride, calcium fluoride, spin on glass, polyimide or passivation dielectrics. FIG. 11 in Meng et al. also shows absorption verses wavelength.

High contrast gratings may be considered a certain class of metamaterial. This, in combination with other effects, may explain the observed absorption enhancement. Other effects include: plasmonic, nonlinear, subwavelength and near wavelength effects, photonic crystals, slow wave, coupled resonances, interferences, field enhancements, and resonance with loss.

Figure 95:
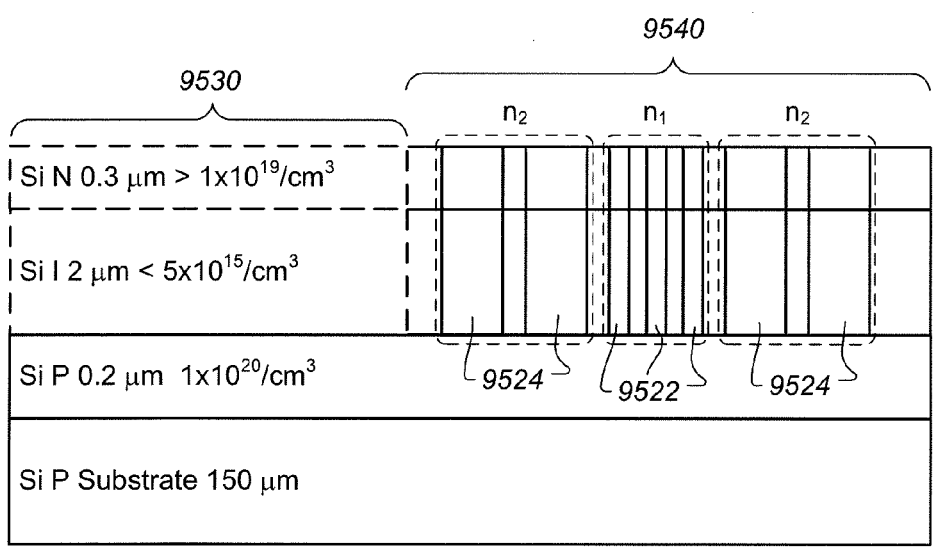
FIG. 95 is a diagram showing a material structure with different diameter microstructured holes, according to some embodiments.

FIG. 95 is a diagram showing a material structure with different diameter microstructured holes, according to some embodiments. Holes 9522 and 9524 have different diameters. Holes with smaller diameter remove less silicon material than holes with larger diameter if the periods are approximately the same. The effective index of an array of holes 9522 with smaller diameter is an effective index $n_1$ and these holes can be clustered near the center of the MS-PD/APD. An array of holes 9524 with larger diameter has an effective index of $n_2$ and can cluster around the smaller diameter holes (e.g. in a ring-shaped pattern). Since less material is removed in the smaller diameter holes 9522 than in the larger diameter holes 9524, $n_1$ is greater than $n_2$ for example. Light will be guided in the $n_1$ region so that as light bounces back and forth between the hole-silicon (P silicon in this example) interface and the hole-air interface, minimal light is lost due to diffraction for example. In addition, a mesa etch removes the N silicon layer and most, if not all, of the "I" silicon layer in region 9530. The mesa 9540 is etched to define the capacitance of the NIP junction as shown in this example. In certain cases ion implantation and/or diffusion can be used to define the NIP junction capacitance. And in certain cases, only the N Si layer needs to be removed and/or converted to low doping or opposite doping. The N and P can be interchanged, for example the MS-PD can be PIN and the MS-APD can be NINIP or PIPIN.

Figure 96:
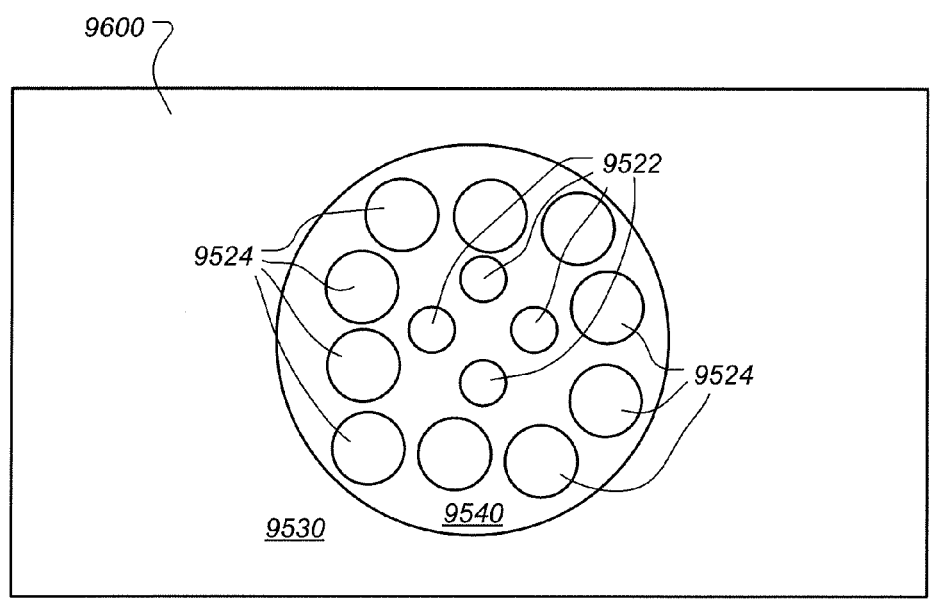
FIG. 96 shows a top view the material structure with different diameter microstructured holes, as depicted in FIG. 95.

FIG. 96 shows a top view of the material structure with different diameter microstructured holes, as depicted in FIG. 95. As can be seen, the smaller diameter holes 9522 are clustered within the larger diameter holes 9524. The resulting difference in effective refractive indices between regions near the center of the microstructured photodiode/avalanched photodiode (MS-PD/APD) 9600 results in a light guiding effect similar to optical fibers, such that light is guided more to the region of higher effective index. Also shown is a mesa 9540 defined by etched-away region 9530 that can further provide light guiding effects. The mesa 9540 also defines the NIP junction capacitance, and can also be etched just through the N layer, the "I" layer or fully to the P layer. Not shown are the ohmic contact metals, bond metals, passivation, planarization, polyimide, and other dielectrics. The numerical aperture of the MS-PD/APD 9600 can be adjusted according to some embodiments by adjusting the hole diameters in the core area (smaller diameter holes) compared to cladding (larger diameter holes). Density and diameter of holes are ways to adjust the amount of silicon material within a region to alter the effective refractive index. This is also applicable to emitters to reduce loss of light due to diffraction.

According to some embodiments, a guiding structure with a higher index core and a lower index cladding can effectively behave as a light guide such as an optical waveguide, for example to reduce or minimize light loss due to diffraction. For example, a square hole lattice with period 2300 nm and hole diameter of 1500 nm can result in an approximate effective index of 2.63, and a square lattice with period of 2000 nm and hole diameter of 1500 nm can result in an approximate effective index of 2.36. The higher index can be the core and the lower index can be the cladding. Approximately 10% index difference between the core and cladding can be achieved by changing the period of the square lattice. Other combinations are also possible. The cladding can have a hexagonal lattice and the core can have a square lattice, with the period and diameter being the same or varied.

Figure 97A:
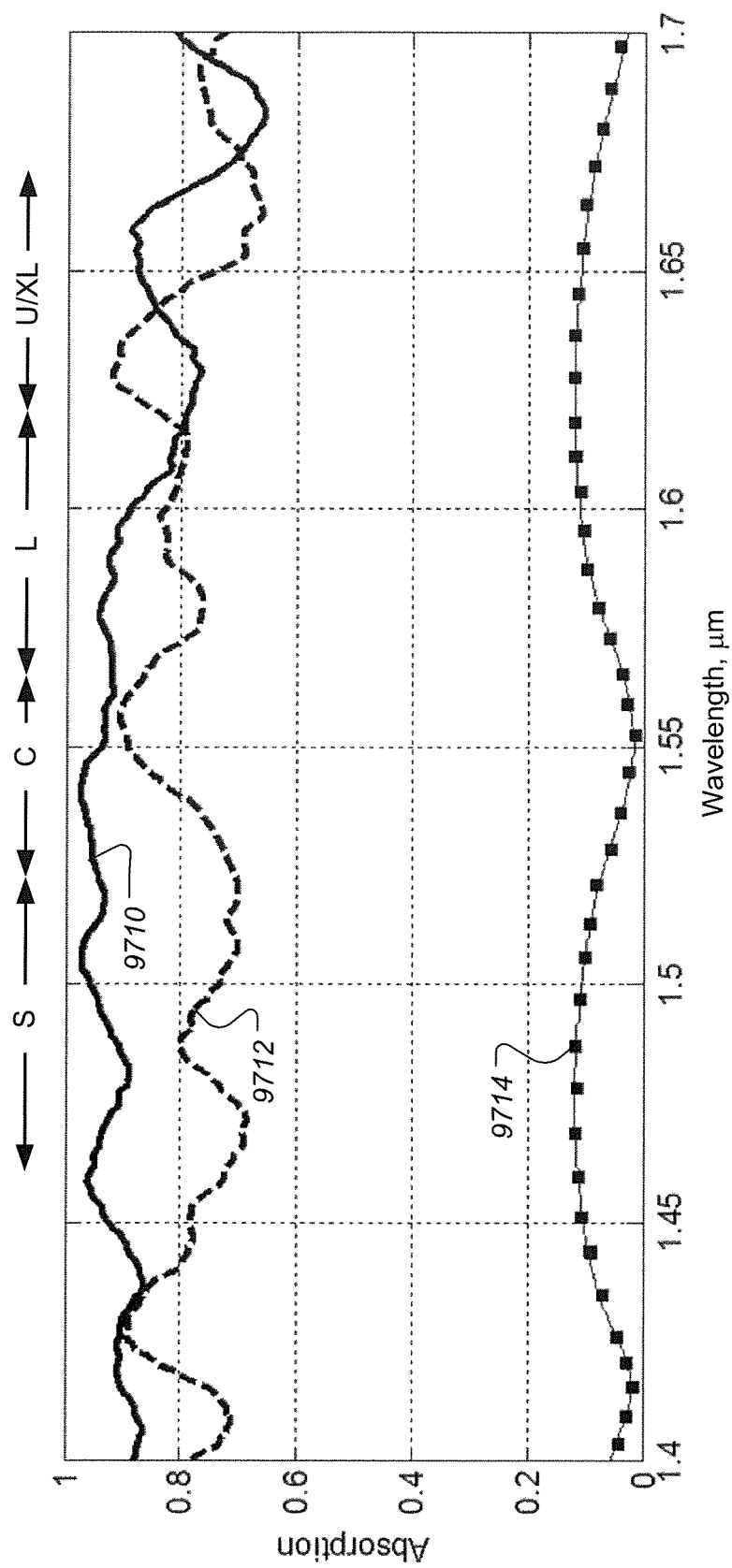
FIGS. 97A and 97B are graphs showing the absorption for light incident on a microstructure with layer structure as shown in FIG. 82A.
Figure 97B:
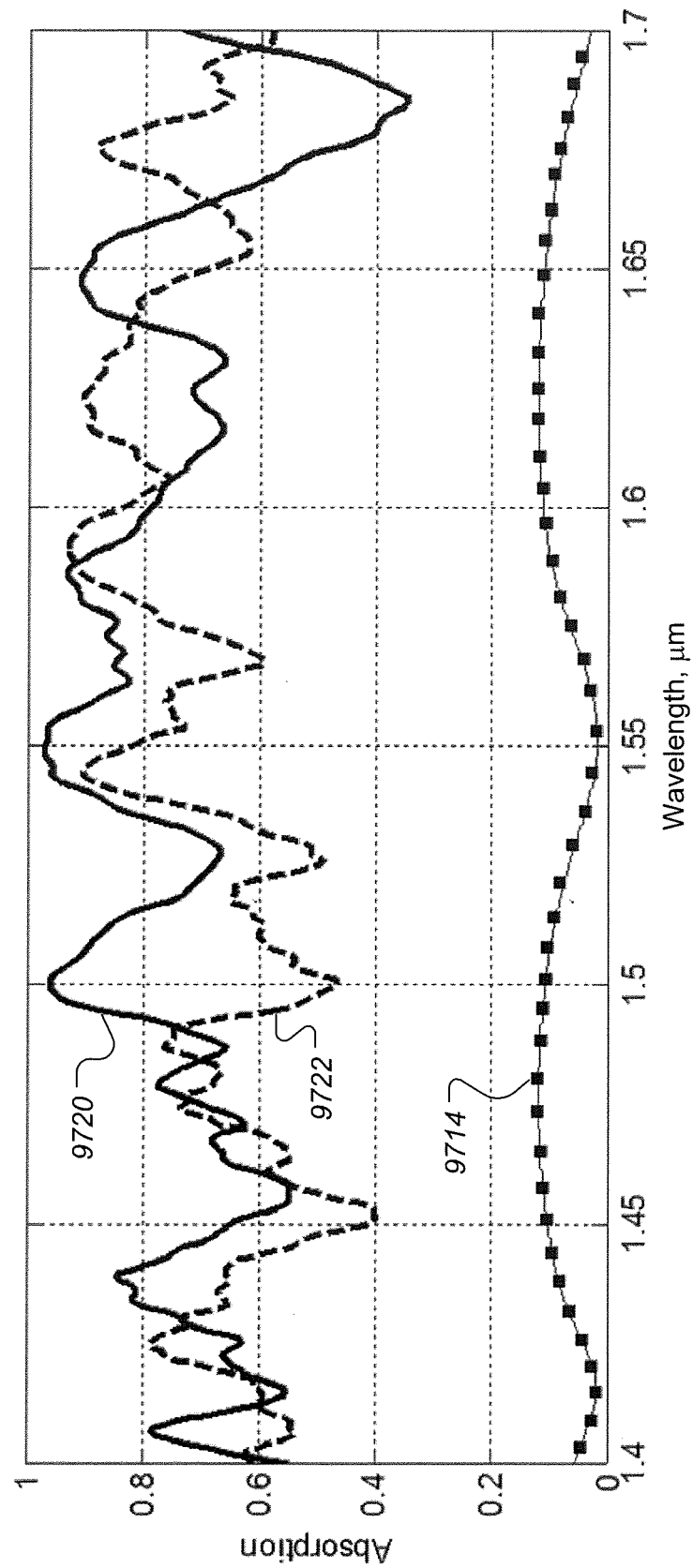

FIGS. 97A and 97B are graphs showing the absorption for light incident on a microstructure with layer structure as shown in FIG. 82A. The holes in hexagonal and square lattice arrays are etched with hole diameters of 1500 nm and periods of 2000 and 2500 nm. In FIG. 97A, curve 9710 shows a hexagonal lattice with hole diameter and period of 1500 nm and 2000 nm respectively. Curve 9712 is a for square lattice with the same period and hole diameter. The absorption is over 80% from 1.4 to 1.6 µm wavelength and at 1.55 µm it is over 90% for the hexagonal lattice. Curve 9714 is the absorption without any microstructured holes giving 10% or less absorption and at 1.55 µm only a few percent absorption. In addition, with the hexagonal lattice, the absorption varies by less than 10% over a wavelength span from 1450 nm to 1600 nm. FIG. 97A also shows the data and communication bands; S, C, L and U/XL. With a structure as in FIG. 82A, MS-PD/APD can be used in all these bands from S to U/XL.

In FIG. 97B, curve 9720 shows absorption vs. wavelength for a hexagonal hole lattice with a period of 2500 nm and a hole diameter of 1500 nm, and curve 9722 is for a square lattice with the same period and diameter. It is less optimal, however, at 1.55 µm wavelength, the absorption is over 90%. Curve 9714 is also shown for reference.

Absorption and quantum efficiency are directly proportional, and approximately 90% absorption with minimal reflection can be equivalent to approximately 90% quantum efficiency. For example, external quantum efficiency can be defined as $QE=(1-R)(1-e^{-\alpha x})$ where R is reflection from the surface of the MS-PD/APD, α is the absorption coefficient, and x the absorption length. Absorption can be given by $(1-e^{-\alpha x})$ which is the amount of photons absorbed in a length x with absorption coefficient α. Absorption of 90% at 1.55 µm wavelength translates to the product of the absorption coefficient and the length of absorption; αx is approximately equal to 2.3. If the bulk absorption coefficient is used, 460/cm at 1.55 µm wavelength, then x is approximately 50 µm. Compared to the physical length of 2.2 µm of Ge, then light would have traversed the absorbing region approximately 23 times. Equivalently, if the physical absorption length is 2.2 µm, then the enhanced effective absorption coefficient is approximately 10455/cm at 1.55 µm wavelength, as compared to the bulk absorption coefficient of approximately 460/cm at 1.55 µm wavelength. Again this indicates an enhancement of approximately 23 times.

The absorption enhancement can be caused by any of the following alone or in combination: field enhancement, interference, plasmonic, metamaterial absorber, high contrast grating, wavelength and sub wavelength feature size, non-linear effects, resonance effects, high contrast grating with loss, slow wave, coupled wave, coupled resonances, coupled modes, and photonic crystal (see, e.g., Krauss, J. "Slow light in photonic crystal waveguides" Phys. D: Appl. Phys. 40 2666-2670 (2007), incorporated herein by reference).

In addition, the quantum efficiency, which is directly proportional to the absorption, is high over the range of data/tele communication wavelengths. The standard bands are S (1460-1530 nm), C (1530-1565 nm), L (1565-1625 nm), and U/XL (1625-1675 nm). Other bands not shown also can have high absorption efficiency are O (1260-1360 nm), E (1360-1460 nm). A single microstructured Ge on Si PD/APD can cover the entire data/tele communication wavelength spectrum. See e.g., Gasca, "From O to L: The Future of Optical-Wavelength Bands"|www.broadband-properties.com|BROADBAND PROPERTIES, June 2008, which is incorporated by reference herein.

Figure 98:
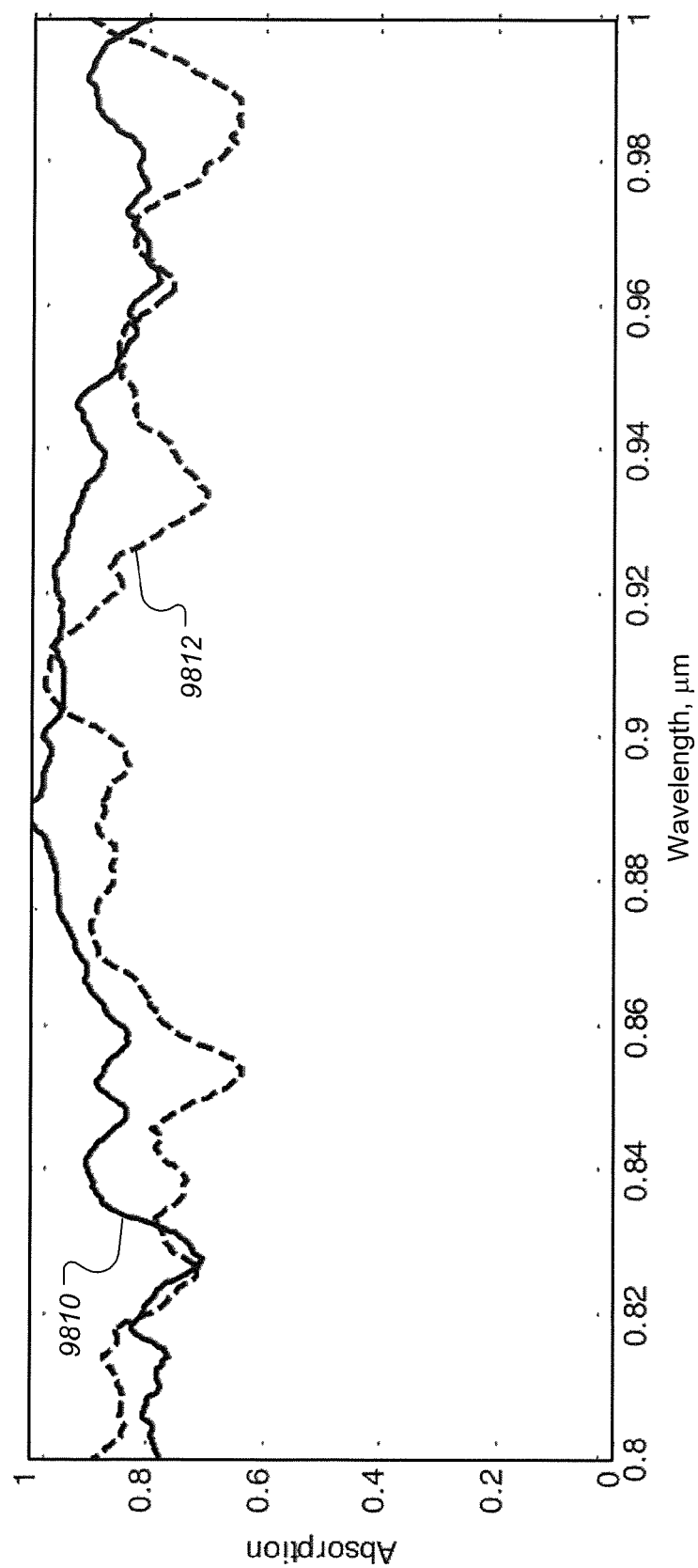
FIG. 98 is a graph showing simulated absorption for the structure shown in FIG. 82A and simulated in FIGS. 97A and 97B.

FIG. 98 is a graph showing simulated absorption for the structure shown in FIG. 82A and simulated in FIGS. 97A and 97B. Curves 9810 and 9812 show absorption for a hexagonal lattice and square lattice, respectively. In each case, the hole period was 2000 nm and diameter was 1500 nm. It can be seen that the structure will also absorb well in the 850 nm wavelength range: better than 80% absorption between 830 to 1000 nm. An advantage is that with a single device the wavelength coverage can span from 800 to 1700 nm and longer with better than 70% absorption and/or quantum efficiency. Such Ge on Si MS-PD/APDs can be integrated with electronics such that a single chip with MS-PD/APD and transimpedance amplifier or other integrated circuit electronics for signal processing which greatly reduce assembly and packaging costs.

Figures 99, 100:
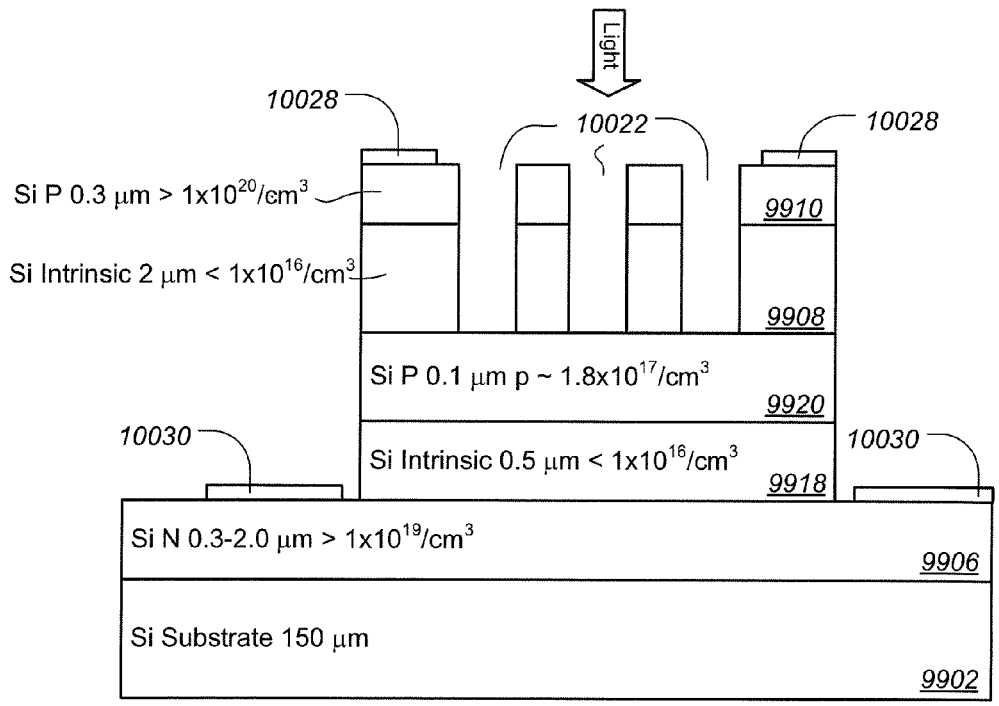
FIG. 99 shows another preferred epitaxial structure for a Si avalanche photodiode for operation in wavelength range from 800 to 1000 nm, according to some embodiments.
FIG. 100 is a diagram showing some features of a microstructured APD, according to some embodiments.

FIG. 99 shows another preferred epitaxial structure for a Si avalanche photodiode for operation in wavelength range from 800 to 1000 nm, according to some embodiments. In particular, the structure shown has been found to operate very well around 850 nm plus or minus 30 nm where the bulk of datacommunication takes place and for data rates of 5-40 Gb/s or greater. Microstructures will be used to enhance the absorption, which can either be enhanced absorption coefficient and/or enhanced absorption length. The N Si substrate 9902 can be thinned to 150 µm after device processing. The epitaxial layers are: N Si layer 9906 which is the N contact layer of thickness ranging from 0.1-4 µm, and in some cases, from 0.3 to 2 µm with doping greater than $1\times10^{19}/cm^3$; Si intrinsic or "I" layer 9918 which is the multiplication or gain layer, also known as the avalanche layer, of thicknesses ranging from 0.2 to 1 µm, and in some cases 0.5 µm with background doping less than $1\times10^{16}/cm^3$; P Si layer 9920 which is a charge layer, of thickness range from 0.02 to 0.3 µm and in some cases 0.1 µm with a doping ranging $1\text{-}6\times10^{17}/cm^3$, and in some cases $1.8\times10^{17}/cm^3$; Si intrinsic "I" layer 9908 which is the absorption layer with thicknesses ranging from 0.3 to 4 µm and in some cases 2 µm with background doping less than $1\times10^{16}/cm^3$; and P Si layer 9910 which is the P contact layer with thicknesses ranging from 0.1 to 2 µm and in some cases 0.3 µm with doping greater than $1\times10^{20}/cm^3$ for example.

FIG. 100 is a diagram showing some features of a microstructured APD, according to some embodiments. The MS-APD uses the material structure depicted in FIG. 99. Microstructured hole array 10022 is etched into the P Si contact layer 9920 and into the "I" Si absorbing layer 9918 either partially or entirely. Light impinges from the top surface or the P Si layer 9910 either normal to the surface and/or off normal to the surface. A mesa etch is performed to N contact layer 9906 that defines the capacitance of the device. P ohmic contact 10028 and N ohmic contact 10030 are formed on the P Si contact layer 9910 and N Si contact layer 9906 respectively. A reverse bias of 10-60 volts is applied to the P and N ohmic contacts. Negative voltage is applied to the P contact (anode) in respect to the N contact (cathode). Not shown for simplicity are elements such as passivation layers, planarization layers, bridging layers, bond metallization layers, and guard rings. The combination of a microstructured photodiode with enhanced absorption with a Si avalanche or gain layers allow the microstructured Si APD to operate in the wavelength range of 800-1000 nm and particularly at 850 nm plus or minus 30 nm at data rates greater than 5 Gb/s and in some cases greater than 10 Gb/s. In other cases the data rates can be 15-40 Gb/s with multiplication factors of 2, 4, 6, 8, 10, or greater. An advantage of a Si Microstructured APD is the lower excess noise, which is lower than for example GaAs and/or InP based APD.

Figures 101, 102:
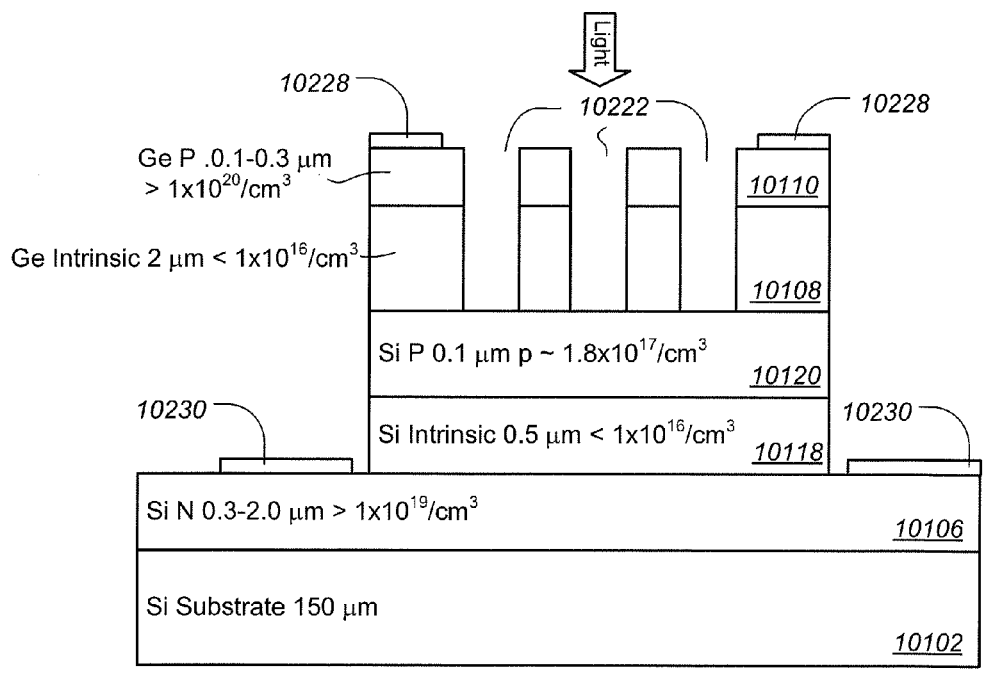
FIG. 102 is a diagram showing some features of a microstructured Ge on Si APD.

FIG. 101 shows another preferred epitaxial structure for a Ge on Si avalanche photodiode for operation in wavelength ranges from 800 to 1700 nm, according to some embodiments. In particular the structure shown has been found to operate well around 1550 nm plus or minus 200 nm where the bulk of telecommunication takes place and for data rates of 5-40 Gb/s or greater. Microstructures will be used to enhance the absorption, which can either be enhanced absorption coefficient and/or enhanced absorption length. The N Si substrate 10102 can be thinned to 150 μm after device processing. The epitaxial layers are: N Si layer 10106 which is the N contact layer of thickness ranging from 0.1-4 μm, and in some cases, from 0.3 to 2 μm with doping greater than $1\times10^{19}/cm^3$; Si intrinsic or "I" layer 10118 which is the multiplication or gain layer, also known as the avalanche layer, of thicknesses ranging from 0.2 to 1 μm, and in some cases 0.5 μm with background doping less than $1\times10^{16}/cm^3$; P Si layer 10120 which is a charge layer, of thickness range from 0.02 to 0.3 μm and in some cases 0.1 μm with a doping ranging $1-6\times10^{17}/cm^3$, and in some cases $1.8\times10^{17}/cm^3$; Ge intrinsic "I" layer 10108 which is the absorption layer with thicknesses ranging from 0.3 to 4 μm and in some cases 2 μm with background doping less than $1\times10^{16}/cm^3$; and P Ge layer 10110 which is the P contact layer with thicknesses ranging from 0.1 to 2 μm and in some cases 0.2 μm with doping greater than $1\times10^{20}/cm^3$. Often at the interface between Si and Ge, a low temperature Ge buffer layer can be grown prior to regular Ge epitaxial growth. See, e.g. Kang et al.

FIG. 102 is a diagram showing some features of a microstructured Ge on Si APD, according to some embodiments. The MS-APD use the material structure depicted in FIG. 101. Microstructured hole array 10222 is etched into the P Ge contact layer 10110 and into the "I" Ge absorbing layer 10108 partially or entirely with dimension, diameter and hexagonal lattice as in FIG. 97A. Light impinges from the top surface or the P Si layer either normal to the surface and/or off normal to the surface. A mesa etch to N contact layer 10106 defines the capacitance of the device and P ohmic contact 10228 and N ohmic contact 10230 are formed on the P Ge contact layer and N Si contact layer respectively. A reverse bias of 10-60 volts is applied to the P and N ohmic contacts. Not shown for simplicity are passivation layers, planarization layers, bridging layers, bond metallization layers, and guard rings. The combination of a microstructured Ge photodiode with enhanced absorption with a Si avalanche or gain layers allow a microstructured Ge on Si APD to operate in the wavelength range of 800-1700 nm and particularly at 1550 nm plus or minus 200 nm at data rates greater than 5 Gb/s and in some cases greater than 10 Gb/s and further in some cases greater than 15-40 Gb/s with a multiplication factor of greater than 2 and in some cases greater than 4 and further in some cases greater than 8-10. An advantage of a Ge on Si Microstructured APD is the lower excess noise, which is lower than for example GaAs and/or InP based APD.

Figure 103B:
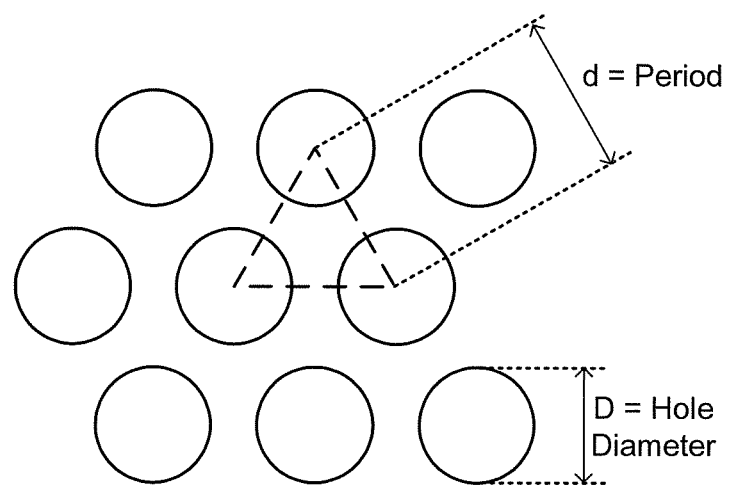
Figure 103C:
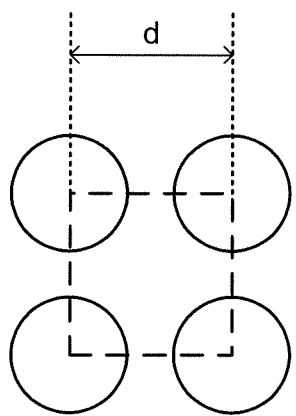

FIGS. 103A-C show hole diameters, periods, and other parameters for microstructured silicon and germanium on Si photodiodes and avalanche photodiodes, according to some embodiments. FIG. 103A is a table showing various parameters used. According to some embodiments, both hexagonal and square lattices can be used. Other lattices and/or non-lattice arrangement of holes are also possible, but not shown. Mesa sizes of 10, 25, 30, 40, 50, 60, 80 μm diameters are used for achieving capacitances to support data rates from 5 to over 80 Gb/s. According to some embodiments, other methods of defining junction capacitance can be used such as ion implantation or diffusion to deplete carriers. Hole diameters and periods for operation of Si microstructured PD and APD in the wavelength range of 800-1000 nm and in particular 850 nm plus or minus 30 nm, can range from (diameter/period in nm) 1300/2000, 1500/2000, 700/1000, 630/900 for either hexagonal and/or square lattice for example. For Ge on Si microstructured PD and APD, for operation in the wavelength range from 800-1700 nm and in particular 1550 nm plus or minus 200 nm, examples of hole diameter and period combinations for either hexagonal or square lattices include: 1300 nm/2000 nm, 1500 nm/2000 nm, 1500 nm/2500 nm, and 1300 nm/2300 nm. Other hole diameters and periods are also possible. Absorption better than 50%, and in some cases better than 70% or 90% can be achieved with those hole diameters and periods at wavelengths of 800-1000 nm and 800-1700. In FIGS. 103B and 103C, "d" is shown as the period for the hexagonal and square lattice patterns. While circular holes are depicted, non-circular holes such as elliptical, rectangular, polygon, and/or other irregular shapes are also possible. Circular holes were chosen for simplicity of simulation using FDTD.

Figure 104A:
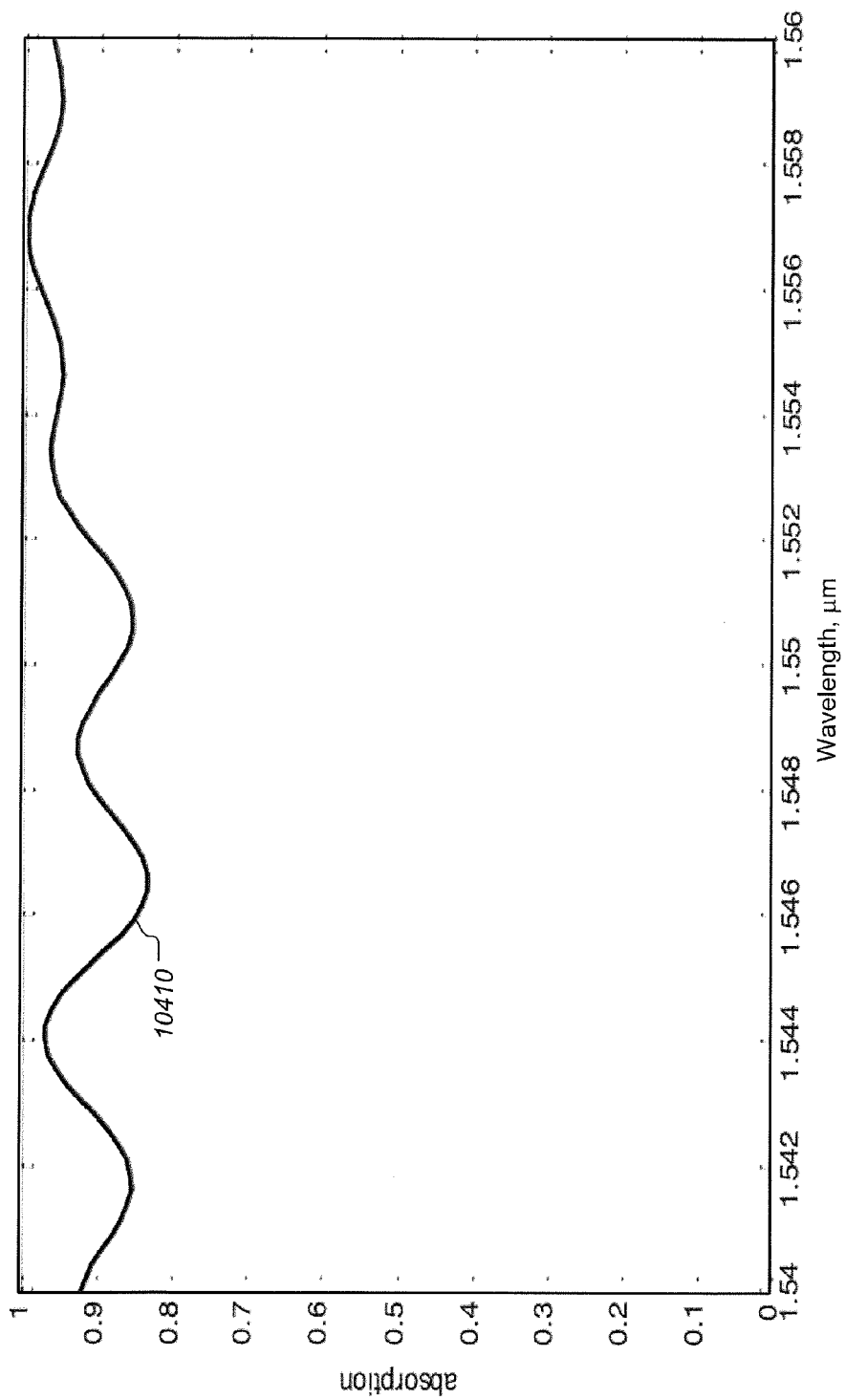
FIGS. 104A and 104B are graphs showing simulation results using FDTD (finite difference time domain) for absorption verse wavelength for the structure shown in FIG. 82A which is microstructured Ge P-Ge I-Si N on Si N substrate photodiode.
Figure 104B:
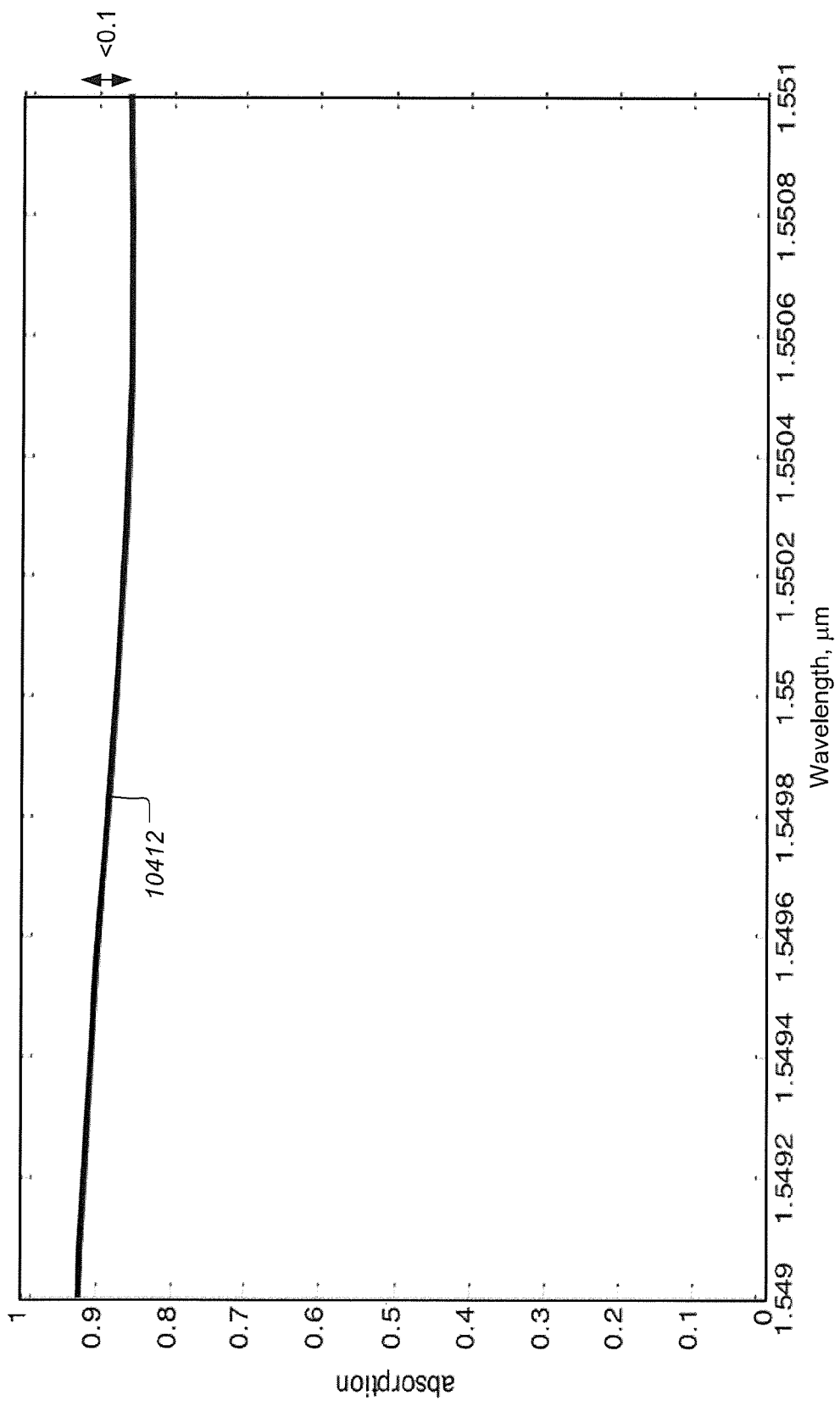

FIGS. 104A and 104B are graphs showing simulation results using FDTD (finite difference time domain) for absorption verse wavelength for the structure shown in FIG. 82A which is microstructured Ge P-Ge I-Si N on Si N substrate photodiode. Note that the simulation results can also apply to a microstructured Ge P Ge I Si P Si I Si N APD). The simulation used a hexagonal lattice, hole diameter of 1500 nm, hole period of 2000 nm, where the holes are etched to the Si N layer. In this simulation, the wavelength is centered at 1550 nm with plus and minus 10 nm (curve 10410 in FIG. 104A) and 1550 nm plus and minus 1 nm (curve 10412 in FIG. 104B). The simulation mesh is finer than 0.1 nm and from curve 10412 in FIG. 104B, it can be seen that the absorption varies by less than 10 percent with a high absorption value of over 0.9 (90% absorption) and a low absorption value of over 0.85 (85% absorption) over 1549 to 1551 nm wavelength. This characteristic in the absorption vs wavelength is important in optical telecommunication applications where there are no rapid changes in the absorption within 2 nm of wavelength variation centered for example at 1550 nm. Curve 10410 in FIG. 104A shows the absorption variation from 0.8 to over 0.99 over a 20 nm wavelength variation centered at 1550 nm. Over any 2 nm wavelength variation the absorption variation is less than 15%. In certain cases it's less than 5%. Channel spacing in wavelength division multiplexing (WDM) for coarse WDM can be 2 nm or greater, whereas for dense WDM channel spacing can be 0.8, 0.4 nm or less so that for example at 1550 nm 3 or more channels can fit in a 2 nm spectral width, whereas for coarse WDM 4 nm or more is needed.

Figure 105A:
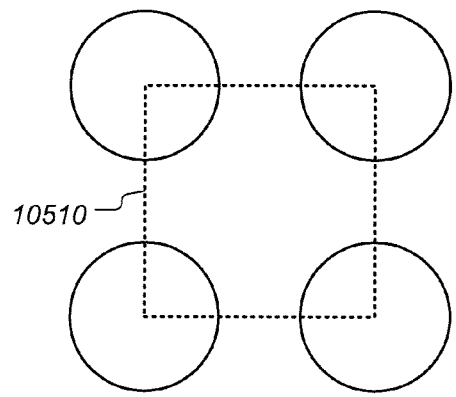
FIGS. 105A and 105B relate to eigenmodes for a square lattice hole pattern, according to some embodiments.
Figure 105B:
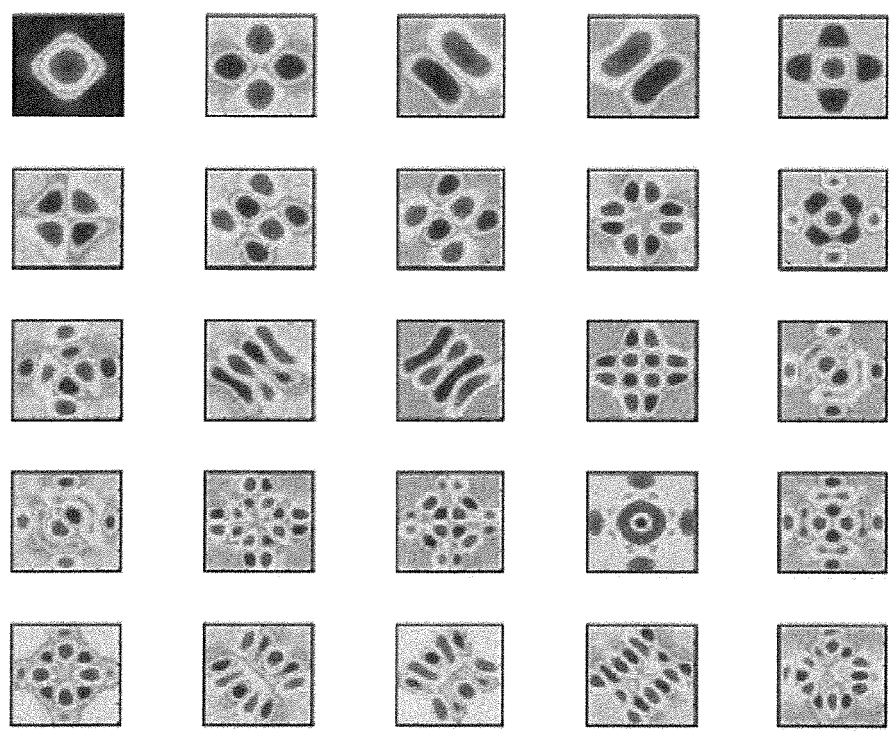

FIGS. 105A and 105B relate to eigenmodes for a square lattice hole pattern, according to some embodiments. FIG. 105A shows a single unit cell 10510 in a square lattice arrangement. FIG. 105B shows various 2D eigenmodes (stationary modes, standing wave modes, resonant modes) (from FDTD simulation using Maxwell Equations) in a unit cell of the microstructured holes in a Si (or Ge) material. The wave propagates along the length of the microstructured hole array, for example between the air/semiconductor interface to the Ge/Si interface. The waveguide and/or resonator is defined by the region to which the microstructured holes are etched. The length of the hole and semiconductor in the unit cell can be thought of as an optical waveguide and/or resonator and the many parallel optical waveguides/resonators of adjacent unit cells can be coupled resulting in coupled waves, coupled modes and/or coupled resonators in a 2D array. A combination of high contrast grating (HCG), photonic crystal, slow wave effects and coupled waveguides/resonators eigen modes, super modes, field enhancement, linear and non-linear effects, transverse modes, guided resonant modes, Bloch modes, and coupled Bloch modes can cause the observed enhancement of the "αx" product in the expression for quantum efficiency which is proportional to $(1-e^{-\alpha x})$ which is the absorption, where α is the bulk material absorption coefficient and x is the absorption length. Keeping x constant, α can be enhanced; keeping α constant, x can be enhanced; and in some cases both α and x can be enhanced. FIG. 105B shows the many complex Eigenmodes of the unit cell 10510 of a square lattice in FIG. 105A. Each cell in the square lattice can have any one or multiple of these Eigenmodes and can couple to the Eigenmodes of adjacent cells, the massively coupled modes of all the cells can be called a super mode. This massive coupling can then result in "smoother" absorption characteristics verses wavelength where smoother can be defined as having less than 10% variation in the absorption characteristics over a certain wavelength span, 20 nm for example, and in certain cases 50 nm and in certain cases 100 nm or more.

Figure 106:
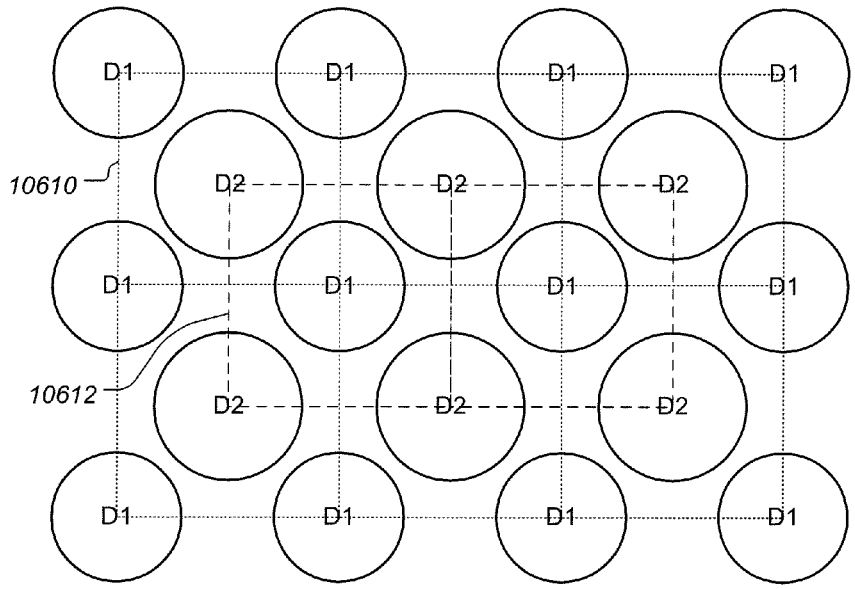
FIG. 106 is a schematic diagram showing microstructured holes with two square lattices arranged overlapping each other, according to some embodiments.

FIG. 106 is a schematic diagram showing microstructured holes with two square lattices arranged overlapping each other, according to some embodiments. The dotted line squares 10610 represent a unit cell of square lattice with D1 as the hole diameter. The dashed line squares 10612 represent another square lattice with similar period but with D2 as the hole diameter and where D1 is not equal to D2. If D1 equals to D2 then it's a square lattice (tilted by 45 degrees). Or equivalently, if the periods of the two square lattices are similar, then it can be also thought of as a hexagonal lattice with two different hole diameters. The lattice pattern can also have more than two different hole diameters; for example, it can have three different hole diameters in a hexagonal lattice. In one preferred microstructures of holes, for example, D1 can be 1300 nm diameter and the square lattice can have a period of 2000 nm, and D2 can be 1500 nm diameter and the square lattice can have a period of 2000 nm. An advantage of including more than one hole diameter in the microstructure array is the absorption versus wavelength curve may be further flattened such that variations in the absorption can be less than 20% over 800-990 nm in wavelength for microstructured PD/APD made in Si, and for 1250-1750 nm wavelength for microstructured PD/APD made in Ge on Si as in FIG. 101. In some cases the absorption varies less than 10% over these wavelength ranges, and in some cases less than 5%. Also, the overall absorption or equivalently the quantum efficiency of the microstructured PD/APD may be improved.

Interspersing the different hole diameters can further flatten the quantum efficiency which is directly proportional to absorption over a wider range of wavelength and in particular from 800-990 nm for microstructured PD/APD in silicon and from 1000-1800 nm for microstructured PD/APD in Ge on Si. Other hole diameters and periods are also possible, according to some embodiments.

According to some embodiments, the improvement in the absorption of the microstructured holes and/or pillars used for enhancing the quantum efficiency of PD/APD, where the bulk absorption coefficient is insufficient to maintain an adequate quantum efficiency within a design parameter such as thickness of the absorbing material for example, can be applied to other devices that use absorption of photons such as solar cells, imaging sensors, radiation absorbers, to name a few.

Figure 107:
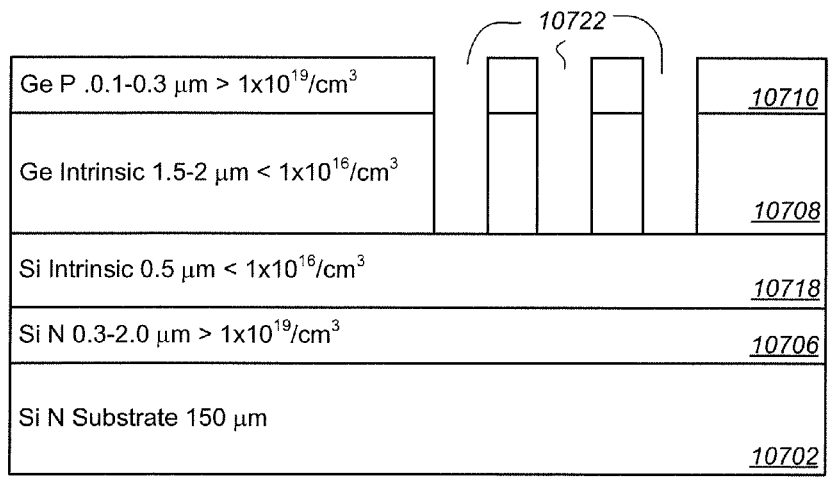
FIG. 107 is a diagram showing an epitaxial structure of Ge on Si, according to some embodiments.

FIG. 107 is a diagram showing an epitaxial structure of Ge on Si, according to some embodiments. The structure is similar to that depicted in FIG. 82A, but with an added Si I layer 10718 of 0.1-0.5 µm thickness with background doping (can be either n or p) of less than $1\text{-}5\times10^{16}/cm^3$ grown on a Si N layer 10706 of 0.2 µm (or a range of 0.1-2 µm) with a N doping $>1\times10^{19}/cm^3$ followed by a Ge I layer 10708 that is not intentionally doped with background doping $<5\times10^{16}/cm^3$ and in some cases $<5\times10^{15}/cm^3$ and with thickness of 2 µm, or a range from 0.5-2.5 µm. P Ge layer 10710 is on to top with doping of $>1\times10^{19}/cm^3$ and with thickness of 0.2 µm or a range from 0.2-0.5 µm. All of these layers are grown on an N Si substrate 10702. Microstructured holes array 10722 can be formed using the parameters shown in FIGS. 103A-C. According to some embodiments, the hole diameters are 1300-1500 nm and period is 2000 nm in a hexagonal or square lattice. According to other embodiments, a layout such as shown in FIG. 106 is used. In such cases the holes with multiple diameters can be, for example, 1300 and 1500 nm square lattices of period 2000 nm nested within each other as shown in FIG. 106.

The Si I layer 10718 is used to bring the dopant in Si to a low level such that the dopant diffusion into the Ge I layer 10708 is reduced or minimized to allow a Ge I layer to be grown. Dopant such as phosphorus for N type doping tend to diffuse faster in Ge than in Si.

According to some embodiments, the structure shown in FIG. 107 is for a microstructured PD and can also be for a microstructured APD with the addition of a multiplication layer and a charge layer as in FIG. 101. The wavelength range for this structure can be from 800-1700 nm and in particular around 1550 nm plus or minus 200 nm.

The added Si "I" layer 10718 also helps to reduce capacitance of the device since the "I" layer is now the sum of the Ge I and the Si I layers. The reduction in capacitance helps increase the modulation bandwidth of the PD/APD. The Si "I" layer in some cases can range in thickness from 0.1 to 3 µm, for example. Holes 10722 can be etched to the Si "I" layer, for example, and/or etched into the Si "I" layer in some cases.

Figure 108:
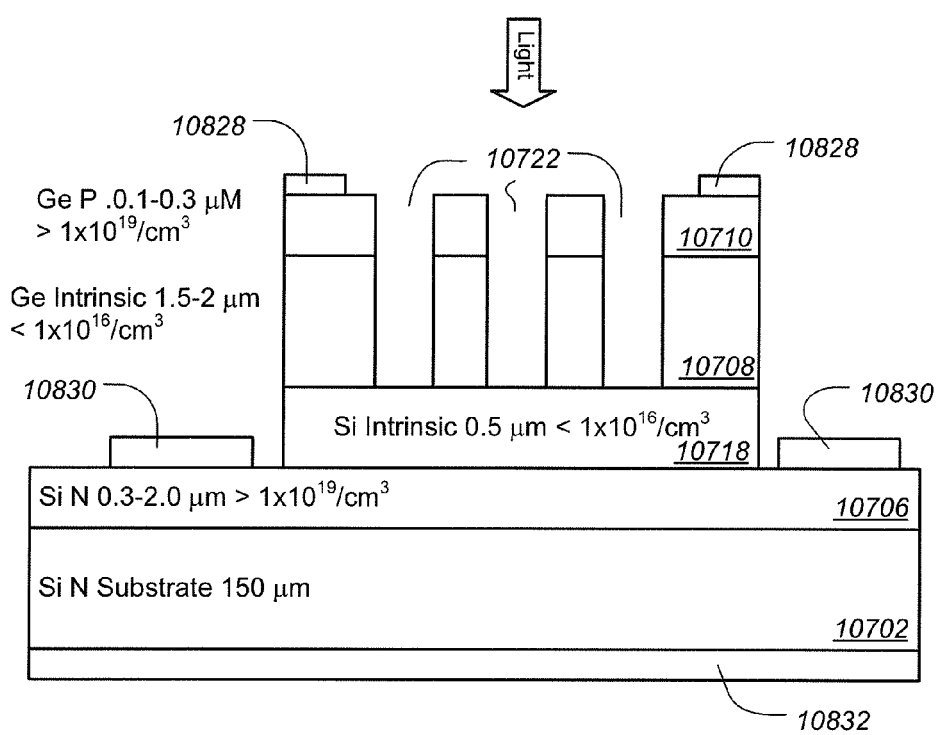
FIG. 108 is a diagram showing the basic features of a microstructured photodiode of Ge on Si, according to some embodiments.

FIG. 108 is a diagram showing basic features of a microstructured photodiode of Ge on Si, according to some embodiments. The structure is similar or identical to that depicted in FIG. 107. The MS-PD has been found to operate well in wavelength ranges of 1300-1700 nm, as well as 600-1300 nm. Light as shown impinges from the top surface where the hole arrays are etched. With some minor changes, light can also impinge from the bottom of the substrate with the N ohmic contact 10832 on the bottom having an aperture and the bottom of the Si substrate 10702 being polished with antireflection coating. In addition, a via (not shown) can be formed on the bottom Si substrate 10702 such that it can provide a guide for the optical fiber for alignment to the microstructured PD. In this example, the holes 10722 are etched to the Si I layer 10718. According to some embodiments, they can also be etched past or into the Si I layer, or not etched through to the Si I layer. Hole arrays can have multiple hole sizes, and multiple periods and can be non-periodical. Hole diameters can range from 500-1700 nm and periods can range from 1000-2500 nm. According to some embodiments, hole diameters are 1300 and 1500 nm with period of 2000 nm in a square or hexagonal lattice. In addition, 1300 and 1500 nm holes can be in a square lattice with period of 2000 nm that are nested within each other as shown in FIG. 106. Hole diameters and periods can vary by 10-50 nm and in some cases by 50-100 nm. Not shown are passivation layers that can have thicknesses of 2-100 nm on the walls of the semiconductor. Passivation can be used in the high field regions of the exposed mesa to reduce leakage current. A reverse bias of −2 to −12 volts is applied between the P contact 10828 and N contacts 10830 (and/or 10832). Reverse bias means that a negative voltage is applied the P (anode) with respect to the N (cathode) contacts. Voltages shown with negative sign or without negative sign are meant to be negative at the anode with respect to the cathode. In addition, holes can have different shapes, not necessarily all circular.

It is known to use nanowires in photodetectors. The nanowires are InP and the photodetector demonstrate a 14 ps response time, or equivalently in the frequency domain for a Gaussian transform limited approximately 30 GHz 3 dB modulation bandwidth. See, V. J. Logeeswaran et al., "A 14-ps full width at half maximum high-speed photoconductor fabricated with intersecting InP nanowires on an amorphous surface" Appl. Phys. A 91, 1-5 (2008) (hereafter "Logeeswaran et al.") which is incorporated by reference herein. In Logeeswaran et al, the impinging photons were at 780 nm and the InP absorption coefficient at approximately 780 nm is approximately 35000 $cm^{-1}$ and no enhancement of the absorption nor the absorption length was needed. Similarly in another known technique, 850 nm photons were impinged on the nanowires and the absorption coefficient of GaAs at approximately 850 nm is approximately 12000 $cm^{-1}$ where again enhancement of absorption and/or length was not needed. See, M. A. Seyedi et al., "Efficient Schottky-like junction GaAs nanowire photodetector with 9 GHz modulation bandwidth with large active area" APPLIED PHYSICS LETTERS 105, 041105 (2014), incorporated by reference herein. In contrast, according to the techniques described herein, high speed photodiode/avalanched photodiode are described with ps response times and/or modulation bandwidths of 5 Gb/s or greater. In Si at 850 nm the absorption coefficient is approximately 700 $cm^{-1}$ and enhancement of the absorption and/or absorption length is used to achieve quantum efficiency of 40% or better. Similarly for Ge at approximately 1550 nm the absorption coefficient is approximately 459 $cm^{-1}$ which also uses enhancement of the absorption and/or absorption length.

For example, for a 2 μm thick absorbing "I" layer for a typical high speed or high modulation bandwidth PD/APD for operation in approximately 10-30 Gb/s for example (the "I" layer can vary from 0.3-3.5 μm depending on modulation bandwidth of the PD/APD) only approximately 13% of photons at 850 nm are absorbed without enhancement. With enhancement of the absorption and/or absorption length by approximately 12 times or more by microstructured hole arrays (or pillars) described in this patent application for example, over 80% of the photons can be absorbed in a physical "I" absorption length of 2 μm. It has been demonstrated herein that the use of weakly absorbing (approximately 1000 $cm^{-1}$ or less) material such as Si and Ge at datacom and telecom wavelengths of 850 and 1550 nm respectively and with the addition of microstructured holes and/or pillars, the absorption or absorption coefficient and/or absorption length can be enhanced to the point where the material becomes strongly absorbing (approximately 2000 $cm^{-1}$ or more) and the microstructured PD/APD can be used for high speed or high modulation bandwidth data and tele communication applications and systems.

In some cases only approximately 40% absorption is sufficient for certain optical data/tele communication and an enhancement of the absorption and/or absorption length of only about 3 times is needed for example 2 μm Si "I" layer at 850 nm, or 4.5 times enhancement factor of the absorption coefficient or absorption length for Ge at 1550 nm wavelength for a 2 μm Ge "I" layer. Higher enhancement factors are possible, factors greater than 10 and in some cases greater than 20 and in some cases greater than 40. As the semiconductor bulk material absorption coefficient becomes smaller, the enhancement factor becomes larger, to 100 or more.

Absorption of Si nanowires is discussed in Lu Hu and Gang Chen, Nano Lett., Analysis of Optical Absorption in Silicon Nanowire Arrays for Photovoltaic Applications, Vol. 7, No. 11, 2007, (hereinafter "Hu et al.") which is incorporated by reference herein. The absorption at 1.46 eV which corresponds to 850 nm wavelength is not enhanced as compared to a thin Si film, and where above approximately 2.25 eV or approximately 550 nm or shorter wavelength, the absorption is enhanced as compared to a thin Si film. Hu et al. further add: "[W]hereas in the low-frequency regime, the improvement cannot be achieved due to the small extinction coefficient of silicon".

A similar conclusion is reached also in another publication: Chenxi Lin and Michelle L. Povinelli, "Optical absorption enhancement in silicon nanowire arrays with a large lattice constant for photovoltaic applications", Vol. 17, No. 22/OPTICS EXPRESS 19371, 26 Oct. 2009 (hereinafter "Lin et al.") which is also incorporated by reference herein. Lin et al. shows a resonant enhancement of the absorption at approximately 1.5 eV which Lin et al. attributes to guides resonance mode or slow Bloch mode that result in an increase in the electromagnetic field intensity in the nanostructures. Lin et al. states: "[C]oupling of incident light from air to high-Q leaky modes of the 2D periodic structure". The sharp resonance of the high Q modes is not desirable in a photodiode use for data and/or telecommunication applications. This characteristics of resonant photodiodes are discussed for example in J. D. Schaub et al, Resonant-Cavity-Enhanced High-Speed Si Photodiode Grown by Epitaxial Lateral Overgrowth, IEEE PHOTONICS TECHNOLOGY LETTERS, VOL. 11, NO. 12, DECEMBER 1999, (hereinafter "J. D. Schaub et al.") which is incorporated by reference herein. Schaub et al. shows quantum efficiencies as high as 40% at approximately 800 nm wavelength, (see FIG. 3 in Schaub et al.). However, its sharp resonance is undesirable since any drift in wavelength of the transmitter due to temperature (0.3 nm/degree for certain diode lasers for example, laser internal temperature due to joule heating and ambient can vary as much as 80 degree C. or more in a datacenter for example), for example, can result in a significant change in quantum efficiency. The previously known resonant photodiodes with sharp resonance may also be temperature sensitive in terms of the peak resonant wavelength where the quantum efficiency is the highest. In addition, laser sources often have variation in the lasing wavelengths due to manufacturing variability, and it is undesirable to have to match laser to photodiode precisely in wavelength. Variability in manufacturing of the resonant photodiode may also result in resonant peaks at varying wavelengths. This reduces the yield and increase the cost of optical systems since careful testing of wavelengths of the source and detector need to be matched and maintain temperature stability, A recent publication, Rui Ren, Yong-Xin Guo, and Ri-Hong Zhu, "Enhanced absorption in elliptical silicon nanowire arrays for solar energy harvesting", Optical Engineering 53(2), 027102 (February 2014), which is incorporated by reference, also shows similar results with weak or no enhancement at 1.5 eV but stronger enhancement of the absorption at higher energies.

In Donnelly et al., "Mode-based analysis of silicon nanohole arrays for photovoltaic applications", Vol. 22, No. S5, OPTICS EXPRESS A1343 25 Aug. 2014 (hereafter "Donnelly et al.") incorporated by reference herein, nanoholes were analyzed for photovoltaic applications. Sharp resonances are not an issue in photovoltaic applications since the solar spectrum is very broad (hundreds of nm) whereas in optical data/telecommunication the laser spectrum is very narrow from much less than 1 nm to a few nm, <0.01-3 nm for example depending the type of laser such as distributed feedback laser, Fabry-Perot laser, vertical cavity surface emitting laser (VCSEL) and weather its single or multimode and if its operated in CW with external modulation or direct modulation. Donnelly et al. also shows sharp resonances at 850 nm wavelength region for example with variations in absorption by as much as 75% or more over a wavelength span of 20 nm at 800 nm in FIG. 4 of Ref. Donnelly for example. FIG. 5 of Donnelly et al. shows optimal period of 500 nm with various nanohole depth, also showing sharp resonance at 850 nm wavelength for example where the absorption can vary form approximately 100% to 20% over a 10 nm wavelength span, a 80% change approximately in absorption. In addition to resonance guided mode, the paper also includes fundamental mode and channeling mode that can cause absorption enhancement.

Ripple in the absorption, which is directly proportional to quantum efficiency, of approximately 30%-40% and in some cases <20% or <10% are tolerable for data and telecommunication applications. In some cases, less than or equal to 5% in ripple of the quantum efficiency is desirable for a center wavelength of approximately 850 nm for example plus or minus 5, 10, 20, 50 or 100 nm.

Experimentally, light trapping and enhanced absorption was observed in Erik Garnett and Peidong Yang, "Light Trapping in Silicon Nanowire Solar Cells", *Nano Lett.* 2010, 10, 1082-1087 (hereinafter "Garnett et al.") incorporated by reference herein. FIG. 4 of Garnett et al. shows optical transmission of less than 10% at wavelength to 1100 nm and approximately 5% at 850 nm wavelength, if reflection can be neglected than the absorption is approximately 90-95% respectively from the equation 1=T+R+A where T is transmission, R is reflection and A is absorption, assuming all light is collected.

In another recent publication, Katherine T. Fountaine, Christian G. Kendall, and Harry A. Atwater, "Near-unity broadband absorption designs for semiconducting nanowire arrays via localized radial mode excitation", Vol. 22, No. OPTICS EXPRESS A930, 5 May 2014 (hereinafter "Fountaine et al.") incorporated by reference herein, simulation results of GaAs nanowires on Si of 3 μm height with varying diameters show that near unity absorption can be achieved with a fill factor of 5%. See, Fountaine et al. FIG. 4. The purpose of the simulation is the reduction of the use of material to achieve high efficiency photovoltaic devices; a 5% fill factor with 3 μm GaAs nanowires is equivalent to 150 nm of planar GaAs layer in terms of amount of material. However, a proper comparison of absorption enhancement is to compare the 3 μm GaAs nanowire with a 3 μm thick GaAs planar layer. In this case, the planar GaAs 3 μm layer will have unity absorption until it reach the bandgap edge of 1.42 eV or approximately 873 nm and it will drop sharply, at 886 nm the absorption coefficient is approximately 241/cm where it's weakly absorbing as compared to 5917/cm approximately at 855 nm, for example, where it is strongly absorbing, and a 3 μm thick layer approximately 7% is absorbed at 886 nm, approximately 83% absorption at 855 nm and approximately 99% absorption at 827 nm. Comparing a 3 μm GaAs layer with Fountaine et al. FIG. 4, there is no noticeable absorption enhancement. Without appreciable absorption enhancement, there is no advantage to use a nanowire photodiode over that of a bulk layer photodiode. In this case a bulk 3 μm GaAs photodiode will work just as well, if not better, than the 3 μm GaAs nanowire photodiode for data/tele communication at 800-850 nm wavelength.

According to techniques described herein, enhancement of the absorption (coefficient and/or length) is provided such that a 2 μm microstructured holes (can also be pillars and/or pillars and holes) for example in Si is significantly more absorbing than a 2 μm Si bulk layer photodiode at 800-900 nm wavelength for example for high data rate data/tele communication of 5 Gb/s or greater.

Figure 109A:
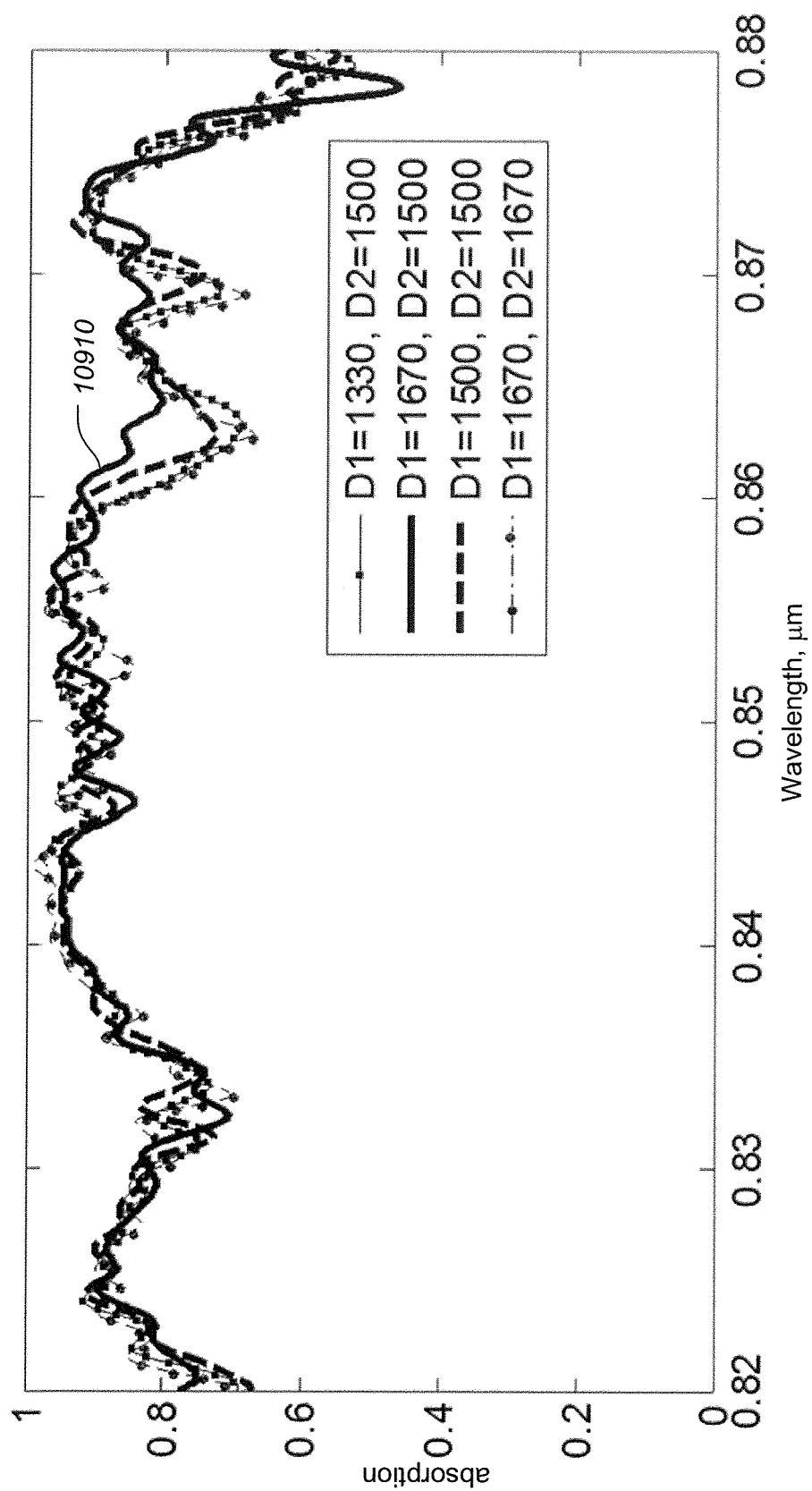
FIGS. 109A and 109B are graphs showing results of FDTD simulations using Maxwell equations for a microstructured hole array, according to some embodiments.
Figure 109B:
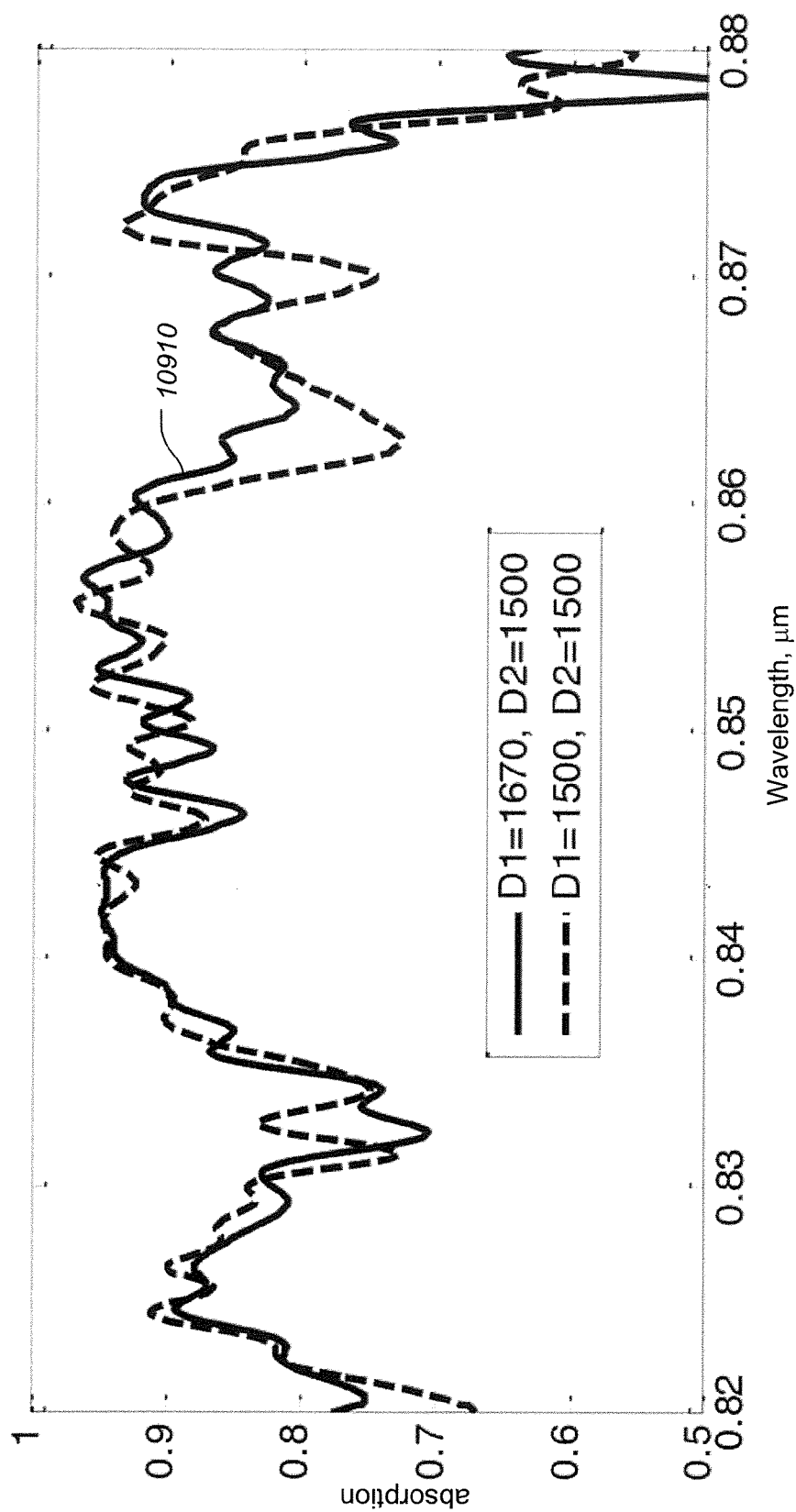

FIGS. 109A and 109B are graphs showing results of FDTD simulations using Maxwell equations for a microstructured hole array, according to some embodiments. The hole array has a hexagonal lattice with a 2000 nm period, and with two hole diameters (as shown in FIG. 106) with a epitaxial structure similar to FIG. 92 of Si NIP with "I" thickness of 2 μm and holes being etched through the I layer. FIG. 109A shows absorption versus wavelength for four cases, including curve 10910, which uses hole diameters of 1670 and 1500 nm, while FIG. 109B shows absorption versus wavelength on an exaggerated scale for two of the cases including curve 10910, which uses hole diameters of 1670 and 1500 nm. The simulation shows ripple of less than 10% over 840 to 860 nm wavelength and with an average absorption of approximately 90%. In addition, the region between 835-875 nm wavelengths can have equal to or better than 80% absorption of incident photons. The addition of more than one hole diameter and/or period reduces the ripple in the absorption verses wavelength curve. The coupling of different resonance modes, eigen modes of different structures with different hole diameter and/or period help reduce ripple and improve absorption enhancement over a broader wavelength range, and achieve high absorption efficiency which is directly proportional to quantum efficiency of greater than 80% at 850 nm in approximately 2 μm thick Si material. In some cases, greater than 90% at 850 nm plus or minus nm can be achieved. In some cases quantum efficiencies of greater than 70%, 60%, 50% or 40% can be achieved at 850 nm plus or minus 10 nm.

Other hole diameters are also shown, for example 1330 and 1500 nm, 1500 and 1500 nm, 1670 and 1670 nm all with a period of 2000 nm and ripples are better in certain wavelength range than others so that in designing the microstructured PD/APD for a certain wavelength range for example 850 nm plus or minus 10 nm, the 1500 nm hole size in a hexagonal lattice with period 2000 nm can attain absorption greater than 80% with less than 10% ripple in a 2 µm Si "I" layer. In addition, holes with 1330 nm and 1500 nm and as mentioned earlier, 1500 and 1670 nm diameters holes with hexagonal lattices with period of 2000 nm can also attain this performance approximately. Therefore a range of hole sizes, from 600 to 1700 nm diameter with a range of periods from 900 to 2000 nm, can be used to design specific wavelength ranges with 20 nm or more spectral range. Other diameters and periods may also be used, the examples given show that certain combinations of hole diameters and periods can result in enhancements of absorption with ripples of less than 10%, 20%, 30%, 40% and 50%.

The hole diameters can be greater than the wavelength or less than the wavelength and the period in free space is greater than the wavelength. Subwavelength periods may also be used in conjunction with periods that are equal to or greater than a wavelength.

This example shows that a variety of hole diameter with the same period can be used to design an operational 850 nm PD/APD in Si with data rate in excess of 5 Gb/s, and in some cases 10 Gb/s and in some cases 20 Gb/s, and in some cases 30-40 Gb/s or more with a useful spectral range of 20 nm and in some cases, 10 nm and in some cases 40 nm or more. Other hole diameters and periods can be used to optimize absorption enhancement at for example, 880 nm wavelength, 980 nm wavelengths where in general hole diameters and/or periods will correspondingly be larger as the wavelengths becomes longer. Multiple hole diameters and/or multiple periods can be used to extend the microstructured Silicon PD/APD to longer wavelengths for example from 800 to 1000 nm wavelengths with enhanced absorption of 40% or more, and in some cases 50% or more and in some cases 60% or more and in some cases 70% or more and in some cases 80% or more and in certain cases 90% or more at certain wavelengths. For longer wavelengths, for example 1550 nm, the holes and period can be 1300 nm diameter and 1500 nm diameter with periods of 2300 and 2500 nm for example where the period are increased. Other hole diameters/periods for 1550 nm wavelength in Ge on Si can be 2300/3100 (in nm), 2000/3100 (in nm) for example where both diameter and period are increased.

In addition, other shapes such as chevron or "V" shaped holes can also be used for absorption enhancements. Other shapes can be "X" shaped, can be rectangular, triangular, polygonal, and/or any combination of shapes to achieve the desired absorption enhancement and spectral width and polarization sensitivities.

Figure 110:
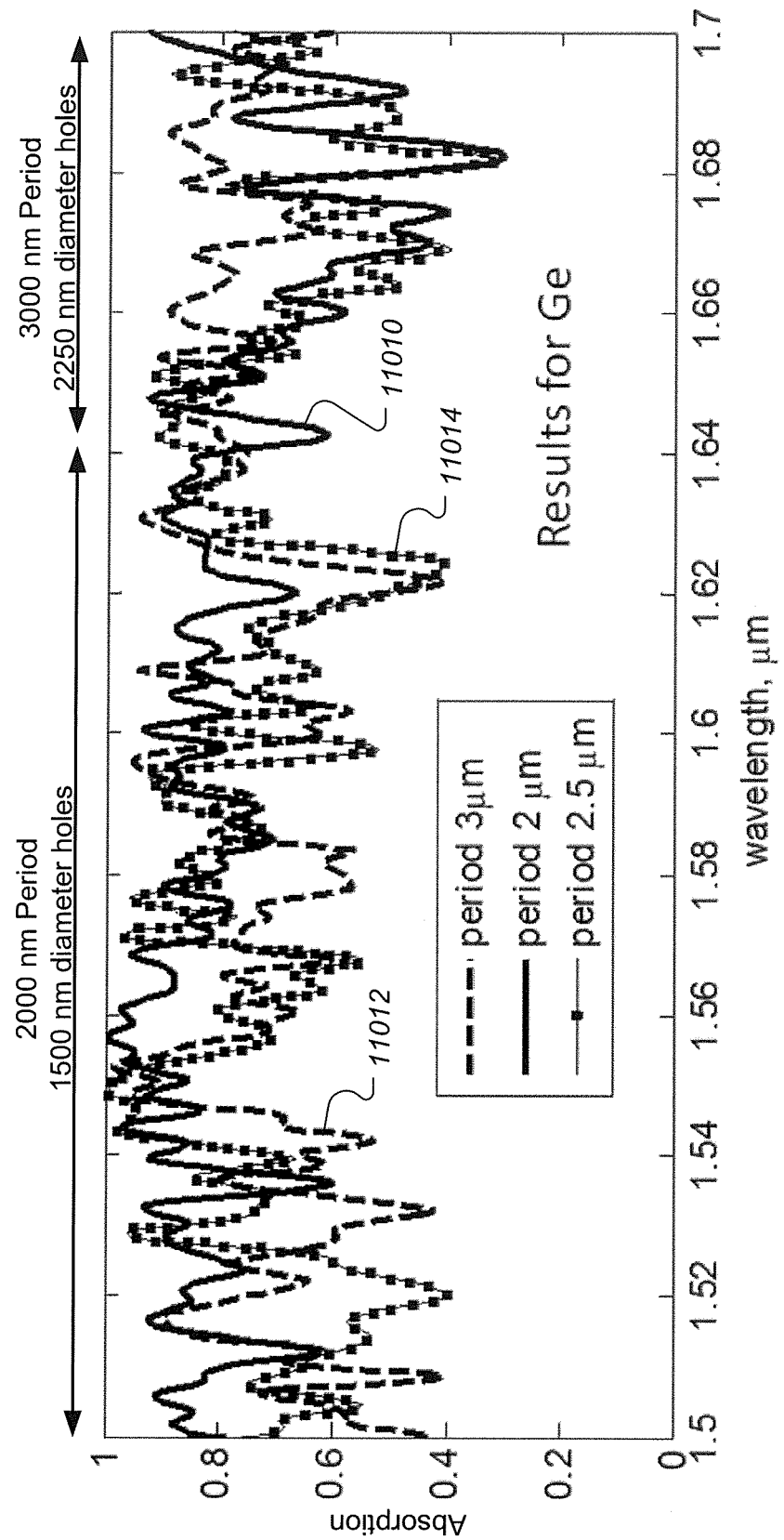
FIG. 110 shows plots of absorption verses wavelength for microstructured photodiodes/avalanche photodiodes with different hole diameters and lattice periods, according to some embodiments.

FIG. 110 shows plots of absorption verses wavelength for microstructured photodiodes/avalanche photodiodes with different hole diameters and lattice periods, according to some embodiments. The MS-PD/APDs simulated had a square lattice with photons impinging either from the top surface or bottom surface. The absorbing layer is Ge with an approximate thickness of 2 µm. The structure is similar to that shown in FIG. 82A. A microstructure with hole diameter of 1500 nm and a period of 2000 nm, represented by curve 11010 in the absorption vs. wavelength curve, for example, shows good absorption characteristics of incident photons with wavelengths ranging from 1500 nm to 1650 nm. A microstructure with hole diameter of 2250 nm and a period of 3000 nm for example, represented by curve 11012 in the absorption vs wavelength curves, show good absorption characteristics on incident photons with wavelength ranging from 1650 to 1700 nm for example. A combination of these two hole diameters and lattices may result in absorption better than 60% for wavelength ranging from 1500 to 1700 nm. Other combination of hole diameters/periods can also be used to achieve good absorption characteristics, for example better than 50%, in some cases better than 40% and in some cases better than 30% for example. In certain wavelengths, better than 80% can be achieved, for example at 1550 nm wavelength plus or minus 10 nm or more. In addition 1669 nm can also achieve better than 80% absorption efficiency plus or minus a few nanometer in wavelength. Other hole diameters/periods of 1875 nm/2500 nm are also shown and is represented by the curve 11014.

In certain cases, the hole diameter can be larger than the wavelength of light that is impinging on the microstructured PD/APD to be absorbed, and in some cases, the diameter of the hole can be approximately the same as the impinging photon wavelength and in some cases, the diameter of the hole can be smaller than the impinging photon wavelength. The same can be said about the period of the lattice where the period can be smaller, approximately the same and/or larger than the impinging wavelength of light to be detected.

Figure 111A:
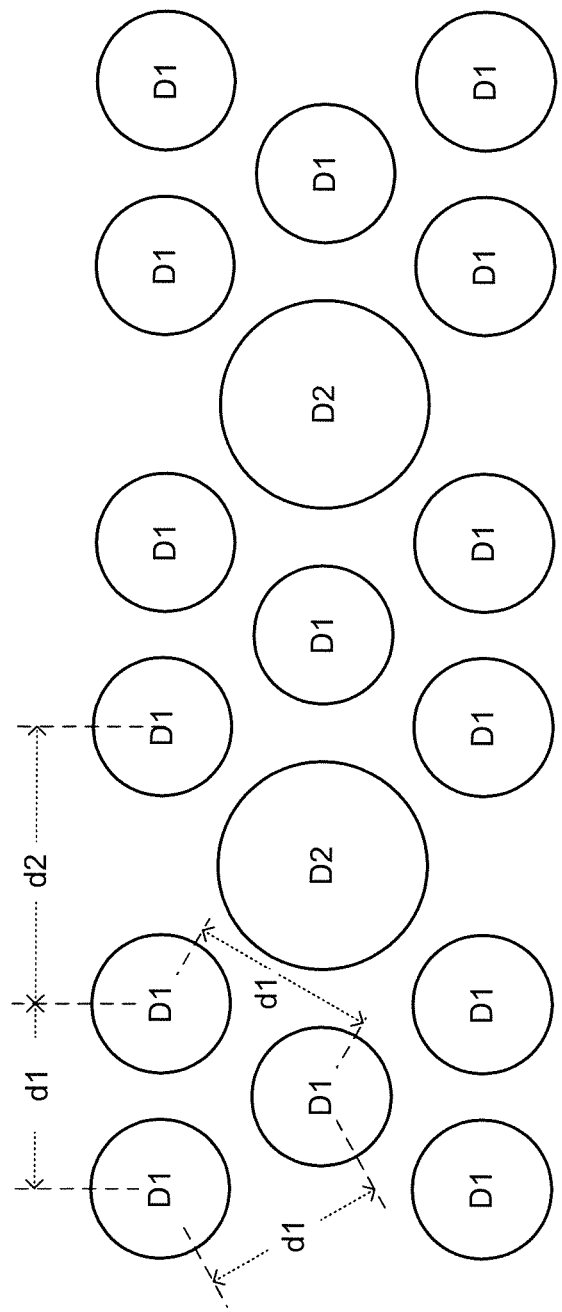
FIGS. 111A and 111B shows a simulation using FDTD methods of a structure as in FIG. 82A where two lattices and two different hole diameters are used, according to some embodiments.
Figure 111B:
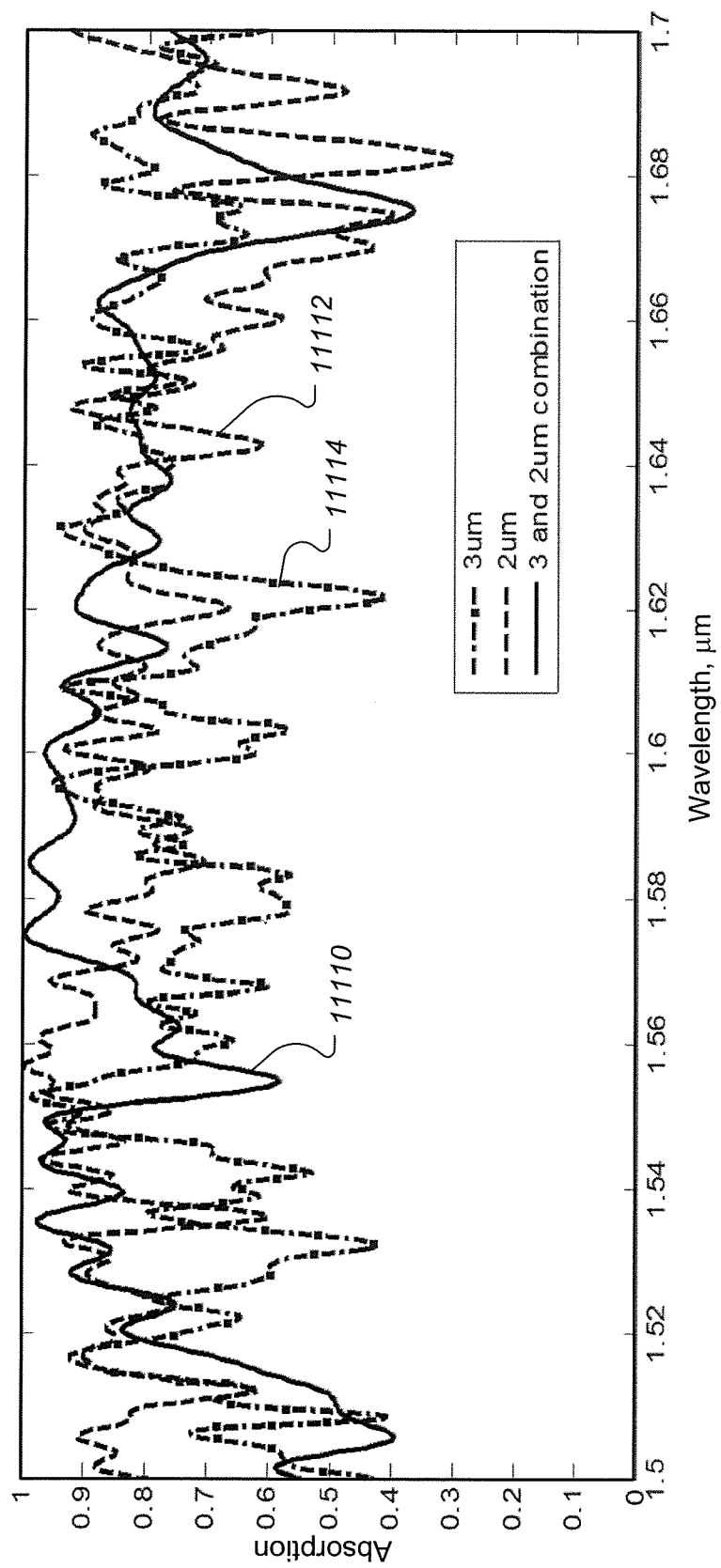

FIGS. 111A and 111B show a simulation using FDTD methods of a structure as in FIG. 82A, where two lattices and two different hole diameters are used, according to some embodiments. FIG. 111A shows a hole pattern that includes a hexagonal lattice with hole diameter D1 of 1500 nm combined with a square lattice with D1 at the four corners and D2 of 2250 nm at the center. The D1 holes are spaced horizontally by 3 µm (d2=3 µm) and vertically by approximately 3.46 µm. The hexagonal lattice has a period of 2 µm (d1=2 µm). FIG. 111B shows plots of absorption vs. wavelength. It can be seen that the 2 lattice, 2 different hole diameter case (curve 11110) shows that at certain wavelengths, the absorption is better than those of a single lattice/hole microstructured PD/APD. For example, at approximately 1570 nm to 1600 nm or the L band of the data/telecommunication wavelengths, curve 11110 shows much better absorption. This is in comparison for example of square lattices with 2 µm periods with hole diameter of 1500 nm (curve 11112) and 3 µm periods with hole diameters of 2250 nm (curve 11114). This result just shows that with different combination of hole diameters and periods, the absorption response can have less resonances and/or less sharp resonances and also can tailor the absorption response optimally at certain wavelength ranges. This is just one example, other combinations of lattices, periods, hole diameters and shapes can be simulated to obtain desired quantum efficiencies, polarization sensitivities, non sensitivity, wavelength selectivity and/or non selectivity for example broad band, ripple/resonance reduction to name a few. Diameters or the smallest dimension can range from 100 nm to 3000 nm and the period and/or periods can range from 150 nm to 4000 nm for example. In addition, the hole pattern may not be a lattice, such as where holes are distributed non periodically and/or with the spacing between the holes chirped. In addition, a pattern of holes may not need to be periodic, but the patterns can be periodic or non periodic. Holes can be random or pseudo randomly distributed and the hole diameters can be varying in a periodic, non periodic fashion, random fashion or pseudo random fashion. In addition, holes can be connected at least at one point, for example where the period is the same, almost the same, less than the diameter of the holes at certain periods. The array of holes can have multiple periods and at least one period can be such that the holes are touching and/or overlap.

Using the coupling of the resonant cells with adjacent neighboring resonant cells according to the techniques described herein, a smoothing out of the absorption response is achieved which is in contrast to existing known resonant photodiodes that have only a single resonator and show sharp resonant behavior in its absorption vs wavelength. The ensemble of resonant cells in according to the techniques described herein results in a more tailored absorption response with controlled ripples and wavelength ranges. In addition, the techniques described herein can also be used tailor specific absorption characteristics at specific wavelengths for more optimal PD/APD performance at specific wavelengths.

In addition, other microstructures/nanostructures that do not participate in the absorption enhancement process can be used to reduce reflection; for example, such as sub-wavelength holes or pits on the surface of dimensions (such as diameter) ranging from 100s of nm to 100s of nm and where the depth can range from 10s of nm to 100s of nm or more.

Figure 112:
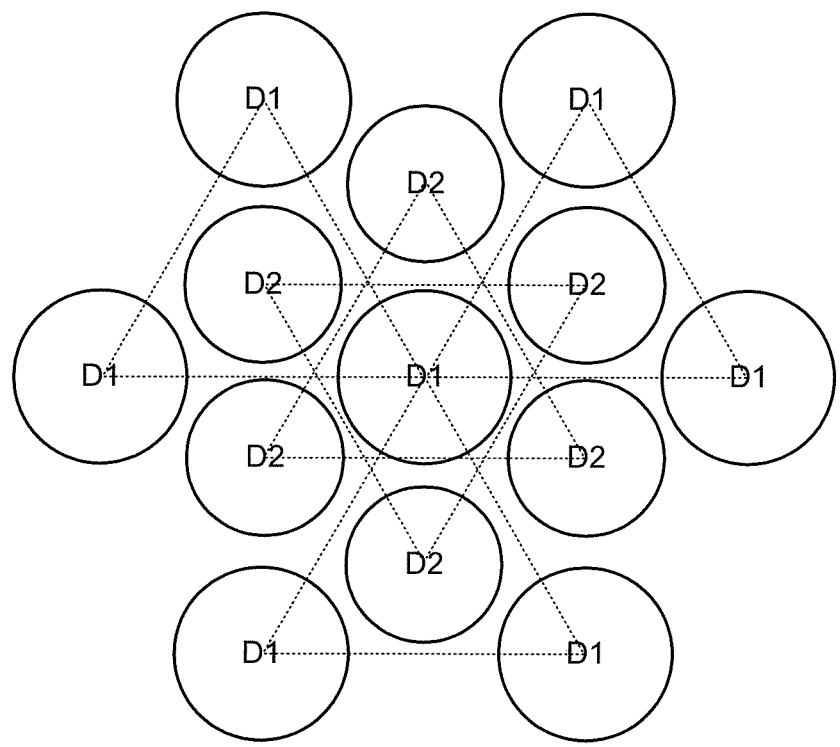
FIG. 112 is a diagram shows another lattice structure where two hexagonal lattices with the same period are combined and interlaced within each other, according to some embodiments.

FIG. 112 is a diagram showing another lattice structure where two hexagonal lattices with the same period are combined and interlaced within each other, according to some embodiments. The pattern can use the same or different diameter holes. As shown, the pattern has two different diameters, for example, the period can be 2000 nm and D1 can be 1500 nm and D2 can be 700 nm. Other combinations of periods and diameters are also possible and are used to tailor the absorption characteristics and therefore the quantum efficiency versus incident photon wavelength and the wavelength span where the absorption characteristics are acceptable for optical data/telecommunication purposes and to satisfy any specific application requirements for that particular optical system or systems.

The unit cells, as shown by the dotted triangles of the two hexagonal lattices overlap each other so that their Eigen modes also overlap each other which can further reduce the ripple of the absorption characteristics within a specific wavelength range, and can also extend the wavelength range where the ripple in the absorption characteristics is reduced. Sharp changes in absorption characteristics within a certain wavelength range are not desirable in a photodiode/avalanche photodiode since any drift in either the incoming optical signal wavelength and/or drift of the photodiode absorption characteristics with respect to temperature, for example, can result in a significant change in the optical to electrical signal conversion. Changes of less than 5% are preferred, and in some other cases less than 10%, 20%, 30%, 40% or 50% is preferred within a certain wavelength range of 2 nm, 4 nm, 10 nm, 20 nm, 40 nm, 60 nm, 100 nm or 250 nm.

Figure 113:
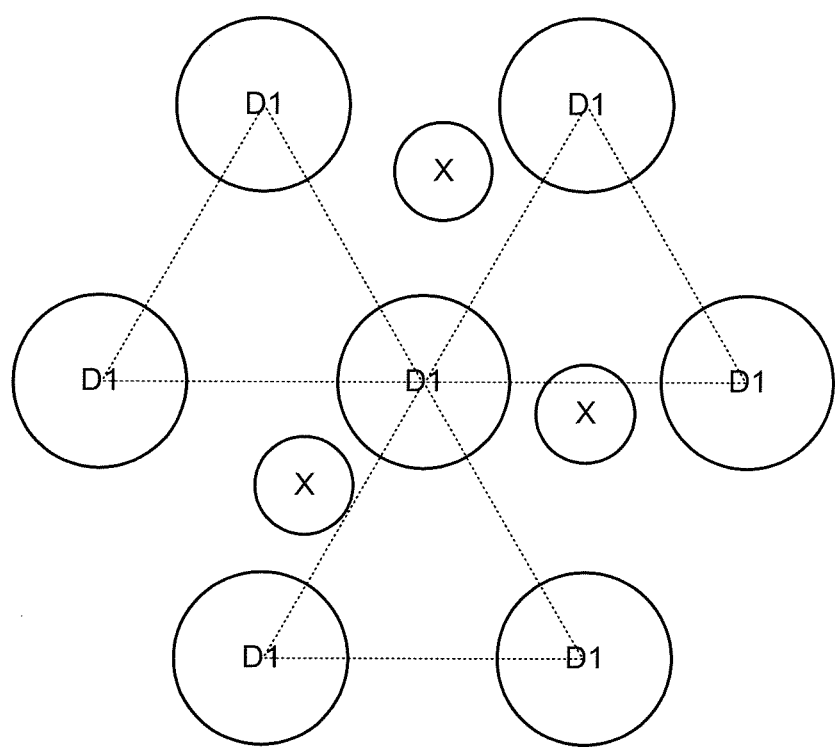
FIG. 113 shows a hexagonal lattice with 6 unit cells, each cell with its Eigen modes where any field propagation/distribution can be an expansion of its Eigen modes.

FIG. 113 shows a hexagonal lattice with 6 unit cells, each cell with its Eigen modes where any field propagation/distribution can be an expansion of its Eigen modes. The Eigen modes of each cell can be coupled with the Eigen modes of the adjacent cell forming complex coupled super modes which can be thought of as a coupling of a 2D array of pendulums, for visualization purposes only, such that the response or motion of this massively coupled 2D array of pendulums motion, where each pendulum is connect via a weak spring to all its adjacent pendulums (the weak spring is the mechanical coupling mechanism), are very complex and not a simple oscillatory motion of a single pendulum. To add to the coupling, a second nested hexagonal lattice can be added such as in FIG. 112. In addition, holes, circular or of any shape and of any depth and of any diameters, where any of the parameters can have multiple values, can be added within the cell and/or at the boundary of adjacent cells which can affect the Eigen modes of the cell and its coupling with adjacent cell Eigen modes. For example, for simplicity, holes of diameter X can be added as shown where X can have single or multiple value and where the holes can be etch partially or entirely in the Si or Ge surface and into the absorbing layer. This can also just be on the surface and not penetrate the absorbing layer. According to some embodiments, the holes can be partially or fully etched into the absorbing layer.

The coupling of the cells resulting in a complex stationary wave or super Eigen mode, can give a smoother absorption vs wavelength response as compared to that of a single resonator such as a resonant photodiode as in previously known structures where the absorption response (proportional to quantum efficiency) has sharp resonant features.

Figure 114:
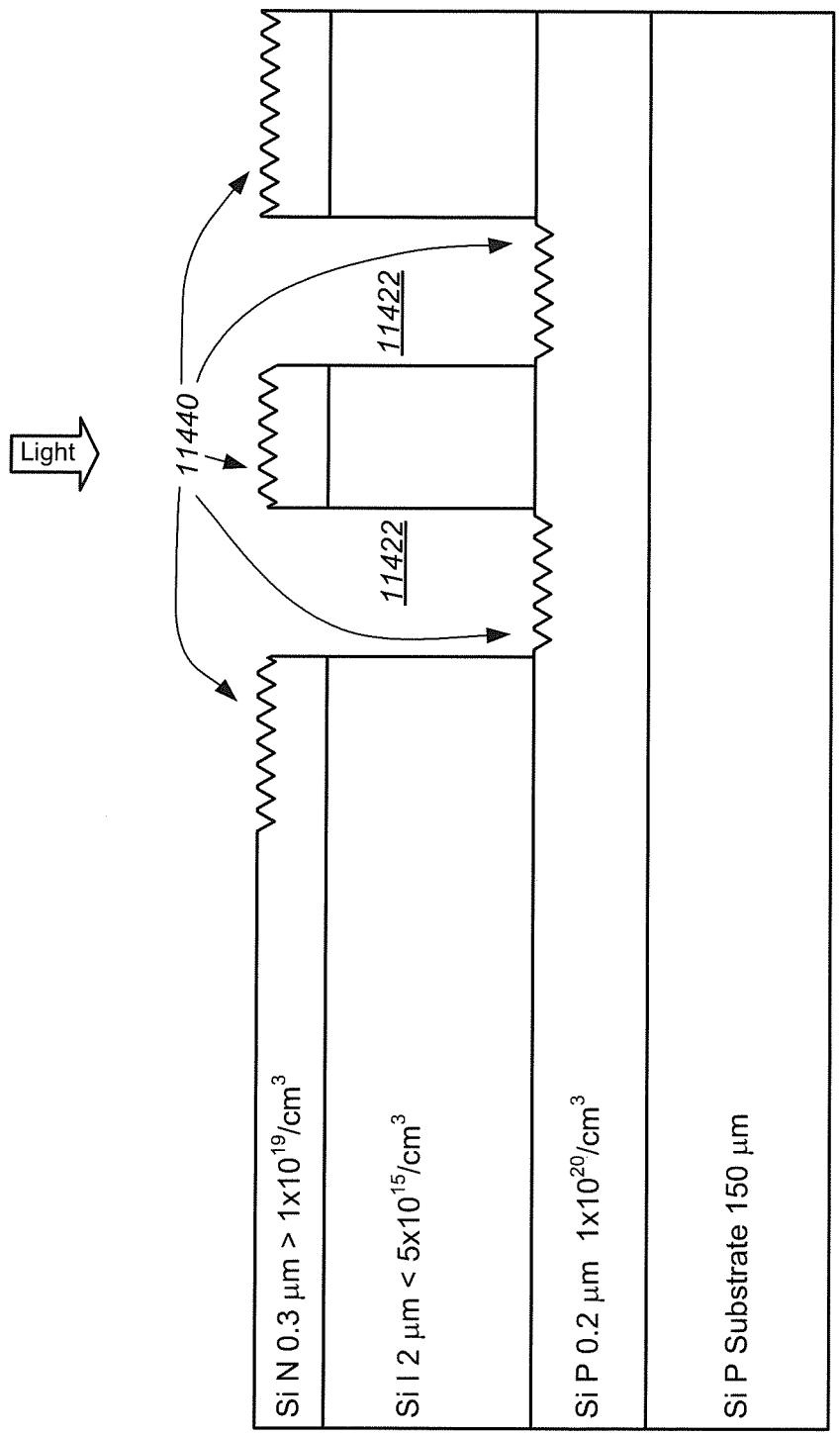
FIG. 114 shows a Si NIP microstructured photodiode with hole arrays and textured surfaces, according to some embodiments.

FIG. 114 shows a Si NIP microstructured photodiode with hole arrays and textured surfaces, according to some embodiments. The textured surface 11440 can be on the top surface and/or in the holes 11422 themselves. The texturing can be at an angle off normal where the substrate can be rotated (or stationary) with a tilt with respect to the dry etching beam (direction) and textures can be partially on the sidewalls for example. According to some embodiments, the texture 11440 reduces reflection of the incident radiation since in an optical communication link, optical signal reflected back to the optical source is not desirable and can cause degradation of the signal to noise of the data communication system. Texturing such as black silicon, where a dry etch is performed on a semiconductor surface with or without masking can result in a forest of nanostructures that can trap the photons and reduce reflection. Without any texturing, the reflection is less than 10% and in some cases less than 5% and in some cases less than 2% as can be seen in the absorption verses wavelength plots such as in FIG. 39, for example, where the absorption is greater than 90-95% at certain wavelengths. From the equation 1=T+R+A where T is the transmitted light, R is the reflected light, and A is the absorbed light, then for A=90-95% indicates that T+R is 5-10%. Therefore, R is less than or equal to 10% and in some cases less than or equal to 5%. With the addition of texturing of the semiconductor surface, the reflection can be further reduced to less than 1% at certain wavelengths. In addition, the optical signal can impinge on the microstructured PD/APD at an angle off normal, and reflection back into the optical data communication channel can be further reduced.

Figure 115:
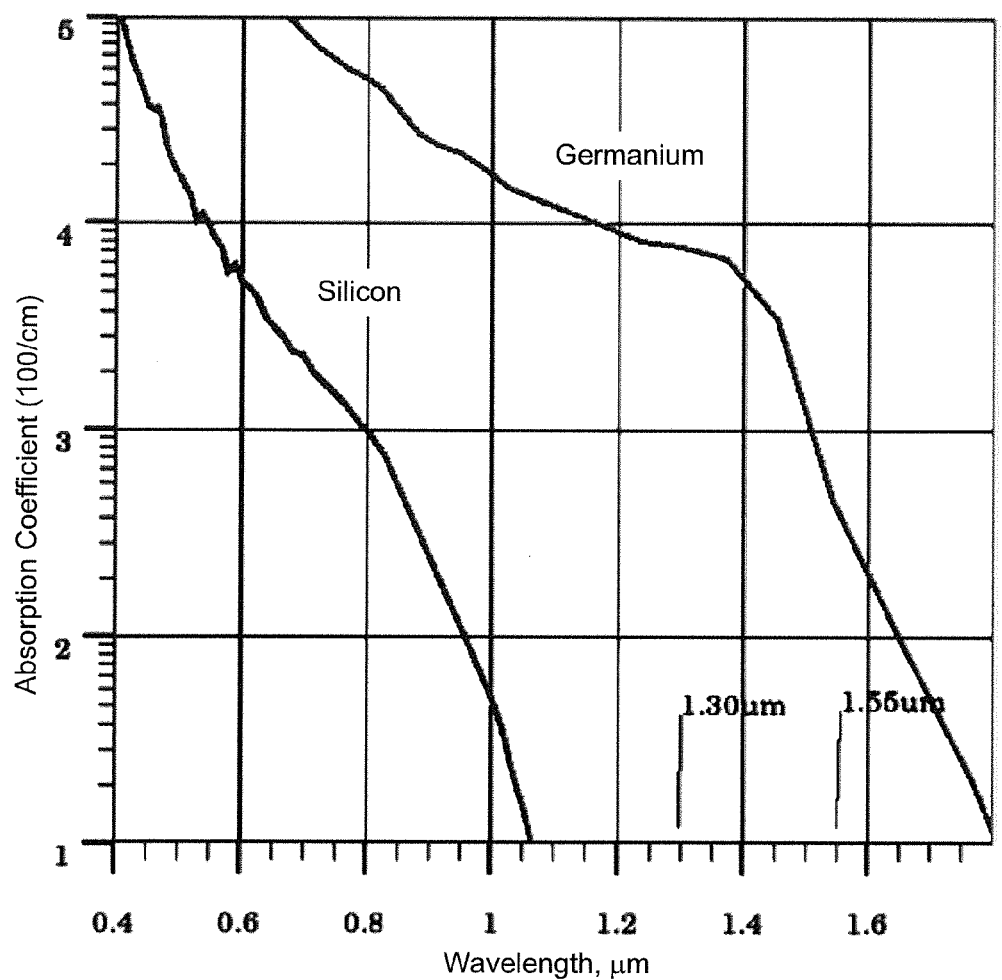
FIG. 115 is a graph showing absorption coefficient of Si and Ge verses wavelength.

FIG. 115 is a graph showing absorption coefficient of Si and Ge verses wavelength. See, e.g. FIG. 6 of http://www.silvaco.com/tech_lib_TCAD/simulationstandard/2010/apr_may_jun/a1/a1.html), which is incorporated herein by reference. At 850 nm for Si and 1550 nm for Ge both have absorption coefficients of less than 300/cm approximately. This weak absorption results in poor quantum efficiency for high speed photodiodes and/or avalanche photodiodes that typically have absorption thicknesses of approximately 2 μm or less for data rates of >10 Gb/s bandwidths for example. This is one of the reasons why there are currently no commercial high speed photodiodes of >5 Gb/s data rate for example, for 850 nm wavelength in Si and 1550 nm wavelength in Ge for example.

Figure 116:
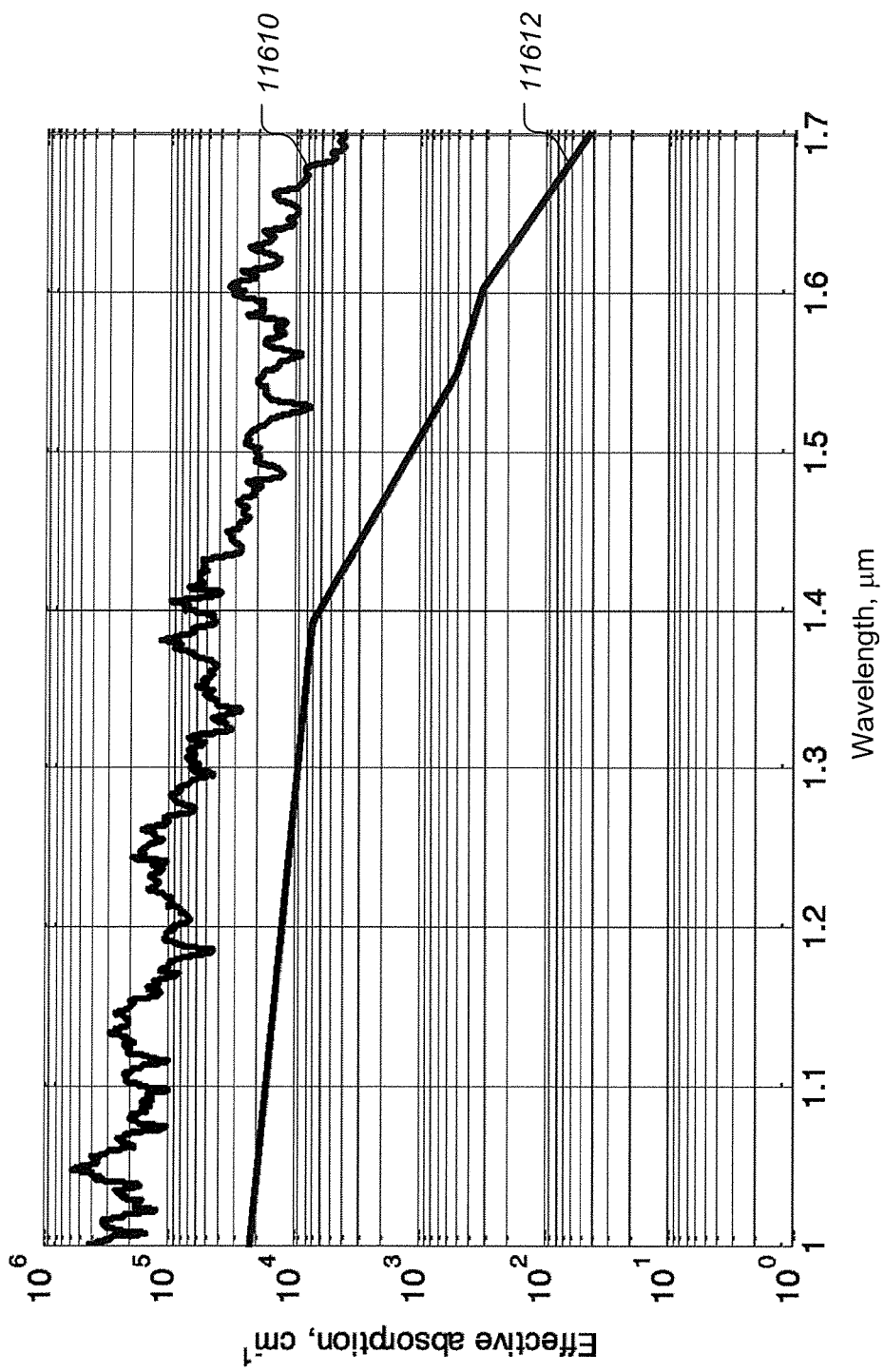
FIG. 116 is a graph showing enhanced effective absorption coefficient of Ge due to microstructured hole arrays, according to some embodiments.

FIG. 116 is a graph showing enhanced effective absorption coefficient of Ge due to microstructured hole arrays, according to some embodiments. The curve 11610 shows enhanced absorption coefficient for Ge with a hexagonal lattice with period of 1.65 μm and hole diameters of 1.25 μm for a 2 μm thick layer of Ge. For comparison, curve 11612 shows absorption coefficient of bulk Ge (without microstructured holes). According to some embodiments, other microstructures can also give an enhanced effective absorption coefficient that can be optimized for certain wavelength bands. For example, the microstructures could be holes or pillars, the spacing can be periodic or non periodic, the holes or pillars can have single of multiple diameters, and the shapes can be circular or non-circular. As shown earlier, the absorption is a product of both the absorption coefficient and absorption length. Therefore, keeping the absorption coefficient as the bulk material absorption coefficient (curve 11612 for Ge), then the absorption length can be an enhanced effective absorption length that is 5, 10, 20 or more times longer than the physical absorption length. As can be seen in FIG. 116, the enhanced effective absorption coefficient is in many wavelength ranges over 10 times greater than the bulk absorption coefficient in Ge. The enhanced effective absorption coefficient in Ge due to microstructures enables the development of high speed PD/APDs, were the absorption length is approximately 2 µm or less typically, at 1550 nm wavelength and longer wavelengths with quantum efficiencies (directly proportional to absorption) of greater than 30%, greater than 40%, greater than 50%, greater than 60%, greater than 70%, greater than 80%, greater than 90%. Such combinations of material, absorption length, wavelength, data rate and quantum efficiency is otherwise not known to be commercially available for Si nor Ge. The same can be said about Si microstructured PD/APD for operation in the wavelength range of 850 nm and longer and at high data rate bandwidths where the absorption length is approximately 2 µm or less typically for example for data rates of 5, 10, 20 Gb/s and higher.

In addition, microstructures can be composed of a single element or cell and/or multiple elements or cells, and can have enhanced effective absorption and/or enhanced effective absorption length that can be the result of linear optical field effects, non linear optical field effects, coupled mode effects, and/or slow wave effects.

The enhancement of absorption coefficient and/or absorption length using microstructures can also be used to extend the operational wavelengths of other material such as III-V material, GaAs, InP, GaN to name a few, at the band edge where the absorption coefficient is becoming weaker. See, e.g. FIG. 3 in Slawomir S. Piatek, http://www.hamamatsu.com/us/en/community/optical_sensors/tutorials/physics_of_mppc/index.html?utm_source=googleplus&utm_medium=social&utm_campaign=hc-social, which is incorporated herein by reference, for InGaAs in the vicinity of 1.6 µm wavelength. According to some embodiments, microstructures can be used to extend the operational wavelength near 1.6 µm and longer.

In addition, the use of microstructures for enhancement of absorption can also be applied to amorphous material such as amorphous Si for example and also to other materials such as polymers, ceramics, graphene, alloys, and oxides. In addition, other forms of energy propagation such as acoustics, microwaves, UV, X-rays and pressure waves, can be converted from one form of energy to another. For example, structures of dimensions approximately to the acoustic wavelengths on a piezoelectric ceramic and/or crystal can enhance the conversion of acoustic energy to electrical energy for example. The use of structures approximately the dimension of the acoustic wavelength, can enhance acoustic absorption that can result in a thinner piezoelectric material, for example, that can in turn have a higher acoustic frequency response for example.

Figure 117:
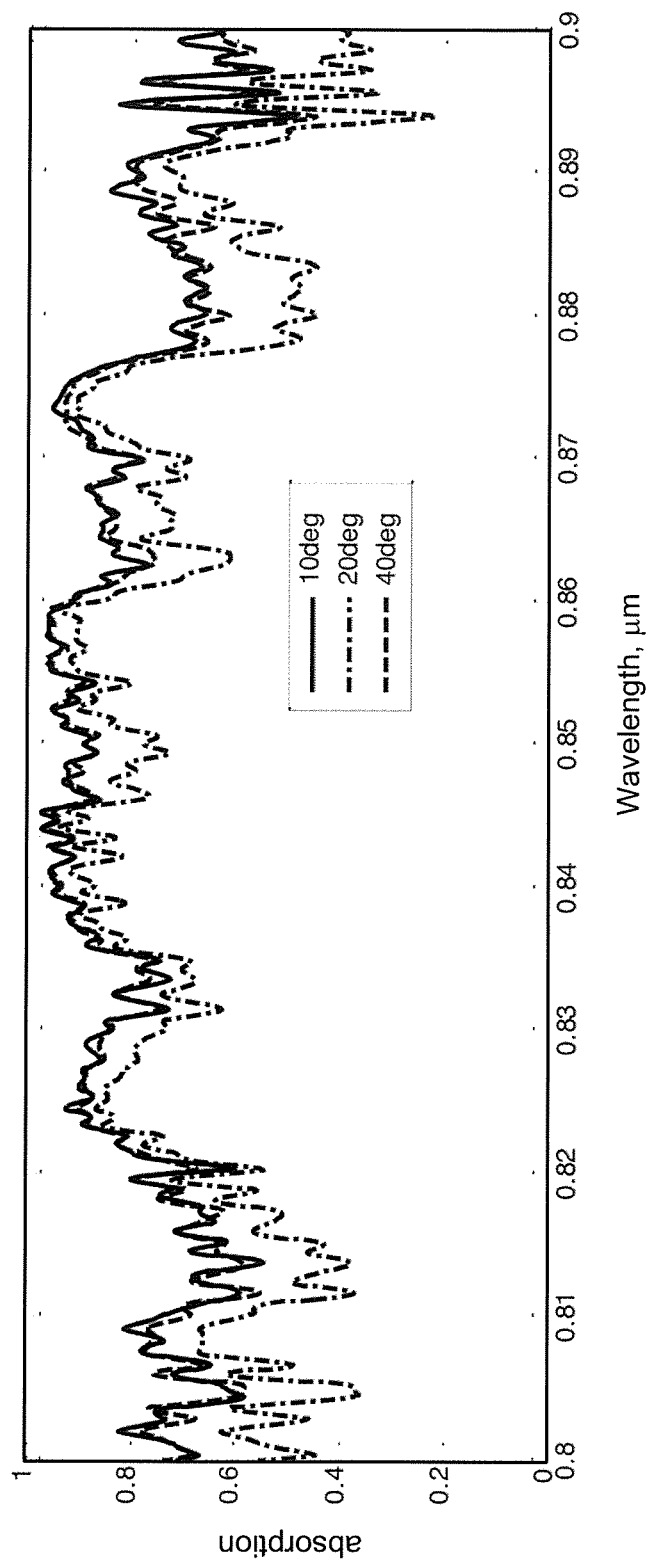
FIG. 117 is graph showing the enhanced absorption of a Si microstructured PD/APD, according to some embodiments.

FIG. 117 is graph showing the enhanced absorption of a Si microstructured PD/APD, according to some embodiments. The simulated MS-PD/APD has a hexagonal lattice hole array, period of 2000 nm, diameter of 1500 nm and photons impinging off normal for example 10, 20 and 40 degrees off normal. FIG. 39 shows simulated enhanced absorption verses wavelength for a similar structure where the photons are impinging normal to the surface. As can be seen, photons at 10 degrees off normal does not change the absorption significantly at a wavelength of 850 nm, the absorption is still greater than 90%. At degrees the absorption at 850 nm wavelength is still over 90%, however at 20 degrees the absorption seems to decrease to 85% at 850 nm, Overall at certain wavelengths, the change in the incident angle of photons impinging on the microstructure can have absorption changes of less than 10% over an angle range of 0-40 degrees for example. With optimization of hole diameters, period, non-periodic microstructures, at certain wavelength ranges the change in quantum efficiency (directly proportional to absorption) with respect to incident angle of impinging photons can be less than 10% and in certain cases less than 5% and in certain cases less than 3%. This feature is important to minimize reflected light back toward the laser source that is either directly modulated at the data rate to transmit the optical signal or indirectly where an optical modulator is used to convert the electrical signal to optical signal for transmission in optical fiber, and/or free space and/or optical waveguides. The use of a non-laser source, such as a light emitting diode as the electrical to optical signal converter, lessens the requirement of reflected power back toward the optical source since an LED is less coherent and/or incoherent optical source; and reflection at the same wavelength causes less corruption in its integrity as an electrical to optical signal converter.

This patent application refers to certain theories in explaining the nature and operation of devices, but it should be clear that such theories are based on current understanding and do not affect the actual operation of the disclosed devices even if future developments prove the theories incorrect. This patent specification also refers to numerical ranges of parameters, and it should be understood that insubstantial departures from such ranges are still within the spirit of the disclosed advancements.

It should be understood that the figures depicting devices are not to scale and are somewhat idealized, e.g., with straight lines and sharp corners whereas the actual devices may and are likely to have walls that are not as straight or smooth and corners that are somewhat rounded. In fact, depending on processing parameters walls such as the walls of holes or pillars in the microstructures are likely to be uneven and rough-surfaces, with surface features such as depressions and bumps, which can actually help with effects such as reduced undesirable reflections.

The semiconductor layers for the detection of light and or signal processing and distribution integrated circuits can be grown epitaxially using techniques such as vapor phase epitaxy, chemical vapor deposition, plasma enhanced chemical vapor deposition, atomic layer deposition, molecular beam epitaxy, to name a few, and or selective area epitaxy, selective area epitaxial lateral over growth, epitaxial lateral overgrowth, heteroepitaxy, wafer bonding, epitaxial lift-off process for example and any combination of growth, bonding, lift-off processes. A preferred process for the semiconductor layers is chemical vapor epitaxy or chemical vapor deposition.

In addition, the microstructure holes can be only in the absorbing high electric field "I" region and not necessarily extend into and or through the N and P regions of the PD/APD. The holes can also overlap either the entire length of the hole and or adjacent holes can partially overlap along the length of the holes.

Doping of P, I and N regions often have a gradual transition between different doping level regions due in part to diffusion of the dopants during epitaxial growth. Transition from high doping to low doping can occur over a distance of 1 to 1000 nm or more depending on dopant types, doping levels, growth temperatures and epitaxial deposition methods. PIN structures are often P+ P P− I N− N N+ where the P and P− and N and N− are transition regions and a very narrow transition region is desirable.

Although the foregoing has been described in some detail for purposes of clarity, it will be apparent that certain changes and modifications may be made without departing from the principles thereof. It should be noted that there are many alternative ways of implementing both the processes and apparatuses described herein. Accordingly, the present embodiments are to be considered as illustrative and not restrictive, and the body of work described herein is not to be limited to the details given herein, which may be modified within the scope and equivalents of the appended claims.

What is claimed is:

1. A microstructure-enhanced photodetector comprising:
a first layer of doped semiconductor material, a second layer of doped semiconductor material, and an intermediate layer of semiconductor material that is between the first and second layers and is not intentionally doped or is doped to a substantially lower level of doping than the first and second layers;
wherein said intermediate layer is:
substantially continuous except for intentionally formed plural holes extending therein; and
configured to concurrently receive at a plural number of the holes, a modulated optical input that is substantially continuous;
said photodetector being configured to:
operate at quantum efficiency of at least 30% when reverse-biased and receiving said modulated optical input at a frequency of at least 5 Gigabits per second and a wavelength range included in at least one of the ranges 800-990 nanometers and 1250-1600 nanometers; and
produce an electrical output signal representative of the modulation of said optical input signal.

2. The microstructure-enhanced photodetector of claim 1, in which each of the layers is silicon and the modulated optical signal wavelength is in a range within the 800-990 nanometers range.

3. The microstructure-enhanced photodetector of claim 2, in which the holes are tapered.

4. The microstructure-enhanced photodetector of claim 3, in which the tapered holes are funnel-shaped.

5. The microstructure-enhanced photodetector of claim 2, in which the holes are in a non-periodic array.

6. The microstructure-enhanced photodetector of claim 2, in which the holes extend through at least one of the first layer and second layer.

7. The microstructure-enhanced photodetector of claim 2, in which the holes extend through one of the first layer and the second layer and at least partway into the other of the first layer and the second layer.

8. The microstructure-enhanced photodetector of claim 2, in which the first and second layers are doped to opposite conductivity types.

9. The microstructure-enhanced photodetector of claim 2, in which the first and second layers are doped to the same conductivity type.

10. The microstructure-enhanced photodetector of claim 2, further including an avalanche structure operatively coupled with the photodetector to form an avalanche photodetector therewith, wherein said avalanche photodetector operates at a quantum efficiency of at least 80%.

11. The microstructure-enhanced photodetector of claim 2, further comprising a silicon substrate on which the photodetector is formed and an active electronic circuit formed on the same substrate to thereby form an integrated single chip that includes both the photodetector and the active electronic circuit, wherein the active electronic circuit is configured to receive said electrical output signal from the photodetector and produce a processed electrical output.

12. The microstructure-enhanced photodetector of claim 11, in which the active electronic circuit comprises at least one of: electronic transimpedance amplifier, signal processing electronics, and signal routing electronics.

13. The microstructure-enhanced photodetector of claim 2, in which the intermediate layer is no more than 5 micrometers thick.

14. The microstructure-enhanced photodetector of claim 1, in which the first layer and the intermediate layer are germanium based material and the second layer is silicon, and the modulated optical signal wavelength is in a range within the 1250-1600 nanometers range.

15. The microstructure-enhanced photodetector of claim 14, in which the holes are tapered.

16. The microstructure-enhanced photodetector of claim 15, in which the tapered holes are funnel-shaped.

17. The microstructure-enhanced photodetector of claim 14, in which the holes are in a non-periodic array.

18. The microstructure-enhanced photodetector of claim 14, further including an avalanche structure operatively coupled with the photodetector to form an avalanche photodetector therewith, wherein said avalanche photodetector operates at a quantum efficiency of at least 80%.

19. The microstructure-enhanced photodetector of claim 14, further comprising a silicon substrate on which the photodetector is formed and an active electronic circuit formed on the same substrate to thereby form an integrated single chip that includes both the photodetector and the active electronic circuit, wherein the active electronic circuit is configured to receive said electrical output signal from the photodetector and produce a processed electrical output.

20. The microstructure-enhanced photodetector of claim 19, in which the active electronic circuit comprises at least one of: electronic transimpedance amplifier, signal processing electronics, and signal routing electronics.

21. The microstructure-enhanced photodetector of claim 14, in which the intermediate layer is no more than 5 micrometers thick.

22. The microstructure-enhanced photodetector of claim 1, further including a buffer layer between at least one of the first and second layers and the intermediate layers.

23. The microstructure-enhanced photodetector of claim 22, in which the buffer layer is of a semiconductor material.

24. The microstructure-enhanced photodetector of claim 1, including a substrate on which the photodetector is formed, said substrate including a via configured to receive and optical fiber carrying said optical input, wherein the via is aligned with said holes for self-alignment of the fiber with said holes causing the optical signal to be concurrently received at said plural holes.

25. The microstructure-enhanced photodetector of claim 1, in which the semiconductor material of the intermediate layer is other than gallium arsenade.

26. A method of fabricating a microstructured photodetector, comprising:
processing a silicon substrate to form thereon or therein a first layer of doped semiconductor material, a second layer of doped semiconductor material, and an intermediate layer of semiconductor material no more than 5 micrometers thick that is between the first and second layers and is not intentionally doped or is doped to a substantially lower level of doping than the first and second layers;
etching plural holes in said intermediate layer while leaving the intermediate layer substantially continuous except for the holes; and
configuring the photodetector for:
  concurrent receipt at a plural number of the holes, of a modulated optical input that is substantially continuous;
  operation at quantum efficiency of at least 30% when reverse-biased and receiving said modulated optical input at a frequency of at least 5 Gigabits per second and a wavelength range included in at least one of the ranges 800-990 nanometers and 1250-1600 nanometers; and
  production of an electrical output signal representative of the modulation of said optical input signal.

27. The method of claim 26, in which the processing step comprises making the first layer and the intermediate layer of germanium based material and the second layer of silicon or germanium based material, and the configuring step comprises configuring the photodetector to operate at a wavelength of the optical input in a range within said 1250-1600 nanometers range.

28. The method of claim 26, in which the processing step comprises making the first layer, the intermediate layer, and the second layer of silicon, and the configuring step comprises configuring the photodetector to operate at a wavelength of the optical input in a range within said 800-990 nanometers range.

29. The method of claim 26, further including forming on or in said substrate an avalanche structure that includes and avalanche layer operatively associated with said intermediate layer to increase the quantum efficiency of a resulting combination of the photodetector and said avalanche structure.

30. The method of claim 26, further including forming on said substrate an active electronic circuit to thereby form an integrated single chip that includes both the photodetector and the active electronic circuit, and configuring the active electronic circuit to receive said electrical output signal from the photodetector and produce a processed electrical output.

* * * * *